US011121271B2

(12) United States Patent
Wang et al.

(10) Patent No.: US 11,121,271 B2
(45) Date of Patent: Sep. 14, 2021

(54) MICROSTRUCTURE ENHANCED ABSORPTION PHOTOSENSITIVE DEVICES

(71) Applicant: W&Wsens Devices, Inc., Los Altos, CA (US)

(72) Inventors: Shih-Yuan Wang, Palo Alto, CA (US); Shih-Ping Wang, Los Altos, CA (US)

(73) Assignee: W&WSens, Devices, Inc., Los Altos, CA (US)

( * ) Notice: Subject to any disclaimer, the term of this patent is extended or adjusted under 35 U.S.C. 154(b) by 0 days.

(21) Appl. No.: 16/528,958

(22) Filed: Aug. 1, 2019

(65) Prior Publication Data

US 2020/0028000 A1 Jan. 23, 2020

Related U.S. Application Data

(63) Continuation-in-part of application No. 15/797,821, filed on Oct. 30, 2017, now Pat. No. 10,446,700, (Continued)

(51) Int. Cl.
*H01L 31/0236* (2006.01)
*H01L 31/0352* (2006.01)
(Continued)

(52) U.S. Cl.
CPC ........ *H01L 31/02363* (2013.01); *G02B 1/002* (2013.01); *G02B 6/4204* (2013.01); (Continued)

(58) Field of Classification Search
CPC ... H01L 31/00; H01L 31/02; H01L 31/02016; H01L 31/0232; H01L 31/0236; (Continued)

(56) References Cited

U.S. PATENT DOCUMENTS 4,292,512 A 9/1981 Miller et al.
4,571,559 A 2/1986 Henry et al.
(Continued)

FOREIGN PATENT DOCUMENTS

JP 6-53424 2/1994
JP 2003-142778 5/2003
(Continued)

OTHER PUBLICATIONS

Hideyuki Nasu et al, 13-Tb/s VCSEL-Based On-Board Parallel-Optical Transceiver Module for High-Density Optical Interconnects, Journal of Lightwave Technology, vol. 31, No. XXX Jan. 2018.

(Continued)

*Primary Examiner* — Eduardo A Rodela
(74) *Attorney, Agent, or Firm* — Wissing Miller LLP

(57) ABSTRACT

Lateral and vertical microstructure enhanced photodetectors and avalanche photodetectors are monolithically integrated with CMOS/BiCMOS ASICs and can also be integrated with laser devices using fluidic assembly techniques. Photodetectors can be configured in a vertical PIN arrangement or lateral metal-semiconductor-metal arrangement where electrodes are in an inter-digitated pattern. Microstructures, such as holes and protrusions, can improve quantum efficiency in silicon, germanium and III-V materials and can also reduce avalanche voltages for avalanche photodiodes. Applications include optical communications within and between datacenters, telecommunications, LIDAR, and free space data communication.

25 Claims, 167 Drawing Sheets

Related U.S. Application Data which is a continuation-in-part of application No. 15/309,922, filed as application No. PCT/US2015/061120 on Nov. 17, 2015, now Pat. No. 9,818,893, said application No. 15/309,922 is a continuation of application No. 14/943,898, filed on Nov. 17, 2015, now Pat. No. 9,530,905, and a continuation of application No. 14/945,003, filed on Nov. 18, 2015, now Pat. No. 9,525,084, said application No. 15/797,821 is a continuation-in-part of application No. 14/947,718, filed on Nov. 20, 2015, now Pat. No. 10,622,498, which is a continuation of application No. PCT/US2014/039208, filed on May 22, 2014, said application No. 15/797,821 is a continuation-in-part of application No. PCT/US2016/067977, filed on Dec. 21, 2016, application No. 16/528,958, which is a continuation-in-part of application No. 16/042,535, filed on Jul. 23, 2018, now Pat. No. 10,700,225, which is a continuation-in-part of application No. 15/797,821, filed on Oct. 30, 2017, now Pat. No. 10,446,700, application No. 16/528,958, which is a continuation-in-part of application No. 16/296,985, filed on Mar. 8, 2019, now Pat. No. 10,468,543, which is a continuation of application No. 15/797,821, filed on Oct. 30, 2017, now Pat. No. 10,446,700, application No. 16/528,958, which is a continuation-in-part of application No. 14/947,718, filed on Nov. 20, 2015, now Pat. No. 10,622,498, and a continuation-in-part of application No. PCT/US2016/067977, filed on Dec. 21, 2016, and a continuation-in-part of application No. PCT/US2018/057963, filed on Oct. 29, 2018, which is a continuation-in-part of application No. 15/797,821, filed on Oct. 30, 2017, now Pat. No. 10,446,700, application No. 16/528,958, which is a continuation-in-part of application No. PCT/US2018/043289, filed on Jul. 23, 2018, which is a continuation-in-part of application No. 15/797,821, filed on Oct. 30, 2017, now Pat. No. 10,446,700.

(60) Provisional application No. 62/081,538, filed on Nov. 18, 2014, provisional application No. 62/090,879, filed on Dec. 11, 2014, provisional application No. 62/100,025, filed on Jan. 5, 2015, provisional application No. 62/111,582, filed on Feb. 3, 2015, provisional application No. 62/139,511, filed on Mar. 27, 2015, provisional application No. 62/153,443, filed on Apr. 27, 2015, provisional application No. 62/154,675, filed on Apr. 29, 2015, provisional application No. 62/157,876, filed on May 6, 2015, provisional application No. 62/171,915, filed on Jun. 5, 2015, provisional application No. 62/174,498, filed on Jun. 11, 2015, provisional application No. 62/175,855, filed on Jun. 15, 2015, provisional application No. 62/182,602, filed on Jun. 21, 2015, provisional application No. 62/188,876, filed on Jul. 6, 2015, provisional application No. 62/197,120, filed on Jul. 27, 2015, provisional application No. 62/199,607, filed on Jul. 31, 2015, provisional application No. 62/205,717, filed on Aug. 15, 2015, provisional application No. 62/209,311, filed on Aug. 24, 2015, provisional application No. 62/213,556, filed on Sep. 2, 2015, provisional application No. 62/232,716, filed on Sep. 25, 2015, provisional application No. 61/826,446, filed on May 22, 2013, provisional application No. 61/834,873, filed on Jun. 13, 2013, provisional application No. 61/843,021, filed on Jul. 4, 2013, provisional application No. 61/905,109, filed on Nov. 15, 2013, provisional application No. 62/270,577, filed on Dec. 21, 2015, provisional application No. 62/415,339, filed on Oct. 31, 2016, provisional application No. 62/414,671, filed on Oct. 29, 2016, provisional application No. 62/290,391, filed on Feb. 2, 2016, provisional application No. 62/304,907, filed on Mar. 7, 2016, provisional application No. 62/334,934, filed on May 11, 2016, provisional application No. 62/338,263, filed on May 18, 2016, provisional application No. 62/346,850, filed on Jun. 7, 2016, provisional application No. 62/359,349, filed on Jul. 7, 2016, provisional application No. 62/366,188, filed on Jul. 25, 2016, provisional application No. 62/368,109, filed on Jul. 28, 2016, provisional application No. 62/374,828, filed on Aug. 13, 2016, provisional application No. 62/376,869, filed on Aug. 18, 2016, provisional application No. 62/380,364, filed on Aug. 27, 2016, provisional application No. 62/383,391, filed on Sep. 3, 2016, provisional application No. 62/383,479, filed on Sep. 4, 2016, provisional application No. 62/394,222, filed on Sep. 14, 2016, provisional application No. 62/398,607, filed on Sep. 23, 2016, provisional application No. 62/401,126, filed on Sep. 28, 2016, provisional application No. 62/406,999, filed on Oct. 12, 2016, provisional application No. 62/414,671, filed on Oct. 29, 2016, provisional application No. 62/415,339, filed on Oct. 31, 2016, provisional application No. 62/465,734, filed on Mar. 1, 2017, provisional application No. 62/474,179, filed on Mar. 21, 2017, provisional application No. 62/484,474, filed on Apr. 12, 2017, provisional application No. 62/487,606, filed on Apr. 20, 2017, provisional application No. 62/488,998, filed on Apr. 24, 2017, provisional application No. 62/500,581, filed on May 3, 2017, provisional application No. 62/505,974, filed on May 14, 2017, provisional application No. 62/509,093, filed on May 20, 2017, provisional application No. 62/510,249, filed on May 23, 2017, provisional application No. 62/514,889, filed on Jun. 4, 2017, provisional application No. 62/521,504, filed on Jun. 18, 2017, provisional application No. 62/522,169, filed on Jun. 20, 2017, provisional application No. 62/527,962, filed on Jun. 30, 2017, provisional application No. 62/530,281, filed on Jul. 9, 2017, provisional application No. 62/533,078, filed on Jul. 16, 2017, provisional application No. 62/533,603, filed on Jul. 17, 2017, provisional application No. 62/535,801, filed on Jul. 21, 2017, provisional application No. 62/540,524, filed on Aug. 2, 2017, provisional application No. 62/542,243, filed on Aug. 7, 2017, provisional application No. 62/547,728, filed on Aug. 18, 2017, provisional application No. 62/553,844, filed on Sep. 2, 2017, provisional application No. 62/556,426, filed on Sep. 10, 2017, provisional application No. 62/561,869, filed on Sep. 22, 2017, provisional application No. 62/591,072, filed on Nov. 27, 2017, provisional application No. 62/599,246, filed on Dec. 15, 2017, provisional application No. 62/607,860, filed on Dec. 19, 2017, provisional application No. 62/615,314, filed on Jan. 9, 2018, provisional application No. 62/623,971, filed on Jan.

30, 2018, provisional application No. 62/628,764, filed on Feb. 9, 2018, provisional application No. 62/631,630, filed on Feb. 17, 2018, provisional application No. 62/633,514, filed on Feb. 21, 2018, provisional application No. 62/634,692, filed on Feb. 23, 2018, provisional application No. 62/637,945, filed on Mar. 2, 2018, provisional application No. 62/639,356, filed on Mar. 6, 2018, provisional application No. 62/639,472, filed on Mar. 6, 2018, provisional application No. 62/640,522, filed on Mar. 8, 2018, provisional application No. 62/643,010, filed on Mar. 14, 2018, provisional application No. 62/645,810, filed on Mar. 21, 2018, provisional application No. 62/646,871, filed on Mar. 22, 2018, provisional application No. 62/651,053, filed on Mar. 30, 2018, provisional application No. 62/651,087, filed on Mar. 31, 2018, provisional application No. 62/652,830, filed on Apr. 4, 2018, provisional application No. 62/659,067, filed on Apr. 17, 2018, provisional application No. 62/659,072, filed on Apr. 17, 2018, provisional application No. 62/662,217, filed on Apr. 24, 2018, provisional application No. 62/666,005, filed on May 2, 2018, provisional application No. 62/669,194, filed on May 9, 2018, provisional application No. 62/675,130, filed on May 22, 2018, provisional application No. 62/677,609, filed on May 29, 2018, provisional application No. 62/682,909, filed on Jun. 9, 2018, provisional application No. 62/639,920, filed on Mar. 7, 2018, provisional application No. 62/713,455, filed on Aug. 1, 2018, provisional application No. 62/716,310, filed on Aug. 8, 2018, provisional application No. 62/717,750, filed on Aug. 10, 2018, provisional application No. 62/719,689, filed on Aug. 19, 2018, provisional application No. 62/724,449, filed on Aug. 29, 2018, provisional application No. 62/733,476, filed on Sep. 19, 2018, provisional application No. 62/737,062, filed on Sep. 26, 2018, provisional application No. 62/750,016, filed on Oct. 24, 2018, provisional application No. 62/770,656, filed on Nov. 21, 2018, provisional application No. 62/772,498, filed on Nov. 28, 2018, provisional application No. 62/777,157, filed on Dec. 9, 2018, provisional application No. 62/779,693, filed on Dec. 14, 2018, provisional application No. 62/784,342, filed on Dec. 21, 2018, provisional application No. 62/794,330, filed on Jan. 18, 2019, provisional application No. 62/797,141, filed on Jan. 25, 2019, provisional application No. 62/797,263, filed on Jan. 26, 2019, provisional application No. 62/800,371, filed on Feb. 1, 2019, provisional application No. 62/802,171, filed on Feb. 6, 2019, provisional application No. 62/802,718, filed on Feb. 8, 2019, provisional application No. 62/805,850, filed on Feb. 14, 2019, provisional application No. 62/808,949, filed on Feb. 22, 2019, provisional application No. 62/819,604, filed on Mar. 17, 2019, provisional application No. 62/819,669, filed on Mar. 17, 2019, provisional application No. 62/820,695, filed on Mar. 19, 2019, provisional application No. 62/828,976, filed on Apr. 3, 2019, provisional application No. 62/841,798, filed on May 1, 2019, provisional application No. 62/843,206, filed on May 3, 2019, provisional application No. 62/846,554, filed on May 10, 2019, provisional application No. 62/853,280, filed on May 28, 2019, provisional application No. 62/860,115, filed on Jun. 11, 2019, provisional application No. 62/863,231, filed on Jun. 18, 2019, provisional application No. 62/863,852, filed on Jun. 19, 2019, provisional application No. 62/867,186, filed on Jun. 26, 2019, provisional application No. 62/868,911, filed on Jun. 29, 2019, provisional application No. 62/870,533, filed on Jul. 3, 2019, provisional application No. 62/873,891, filed on Jul. 13, 2019, provisional application No. 62/874,418, filed on Jul. 15, 2019.

(51) Int. Cl.

| | |
|---|---|
| ***H01L 31/18*** | (2006.01) |
| ***H01L 27/144*** | (2006.01) |
| ***H04B 10/69*** | (2013.01) |
| ***H01L 31/02*** | (2006.01) |
| ***H01L 31/0232*** | (2014.01) |
| ***H01L 31/09*** | (2006.01) |
| ***H01L 31/103*** | (2006.01) |
| ***H01L 31/028*** | (2006.01) |
| ***H01L 31/107*** | (2006.01) |
| ***H04B 10/25*** | (2013.01) |
| ***H04B 10/40*** | (2013.01) |
| ***H04B 10/80*** | (2013.01) |
| ***G02B 1/00*** | (2006.01) |
| ***G02B 6/42*** | (2006.01) |
| ***H01L 27/146*** | (2006.01) |
| ***H01L 31/077*** | (2012.01) |
| ***H01L 31/036*** | (2006.01) |
| ***H01L 31/075*** | (2012.01) |
| ***H01L 31/105*** | (2006.01) |

(52) U.S. Cl.

CPC .......... *G02B 6/428* (2013.01); *H01L 27/1443* (2013.01); *H01L 27/1446* (2013.01); *H01L 27/14625* (2013.01); *H01L 31/02* (2013.01); *H01L 31/028* (2013.01); *H01L 31/02016* (2013.01); *H01L 31/0232* (2013.01); *H01L 31/0236* (2013.01); *H01L 31/02325* (2013.01); *H01L 31/02327* (2013.01); *H01L 31/02366* (2013.01); *H01L 31/036* (2013.01); *H01L 31/0352* (2013.01); *H01L 31/035218* (2013.01); *H01L 31/035281* (2013.01); *H01L 31/075* (2013.01); *H01L 31/077* (2013.01); *H01L 31/09* (2013.01); *H01L 31/103* (2013.01); *H01L 31/105* (2013.01); *H01L 31/107* (2013.01); *H01L 31/1075* (2013.01); *H01L 31/1804* (2013.01); *H01L 31/1808* (2013.01); *H04B 10/25* (2013.01); *H04B 10/40* (2013.01); *H04B 10/691* (2013.01); *H04B 10/6971* (2013.01); *H04B 10/801* (2013.01); *G02B 1/005* (2013.01); *Y02E 10/547* (2013.01); *Y02P 70/50* (2015.11)

(58) Field of Classification Search

CPC ........... H01L 31/02363; H01L 31/0352; H01L 31/035272; H01L 31/035281; H01L 31/036; H01L 31/075; H01L 31/077; H01L 31/09; H01L 31/101; H01L 31/1013; H01L 31/105; H01L 31/035218; H01L 31/1804; H01L 27/1443; H01L 27/14625; H01L 31/1085; H01L 27/1446; H01L 31/02327; H01L 31/103; H01L 31/02325; H01L 31/028; H01L 31/107; H01L 31/02366; H01L 31/1808; H01L 31/1075; H04B 10/6971; H04B 10/691;

H04B 10/25; H04B 10/40; H04B 10/801; Y02P 70/50; Y02E 10/547; G02B 1/005; G02B 1/002; G02B 6/428; G02B 6/4204
See application file for complete search history.

(56) References Cited

U.S. PATENT DOCUMENTS

| | | | |
|---|---|---|---|
| 4,637,129 | A | 1/1987 | Derkits, Jr. et al. |
| 4,716,449 | A | 12/1987 | Miller |
| 4,814,847 | A | 3/1989 | Tabatabaie |
| 5,244,749 | A | 9/1993 | Bean et al. |
| 5,451,767 | A | 9/1995 | Amano et al. |
| 5,457,327 | A | 10/1995 | Taguchi |
| 5,525,828 | A | 6/1996 | Bassous et al. |
| 5,625,636 | A | 4/1997 | Bryan et al. |
| 5,757,057 | A | 5/1998 | Dabrowski |
| 5,886,374 | A | 3/1999 | Sakamoto et al. |
| 6,027,956 | A | 2/2000 | Irissou |
| 6,177,289 | B1 | 1/2001 | Crow et al. |
| 6,392,282 | B1 | 5/2002 | Sahara et al. |
| 6,538,299 | B1 | 3/2003 | Kwark et al. |
| 6,667,528 | B2 | 12/2003 | Cohen et al. |
| 6,724,798 | B2 | 4/2004 | Liu et al. |
| 6,845,034 | B2 | 1/2005 | Bhattacharyya |
| 6,879,014 | B2 | 4/2005 | Wagner et al. |
| 7,115,971 | B2 | 10/2006 | Stumbo |
| 7,161,220 | B2 | 1/2007 | Cohen |
| 7,251,386 | B1 | 7/2007 | Dickinson et al. |
| 7,264,982 | B2 | 9/2007 | Cheng et al. |
| 7,340,709 | B1 | 3/2008 | Masini et al. |
| 7,397,101 | B1 | 7/2008 | Masini et al. |
| 7,495,306 | B2 | 2/2009 | Langguth et al. |
| 7,510,904 | B2 | 3/2009 | Chu et al. |
| 7,601,597 | B2 | 10/2009 | Takei |
| 7,605,406 | B2 | 10/2009 | Iguchi |
| 7,674,563 | B2 | 3/2010 | Suda |
| 7,772,615 | B2 | 8/2010 | Ledentsov et al. |
| 7,795,064 | B2 | 9/2010 | Pan et al. |
| 7,893,348 | B2 | 2/2011 | Korevaar |
| 7,898,052 | B2 | 3/2011 | Prantl et al. |
| 7,972,934 | B2 | 7/2011 | Wilson et al. |
| 7,977,637 | B1 | 7/2011 | Yap et al. |
| 8,022,390 | B1 * | 9/2011 | Kim .................... H01L 27/1446 257/21 |
| 8,114,695 | B2 | 2/2012 | Masuoka et al. |
| 8,129,710 | B2 | 3/2012 | Cho et al. |
| 8,319,241 | B2 | 11/2012 | Na et al. |
| 8,357,960 | B1 | 1/2013 | Dutta |
| 8,436,370 | B2 | 5/2013 | Park et al. |
| 8,680,591 | B2 | 3/2014 | Haddad et al. |
| 8,728,847 | B2 | 5/2014 | Maruyama et al. |
| 9,045,418 | B2 | 6/2015 | Jordan et al. |
| 9,299,865 | B2 | 3/2016 | Marty et al. |
| 9,360,554 | B2 | 6/2016 | Retterath et al. |
| 9,453,190 | B1 | 9/2016 | Byron et al. |
| 9,496,435 | B2 | 11/2016 | Wang et al. |
| 9,525,084 | B2 | 12/2016 | Wang et al. |
| 9,530,905 | B2 | 12/2016 | Wang et al. |
| 9,793,439 | B2 | 10/2017 | Lunev et al. |
| 9,818,893 | B2 | 11/2017 | Wang et al. |
| 9,871,147 | B2 | 1/2018 | Kotani et al. |
| 10,411,053 | B2 | 9/2019 | Yokogawa |
| 10,600,930 | B2 | 3/2020 | Suzuki et al. |
| 2002/0000244 | A1 | 1/2002 | Zaidi |
| 2002/0097962 | A1 | 7/2002 | Yoshimura et al. |
| 2003/0059820 | A1 | 3/2003 | Vo-Dinh |
| 2003/0122210 | A1 | 7/2003 | Cohen |
| 2004/0222357 | A1 | 11/2004 | King et al. |
| 2005/0092925 | A1 | 5/2005 | Zentai et al. |
| 2005/0184354 | A1 | 8/2005 | Chu et al. |
| 2006/0186501 | A1 | 8/2006 | Ishimura |
| 2006/0267054 | A1 | 11/2006 | Martin et al. |
| 2007/0092192 | A1 | 4/2007 | Achouche et al. |
| 2007/0170536 | A1 | 7/2007 | Hsu et al. |
| 2007/0190434 | A1 | 8/2007 | Suda |
| 2007/0215968 | A1 | 9/2007 | Wilson |
| 2007/0277869 | A1 | 12/2007 | Shan |
| 2008/0102582 | A1 | 1/2008 | Takei |
| 2008/0047604 | A1 | 2/2008 | Korevaar et al. |
| 2008/0079022 | A1 | 4/2008 | Yamamoto et al. |
| 2008/0080854 | A1 | 4/2008 | Tian et al. |
| 2008/0218740 | A1 | 9/2008 | Williams et al. |
| 2008/0229941 | A1 | 9/2008 | Heidari |
| 2008/0248608 | A1 | 10/2008 | Wilson et al. |
| 2008/0265449 | A1 | 10/2008 | Meinders et al. |
| 2009/0008735 | A1 | 1/2009 | Ogino et al. |
| 2009/0188557 | A1 | 7/2009 | Wang et al. |
| 2009/0225804 | A1 | 9/2009 | Sasahata et al. |
| 2009/0230498 | A1 | 9/2009 | Iwai et al. |
| 2009/0267049 | A1 | 10/2009 | Cho et al. |
| 2009/0321868 | A1 | 12/2009 | Nakaji |
| 2010/0029067 | A1 | 2/2010 | Vijh |
| 2010/0059789 | A1 | 3/2010 | Choi |
| 2010/0059822 | A1 | 3/2010 | Pinguet et al. |
| 2010/0126548 | A1 | 5/2010 | Jang et al. |
| 2010/0148318 | A1 | 6/2010 | Wang et al. |
| 2010/0193768 | A1 | 8/2010 | Habib |
| 2010/0197068 | A1 | 8/2010 | Poon |
| 2010/0207223 | A1 | 8/2010 | Feng et al. |
| 2010/0221866 | A1 | 9/2010 | Graham |
| 2010/0288341 | A1 | 11/2010 | Kim et al. |
| 2010/0308428 | A1 | 12/2010 | Okamoto et al. |
| 2010/0313941 | A1 | 12/2010 | Huang |
| 2011/0000545 | A1 | 1/2011 | Nishi et al. |
| 2011/0156195 | A1 | 6/2011 | Tivarus et al. |
| 2011/0255046 | A1 | 10/2011 | Kurokawa et al. |
| 2012/0012741 | A1 | 1/2012 | Vasylyev |
| 2012/0141122 | A1 | 6/2012 | Carusone et al. |
| 2012/0153127 | A1 | 6/2012 | Hirigoyen et al. |
| 2012/0153260 | A1 | 6/2012 | Kim et al. |
| 2012/0193676 | A1 | 8/2012 | Bobde et al. |
| 2012/0279553 | A1 | 11/2012 | Shigeta et al. |
| 2012/0292676 | A1 | 11/2012 | Pan |
| 2012/0313204 | A1 | 12/2012 | Haddad et al. |
| 2013/0009265 | A1 | 1/2013 | Dautet et al. |
| 2013/0084044 | A1 | 4/2013 | Ertel et al. |
| 2013/0114629 | A1 | 5/2013 | Firth et al. |
| 2013/0167915 | A1 * | 7/2013 | Moslehi .................. H01L 31/18 136/255 |
| 2013/0207222 | A1 | 8/2013 | Qu et al. |
| 2013/0230272 | A1 | 9/2013 | Raj et al. |
| 2014/0001528 | A1 | 1/2014 | Pfirsch et al. |
| 2014/0167107 | A1 | 6/2014 | Yoneda et al. |
| 2014/0225063 | A1 | 8/2014 | Klem et al. |
| 2014/0263975 | A1 | 9/2014 | Nagano et al. |
| 2015/0041965 | A1 | 2/2015 | Schulze et al. |
| 2015/0054997 | A1 | 2/2015 | Hynecek |
| 2015/0108327 | A1 | 4/2015 | Huang et al. |
| 2015/0340538 | A1 | 11/2015 | Novack et al. |
| 2016/0225631 | A1 | 8/2016 | Jun et al. |
| 2016/0240718 | A1 | 8/2016 | Giziewicz |
| 2016/0254407 | A1 | 9/2016 | Wang et al. |
| 2017/0141243 | A1 | 5/2017 | Kotani et al. |
| 2017/0263798 | A1 | 9/2017 | Suzuki et al. |
| 2017/0338367 | A1 | 11/2017 | Novack et al. |
| 2018/0012918 | A1 | 1/2018 | Na et al. |
| 2018/0102442 | A1 | 4/2018 | Wang et al. |
| 2018/0145098 | A1 | 5/2018 | Yamashita |
| 2019/0166317 | A1 | 5/2019 | Tanaka et al. |
| 2020/0006407 | A1 | 1/2020 | Yokogawa |
| 2020/0075656 | A1 | 3/2020 | Lee et al. |
| 2020/0083389 | A1 | 3/2020 | Wu et al. |
| 2020/0083390 | A1 | 3/2020 | Wu et al. |
| 2020/0266231 | A1 | 8/2020 | Cheng et al. |
| 2020/0266232 | A1 | 8/2020 | Cheng et al. |

FOREIGN PATENT DOCUMENTS

| | | |
|---|---|---|
| JP | 2012-502466 | 1/2012 |
| WO | WO2012034078 | 3/2012 |
| WO | WO2012149441 | 11/2012 |
| WO | WO2013180690 | 12/2013 |
| WO | WO2014190189 | 11/2014 |

(56) References Cited

FOREIGN PATENT DOCUMENTS

| | | |
|---|---|---|
| WO | WO2016081476 | 5/2016 |
| WO | WO2017112747 | 6/2017 |

OTHER PUBLICATIONS

Molly Piels et al., 40 GHz Si/Ge uni-traveling carrier waveguide photodiode, Journal of Lightwave Technology, 2013, pp. 1-7.
Cristiano Niclass et al., A 0.18- m CMOS SoC for a 100-m-Range 10-Frame/s 200 96-Pixel Time-of-Flight Depth Sensor, IEEE Journal of Solid-State Circuits, vol. 49, No. 1, Jan. 2014, pp. 315-330.
Cristiano Niclass et al., A 0.18μm CMOS Single-Photon Sensor for Coaxial Laser Rangefinders, IEEE Asian Solid-State Circuits Conference Nov. 8-10, 2010 / Beijing, China.
Cristiano Niclass et al., A 100-m Range 10-Frame/s 340 96-Pixel Time-of-Flight Depth Sensor in 0.18- m CMOS, IEEE Journal of Solid-State Circuits, vol. 48, No. 2, Feb. 2013, pp. 559-572.
Sanggwon Lee et al., A Back-Illuminated Time-of-Flight Image Sensor with SOI-Based Fully Depleted Detector Technology for LiDAR Application, Nov. 22, 2018, Proceedings 2018, 2, 798; doi:10.3390/proceedings2130798, pp. 1-4.
Z. Chen, R. Fan, X. Li, Z. Dong, Z. Zhou, G. Ye, D. Chen, Accuracy improvement of imaging lidar based on time-correlated single-photon counting using three laser beams, Optics Communications (2018), https://doi.org/10.1016/j.optcom.2018.08.017.
Ulrich Hofmann, MEMS mirror for low cost laser scanners, <URL: http://www. minfaros.eu>.
Frederic Laforce, Low noise optical receiver using Si APD, Proc. SPIE vol. 7212, 721210 (Feb. 6, 2009).
Hamamatsu Photonics K.K., Solid State Division, Technical Information SD-28 Characteristics and Use of Si APD (Avalanche Photodiode), May 2004.
Federica Villa et al., CMOS Imager With 1024 SPADs and TDCs for Single-Photon Timing, IEEE Journal of Selected Topics in Quantum Electronics, vol. 20, No. 6, Nov./Dec. 2014.
Chao Zhang et al., A CMOS SPAD Imager with Collision Detection and 128 Dynamically Reallocating TDCs for Single-Photon Counting and 3D Time-of-Flight Imaging, Sensors 2018, 18, 4016; doi:10.3390/s18114016.
Cristiano Niclass et al., Design and characterization of a 256×64-pixel single-photon imager in CMOS for a MEMSbased laser scanning time-of-flight sensor, May 2012 / vol. 20, No. 11 / Optics Express 11863-11881.
I. Wĕgrzecka et al,, Design and properties of silicon avalanche photodiodes, Opto-Electronics Review 12 (1), 95-104 (2004).
Hallman et al., Detection jitter of pulsed time-of-flight lidar with dual pulse triggering, Review of Scientific Instruments 85, 036105 (2014); doi: 10.1063/1.4868590.
Takashi Baba et al., Development of an InGaAs SPAD 2D array for flash LIDAR, Quantum Sensing and Nano Electronics and Photonics XV, edited by Manijeh Razeghi, Gail J. Brown, Jay S. Lewis, Giuseppe Leo, Proc. of SPIE vol. 10540, 105400L • © 2018 SPIE.
M. Saiful Islam et al., Distributed Balanced Photodetectors for Broad-Band Noise Suppression, IEEE Transactions on Microwave Theory and Techniques, vol. 47, No. 7, Jul. 1999.
Jean Benoit Heroux et al., Energy-Efficient 1060-nm Optical Link Operating up to 28 Gb/s, Journal of Lightwave Technology, vol. 33, No. 4, Feb. 15, 2015, pp. 733-740.
Se-Chul Park et al., A First Implementation of an Automated Reel-to-Reel Fluidic Self-Assembly Machine, https://doi.org/10.1002/adma.201401573, Jun. 27, 2014.
Jaehoon Chung et al., Fluidic Heterogeneous Microsystems Assembly and Packaging, Journal of Microelectromechanical Systems—Sep. 2006, p. 864-870.
Huei Pei Kuo et al., Free-space optical links for board-to-board interconnects, Appl Phys A (2009) 95: 955-965, DOI 10.1007/s00339-009-5144-z, Mar. 5, 2009.
Ghada Dushaq et al., Metal-germanium-metal photodetector grown on silicon using low temperature RF-PECVD, vol. 25, No. 25 | Dec. 11, 2017 | Optics Express 32110-32119.
D. Renker, Geiger-mode avalanche photodiodes, history, properties and problems, Nuclear Instruments and Methods in Physics Research A 567 (2006) 48-56.
Steven J. Koester et al., Ge-on-SOI-Detector/Si-CMOS-Amplifier Receivers for High-Performance Optical-Communication Applications, Journal of Lightwave Technology, vol. 25, No. 1, Jan. 2007.
Wissem Sfar Zaoui, Origin of the Gain-Bandwidth-Product Enhancement in Separate-Absorption-Charge-Multiplication Ge/Si Avalanche Photodiodes, 2009 OSA/OFC/NFOEC 2009.
Fuad E. Doany, High Density Optical Interconnects for High Performance Computing, OFC 2014 © OSA 2014.
Sungeun Jo et al., High resolution three-dimensional flash LIDAR system using a polarization modulating Pockels cell and a micro-polarizer CCD camera, vol. 24, No. 26 | Dec. 26, 2016 | Optics Express A1580-A1585.
High-Speed Germanium-on-SOI Lateral PIN Photodiodes, IEEE Photonics Technology Letters, vol. 16, No. 11, Nov. 2004, pp. 2547-2549.
Joris Van Kerrebrouck et al., High-Speed PAM4-Based Optical SDM Interconnects With Directly Modulated Long-Wavelength VCSEL, DOI 10.1109/JLT.2018.2875538, Journal of Lightwave Technology 2018.
Y. Wang et al., InP-based Balanced Photodiodes Heterogeneously Integrated on SOI Nano-Waveguides, 978-1-5090-1602-0/16/$31.00 © 2016 IEEE, pp. 237-240.
Yokogawa et al., IR sensitivity enhancement of CMOS Image Sensor with diffractive light trapping pixels, Scientific Reports | 7: 3832 | DOI:10.1038/s41598-017-04200-y, Jun. 19, 2017.
E. Simpanen et al., Long-Reach 1060 nm SM VCSEL—SMF Optical Interconnects, Optical Fiber Technology, vol. 44, p. 36-42. Aug. 2018.
Jean Benoit Heroux et al., Low power CMOS-driven 1060 nm multimode optical link, OFC 2014 © OSA 2014.
Yimin Kang et al., Monolithic germanium/silicon avalanche photodiodes with 340 GHz gain—bandwidth product, nature photonics, Published Online: Dec. 7, 2008 | DOI: 10.1038/NPHOTON.2008.247, pp. 59-63.
D. Knoll et al., Monolithically Integrated 25Gbit/sec Receiver for 1.55μm in Photonic BiCMOS Technology, 978-1-55752-993-0/14/$31.00 © 2014 Optical Society of America.
Claudio Piemonte et al., Overview on the main parameters and technology of modem Silicon Photomultipliers, Nuclear Inst. and Methods in Physics Research, A 926 (2019) 2-15.
Photodetectors for LiDAR, Hamamatsu, May 2017.
S. Vasile et al., Photon Detection with High Gain Avalanche Photodiode Arrays, IEEE Transactions on Nuclear Science, vol. 45, No. 3, Jun. 1998.
Jin-Sung Youn et al., A 12.5-Gb/s SiGe BiCMOS Optical Receiver with a Monolithically Integrated 850-nm Avalanche Photodetector, OFC/NFOEC Technical Digest © 2012 OSA.
Koichi Liyama, Silicon Lateral Avalanche Photodiodes Fabricated by Standard 0.18 urn CMOS Process, ECOC 2009, Sep. 20-24, 2009, Vienna, Austria.
X. Li, et al., Silicon photodiodes with high photoconductive gain at room temperature, Feb. 27, 2012 / vol. 20, No. 6 / Optics Express 5518.
Seigo Ito et al., Small Imaging Depth LIDAR and DCNN-Based Localization for Automated Guided Vehicle, Sensors 2018, 18, 177; doi:10.3390/s18010177.
Maik Beer et al., SPAD-based flash LiDAR sensor with high ambient light rejection for automotive applications, Proceedings of SPIE, SPIEDigitalLibrary.org/conference-proceedings-of-spie, Event: SPIE Opto, 2018, San Francisco, California, United States.
Fuad E. Doany, Terabit/Sec VCSEL-Based 48-Channel Optical Module Based on Holey CMOS Transceiver IC, Journal of Lightwave Technology, vol. 31, No. 4, Feb. 15, 2013.
Patrick Runge, Waveguide Integrated Balanced Photodetectors for Coherent Receivers, IEEE Journal of Selected Topics in Quantum Electronics, vol. 24, No. 2, Mar./Apr. 2018.

(56) References Cited

OTHER PUBLICATIONS

Shiyang Zhu et al., Waveguided Ge/Si Avalanche Photodiode With Separate Vertical SEG-Ge Absorption, Lateral Si Charge, and Multiplication Configuration, IEEE Electron Device Letters, vol. 30, No. 9, Sep. 2009.
SPIEDigitalLibrary.org: "Electrical and optical 3D modelling of light-trapping single-photon avalanche diode" by Tianzhe Zheng, Kai Zang, Matthew Morea, Muyu Xue, Ching-Ying Lu, et al. Downloaded From: https://www.spiedigitallibrary.org/conference-proceedings-of-spie on Mar. 28, 2019.
International Search Report for PCT Application No. PCT/US20/51733, dated Dec. 17, 2020.
Y. G. Wang, Y. X. Kang, W. J. Zhao, S. Yan, P. J. Zhai, and X. W. Tang, "Studies on surface damage induced by ion bombardment," Journal of Applied Physics, vol. 83, pp. 1341-1344, Feb. 1, 1998.
Liu AY et al., High performance continous wave 1.3 μm quantum dot lasers on silicon, Appl. Phys. Letters, 2014, 104, 041104.
European Patent Office Supplementary Search Report issued in European Application No. 14801543 dated Dec. 6, 2016.
Joshi et al., "25 Gbps 850 nm photodiode for emerging 100 Gb ethernet applications" SPIE Proceedings vol. 8054, May 4, 2011, (May 4, 2011), Abstract http://proceedings.spiedigitallibrary.org/proceeding.aspx?articleid= 1351039.
"Dosunmu et al., "Germanium on double-SOI photodetectors for 1550 nm operation." Conference: Lasers and Electro-Optics Society, Nov. 2003, (Nov. 2003). https://www.researchgate.neVpublication/224745299".
Fan et al. "Differences in etching characteristics of TMAH and KOH on preparing inverted pyramids for silicon solar cells", Applied Surface Science, 2013, 264, 761-766.
Wu et al. "High aspect ration silicon etch: A review" J. Appl. Phys. 2010, 108, 051101.
Singh et al. "Silicon on Insulator technology review", International Journal of Engineering Sciences & Emerging Technologies, 2011, 1, 1, 1-16.
Montalenti et al. "Fully coherent growth of Ge on free-standing Si(001) nanomesas", Physical Review B 89, 014101 (2014).
Collot et al. "Dry-etch monitoring of III-V heterostructures using laser reflectometry and optical emission spectroscopy", J. Vac. Sci. Technol. B9 (5) Sep./Oct. 1991.
Ingham "Future of Short-Reach Optical Interconnects based on MMF Technologies" OFC 2017.
Sun et al. "SWDM PAM4 Transmission Over Next Generation Wide-Band Multimode Optical Fiber" Journal of Lightwave Technology, vol. 35, No. 4, Feb. 15, 2017.
Tekin "Review of packaging of Optoelectronic, Photonic and MEMS Components" IEEE Journal of Selected Topics in Quantum Electronics, vol. 17, No. 3, 2011.
Orcutt et al. "Monolithic Silicon Photonics at 25 Gb/s" OFC 2016 © OSA (2016).
Eshaghi et al., "Optical and electrical properties of indium tin oxide (ITO) nanostructured thin films deposited on polycarbonate substrates "thickness effect"", Optik 125 (2014) 1478-1481.
Uddin et al. "Highly efficient color filter array using resonant Si3N4 gratings" Optics Express May 20, 2013, vol. 21, No. 10, 12497.
Jacob et al., "Normally incident resonant grating reflection filters for efficient narrow-band spectral filtering of finite beams" J. Opt. Soc. Am. A, vol. 18, No. 9, Sep. 2001.
Zhou et al., "Surface-normal emission of a high-Q resonator using a subwavelength high-contrast grating" Optics Express, Oct. 27, 2008,vol. 16, No. 22, 17282.
Poulton et al., "MIT and DARPA Pack Lidar Sensor Onto Single Chip" http://spectrum.ieee.org/tech-talk/semiconductors/optoelectronics/mit-lidar-on-a-chip, IEEE Spectrum, 2016.
Rasshofer et al., "Influences of weather phenomena on automotive laser radar systems" Adv. Radio Sci., 9, 49-60, 2011.
Youn et al. "10-Gb/s 850-nm CMOS OEIC Receiver with a Silicon Avalanche Photodetector" IEEE Journal of Quantum Electronics, vol. 48, No. 2, Feb. 2012.
Swoboda et al., "11Gb/s Monolithically Integrated Silicon Optical Receiver for 850nm Wavelength" 006 IEEE International Solid-State Circuits Conference.
Tavernier et al. "Power Efficient 4.5Gbit/s Optical Receiver in 130nm CMOS with Integrated Photodiode" 34th European Solid-State Circuits Conference, 2008.
CMOS Manufacturing Process, EE141 UCBerkeley, http://bwrcs.eecs.berkeley.edu/Classes/icdesign/ee141_s02/Lectures/Lecture5-Manufacturing.pdf.
Williams "Ion Implantation of Semiconductors, Materials Science and Engineering" A253 (1998) 8-15.
Gibbons "Ion Implantation in Semiconductors-Part I Range Distribution Theory and Experiments" Proceedings of the IEEE, vol. 56. No. 3, 1968.
Assefa et al. "Monolithically Integrated Silicon Nanophotonics Receiver in 90nm CMOS Technology Node" OFC/NFOEC Technical Digest © 2013 OSA.
Taubenblatt "Optical Interconnects for High-Performance Computing" Journal of Lightwave Technology, vol. 30, No. 4, Feb. 15, 2012.
Chen et al. "A 1.8-V 10-Gb/s Fully Integrated CMOS Optical Receiver Analog Front-End" IEEE Journal of Solid-State Circuits, vol. 40, No. 6, Jun. 2005.
Kuchta et al., "A 55Gb/s Directly Modulated 850nm VCSEL-Based Optical Link" IEEE Photonics Conference 2012 (IPC 2012) Post Deadline Paper PD 1.5.
Lengyel et al. "Sensitivity Improvements in an 850-nm VCSEL-Based Link Using a Two-Tap Pre-Emphasis Electronic Filter" Journal of Lightwave Technology, vol. 35, No. 9, May 1, 2017.
Ghosh et al. "On Integrated CMOS-MEMS System-on-Chip" IEEE-NEWCAS Conference, 2005.
Kalogerakis et al. "A Quad 25Gb/s 270mW TIA in 0.13μm BiCMOS with <0.15dB Crosstalk Penalty" ISSCC 2013, Session 7, Optical Transceivers and Silicon Photonics, 7.1.
Knochenhauer et al. "40 Gbit/s transimpedance amplifier with high linearity range in 0.13 mm SiGe BiCMOS" Electronics Letters May 12, 2011 vol. 47 No. 10.
Niishihara et al. "10.3 Gbit/s burst-mode PIN-TIA module with high sensitivity, wide dynamic range and quick response" Electronics Letters Jan. 31, 2008 vol. 44 No. 3.
Racanelli et al. "SiGe BiCMOS Technology for Communication Products" IEEE 2003 Custom Integrated Circuits Conference.
General Properties of Silicon, http://www.pveducation.org/pvcdrom/materials/general-properties-of-silicon.
Wegrzecka et al. "Design and properties of silicon avalanche photodiodes" Opto-Electronics Review 12(1), 95-104 (2004).
Xie et al. "Post-CMOS Processing for High-Aspect-Ratio Integrated Silicon Microstructures" Journal of Microelectromechanical Systems, vol. 11, No. 2, Apr. 2002.
Huang et al. "A 10-Gb/s OEIC with Meshed Spatially-Modulated PhotoDetectorin 0.18- umCMOSTechnology" IEEE Journal of Solid-State Circuits, vol. 46, No. 5, May 2011.
Tavernier et al. "High-Speed Optical Receivers With Integrated Photodiode in 130 nm CMOS" IEEE Journal of Solid-State Circuits, vol. 44, No. 10, Oct. 2009.
Kao et al. "A 5-Gbit/s CMOS Optical Receiver With Integrated Spatially Modulated Light Detector and Equalization" IEEE Transactions on Circuits and Systems—I: Regular Papers.
Hartman et al. "A Monolithic Silicon Photodetector/Amplifier IC for Fiber and Integrated Optics Application" Journal of Lightwave Technology, vol. LT-3, No. 4, Aug. 1985.
Radovanovic et al. "A 3-Gb/s Optical Detector in Standard CMOS for 850-nm Optical Communication" IEEE Journal of Solid-State Circuits, vol. 40, No. 8, Aug. 2005.
Csutak et al. "High-Speed Monolithically Integrated Silicon Photoreceivers Fabricated in 130-nm CMOS Technology" Journal of Lightwave Technology, vol. 20, No. 9, Sep. 2002.
Yin et al. "Integrated ARROW waveguides with hollow cores" Optics Express, Jun. 14, 2004, vol. 12, No. 12, 2710.
Michel et al. "High-performance Ge-on-Si photodetectors" Nature Photonics, Jul. 30, 2010, DOI: 10.1038/NIPHOTON.2010.157.
Analog Devices, Inc. data sheet ADN3010-11 11.3 Gbps Optical Receiver.

(56) References Cited

OTHER PUBLICATIONS

Yashiki et al. "5 mW/Gbps hybrid-integrated Si-photonics-based optical I/O cores and their 25-Gbps/ch error-free operation with over 300-m MMF" OFC 2015 © OSA 2015.
Pyo et al., "3D Printed Nanophotonic Waveguides" Adv. Optical Mater. 2016, 4, 1190-1195.
Zang K. et al. "Silicon single-photon avalanche diodes with nano-structured light trapping" Nat. Comm. 2017, 8, 628.
Gao, Y. et al. "Photon-trapping microstructures enable high-speed high-efficiency silicon photodiodes" Nature, 2017, 11, 301-308.
International Search Report dated Nov. 28 2014 in connection with PCT/US2014/39208.
International Search Report dated Dec. 23, 2011 in connection with PCT/US2011/051091.
International Search report dated Mar. 11, 2016 in connection with PCT/US2015/061120.
International Search report dated Mar. 9, 2017 in connection with PCT/US2016/67977.
Ren, R., et al., "Enhanced absorption in elliptical silicon nanowire arrays for solar energy harvesting", Optical Engineering, vol. 53(2), 027102, Feb. 2014, http://opticalengineering.spiedigitallibrary.org/article.aspx?articleid=1828860.
Dayal, G., et al, "Broadband infrared metamaterial absorber with visible transparency using ITO as ground plane", Optics Express 15104 Jun. 2014.
Donnelly, J. L., et al., "Mode-based analysis of silicon nanohole arrays for photovoltaic applications," vol. 22, No. 55, Optics Express, A1343, Aug. 25, 2014.
Gasca, L., "From O to L: The Future of Optical-Wavelength Bands," Broadband Properties, Jun. 2008, pp. 83-85. www.broadbandproperties.com.
"Finisar, "World's Largest Supplier of Optical Solutions for the Communications Industry." http://files.shareholder.com/downloads/FNSR/Ox0x382377/0b3893ea-fb06-417d-ac71-84f2f9084b0d/Finisar_Investor_Presentation.pdf,)".
Silvaco., "Investigation of the SiGe Waveguide Phototides Using FDTD Method for High Speed Optical Communication, " Simulation Standard, http://www.silvaco.com/tech_lib_TCAD/simulationstandard/2010/apr_may_jun/a1/a1.html).
Kolodzey, J., et al, "Optical and electronic properties of SiGeC alloys grown on Si substrates," Journal of Crystal Growth 157, 386-391, (1995).
Kraus, T.F., "Slow light in photonic crystal waveguides," Journal of Physics D: Applied Physics, 2007, vol. 40, pp. 2666-2670.
Liu, A., et al., "Quantum dot lasers for silicon photonics [Invited]," Photonics Research, vol. 3, No. 5, Oct. 2015.
"Liu, N., et al, "Infrared Perfect Absorber and Its Application as Plasmonic Sensor," Nano Lett. 10, 2342-2348, (2010)."
Kang, Y., "Monolithic Ge/Si Avalnache Photodiodes," 978-1-4244-4403, IEEE, (2009).
Liu, A.Y., et al., Quantum Dot Lasers on Silicon, aUCSB Materials Department, Santa Barbara, California, USA, bUCSB Department of Electrical and Computer Engineering, Santa Barbara, California, USA.
Logeeswaran et al. "A 14-ps full width at half maximum high-speed photoconductor fabricated with intersecting InP nanowires on an amorphous surface," Applied Physics A, vol. 91, 1-5., (2008).
Hu, L., et al. "Analysis of Optical Absorption in Silicon Nanowire Arrays for Photovoltaic Applications," Nano Lett. vol. 7, No. 11, 2007.
Meng, L., et al. "Polarization-sensitive perfect absorbers at near-infrared wavelengths," Optics Express, A111, Dec. 2012.
Molin, D. et al. "850-950nm WideBand OM4 Multimode Fiber for Next-Generation WDM Systems," OFC (2015).
Piels, et al., "40 GHz Si/Ge uni-traveling carrier waveguide phototiode", Journal of Lightwave Technology, 15908, (2014).
Fountaine, K., et al., "Near-unity broadband absorption designs for semiconducting nanowire arrays via localized radial mode excitation", vol. 22, No. Optics Express A930, May 5, 2014.
Feng, D., et al, "High-speed Ge photodetector monolithically integrated with large cross-section silicon-on-insulator waveguide," Applied Physics Letters 95, 261105 (2009).
Schaub, J.D., et al. "Resonant-Cavity-Enhanced High-Speed Si Photodiode Grown by Epitaxial Lateral Overgrowth," IIEE Photonics Technology Letters, vol. 11, No. 12, Dec. 1999.
Seyedi, M.A., et al., "Efficient Schottky-like junction GaAs nanowire photodetector with 9 GHz modulation bandwidth with large active area," Applied Physics Letters 105, 041105 (2014).
Piatek, S., "Physics and Operation of an MPPC," Tutorials, Hamanatsu Phototonics, Nov. 16, 2015; http://www.hamamatsu.com/us/en/community/optical_sensors/tutorials/physics_of_mppc/index.html?utm_source=googleplus&utm_medium=social&utm_campaign=hc-social.
Garnett, E., et al. "Light Trapping in Silicon Nanowire Solar Cells", Nano Letters 2010, 10, pp. 1082-1087.
Tanus et al.; "High-performance 1200-nm InGaAs and 1300- nm InGaAsN quantum-well lasers by metalorganic chemical vapor deposition," Selected Topics in Quantum Electronics, IEEE Journal of Selected Topics in Quantum Electronics, vol. 9, Issue: 5 (2003).
Kelzenberg, et al., Enhanced absorption and carrier collection in Si wire arrays for photovoltaic applications, Nature Materials, vol. 9, Mar. 2010, p. 239-244. http://authors.library.caltech.edu/17688/.
Lin, et al., "Optical absorption enhancement in silicon nanowire and nanohole arrays for photovoltaic applications," Proceeding of SPIE, vol. 772, 77721G-1, (2010).
Chang-Hasnain, C., et al., "High contrast gratings for integrated optoelectrionics" Advances in Optics and Photonics vol. 4, (2012), p. 379-440. http://www.eecs.berkeley.edu/Pubs/TechRpts/2014/EECS-2014-197.html.
Chu., H-J.,et al., "Wurtzite InP nanowire arrays grown by selective area MOCVD," Phys. Status Solidi vol. C 7, No. 10, (2010), p. 2494-2497.
Kang et al., "Epitaxially-grown Ge/Si avalanche photodiodes for 1.3μm light detection," Optics Express 9365, vol. 16, No. 13, Jun. 23, 2008.
E. D. Palik, Handbook of optical constants of solids. Orlando: Academic Press, 1985.
M. K. Emsley, O. Dosunmu, and M. S. Unlu, "High-speed resonant-cavity-enhanced silicon photodetectors on reflecting silicon-on-insulator substrates," IEEE Photonics Technology Letters, vol. 14, pp. 519-521, Apr. 2002.
E. Ozbay, M. S. Islam, B. Onat, M. Gokkavas, O. Aytur, G. Tuttle, et al., "Fabrication of high-speed resonant cavity enhanced Schottky photodiodes," IEEE Photonics Technology Letters, vol. 9, pp. 672-674, May 1997.
T. Knodl, H. K. H. Choy, J. L. Pan, R. King, R. Jager, G. Lullo et al., "RCE photodetectors based on VCSEL structures," IEE Photonics Technology Letters, vol. 11, pp. 1289-1291, Oct. 1999.
K. Kato, "Ultrawide-band/high-frequency photodetectors," IEEE Transactions on Microwave Theory and Techniques, vol. 47, pp. 1265-1281, Jul. 1999.
M. Amani, D. H. Lien, D. Kiriya, J. Xiao, A. Azcatl, J. Noh, et al., "Near-unity photoluminescence quantum yield in MoS2," Science, vol. 350, pp. 1065-1068, Nov. 27, 2015.
T. Mueller, F. N. A. Xia, and P. Avouris, "Graphene photodetectors for high-speed optical communications," Nature Photonics, vol. 4, pp. 297-301, May 2010.
L. Chen and M. Lipson "Ultra-low capacitance and high speed germanium photodetectors on silicon," Optics Express, vol. 17, pp. 7901-7906, May 11, 2009.
P. Kuang, S. Eyderman, M. L. Hsieh, A. Post, S. John, and S. Y. Lin "Achieving an Accurate Surface Profile of a Photonic Crystal for Near-Unity Solar Absorption in a Super Thin-Film Architecture," ACS Nano, vol. 10, pp. 6116-6124, Jun. 2016.
A. Mavrokefalos, S. E. Han, S. Yerci, M. S. Branham and G. Chen "Efficient Light Trapping in Inverted Nanopyramid Thin Crystalline Silicon Membranes for Solar Cell Applications," Nano Letters, vol. 12, pp. 2792-2796, Jun. 2012.
K. X. Z. Wang, Z. F. Yu, V. Liu, A. Raman, Y. Cui, and S. H. Fan, "Light trapping in photonic crystals," Energy & Environmental Science, vol. 7, pp. 2725-2738, Aug. 2014.

(56) References Cited

OTHER PUBLICATIONS

E. Garnett and P. D. Yang, "Light Trapping in Silicon Nanowire Solar Cells," Nano Letters, vol. 10, pp. 1082-1087, Mar. 2010.
S. E. Han and G. Chen "Optical Absorption Enhancement in Silicon Nanohole Arrays for Solar Photovoltaics," Nano Letters, vol. 10, pp. 1012-1015, Mar. 2010.
Y. Park, E. Drouard, O. El Daif, X. Letartre, P. Viktorovotich, A. Fave et al., "Absorption enhancement using photonic crystals for silicon thin film solar cells," Optics Express, vol. 17, pp. 14312-14321, Aug. 3, 2009.
C. Yeh and F. I. Shimabukuro "The essence of dielectric waveguides". New York ; London: Springer, 2008.
Berenschot et al. "Fabrication of 3D fractal structures using nanoscale anisotropic etching of single crystalline silicon" J. Micromech. Microeng. 2013, 23,055024 (10pp).
Sato "Basic 2 Anisotropic Wet-etching of Silicon: Characterization and Modeling of Changeable Anisotropy" http://gcoe.mech.nagoya-u.ac.jp/basic/pdf/basic-02.pdf.
Sato et al. "Anisotropic etching rates of single-crystal silicon for TMAH water solution as a function of crystallographic orientation" Sensors and Actuators, 73(1999) 131-137.
Bassous "Fabrication of Novel Three Dimensinal Microstructures by the Anisotropic Etching of (100) and (110) Silicon" IEEE Transactions of Electron Devices, ED-25, 10, 1978.
Zubel "Anisotropic etching of silicon in solutions containing tensioactive compounds" Proc. of SPIE vol. 10175 101750L-1.
Hisiao et al. "Compact and passive-alignment 4-channel × 2.5-Gbps optical interconnect modules based on silicon optical benches with 45° micro-reflectors" Optics Express, Dec. 21, 2009, vol. 17, No. 26, 24250.
Rola "Anisotropic etching of silicon in KOH + Triton X-100 for 45° micromirror applications" Microsyst Technol (2017) 23:1463-1473.
Rola et al "Triton Surfactant as an Additive to KOH Silicon Etchant" Journal of Microelectromechanical Systems, vol. 22, No. 6, Dec. 2013.
Izumi et al. "C.M.O.S. Devices Fabricated on Buried SiO2 Layers Formed by Oxygen Implantation Into Silicon" Electronics Letters, Aug. 31, 1978 vol. 14 No. 1.
Hauthan et al. "Improvement in buried silicon nitride silicon-on-insulator structures by fluorine-ion implantation" J. Appl. Phys., vol. 83, No. 7, Apr. 1, 1998.
Judy "Microelectromechanical systems (MEMS): fabrication, design and applications" Smart Mater. Struct. 10 (2001) 1115-1134.
Smith et al. "Embedded Micromechanical Devices for the Monolithic Integration of MEMS with CMOS" Proc. 1995 IEDM, pp. 609-612.
Gao et al. "High Speed Surface Illuminated Si Photodiode Using Microstructured Holes for Absorption Enhancements at 900-1000 nm Wavelength" DOI: 10.1021/acsphotonics.7b00486.
Fiori et al. "Electronics based on two-dimensional materials" Published Online: Oct. 6, 2014 | DOI: 10.1038/NNAN0.2014.207.
Molle et al. "Buckled two-dimensional Xene sheets" Published Online: Jan. 16, 2017 | DOI: 10.1038/NMAT4802.
Mak et al. "Photonics and optoelectronics of 2D semiconductor transition metal dichalcogenides" Published Online: Mar. 31, 2016 | DOI: 10.1038/NPHOTON.2015.282.
Takai et al. "Single-Photon Avalanche Diode with Enhanced NIR-Sensitivity for Automotive LIDAR Systems" Sensors 2016, 16, 459; doi:10.3390/s16040459.
Carey K.W., et al. "Characterization of InP/GaInAs/InP heterostructures grown by organometallic vapor phase epitaxy for high-speed pin photodiode" Journal of Crystal Growth 1986.
Chen et al. "Optimization of InGaAs/InAlAs Avalanche Photodiodes" Nanoscale Research Letters (2017) 12:33.
Miura et al. "Modeling and Fabrication of Hollow Optical Waveguide for Photonic Integrated Circuits" Jpn. J. Appl. Phys. vol. 41 (2002) pp. 4785-4789.
Germanium Electrical Properties: http://www.ioffe.ru/SVA/NSM/Semicond/Ge/electric.html.
Rylyakov et al. "A 40-Gb/s, 850-nm, VCSEL-Based Full Optical Link" 2012.
Kenneth et al. "A BiCMOS Process Utilizing Selective Epitaxy for Analog/Digital Applications", IEEE Transactions on Electron Devices. vol. 36. No. 7. Jul. 1989.
Litchinitser et al. "Antiresonant reflecting photonic crystal optical waveguides" Optics Letters 2002, vol. 27, No. 18, 1592.
Tatarczak et al. "Reach Extension and Capacity Enhancement of VCSEL-Based Transmission Over Single-Lane MMF Links" Journal of Lightwave Technology, vol. 35, No. 4, Feb. 15, 2017.
Paneva et al. "Nitrogen implanted etch-stop layers in silicon" Microelectronic Engineering 27 (1995) 509-512.
Wada et al. "Very high speed GaInAs metal-semiconductor-metal photodiode incorporating an AlInAs/GaInAs graded superlattice" Appl. Phys. Lett. 54, 16 (1989). American Institute of Physics.
Liu et al. "140-GHz metal-semiconductor-metal photodetectors on silicon-on-insulator substrate with a scaled active layer" Appl. Phys. Lett. 65, 887 (1994). American Institute of Physics.
Zang et al. "Application of dopant segregation to metal-germanium-metal photodetectors and its dark current suppression mechanism" Appl. Phys. Lett. 92, 051110 (2008). American Institute of Physics.
Ghanbarzadeh, et al. "Low Dark Current Amorphous SiliconMetal-Semiconductor-Metal Photodetector for Digital Imaging Applications" IEEE Electron Device Letters, vol. 35, No. 2, Feb. 2014. pp. 234-237.
Assefa, et al. "A 90nm CMOS Integrated Nano-Photonics Technology for 25Gbps WDM Optical Communications Applications" IEEE International Electron Devices Meeting (IEDM), postdeadline session 33.8, Dec. 10-12, 2012.
Sao et al. "High Speed Surface Illuminated Si Photodiode Using Microstructured Holes for Absorption Enhancements at 900-1000 nm Wavelength" ACS Photonics, pp. A-H, Jul. 18, 2017.
Anderson et al. "HPSM4 Technology & Relative Cost Analysis Update" IEEE P802.3bm TF, Phoenix, AZ, Jan. 21-24, 2013.
Xi et al. "Optical thin-film materials with low refractive index for broadband elimination of Fresnel reflection" Nature Photonics, vol. 1, Mar. 2007.
Assefa et al. "CMOS-integrated high-speed MSM germanium waveguide photodetector" Mar. 1, 2010 / vol. 18, No. 5 / Optics Express pp. 4986-4999.
Zheng et al. "Fluidic Heterogeneous Microsystems Assembly and Packaging" Journal of Microelectromechanical Systems vol. 15, No. 4, Aug. 2006, pp. 864-870.
Xue et al. "1 X 4 Ge-on-SOI PIN Photodetector Array forParallel Optical Interconnects" Journal of Lightwave Technology, vol. 27, No. 24, Dec. 15, 2009, pp. 5687-5689.
DiLello et al. "Characterization of dark current in Ge-on-Si photodiodes" Journal of Applied Physics 112, 054506 (2012).
Dong et al., "Suppression of dark current in germanium-tin on silicon p-i-n photodiode by a silicon surface passivation technique", Optical Society of America, Jul. 13, 2015 | vol. 23, No. 14 | DOI:10.1364/OE.23.018611 | Optics Express, pp. 18611-18619.
Koester et al., "Ge-on-SOI-Detector/Si-CMOS-Amplifier Receivers for High-Performance Optical-Communication Applications", Journal of Lightwave Technology, vol. 25, No. 1, Jan. 2007, pp. 46-57.
Pearson et al., "Germanium Photodetectors on Amorphous Substrates for Electronic-Photonic Integration", 2016 IEEE, pp. 20-21.
Michel et al., "High-performance Ge-on-Si photodetectors," Nature Photonics | vol. 4 | Aug. 2010, pp. 527-534.
Knoll et al., "Monolithically Integrated 25Gbit/sec Receiver for 1.55μm in Photonic BiCMOS Technology", Optical Society of America 2014.
Xiao et al., "A 2 Gb/s optical receiver with monolithically integrated MSM photodetector in standard CMOS process", Chinese Science Bulletin, Jul. 2011, vol. 56, No. 21, pp. 2281-2285.
Nishimura et al., "A Significant Shift of Schottky Barrier Heights at Strongly Pinned Metal/Germanium Interface by Inserting an Ultra-Thin Insulating Film", The Japan Society of Applied Physics, Applied Physics Express 1 (2008), pp. 051406-1-051406-3.
Urino et al., "Demonstration of 12.5-Gbps optical interconnects integrated with lasers, optical splitters, optical modulators and photodetectors on a single silicon substrate", Optical Society of America, Dec. 10, 2012 / vol. 20, No. 26 / Optics Express B256.

(56) References Cited

OTHER PUBLICATIONS

Miura et al., "Differential receivers with highly -uniform MSM Germanium photodetectors capped by SiGe layer", Optical Society of America, Oct. 7, 2013 | vol. 21, No. 20 | DOI:10.1364/OE.21. 023295 | Optics Express 23295.
Kang et al. "Suppression of dark current in GeOx-passivated germanium metal-semiconductor-metal photodetector by plasma post-oxidation", Optical Society of America, Jun. 29, 2015 | vol. 23, No. 13 | Doi:10.1364/oE.23.016967 | optics Express 16967.
Dushaq et al. "Metal-germanium-metal photodetector grown on silicon using low temperature RF-PECVD", vol. 25, no. 25 | Dec. 11, 2017 | Optics Express, pp. 32110-32119.
Zang et al. "Asymmetrically contacted germanium photodiode using a metal—interlayer—semiconductor—metal structure for extremely large dark current suppression", Optical Society of America, vol. 41, No. 16 | Aug. 15 2016 / optics Letters, pp. 3686-.
Frey et al. "Enhancing Near-Infrared Photodetection Efficiency in SPAD With Silicon Surface Nanostructuration" Journal of the Electron Devices Society, Published Feb. 28, 2018.
zang et al., "Silicon single-photon avalanche diodes with nanostructured light trapping" Nature Communications 8: 628 (Sep. 20, 2017).
Liu et al. "Tensile strained Ge photodetectors on Si platform for C and L band telecommunications", Appl. Phys. Lett. 87 (2005). American Institute of Physics. pp. 011110-1-011110-3.
chen et al. "Ultra-low capacitance and high speed germanium photodetectors on silicon", Optical Society of America, May 11, 2009 / vol. 17, No. 10 / Optics Express pp. 7901-7906.
Houng et al., "Characterization of the Nanoporous Template Using Anodic Alumina Method", Journal of Nanomaterials, vol. 2014, Article 10 130716, pp. 1-7.
Ackert, "10 Gbps silicon waveguide-integrated infrared avalanche photodiode." Optics 3 Express, Aug. 12, 2013, (Aug. 12, 2013), Abstract, pp. 19535 https:/lwww.osapublishing .org/DirectPDFAccess/5DB4DFDB-E034-29D4-E6AEE5BDEF4D8089 2601821 Je-21-17 -19530 .pdf?da= 1 &id=260 182&seq=0&mobile=no.
Jul. 16, 2018 European Search Report issued by the European Patent Office in connection with European Patent Application No. 15861593. 0.
Jan. 8, 2019 official action issued by the Japanese Patent Office in connection with Japanese Patent Application No. 2016-515097.
Jan. 15, 2019 International Search Report of the International Searching Authority in connection with PCT/US2018/057963.
Feb. 12, 2019 International Search Report of the International Searching Authority in connection with PCT/US2018/043289.
Yokogawa, s., et al. IR sensitivity enhancement of CMOS Image Sensor with diffractive light trapping pixels, Scientific Reports/ 7:3832/DOI:10.1038/s41598-017-04200-y, Jun. 19, 2017.
E. Ponizovskaya Devine et al., Single Microhole per Pixel in CMOS Image Sensors with Enhanced Optical Sensitivity in Near-Infrared, IEEE Sensors Journal, 2021, pp. 1-7.
Chang-Fu Han et al., Deep Trench Isolation and Inverted Pyramid Array Structures Used to Enhance Optical Eciency of Photodiode in CMOS Image Sensor via Simulations, Department of Mechanical Engineering, National Sheng Kung University, Tainan 701, Taiwan, May 28, 2020, pp. 1-14.
Jonghoon Park et al., Pixel Technology for Improving IR Quantum Efficiency of Backside-illuminated CMOS mage Sensor, 1 System LSI Division, Samsung Electronics Co., Ltd, 2Foundry Division, Samsung Electronics Co., Ltd. Yongin-city, Gyeonggi-do, Korea, 4 pages.
Sozo Yokogawa, Nanophotonics Contributions to State-of-the-art CMOS Image Sensors, Sony Semiconductor Solutions Corporation, Kanagawa, Japan, 2019, 4 pages.
Sozo Yokogawa et al., IR Sensitivity Enhancement of CMOS Image Sensor with Diffractive Light Trapping Pixels, Scientific Reports, Sony Semiconductor Solutions Corporation, Atsugi Tec., 4-14-1 Asahi-cho, Atsugi, Kanagawa, 243-0014, Japan, Jun. 19, 2017, 9 page.

* cited by examiner

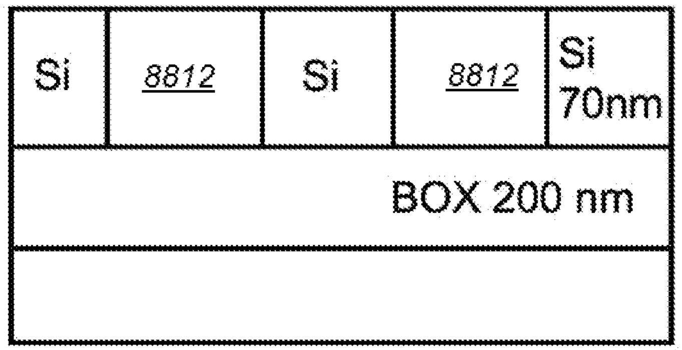
FIG. 88A
FIG. 89A
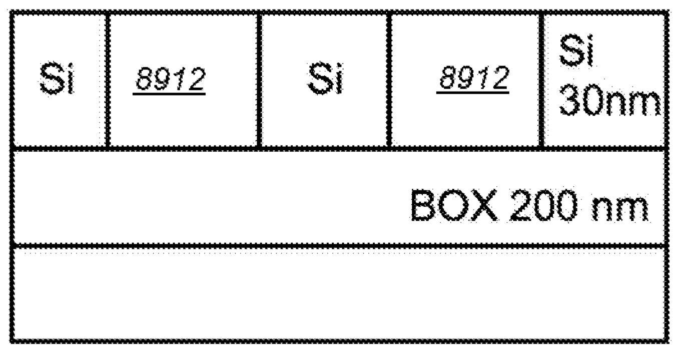
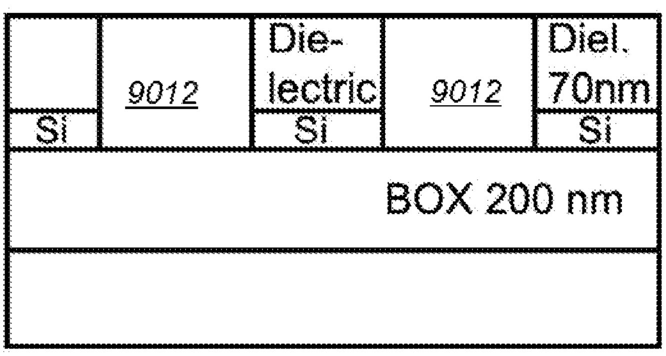
FIG. 90A
FIG. 91A
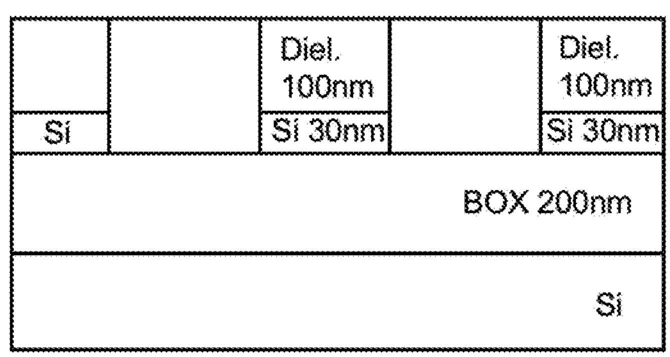

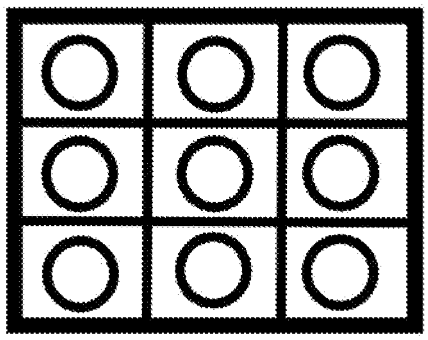
FIG. 104A
FIG. 104B
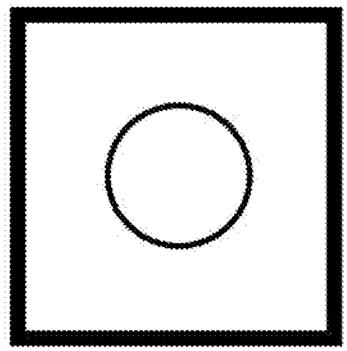
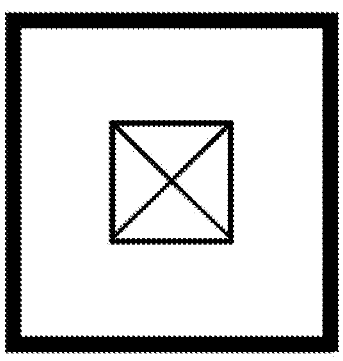
FIG. 104C
FIG. 104D
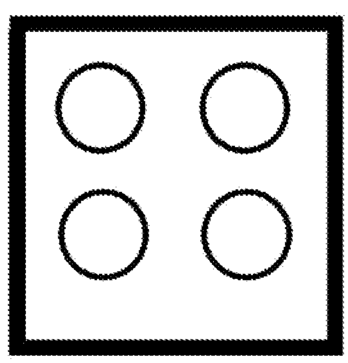

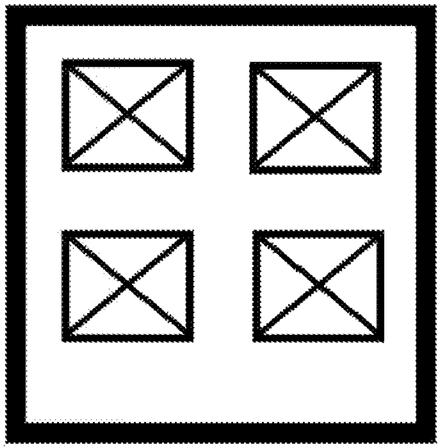
FIG. 104E
FIG. 104F
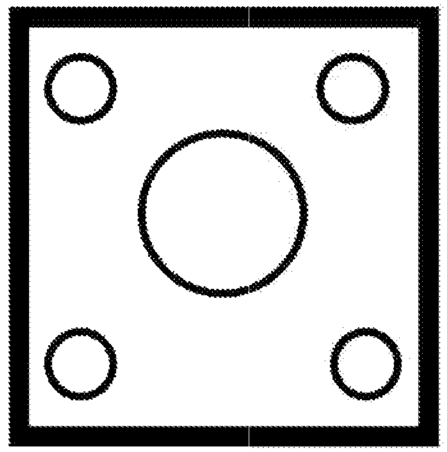
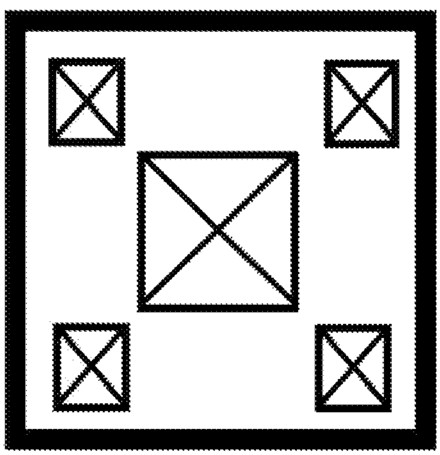
FIG. 104G
FIG. 104H
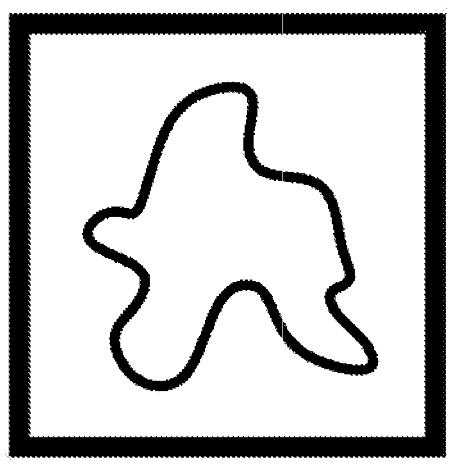

MICROSTRUCTURE ENHANCED ABSORPTION PHOTOSENSITIVE DEVICES

REFERENCE TO RELATED APPLICATIONS

This application is a continuation-in-part of each of: U.S. patent application Ser. No. 16/042,535 filed Jul. 23, 2018; International Patent Appl. No. PCT/US18/43289 filed Jul. 23, 2018 and published as WO 2019/018846; U.S. patent application Ser. No. 15/797,821 filed Oct. 30, 2017; U.S. patent application Ser. No. 14/947,718 filed Nov. 20, 2015; and International Patent Appl. No. PCT/US16/67977 filed Dec. 21, 2016 published as WO 2017/112747; U.S. patent application Ser. No. 16/296,985 filed Mar. 8, 2019; and International Patent Appl. No. PCT/US18/57963 filed Oct. 29, 2018 and published as WO 2019/089437.

This application incorporates by reference and claims the benefit of the filing date of each of the above-identified patent applications, as well as of the applications that they incorporate by reference, directly or indirectly, and the benefit of which they claim, including U.S. provisional applications, U.S. non-provisional applications, and International applications.

This patent application claims the benefit of and incorporates by reference each of the following provisional applications:

U.S. Prov. Ser. No. 62/713,455 filed Aug. 1, 2018;
U.S. Prov. Ser. No. 62/716,310 filed Aug. 8, 2018;
U.S. Prov. Ser. No. 62/717,750 filed Aug. 10, 2018;
U.S. Prov. Ser. No. 62/719,689 filed Aug. 19, 2018;
U.S. Prov. Ser. No. 62/724,449 filed Aug. 29, 2018;
U.S. Prov. Ser. No. 62/733,476 filed Sep. 19, 2018;
U.S. Prov. Ser. No. 62/737,062 filed Sep. 26, 2018;
U.S. Prov. Ser. No. 62/750,016 filed Oct. 24, 2018;
U.S. Prov. Ser. No. 62/770,656 filed Nov. 21, 2018;
U.S. Prov. Ser. No. 62/772,498 filed Nov. 28, 2018;
U.S. Prov. Ser. No. 62/777,157 filed Dec. 9, 2018;
U.S. Prov. Ser. No. 62/779,693 filed Dec. 14, 2018;
U.S. Prov. Ser. No. 62/784,342 filed Dec. 21, 2018;
U.S. Prov. Ser. No. 62/794,330 filed Jan. 18, 2019;
U.S. Prov. Ser. No. 62/797,141 filed Jan. 25, 2019;
U.S. Prov. Ser. No. 62/797,263 filed Jan. 26, 2019;
U.S. Prov. Ser. No. 62/800,371 filed Feb. 1, 2019;
U.S. Prov. Ser. No. 62/802,171 filed Feb. 6, 2019;
U.S. Prov. Ser. No. 62/802,718 filed Feb. 8, 2019;
U.S. Prov. Ser. No. 62/805,850 filed Feb. 14, 2019;
U.S. Prov. Ser. No. 62/808,949 filed Feb. 22, 2019;
U.S. Prov. Ser. No. 62/819,604 filed Mar. 17, 2019;
U.S. Prov. Ser. No. 62/819,669 filed Mar. 17, 2019;
U.S. Prov. Ser. No. 62/820,695 filed Mar. 19, 2019;
U.S. Prov. Ser. No. 62/828,976 filed Apr. 3, 2019;
U.S. Prov. Ser. No. 62/841,798 filed May 1, 2019;
U.S. Prov. Ser. No. 62/843,206 filed May 3, 2019;
U.S. Prov. Ser. No. 62/846,554 filed May 10, 2019;
U.S. Prov. Ser. No. 62/853,280 filed May 29, 2019;
U.S. Prov. Ser. No. 62/860,115 filed Jun. 11, 2019;
U.S. Prov. Ser. No. 62/863,231 filed Jun. 18, 2019;
U.S. Prov. Ser. No. 62/863,852 filed Jun. 19, 2019;
U.S. Prov. Ser. No. 62/867,186 filed Jun. 26, 2019;
U.S. Prov. Ser. No. 62/868,911 filed Jun. 29, 2019;
U.S. Prov. Ser. No. 62/870,533 filed Jul. 3, 2019;
U.S. Prov. Ser. No. 62/873,891 filed Jul. 13, 2019, and
U.S. Prov. Ser. No. 62/874,418 filed Jul. 15, 2019.

Said U.S. patent application Ser. No. 16/296,985 is a continuation of said U.S. patent application Ser. No. 15/797,821, and said U.S. patent application Ser. No. 16/042,535 is a continuation-in-part of said U.S. patent application Ser. No. 15/797,821.

Said U.S. patent application Ser. No. 15/797,821 claims the benefit of and incorporates by reference each of the following provisional applications:

U.S. Prov. Ser. No. 62/465,734 filed Mar. 1, 2017;
U.S. Prov. Ser. No. 62/474,179 filed Mar. 21, 2017;
U.S. Prov. Ser. No. 62/484,474 filed Apr. 12, 2017;
U.S. Prov. Ser. No. 62/487,606 filed Apr. 20, 2017;
U.S. Prov. Ser. No. 62/488,998 filed Apr. 24, 2017;
U.S. Prov. Ser. No. 62/500,581 filed May 3, 2017;
U.S. Prov. Ser. No. 62/505,974 filed May 14, 2017;
U.S. Prov. Ser. No. 62/509,093 filed May 20, 2017;
U.S. Prov. Ser. No. 62/510,249 filed May 23, 2017;
U.S. Prov. Ser. No. 62/514,889 filed Jun. 4, 2017;
U.S. Prov. Ser. No. 62/521,504 filed Jun. 18, 2017;
U.S. Prov. Ser. No. 62/522,169 filed Jun. 20, 2017;
U.S. Prov. Ser. No. 62/527,962 filed Jun. 30, 2017;
U.S. Prov. Ser. No. 62/530,281 filed Jul. 9, 2017;
U.S. Prov. Ser. No. 62/533,078 filed Jul. 16, 2017;
U.S. Prov. Ser. No. 62/533,603 filed Jul. 17, 2017;
U.S. Prov. Ser. No. 62/535,801 filed Jul. 21, 2017;
U.S. Prov. Ser. No. 62/540,524 filed Aug. 2, 2017;
U.S. Prov. Ser. No. 62/542,243 filed Aug. 7, 2017;
U.S. Prov. Ser. No. 62/547,728 filed Aug. 18, 2017;
U.S. Prov. Ser. No. 62/553,844 filed Sep. 2, 2017;
U.S. Prov. Ser. No. 62/556,426 filed Sep. 10, 2017; and
U.S. Prov. Ser. No. 62/561,869 filed Sep. 22, 2017.

Said U.S. patent application Ser. No. 15/797,821 is a continuation-in-part of each of:

U.S. patent application Ser. No. 15/309,922, filed Nov. 9, 2016, now U.S. Pat. No. 9,818,893, which is a § 371 national stage of International Patent Appl. No. PCT/US15/061120 filed Nov. 17, 2015;
Said U.S. patent application Ser. No. 14/947,718 filed Nov. 20, 2015; and
Said International Patent Appl. No. PCT/US16/67977 filed Dec. 21, 2016 published as WO 2017/112747.

Said application Ser. No. 15/309,922 is a continuation of each of (i) U.S. patent application Ser. No. 14/943,898 (now U.S. Pat. No. 9,530,905), (ii) U.S. patent application Ser. No. 14/945,003 filed Nov. 18, 2011 (now U.S. Pat. No. 9,525,084), and is a § 371 national stage of International Patent Appl. No. PCT/US15/061120, and incorporates each by reference and claims the benefit of the filing date of each as well as of each of the U.S. Provisional Patent applications the benefit of which they claim, including:

U.S. Prov. Ser. No. 62/081,538 filed Nov. 18, 2014;
U.S. Prov. Ser. No. 62/090,879 filed Dec. 11, 2014;
U.S. Prov. Ser. No. 62/100,025 filed Jan. 5, 2015;
U.S. Prov. Ser. No. 62/111,582 filed Feb. 3, 2015;
U.S. Prov. Ser. No. 62/139,511 filed Mar. 27, 2015;
U.S. Prov. Ser. No. 62/153,443 filed Apr. 27, 2015
U.S. Prov. Ser. No. 62/154,675 filed Apr. 29, 2015;
U.S. Prov. Ser. No. 62/157,876 filed May 6, 2015;
U.S. Prov. Ser. No. 62/171,915 filed Jun. 5, 2015;
U.S. Prov. Ser. No. 62/174,498 filed Jun. 11, 2015
U.S. Prov. Ser. No. 62/175,855 filed Jun. 15, 2015;
U.S. Prov. Ser. No. 62/182,602 filed Jun. 21, 2015;
U.S. Prov. Ser. No. 62/188,876 filed Jul. 6, 2015;
U.S. Prov. Ser. No. 62/197,120 filed Jul. 27, 2015;
U.S. Prov. Ser. No. 62/199,607 filed Jul. 31, 2015;
U.S. Prov. Ser. No. 62/205,717 filed Aug. 15, 2015;
U.S. Prov. Ser. No. 62/209,311 filed Aug. 24, 2015;
U.S. Prov. Ser. No. 62/213,556 filed Sep. 2, 2015; and
U.S. Prov. Ser. No. 62/232,716 filed Sep. 25, 2015.

Said application Ser. No. 14/947,718 is a continuation of International Patent Appl. No. PCT/US14/39208, published as WO 2014/190189, and incorporates each by reference and claims the benefit of the filing date thereof and of each of the U.S. Provisional Patent applications the benefit of which it claims including:

U.S. Prov. Ser. No. 61/826,446 filed May 22, 2013;
U.S. Prov. Ser. No. 61/834,873 filed Jun. 13, 2013;
U.S. Prov. Ser. No. 61/843,021 filed Jul. 4, 2013; and
U.S. Prov. Ser. No. 61/905,109 filed Nov. 15, 2013.

Said International Patent Appl. No. PCT/US16/67977 claims the benefit of the filing date of each of the following U.S. Provisional Patent applications:

U.S. Prov. Ser. No. 62/270,577 filed Dec. 21, 2015;
U.S. Prov. Ser. No. 62/290,391 filed Feb. 2, 2016;
U.S. Prov. Ser. No. 62/304,907 filed Mar. 7, 2016;
U.S. Prov. Ser. No. 62/334,934 filed May 11, 2016;
U.S. Prov. Ser. No. 62/338,263 filed May 18, 2016;
U.S. Prov. Ser. No. 62/346,850 filed Jun. 7, 2016;
U.S. Prov. Ser. No. 62/359,349 filed Jul. 7, 2016;
U.S. Prov. Ser. No. 62/366,188 filed Jul. 25, 2016;
U.S. Prov. Ser. No. 62/368,109 filed Jul. 28, 2016;
U.S. Prov. Ser. No. 62/374,828 filed Aug. 13, 2016;
U.S. Prov. Ser. No. 62/376,869 filed Aug. 18, 2016;
U.S. Prov. Ser. No. 62/380,364 filed Aug. 27, 2016;
U.S. Prov. Ser. No. 62/383,391 filed Sep. 3, 2016;
U.S. Prov. Ser. No. 62/383,479 filed Sep. 4, 2016;
U.S. Prov. Ser. No. 62/394,222 filed Sep. 14, 2016;
U.S. Prov. Ser. No. 62/398,607 filed Sep. 23, 2016;
U.S. Prov. Ser. No. 62/401,126 filed Sep. 28, 2016;
U.S. Prov. Ser. No. 62/406,999 filed Oct. 12, 2016;
U.S. Prov. Ser. No. 62/414,671 filed Oct. 29, 2016; and
U.S. Prov. Ser. No. 62/415,339 filed Oct. 31, 2016.

Each of said PCT/US18/43289 filed Jul. 23, 2018 and said PCT/US18/57963 filed Oct. 29, 2018 is a continuation-in-part of said U.S. patent application Ser. No. 15/797,821, and PCT/US18/43289 claims the benefit of and incorporates by reference each of the following provisional applications:

U.S. Prov. Ser. No. 62/535,801 filed Jul. 21, 2017;
U.S. Prov. Ser. No. 62/540,524 filed Aug. 2, 2017;
U.S. Prov. Ser. No. 62/542,243 filed Aug. 7, 2017;
U.S. Prov. Ser. No. 62/547,728 filed Aug. 18, 2017;
U.S. Prov. Ser. No. 62/553,844 filed Sep. 2, 2017;
U.S. Prov. Ser. No. 62/556,426 filed Sep. 10, 2017;
U.S. Prov. Ser. No. 62/561,869 filed Sep. 22, 2017;
U.S. Prov. Ser. No. 62/591,072 filed Nov. 27, 2017
U.S. Prov. Ser. No. 62/599,246 filed Dec. 15, 2017
U.S. Prov. Ser. No. 62/607,860 filed Dec. 19, 2017
U.S. Prov. Ser. No. 62/615,314 filed Jan. 9, 2018
U.S. Prov. Ser. No. 62/623,971 filed Jan. 30, 2018
U.S. Prov. Ser. No. 62/628,764 filed Feb. 9, 2018
U.S. Prov. Ser. No. 62/631,630 filed Feb. 17, 2018
U.S. Prov. Ser. No. 62/633,514 filed Feb. 21, 2018
U.S. Prov. Ser. No. 62/634,692 filed Feb. 23, 2018
U.S. Prov. Ser. No. 62/637,945 filed Mar. 2, 2018
U.S. Prov. Ser. No. 62/639,356 filed Mar. 6, 2018
U.S. Prov. Ser. No. 62/639,472 filed Mar. 6, 2018
U.S. Prov. Ser. No. 62/639,920 filed Mar. 7, 2018
U.S. Prov. Ser. No. 62/640,522 filed Mar. 8, 2018
U.S. Prov. Ser. No. 62/643,010 filed Mar. 14, 2018
U.S. Prov. Ser. No. 62/645,810 filed Mar. 21, 2018
U.S. Prov. Ser. No. 62/646,871 filed Mar. 22, 2018
U.S. Prov. Ser. No. 62/651,053 filed Mar. 30, 2018;
U.S. Prov. Ser. No. 62/651,087 filed Mar. 31, 2018;
U.S. Prov. Ser. No. 62/652,830 filed Apr. 4, 2018;
U.S. Prov. Ser. No. 62/659,067 filed Apr. 17, 2018;
U.S. Prov. Ser. No. 62/659,072 filed Apr. 17, 2018;

U.S. Prov. Ser. No. 62/662,217 filed Apr. 24, 2018;
U.S. Prov. Ser. No. 62/666,005 filed May 2, 2018;
U.S. Prov. Ser. No. 62/669,194 filed May 9, 2018;
U.S. Prov. Ser. No. 62/675,130 filed May 22, 2018;
U.S. Prov. Ser. No. 62/677,609 filed May 29, 2018; and
U.S. Prov. Ser. No. 62/682,909 filed Jun. 9, 2018.

All of the above-referenced provisional and non-provisional patent applications are collectively referenced herein as "the commonly assigned incorporated applications."

FIELD

This patent specification relates mainly to photosensitive devices. More particularly, some embodiments relate to photosensitive devices having microstructure enhanced absorption characteristics and photosensitive devices monolithically integrated with active electronic circuits on or in the same chip.

BACKGROUND

Fiber-optic communication is widely used in applications such as telecommunications, communication within large data centers, and communications between data centers. Because of attenuation losses associated with using shorter optical wavelengths, most fiber-optic data communication uses optical wavelengths of 800 nm and longer. Commonly used multimode and single mode optical fiber uses wavelengths between 800 nm and 1675 nm. A main component of optical receivers used in fiber-optic communication system is the photo detector, usually in the form of a photodiode (PD) or avalanche photodiode (APD).

High-quality low-noise APDs can be made from silicon. However, while silicon will absorb light in the visible and near infrared range, it becomes more transparent at longer optical wavelengths. Silicon PDs and APDs can be made for optical wavelengths of 800 nm and longer by increasing the thickness of the absorption "I" region of the device. However, in order to obtain adequate quantum efficiency (also known as external quantum efficiency), the thickness of the silicon "I" region becomes so large that the device's maximum bandwidth (also referred to as "data rate") becomes too low for many current and future telecom and data center applications.

To avoid the inherent problem that silicon PDs and APDs have with longer wavelengths and higher bandwidths, other materials are used. Germanium (Ge) APDs detect infrared out to a wavelength of 2000 nm, but have relatively high multiplication noise. InGaAs APDs can detect out to longer than 1600 nm, and have less multiplication noise than Ge, but still far greater multiplication noise than silicon APDs. InGaAs is known to be used as the absorption region of a heterostructure diode, most typically involving InP as a substrate and as a multiplication layer. This material system is compatible with an absorption window of roughly 900 to 1700 nm. However, InGaAs PD and APD devices are relatively expensive and have relatively high multiplication noise when compared with silicon and are difficult to integrate with Si electronics as a single chip.

Information published by a major company in the business of photodetectors (See http://files.shareholder.com/downloads/FNSR/0x0x382377/0b3893ea-fb06-417d-ac71-84f2f9084b0d/Finisar_Investor_Presentation.pdf,) indicates at page 10 that the current market for optical communication devices is over 7 billion U.S. dollars with a compounded annual growth rate of 12%. Photodiodes (PD) used for 850-950 nm wavelength employ GaAs material and for 1550-1650 nm wavelength photodiodes are InP material based, which is both expensive and difficult to integrate with Si based electronics. Therefore, there is a large market and a long-felt need that has not been met for the development of a better device. To date there are no Si material based photodiodes nor avalanche photodiodes (APD) for 850-950 nm and no Ge on Si material based photodiodes nor avalanche photodiodes for 1550-1650 nm that are top-surface or bottom-surface illuminated, with a data rate of at least 25 Gb/s, and are monolithically integrated with CMOS/BiCMOS silicon electronics on a single chip that are commercially available, to the knowledge of the inventors herein. However, there has been no lack of trying to develop a better device for this large market. For example, there have been proposals for resonant photodiodes fabricated in Si material (see *Resonant-Cavity-Enhanced High-Speed Si Photodiode Grown by Epitaxial Lateral Overgrowth*, Schaub et al., IEEE PHOTONICS TECHNOLOGY LETTERS, VOL. 11, NO. 12, DECEMBER 1999), but they have not reached the known commercial market. Other forms of high speed photodiodes in a waveguide configuration have been proposed, such as in 40 *GHz Si/Ge uni-traveling carrier waveguide photodiode*, Piels et al, DOI 10.1109/JLT.2014.2310780, Journal of Lightwave Technology (incorporated herein by reference); *Monolithic germanium/Silicon avalanche photodiodes with* 340 *GHz gain-bandwidth product*, NATURE PHOTONICS|VOL 3|JANUARY 2009|www.nature.com/naturephotonics (incorporated herein by reference and referred to herein as "Kang et al. 2009"); High-speed Ge photodetector monolithically integrated with large cross-section silicon-on-insulator waveguide, Feng et al., Applied Physics Letters 95, 261105 (2009), doi: 10.1063/1.3279129 (incorporated herein by reference); where light is coupled edge-wise into an optical waveguide and where the absorption length can be 100 um or longer to compensate for the weak absorption coefficient of Ge at 1550 nm. In these previously proposed waveguide photodiode structures, light propagates along the length of the waveguide and the electric field is applied across the PIN waveguide such that the direction of light propagation and the direction of the electric field are predominantly perpendicular in this waveguide configuration. Since light in Si travels approximately 1000 times faster than the saturated velocity of electrons/holes, a waveguide PD can be 200 microns long for example and the "I" in the PIN can be 2 microns, for example, and achieve a bandwidth of over 10 Gb/s. Such edge coupling of light is costly in packaging as compared to surface illumination as described in this patent specification, where dimensions of the cross-section in the direction of light propagation are typically a few microns as compared to tens of microns for known surface illuminated photodiodes or avalanche photodiodes. Known waveguide PD/APD are often only single mode optical systems whereas surface illuminated PD/APD described in this patent specification can be used in both single and multimode optical systems. In addition, known waveguide photodiodes are difficult to test at wafer level, whereas surface illuminated photodiodes described in this patent specification can be easily tested at wafer level. Known waveguide photodiodes/avalanche photodiodes are used mostly in specialty photonic circuits and in many cases require careful temperature control, which can be costly and inefficient in a hostile data center environment. A top or bottom illuminated Si and Ge on Si or GeSi on Si PD/APD that can be integrated with Si is not known to the inventors herein to be commercially available at data rates of 25 Gb/s or more at wavelengths of 850-950 nm, 1250-1350 nm and 1550-1650 nm. In contrast, photodiodes on Si based material, as described in this patent specification, can be monolithically integrated with integrated electronic circuits on a single Si chip, thereby significantly reducing the cost of packaging. In addition, the microstructured PD/APD at 850 nm, 1300 nm and 1550 nm nominal wavelengths described in this patent specification can be predominantly for short haul (short reach), medium haul (reach gap) and long haul (long reach), distances less than 300 meters, in certain cases less than 2000 meters, in certain cases less than 10000 meters and in certain cases greater than 10000 meters optical data transmission. The microstructured PD/APD direction of incident optical beam and the electric field in the "I" region of a PIN or NIP structure, can be predominately collinear and/or almost collinear. In lateral PDs and APDs described in this patent specification, the electric field and light propagation can be in different direction, but the absorption layer can still be much thinner than in devices known to the inventors herein for comparable data rate and/or absorption and quantum efficiency. This patent specification enables such a device and is expected to transform the current data centers to almost all optical data transmission between blades, within a blade, between racks and/or between data centers, that will vastly increase the data transmission bandwidth capabilities and significantly reduce electrical power usage and at the same time improve performance of the monolithically integrated photodetector array with microstructure holes to enhance optical absorption and therefore the external quantum efficiency to CMOS/BiCMOS application specific integrated circuits due to lower parasitics such as capacitance, inductance and resistance. The photodetectors can be photodiodes, avalanche photodiodes, and/or single photon avalanche photodiode (SPAD).

In addition to data communication applications, the fast and efficient microstructure hole photodetectors can be used in time of flight applications such as light direction and ranging (LiDAR), 3D imaging in the near infrared wavelength regions. Monolithic integration of electronics and microstructured hole photodetectors with or without gain can improve performance and reduce cost. The market size is in the multi billion dollars per year range.

The subject matter claimed herein is not limited to embodiments that solve any specific disadvantages or that operate only in environments such as those described above. Rather, this background is only provided to illustrate one exemplary technology area where some embodiments described herein may be practiced.

Each published document referenced in this patent specification is hereby incorporated by reference.

SUMMARY

According to some embodiments, an integrated, single-chip structure comprises a photosensitive portion at one side of a substrate and an active CMOS or BICMOS electronic circuit at an opposite side of the substrate, wherein: said photosensitive portion at one side of said substrate comprises at least one photodetector comprising a P-doped region, an N-doped region, and an I-region of low doped or undoped semiconductor material that is between the N-doped region and the P-doped region and has at least one hole deliberately formed to extend into said photosensitive portion; said I-region is essentially single-crystal semiconductor material having inherent crystal planes and said at least one hole extents into said photosensitive portion to a depth exceeding a depth of an inverted pyramid hole with sides along said crystal planes; said active circuit at an opposite side of said substrate comprises plural active electronic elements; connecting electrodes are configured to carry to said active electronic circuit electrical signals generated by said photosensitive portion in response to illumination, for processing by said active electronic circuit; and output electrodes are connected to said active electronic circuit and are configured to deliver electrical signals processed by the active electronic circuit.

Said P-doped region, N-doped region, and I-region can be vertically arranged to form a vertical device or can be laterally arranged to form a lateral device.

In the vertical device configuration, in which said regions are vertically arranged, the structure can include one or more of the following features: said at least one hole can extend through one and toward the other of said P-doped region and N-doped region; material of one of said P-doped region and N-doped region can be included at sidewall portions of said at least one hole; said I-region can be at a closed end of said at least one hole and along at least sidewall portions thereof; one of said P-doped region and N-doped region can extend along at least sidewall portions of said at least one hole; said at least one hole can extends through said P-doped region and N-doped region; said at least one hole can comprises plural holes laterally spaced from each other and said photosensitive portion can comprise plural photodetectors; at least one avalanche photodiode structure can be included in the photosensitive portion; and at least one single photon avalanche photodiode (SPAD) can be included in the photosensitive portion.

In the lateral configuration, in which said P-doped region, N-doped region, and I-region are laterally arranged, the structure can include one or more of the following features: one of said P-doped region and N-doped region can be at a closed end and at sidewall portions of said at least one hole; said at least one hole can extend through at least one of said P-doped region and N-doped region; said at least one hole can extend into both said P-doped region and N-doped region; said at least one hole can penetrate through both said P-doped region and N-doped region; said at least one hole can comprise plural holes laterally spaced from each other and said photosensitive portion can comprise plural photodetectors laterally spaced from each other; said at least one hole can have a closed end at one of said P-doped region and N-doped region; at least one avalanche photodiode structure can be included in said photosensitive portion; and at least one single photon avalanche photodiode (SPAD) can be included in the photosensitive portion.

According to some embodiments, an integrated, single-chip structure comprises: I-regions of low-doped or undoped first semiconductor material that are laterally spaced from each other by deliberately formed first holes extending in said first semiconductor material; regions of said first semiconductor material doped to one polarity; and regions of a second semiconductor material that is different from said first semiconductor material and comprise triplets each formed of a region that is doped to an opposite polarity and is laterally between regions doped to said one polarity; wherein adjacent regions of said first semiconductor material are laterally spaced from each other by said triplets of the second semiconductor material; wherein said I-regions and regions of said first semiconductor material doped to said one polarity and said regions of said second semiconductor material doped to an opposite polarity are configured as photodetectors generating electrical signals in response to illumination, where illumination concurrently illuminating plural ones of said holes contributes to a respective single one of said electrical signal; and wherein said regions of said second semiconductor material are configured as avalanche structures. The structure can further include first and second interdigitated electrodes respectively coupled to said regions of the first semiconductor doped to said one polarity and to said regions of the second semiconductor material doped to said other polarity. Said regions of the first semiconductor doped to said one conductivity can be spaced vertically from said regions of the second semiconductor material. The structure can further include additional deliberately formed holes in said first semiconductor material that are laterally between adjacent ones of said first holes.

According to some embodiments, an integrated, single-chip structure comprises: an I-region of low-doped or undoped Si semiconductor material; P-doped regions and N-doped regions extending in said semiconductor material; deliberately formed holes extending into said semiconductor material and laterally spacing said doped regions; wherein each P-doped region is laterally spaced from an adjacent N-doped region by at least one of said holes; and first and second interdigitated electrodes, respectively coupled to said P-doped regions to said N-doped regions; wherein said structure is configured to generate an electrical signal in response to light concurrently impinging on a plurality of said holes to generate a respective common electrical output representing said light and to operate at Gigahertz data rates.

According to some embodiments, an integrated, single-chip structure comprises: a first I-region of low-doped or undoped Ge or Ge/Si alloy semiconductor material; a second I-region of low-doped or undoped Si semiconductor material; doped regions in said Ge or Ge/Si material that are doped to one polarity; doped regions in said Si semiconductor material that are doped to opposite polarity and laterally space from each other said regions doped to said one polarity; holes deliberately formed in said Ge or GeSi alloy material; and first and second interdigitated electrodes coupled respectively to said P-doped regions and to said N-doped regions; wherein said structure is configured to generate electrical signals in response to light and to operate at Gigahertz data rates.

According to some embodiments, an integrated, single-chip structure comprises: an I-region of low-doped or undoped Ge or GeSi alloy semiconductor material; P-doped regions and N-doped regions extending in said semiconductor material; deliberately formed holes extending into said semiconductor material and laterally spacing said doped regions from each other; wherein each P-doped region is laterally spaced from an adjacent N-doped region by at least one of said holes; a low-doped Si region extending along said Ge or GeSi region at a side thereof opposite said doped regions; and first and second interdigitated electrodes coupled respectively to said regions doped to one conductivity and to said regions doped to opposite conductivity; wherein said structure is configured to generate electrical signals in response to light and to operate at Gigahertz data rates According to some embodiments, an integrated, single-chip structure comprises; I-regions of Si semiconductor that are low-doped or undoped; first regions of said Si semiconductor material doped to one polarity; and second regions of said Si semiconductor material doped to opposite polarity and third regions of said Si semiconductor material doped to said one polarity, said second a third regions forming triplets each comprising one of said second regions doped to opposite polarity and located laterally between two of said second regions doped to said one polarity; wherein adjacent ones of said first regions are laterally spaced from each other by at least one or said triplets; deliberately formed holes extending into said I-regions, wherein a plurality of said holes is laterally between each adjacent pair of one of said first regions and one of said triplets; wherein said I-regions and said second regions are configured as photodetectors generating electrical signals in response to illumination, and said triplets are configured as avalanche structures.

According to some embodiments, an integrated, single-chip structure comprises a photosensitive portion at one side of a substrate and an active CMOS or BICMOS electronic circuit that is at an opposite side of the substrate, wherein: said photosensitive portion at one side or of said substrate comprises plural sets of regions, each set comprising a P-doped region, an N-doped region, and an I-region of low doped or undoped semiconductor material that is between the N-doped region and the P-doped region; plural holes extend in said photosensitive regions and are laterally located between said sets; said active circuit at an opposite side of said substrate comprises plural active electronic elements; first and second electrodes connect respectively said P-doped regions and said N-doped regions and are configured to carry electrical signals generated by said photosensitive portion in response to illumination to said active electronic circuit for processing; wherein at least two of said sets are connected to combine the electrical signals they generate into a common signal; and output electrodes are connected to said active electronic circuit and are configured to deliver electrical signals processed by the active electronic circuit. Each of said sets can comprise a vertical stack of regions or, alternatively, the regions of each of said sets can be laterally spaced from each other. Said holes are arranged in an aperiodic array.

The term “hole” refers in this patent specification to a deliberately formed volume of material shaped and dimensions as specified, that differs from surrounding material in specified electrical and/or optical properties. The material of a hole can be solid, such as a semiconductor with such different electrical/optical properties, or a dielectric, or a gas such as air, or even vacuum. A hole can be into a top surface of a layer, or into a bottom surface, or can be an internal volume that is between a top layer and a bottom layer of a device. Numerous examples of such holes are described in detail infra., and some are interchangeably called protrusions, for example when a hole in the underside of an I-layer is an indentation filled with material protruding from a layer below.

The term “electrode” refers in this specification to material that serves to create desired electrical fields in the disclosed devices and to extract desired electrical signals that the devices produce in response to light illumination. Numerous examples of electrodes are described in detail infra., for example electrodes that comprise electrically conductive material in ohmic contact with doped regions of a device, or electrically conductive material that makes other types of contact such as Schottky junctions.

The terms “top” and “bottom” and similar terms refer to a specified orientation of a device so that, for example, the top of a device being described below becomes its bottom when the device is flipped over or becomes its left or right side when the device is turned 90 degrees.

BRIEF DESCRIPTION OF THE DRAWINGS

To further clarify the above and other advantages and features of the subject matter of this patent specification, specific examples of embodiments thereof are illustrated in the appended drawings. It should be appreciated that these drawings depict only illustrative embodiments and are therefore not to be considered limiting of the scope of this patent specification or the appended claims. The subject matter hereof will be described and explained with additional specificity and detail through the use of the accompanying drawings in which:

FIGS. 88A-C show an FDTD simulation of the optical field impinging on the top device layer surface;

FIGS. 89A-B show an FDTD simulation of a microstructure hole structure;

FIGS. 90A-B show an FDTD simulation of the optical field of a microstructure hole structure;

FIGS. 91A-B show an FDTD simulation of the optical field of a microstructure configuration;

FIGS. 104A-H are a simplified partial schematic of a top views of photodetector arrays configured as dense 2D arrays for imaging applications, according to some embodiments;

DETAILED DESCRIPTION

A detailed description of examples of preferred embodiments is provided below. While several embodiments are described, it should be understood that the new subject matter described in this patent specification is not limited to any one embodiment or combination of embodiments described herein, but instead encompasses numerous alternatives, modifications, and equivalents. In addition, while numerous specific details are set forth in the following description in order to provide a thorough understanding, some embodiments can be practiced without some or all of these details. Moreover, for the purpose of clarity, certain technical material that is known in the related art has not been described in detail in order to avoid unnecessarily obscuring the new subject matter described herein. It should be clear that individual features of one or several of the specific embodiments described herein can be used in combination with features or other described embodiments. Further, like reference numbers and designations in the various drawings indicate like elements.

All publications cited in this patent specification are hereby incorporated by reference. Some of the figures described herein are simplified in that for clarity they may omit elements of structures that skilled persons would understand need not be shown expressly and the figures may show only a portion of a structure that comprises repeated patterns of the shown portions. For example, a figure may show a device with a single pair of laterally spaced electrodes where the actual device being described includes a collection of two or more such regions on or in the same substrate. The Greek letters ν (nu) and π (pi) denote in this specification semiconductor material that is low doped to N and P doping, respectively, e.g., to no more that about $10^{12}$ per $cm^3$ doping. The semiconductor material regions described in this patent specification are material that is single-crystal or essentially single-crystal except for the deliberately formed "holes" described below, unless otherwise specified. The terms "partial" or "partially" regarding the depth of holes or or of etching refer in this specification to holes that extend partway into a region rather than through the entire region.

Figure 1:
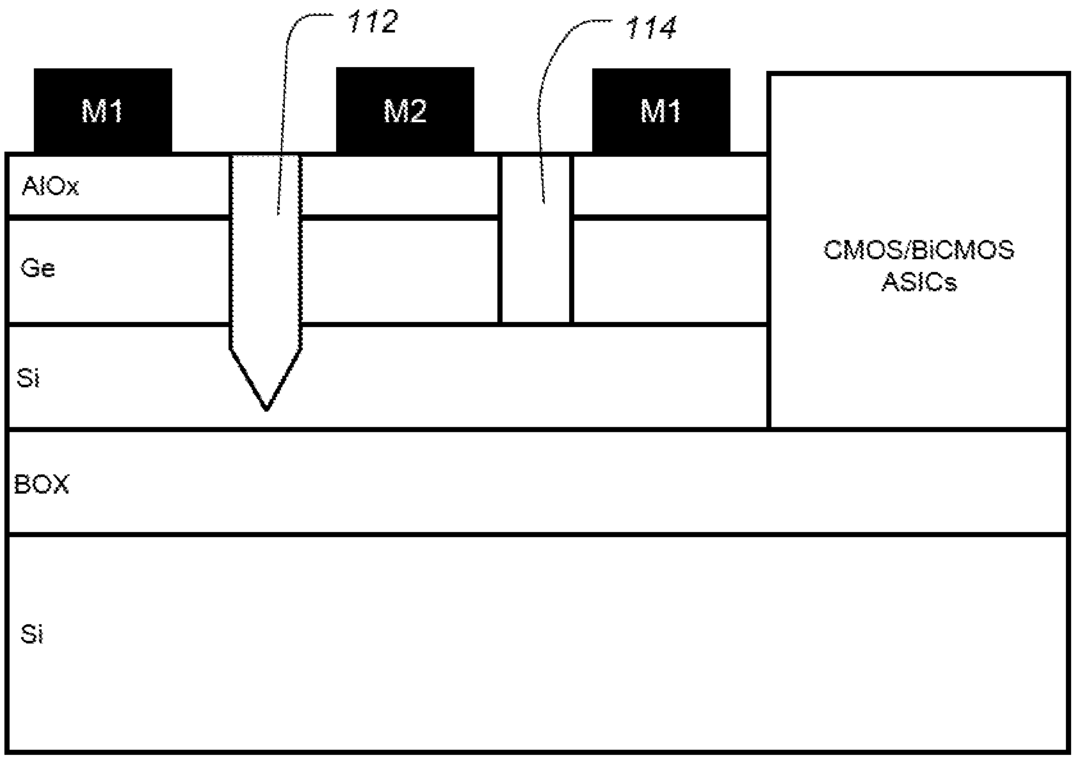
FIG. 1. is a schematic cross-section view of an interdigitated metal-semiconductor-metal (MSM) Ge/GeSi photodetector.

FIG. 1. is a schematic cross-section view of an interdigitated metal-semiconductor-metal (MSM) of Ge/GeSi photodetector. The Ge/GeSi layer is formed on Si and an insulator (SOI). The Si device layer is I or low dope P type with resistivity greater than or equal to 5 ohm/cm and with a thickness ranging from 100-1000 nanometers approximately. A Ge/GeSi layer is selective area grown on the Si device layer with or without a low temperature Ge/GeSi buffer layer(s) and where the Ge/GeSi layer is I or low dope and with a thickness ranging from 100-1000 nm, and in some cases 200-700 nm, and in some cases 300-500 nm. A thin Al oxide layer can be deposited on the Ge/GeSi with thickness ranging from 1-10 nm to reduce leakage current. Metal and/or metal silicide form the interdigits of electrodes M1 and M2. Microstructure holes 112 and 114 are dry etched into the Ge/GeSi layer fully or partially. In some cases the etch can extend to the bottom of the Ge/GeSi layer as in hole 114. In some cases a wet etch can be performed after the dry etch in Si to form inverted pyramids, as in hole 112. The lateral dimension of the microstructure hole can range from 500-1700 nm or more, and the spacing between the microstructure holes can range from 100-300 nm or more. The shape of the microstructure holes can be circular, rectangular, polygonal, inverted pyramids, and/or any combination of shapes. The microstructure holes can be a in a square or hexagonal lattice, and can be periodic, and/or aperiodic. The interdigit electrode spacing can range from 500-1000 nm or more, and in some cases can range from 300 to 1000 nm or more. The width of the interdigit electrodes can range from 30 to 300 nm or more. The length of the interdigits can range from 5 microns to 100 microns or more, and in some cases 10-50 microns.

The microstructure holes can be not filled, partially filled, or fully filled with dielectric or poly crystalline semiconductor. In some cases the Al oxide layer can be replaced with I or low dope Poly Si, with thickness ranging from 10-300 nm or more. The interdigitated photodetector, is monolithically integrated to CMOS/BiCMOS application specific integrated circuits (ASICs). Not shown are transmission lines connecting the interdigits M1 and M2 to the CMOS/BiCMOS electronics.

In some cases the interdigits M1 and M2 can be formed partially into the Ge layer. And in some cases P and N wells can be formed beneath M1 and M2 to form a P-I-N junction between M1 and M2. In the case of P-I-N a reverse bias is applied between M1 and M2 where the P is more negative than the N. In the case where M1 and M2 are Schottky contacts or metal oxide semiconductor contacts the interdigitated detector can be operated in both the forward or reverse voltage bias.

Wavelength can range from 800 nm to 1800 nm and in some cases from 800 nm-1600 nm, in some cases from 1000 nm to 1400 nm and in some cases 700-2200 nm.

Reverse bias voltage for P-I-N can range from 1 to 10 volts or more, and bias voltage for Schottky contacts that can be symmetric in both the forward and reverse bias can range from 1 to 10 volts or more. In some cases at voltages of 10 volts or more gain can be observed in the external quantum efficiency that can be due to avalanche gain for example. In some cases gain can be observed at less than 10 volts. Optical signal can impinge from the top surface where the interdigits are or on the bottom substrate surface. Not shown are passivation antireflection layers. In some cases the microstructure holes can be etched partially into the Ge/GeSi layer, and in some cases it can be etched partially into the Si layer, and in some cases it can be etched to the BOX layer. In some cases the microstructure holes can be etched into the BOX layer, and in some cases through the BOX layer.

The lateral dimension of microstructure holes in most cases mentioned in this patent specification are for microstructure holes not filled with any dielectric, and filled only with air or vacuum where the optical refractive index is approximately 1. In the cases where the microstructure holes are filled fully or partially with the dielectric lateral dimension of the microstructure hole can be reduced by the effective optical refractive index of the dielectric/voids in the microstructure holes. For example a microstructure hole with lateral dimension of 800 nm when not filled in air can have a lateral dimension of 533 nm if completely filled with $SiO_2$ which has an optical refractive index of approximately 1.5. The microstructure hole lateral dimension can in some cases be reduced when filled with dialectic, where the refractive index is greater than 1 for example (lateral dimension of microstructure hole in vacuum or air)/(optical refractive index), and in some cases where the microstructure hole is partially filled with dielectric and effective optical refractive index can be calculated by the ratio of the volume of 1 or more dielectrics in the microstructure hole.

FIGS. 2A-2F are schematic views of a vertical N-I-P Ge/GeSi photodiode with microstructure holes on SOI monolithically integrated with CMOS/BiCMOS ASICs, according to some embodiments.

Figure 2A:
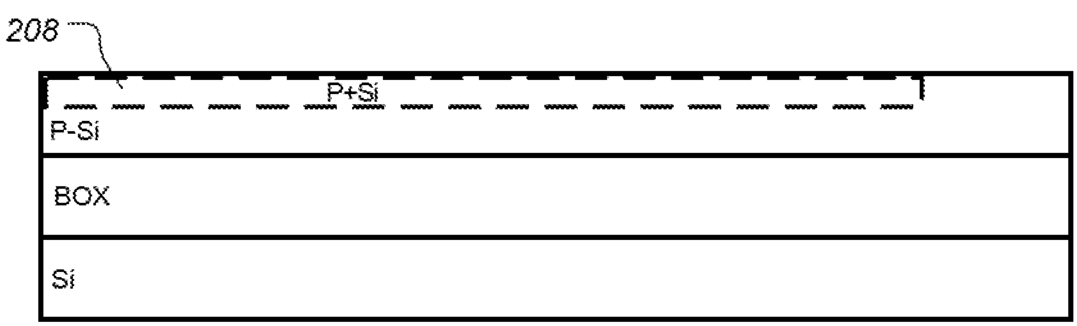
FIGS. 2A-2F are schematic views of a vertical N-I-P Ge/GeSi photodiode with microstructure holes on SOI monolithically integrated with CMOS/BiCMOS ASICs, according to some embodiments.

FIG. 2A. is a cross-section of a SOI wafer with a P+ region 208 that can be doped by diffusion or I implantation of Boron ions in selective areas, for example beneath the photodetector. This formation of P+ well can be part of the CMOS/BiCMOS process.

Figure 2B:
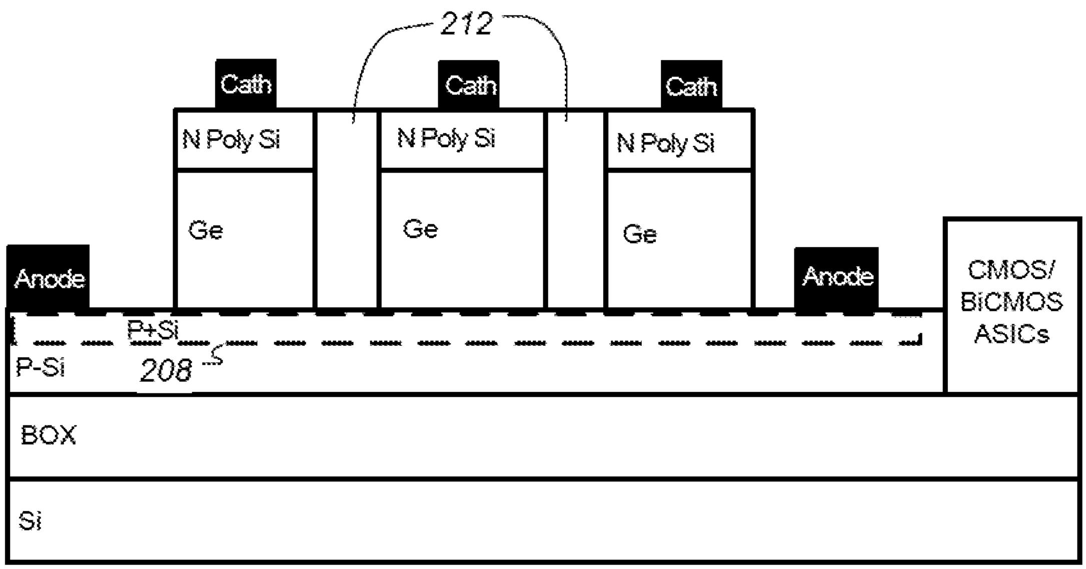

FIG. 2B. shows Ge/GeSi selective area grown over the P+ well region with Ge/GeSi layer that can be I or low doped and with thickness ranging from 200-1000 nm, and in some cases 300-500 nm. The Ge/GeSi layer can include a buffer layer between the Ge/GeSi and the Si device layer. The N+ poly Si layer can be deposited on the Ge/GeSi layer, with a thickness ranging from 100 nm to 1000 nm and in some cases 100 nm-500 nm. A transparent conducting metal oxide can be deposited on the N or N+ poly Si to reduce the series resistance. In some cases multiple cathodes can be formed on the N poly Si. Anode can be formed on the P+ Si. Microstructure holes are etched in the poly Si, and in some cases can extend into the Ge/GeSi, and in some cases can extend through the Ge/GeSi layer. The microstructure holes 212 can be unfilled, partially filled, or fully filled with dielectric and/or poly semiconductor. The dimension of the microstructure holes can be similar to that of FIG. 1.

Figure 2C:
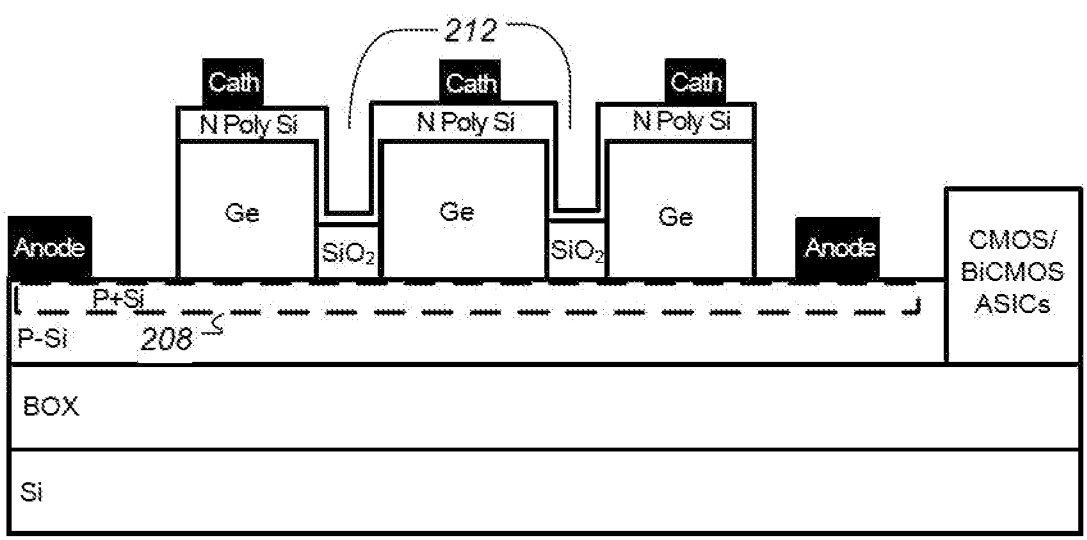

FIG. 2C shows selective area grown Ge/GeSi on SOI such as in FIG. 2A with microstructure holes 212 formed by selective area growth with $SiO_2$ islands. The $SiO_2$ islands can have similar lateral dimensions and spacing as the holes described in FIG. 1, and the thickness of the $SiO_2$ islands can range from 10 nm-500 nm or more. N poly Si can be formed on the surface of the Ge/GeSi and in some cases can be formed on the sidewalls of the microstructure holes. The N poly Si can have a thickness ranging from 100 to 500 nm, in some cases a transparent conducting metal oxide can be formed on the surface of the poly Si. Cathodes are formed on the N poly Si, and anodes formed on the P+ Si.

Figure 2D:
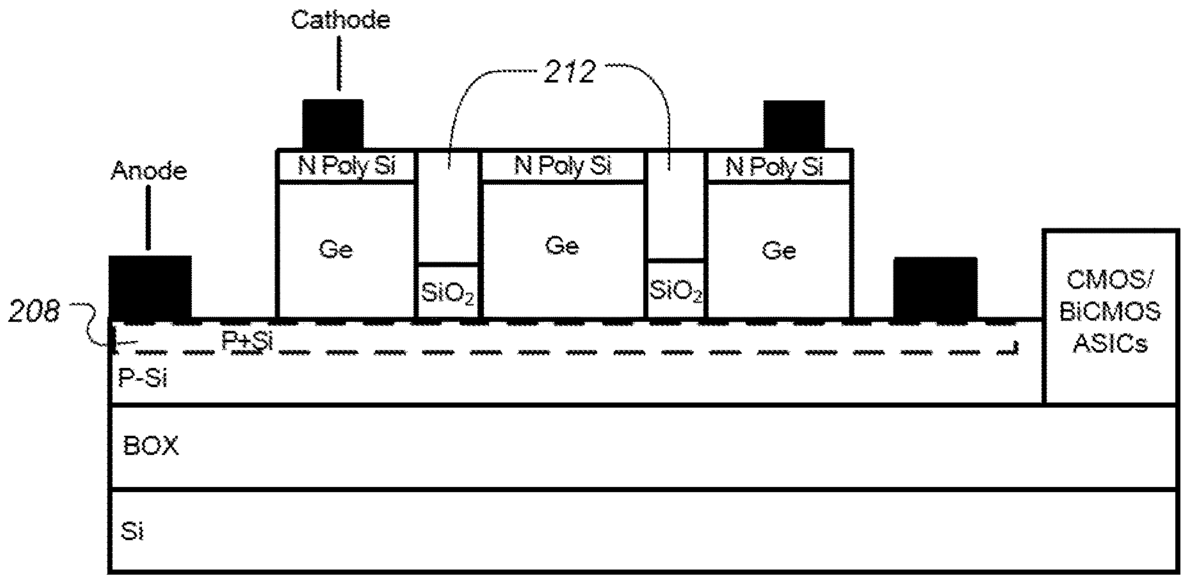

FIG. 2D. is similar to FIG. 2C except that the N poly Si is only on the top surface of the Ge, and not in the holes. In some cases, the poly Si can be partially in the microstructure holes. The microstructure holes can be unfilled, partially filled, or fully filled with dielectric and/or poly semiconductor.

Figure 2E:
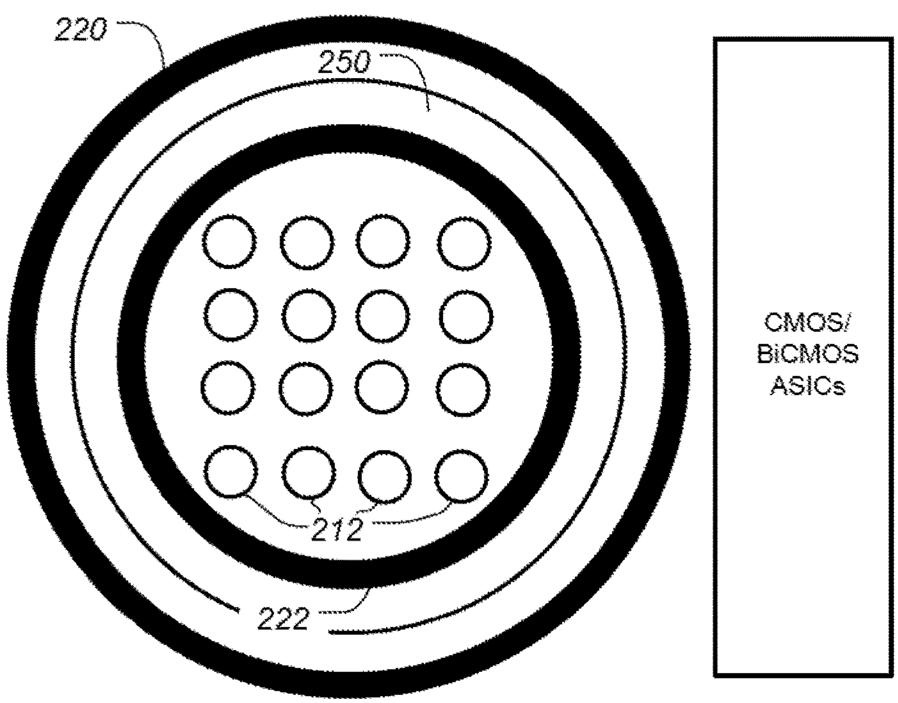

FIG. 2E. is a schematic top view of the microstructure hole photodiode of FIGS. 2B, 2C and 2D showing a region 250 of selective area grown Ge/GeSi and in some cases can be etched mesa where the cathode ring 222 is formed on the selective area growth and/or mesa of the Ge/GeSi layer 250 and the anode 220 is formed on the P+ Si. Microstructure holes 212 are shown that can be etched or formed by selective area growth. The holes can be unfilled, partially filled, or fully filled with dielectric and/or poly/amorphous semiconductor. The photodiode or arrays of photodiode can be monolithically integrated with CMOS/BiCMOS ASICs. Not shown are transmission lines connecting the photodiode to the CMOS/BiCMOS electronics. Also not shown are isolation trenches, light shields, passivations, anti-reflections to name a few.

Figure 2F:
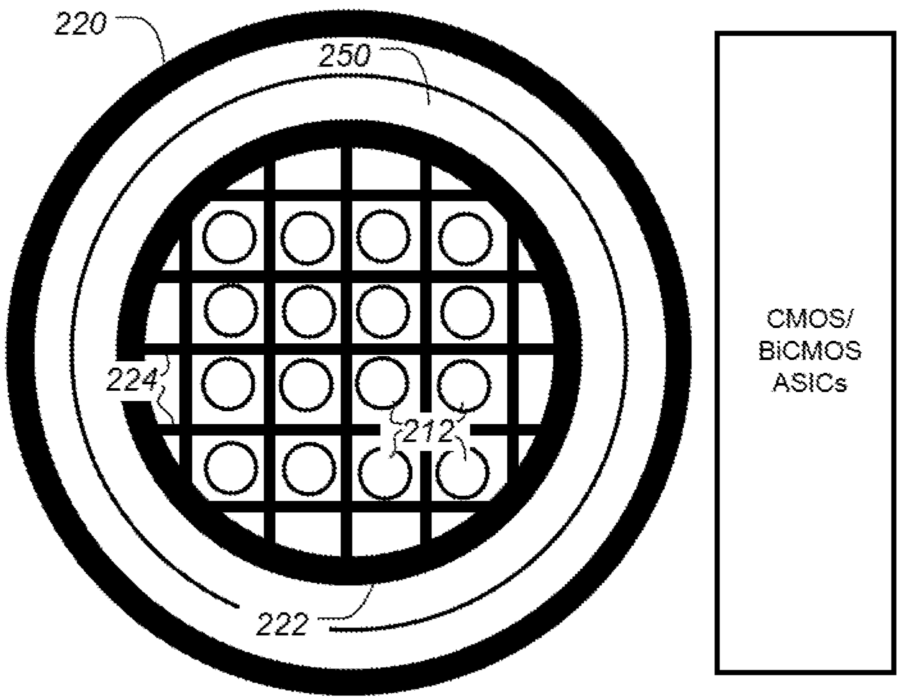

FIG. 2F is another top view that shows an addition of vertical and/or horizontal metal/metal silicide electrodes 224 connecting to the cathode 222. In some cases, the metal/metal silicide can be a grid as shown. The grid can allow a more uniform distribution of the electric field in cases where the N poly Si conductivity is low. For example, where the N poly Si has sheet resistance of 100 ohm per square or more. The width of the metal and/or metal silicide electrodes can range from 20 nm-300 nm. Anti-reflection coating and/or nanostructures of amorphous semiconductors can be deposited on the metal electrode to reduce reflection. In some cases, transparent metal conducting oxide can be deposited on the surface of the poly Si to reduce the series resistance.

The horizontal and/or vertical electrodes connected to the cathode illustrated in FIGS. 2A-F can be spaced by 1 or more hole spacing, and in some cases with both vertical and horizontal electrodes such as in a grid pattern, the spacing of the electrodes can be by 1 or more holes. In some cases, the electrodes connecting to the cathode can be meandering and not necessarily straight lines. This example is for a N-I-P structure, and the N and P can be interchanged, in which case the cathode is replaced by the anode, and the anode is replaced by the cathode.

Figure 3A:
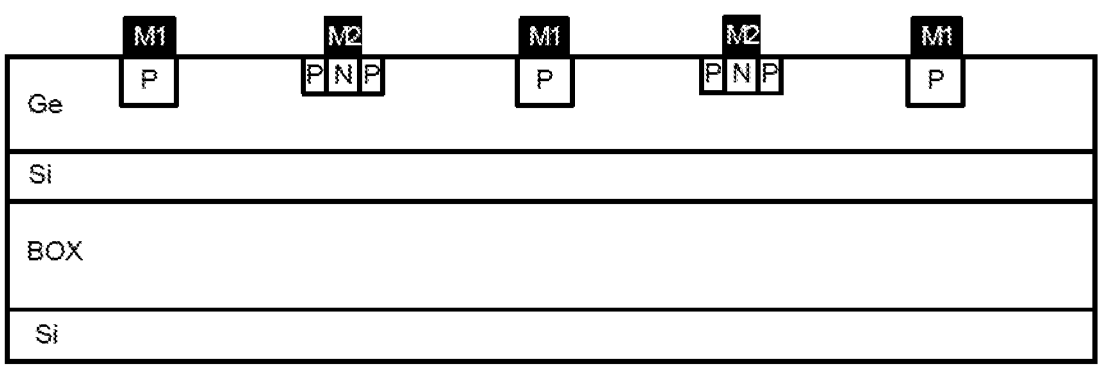
FIG. 3A is a schematic cross-section of Ge and/or GeSi on Si lateral interdigitated avalanche photodiode (APD), according to some embodiments.

FIG. 3A is a schematic cross-section of Ge and/or GeSi on Si lateral interdigitated avalanche photodiode (APD), according to some embodiments. The photodiode can be and APD and/or single photon avalanche photodiode (SPAD) with a lateral P, I or low dope PN structure. A reverse bias is applied between the electrodes M1 and M2. In some cases, the lateral APD/SPAD can be a P, I or low dope N structure. The Ge, and/or GeSi layer thickness can range from 100 nm to 1000 nm or more, and in some cases 300 nm to 700 nm. A low temperature Ge buffer layer can be included prior to the high temperature growth of Ge on Si. For example, see reference Dehlinger et al, High-Speed Germanium-on-SOI Lateral PIN Photodiodes, IEEE Photonics Technology Letters, Vol. 16, No. 11, November 2004. These structures can be monolithically integrated with CMOS/BiCMOS ASICs, for example see reference, Koester et al, Ge-on-SOI-Detector/Si-CMOS-Amplifier Receivers for High-Performance Optical-Communication Applications, Journal of Lightwave Technology, Vol. 25, No. 1, January 2007. A box layer can be included, the Si device layer can have thickness ranging from 10 nm-1000 nm or more. Light or optical signal can impinge on the top surface of the Ge/GeSi or from the bottom surface Si or BOX surface. Wavelength can range from 800 nm to 1800 nm, and in some cases 800 nm-1400 nm or more, and in some cases from 800 nm-1550 nm.

A light shield can be included to shield the PNP multiplication region over the M2 electrode for example.

Figure 3B:
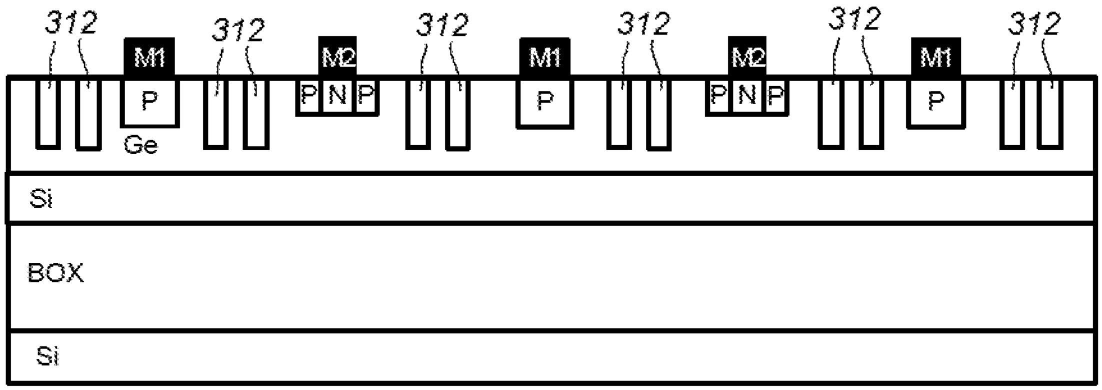
FIG. 3B is a schematic cross-section of a lateral avalanche photodiode (APD) or single photon avalanche photodiode (SPAD), according to some embodiments.

FIG. 3B is a schematic cross-section of a lateral avalanche photodiode (APD) or single photon avalanche photodiode (SPAD), according to some embodiments. The APD/SPAD interdigitated photodetector is similar to FIG. 3A except with the inclusion of microstructure holes for enhancement of absorption. The microstructure holes 312 are formed in the Ge/GeSi layer as shown and can have an etch depth ranging from 100 nm to 1000 nm or more, and in some cases the microstructure holes are partially in the Ge or etched though the Ge/GeSi to the Si layer, and in some cases into the Si layer, and in some cases through the Si layer to the BOX layer. The microstructure holes can be unfilled or partially filled, or fully filled with dielectric, and/or amorphous/poly semiconductor. The dimensions of the microstructure holes can range from 400 nm to 2000 nm, and in some cases 500 nm-1500 nm. The spacing between adjacent holes can range from 0 nm (touching or overlapping) to 1000 nm, and in some cases, from 100 nm to 500 nm. In the case of 0 nm or touching the holes can be conical such that the tops of the holes can touch, but not the bottoms of the holes. The cross-sectional shape of the holes can be cylindrical, conical, polygonal, and any combination of shapes. The holes can be circular, square, or polygonal, and can be aperiodic, and/or periodic, and/or random pattern.

Not shown in FIGS. 3A-B are passivation layers, CMOS/BiCMOS ASICs, anti-reflection coating, light shields, and isolation trenches to name a few.

Figure 4A:
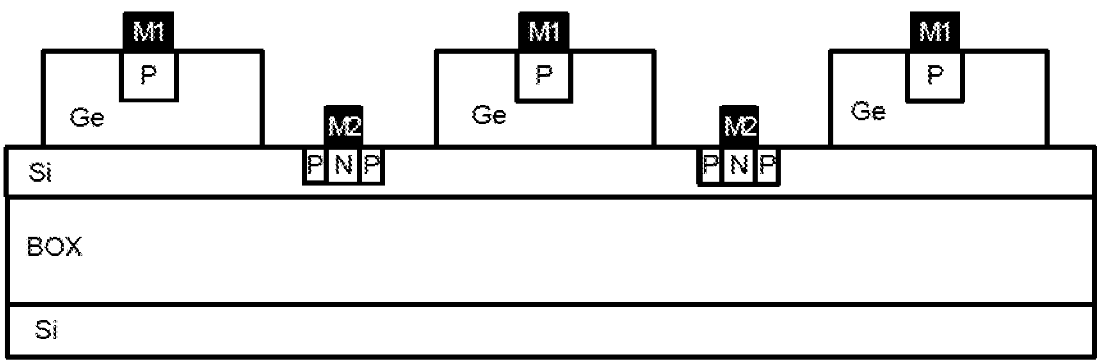
FIG. 4A is a schematic cross-section of a lateral interdigitated Ge or Ge/GeSi on Si APD where optical absorption occurs in the Ge, and multiplication occurs in Si, according to some embodiments.

FIG. 4A is a schematic cross-section of a lateral interdigitated Ge on Si APD where optical absorption occurs in the Ge, and multiplication occurs in Si, according to some embodiments. The structure can be a P (Ge/GeSi), I or low dope Ge/GeSi/Si and PN on Si. The strips of Ge under the M1 electrode can be grown using selective area growth or the strips can be formed by etching the Ge to the Si layer. The Ge/GeSi can be I or low doped with thickness ranging from 100 nm-1000 nm or more, and in some cases 300 nm-700 nm. A P doped well is formed in the Ge and the M1 electrode forms an ohmic contact to the P doped well. P and N wells are formed in the Si and the M2 electrode forms an ohmic contact to the N well. A reverse bias is applied between the M1 and M2 electrode. Multiplication occurs in the PN junction in the Si layer and photon absorption generating electron hole pairs occurs in the Ge/GeSi layer. For LiDAR (Light distance and ranging) applications the spacing between the interdigits can range from 1 micron to 100 microns or more, and in some cases 5 microns-50 microns. The width of the Ge strip can be 50% or more of the spacing between M1 and M2 electrodes. The width of the M1 and/or M2 electrode can range from 20 nm to 300 nm or more, and the length of the interdigitated electrode can range from 5 microns to 100 microns or more. The Si device layer can range from 10 nm to 1000 nm or more. A BOX layer can be included. Wavelength range of the optical signal or light can be from 1000 nm to 1800 nm, and in some cases 800 nm-1800 nm. In some cases, a light shield can be included to cover the multiplication region. Not shown are passivation layers, anti-reflection coating layers, CMOS/BiCMOS ASICs, transmission lines to name a few.

Figure 4B:
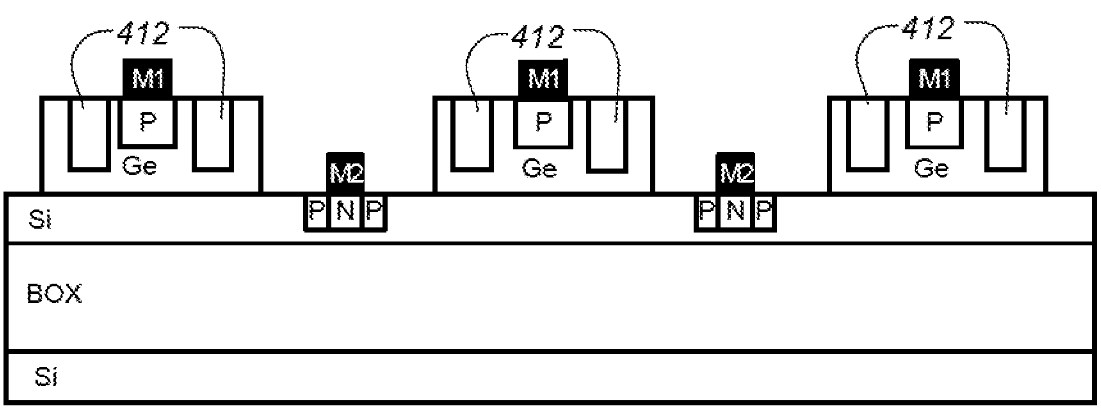
FIG. 4B is a schematic cross-section of a structure similar to FIG. 4A with the addition of microstructure holes 412 in the Ge/GeSi layer, according to some embodiments.

FIG. 4B is a schematic cross-section of a structure similar to FIG. 4A with the addition of microstructure holes 412 in the Ge/GeSi layer, according to some embodiments. As shown, there is a single microstructure hole between the M1 and M2 electrode, and in some cases there can be multiple holes between M1 and M2 electrodes depending on the spacing between the M1 and M2 electrodes. The hole dimensions are similar to those in FIG. 3B. The addition of microstructure holes 412 enhances the optical absorption and can have a higher external quantum efficiency than a similar structure such as in FIG. 4*a* at certain wavelength ranges. Photons can impinge on the top surface or from the bottom surface of the Si substrate. A reverse bias is applied between the M1 and M2 electrode with bias voltage ranging from 1 to 100 volts or more, and in some cases 5-35 volts.

In structures such as illustrated in FIGS. 4A-B, for wavelength range of 1000 nm or longer for example 1000 nm to 1800 nm and in some cases 1200 nm to 1600 nm photons are predominately absorbed in the Ge/GeSi layer and multiplication such as avalanche gain occurs in the Si PN region when the device is reverse biased between the anode (M1) and the cathode (M2) where the voltage or potential at M1 is more negative or lower than the voltage or potential at M2. The reverse bias can range from −3 volts to −50 volts or more, and in some cases −10 volts to −45 volts. In FIGS. 4A and 4B a lateral PI (or low dope) PN junction is shown, and in some cases it can be a PIPIN junction and in some cases PN junction, and in some cases Schottky junctions, and in some cases metal oxide semiconductor junctions, and in some cases any combination of junctions can be used. A lateral separate absorption multiplication APD/SPAD (single photon avalanche diode) is shown in FIGS. 4A and 4B. A vertical separate absorption multiplication APD is shown in Ref. Zaoui et. al, Origin of the Gain-Bandwidth-Product Enhancement in Separate-Absorption-Charge-Multiplication Ge/Si Avalanche Photodiodes. OSA/OFC/NFOEC 2009.

Figure 5A:
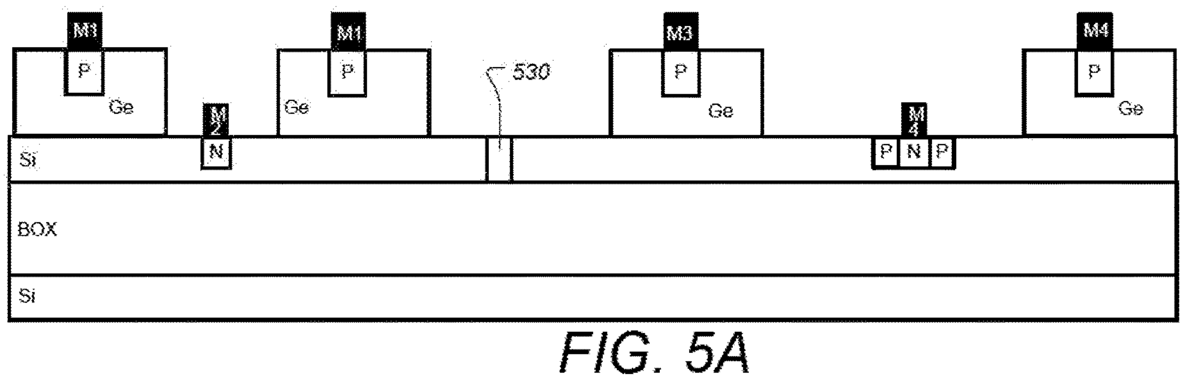
FIG. 5A is a schematic cross-section of interdigitated Ge/GeSi on Si photodiode with an interdigitated Ge/GeSi on Si APD/SPAD on a single chip, according to some embodiments.

FIG. 5A is a schematic cross-section of interdigitated Ge/GeSi on Si photodiode with an interdigitated Ge/GeSi on Si APD/SPAD on a single chip, according to some embodiments. Multiple photodiodes and APD/SPAD can be fabricated on a single Si chip integrated with CMOS/BiCMOS ASICs. In some cases, photodiodes and/or APD/SPAD can have different speed or data rate bandwidths by having different spacing between the interdigit electrodes which can change the transit time and the RC time of the photodetector. 2D arrays of photodiodes and APD/SPAD can be monolithically integrated with CMOS/BiCMOS ASICs electronics on a single chip, and in some cases Vertical Cavity Surface Emitting Lasers (VCSELs) and/or edge surface emitting lasers (ESELs) can be fluidic assembled on the same chip. Other assembly such as robotic assembly can also be used. In some cases, the photodiode and/or APD/SPAD can have a single cycle of the M1 and M2 and/or M3 and M4 electrodes separated by and isolation trench 530; for example the structure can be a lateral photodiode and/or APD/SPAD with a wide spacing between M1 and M2 and/or M3 and M4 electrodes. The spacing can be 20 microns-2000 microns or more, and in some cases 100 microns-2000 microns or more. In most cases the interdigits of the photodiode and/or APD/SPAD have multiple cycles of interdigits.

Figure 5B:
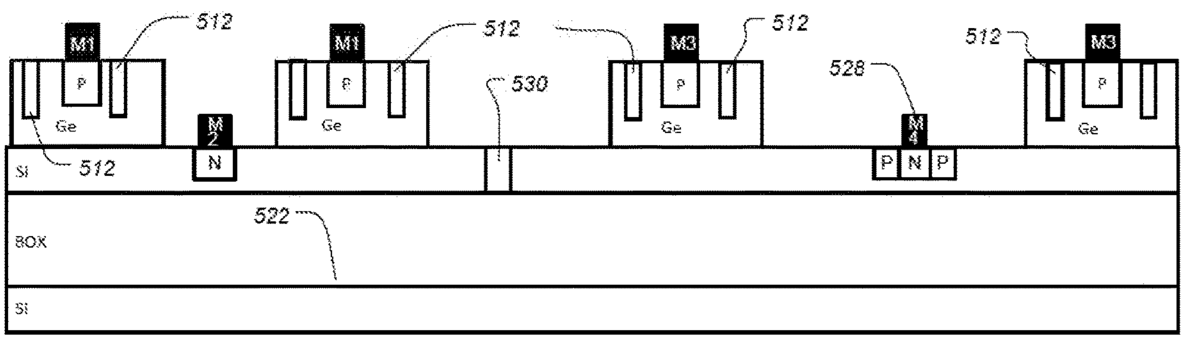
FIG. 5B is a schematic cross-section of lateral photodiode together with a lateral APD/SPAD similar to FIG. 5A with the addition of microstructure holes to enhance absorption and therefore the external quantum efficiency (EQE), according to some embodiments.

FIG. 5B is a schematic cross-section of lateral photodiode together with a lateral APD/SPAD similar to FIG. 5A with the addition of microstructure holes 512 to enhance absorption and therefore the external quantum efficiency (EQE), according to some embodiments. Photodetectors with microstructure holes can have a higher EQE than a similar photodetector without microstructure holes at certain wavelength ranges. In some cases for the photodiode, the M2 can be formed on the Ge and in some cases the APD/SPAD the M4 and the multiplication regions can also be formed on the Ge.

Figure 6:
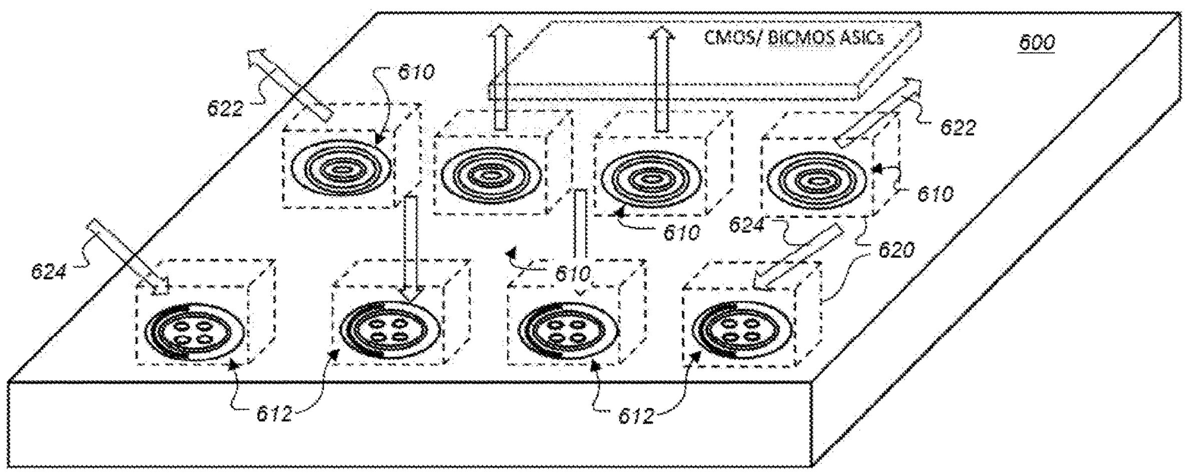
FIG. 6 is a simple 3D perspective view of a chip where the photodetectors are monolithically integrated with CMOS/BiCMOS ASICs electronics and lasers, according to some embodiments.

FIG. 6 is a simplified 3D perspective view of a chip where the photodetectors are monolithically integrated with CMOS/BiCMOS ASICs electronics and lasers, according to some embodiments. The surface emitting lasers, VCSELS and ESELs 610 can be assembled on the Si chip 600 using techniques that can include fluidic assembly and robotic assembly to name a few. Structures 620 can be formed on the surface of the chip at wafer-scale levels to assist the coupling of outgoing light 622 to optical fibers for optical interconnect applications, and in the case of LiDAR applications structures 620 can be formed over the surface emitting lasers to direct the incoming light 624 at an angle off normal to the surface and for the photodetector structures can be formed to collect incoming light 624 from certain angles off normal from the surface. In some cases, the structures 620 can direct light normal to the surface for both the laser and for the photodetector. In the case for directing light from the laser at angles off normal micro-prisms can be used in conjunction in some cases with a lens. Similarly, for collecting light coming in at an off angle, micro-prisms and lens can be used for the photodetectors 612. In this way a single chip can cover a wide angle for LiDAR applications. The chip can include multiple lasers 610 and detectors 612 in 1 or 2D arrays. The structures 620 for guiding the light and/or focusing the light, and/or directing the light can be formed using micro printing techniques and/or lithographic techniques. In some cases, laser ablation can be used together with lithographic techniques, and/or micro printing techniques.

For optical data communication using structures such as illustrated in FIG. 6, 1 or 2D arrays of monolithically integrated Si and/or Ge on Si photodetectors which can be vertical or lateral in structure with CMOS/BiCMOS ASICs and where 1 or 2D arrays of surface emitting lasers which can be vertical cavity surface emitting lasers and/or edge surface emitting lasers in 1 or 2 arrays can be assembled on the same Si chip as the photodetector and CMOS/BiCMOS ASICs. The CMOS/BiCMOS ASICs are connected to the photodetector array and a separate set of CMOS/BiCMOS ASICs can be connected to the surface emitting laser array at the wafer scale level using back end of the line (BEOL) processing methods. This single chip for example can provide multiple channel of optical transmitter and multiple channel of optical receiver. In some cases, the array of optical transmitters can be light emitting diodes. The laser or light emitting diode arrays can be assembled in a single or multiple chips that can have the same or different wavelength, and in some cases surface emitting laser and light emitting diodes singly or in array can be assembled on the same Si chip as the array of photodetectors that can be singly or array. Optical bandpass filters can be formed over the optical detectors to select different wavelengths of incoming signals if needed.

For LiDAR applications using structures such as illustrated in FIG. 6, arrays of laser and/or light emitting diode can be assembled for example using fluidic assembly or robotic assembly on the Si chip that contains the monolithically integrated photodetectors connected to CMOS/BiCMOS ASICs for signal processing. A separate set of CMOS/BiCMOS ASICs on the same chip can be used to drive the laser and/or LED arrays, and where the lasers and LEDs can be singly or in arrays. For LiDAR applications the optical transmitter can be a single or multiple or stream of optical pulses that can be coded to enhance optical detector sensitivity and/or to distinguish the optical pulses from signals emitted by other LiDAR systems. In the case of LiDAR the pulses can have repetition rates ranging from approximately 100 hertz or less to MHz, and in some cases KHz whereas for optical data communication in data center interconnect for example optical pulse repetition or data rate range from 1 Gb/s to 50 Gb/s or more and in some cases 25 Gb/s to 50 Gb/s, and in some cases greater than 50 Gb/s. For certain optical data communication such as automotive or aeronautics data rate can range from 10 s Mb/s to 10 Gb/s or more, and in some cases from 0.5 Gb/s to 10 Gb/s or more.

The wavelength range for optical data communication using structures such as illustrated in FIG. 6, can range from 800 nm to 1750 nm, and the wavelength range for LiDAR can range from 800 nm to 1600 nm.

Figure 7A:
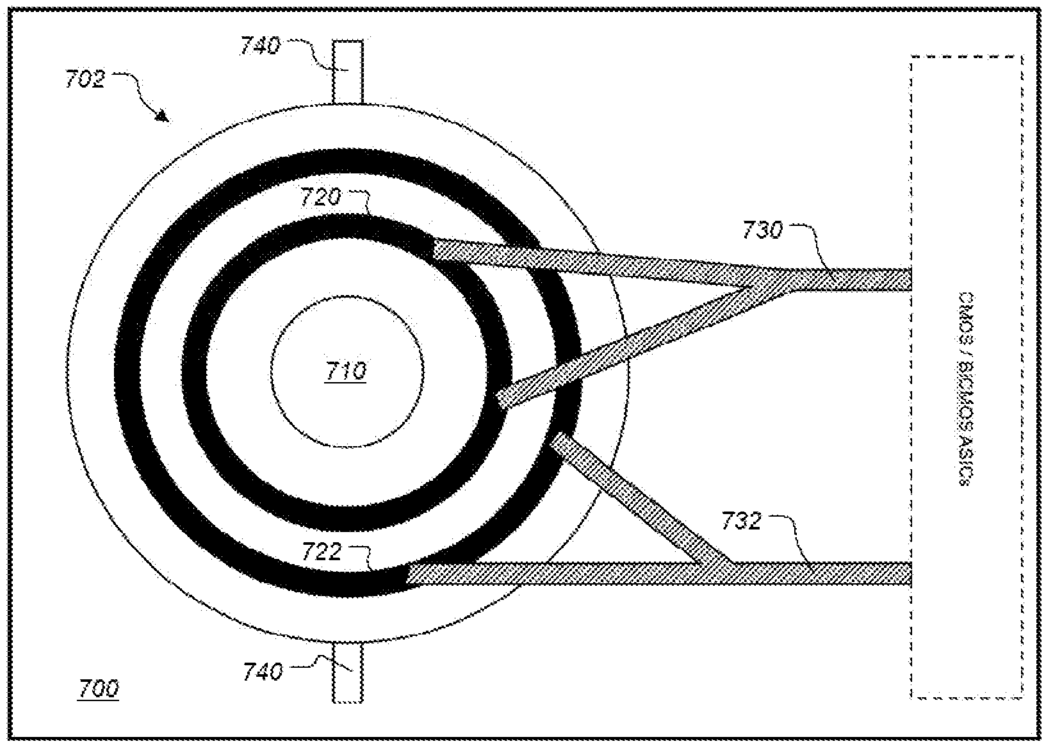
FIG. 7A is a schematic top view of a surface emitting laser, according to some embodiments.

FIG. 7A is a schematic top view of a surface emitting laser, according to some embodiments. In this case, a vertical cavity surface emitting laser 702 is fluidically assembled onto a monolithic silicon chip 700, where the photodetector and the CMOS/BiCMOS ASICs are integrated. Once the laser 702 is fluidically assembled, heat can be applied to solder the bottom of the laser 702 to the bottom surface of a hole that was etched in the silicon chip 700 to receive the laser 702. The laser 702 has a light emitting area 710 and one or more tabs 740 near its top surface to prevent the laser 702 from being positioned upside down. Once the laser 702 is assembled onto the silicon chip, transmission lines 730 and 732 from the CMOS/BiCMOS ASICs electronics such as laser driver electronics can be attached to the anode 720 and cathode 722, respectively, of the laser 702. In some cases, a single wide transmission line can be attached to the cathode, and a single wide transmission line can be attached to the anode 720. In some cases, the transmission line 730 can branch, for example a Y branch such that the transmission line contacts the anode 720 at two places as shown in FIG. 7A. Similarly, the transmission line 732 for the cathode can also branch in a Y geometry such that it attaches at two places on the cathode 722. In case any of the tabs at the edge of the laser is in the same position as the transmission line at least one of the branch can make contact with the anode or cathode. The transmission lines 730 and 732 can be applied using standard CMOS process and lithography. Multiple branches of the transmission line to the laser ensures a successful electrical contact to the anode and cathode.

Figure 7B:
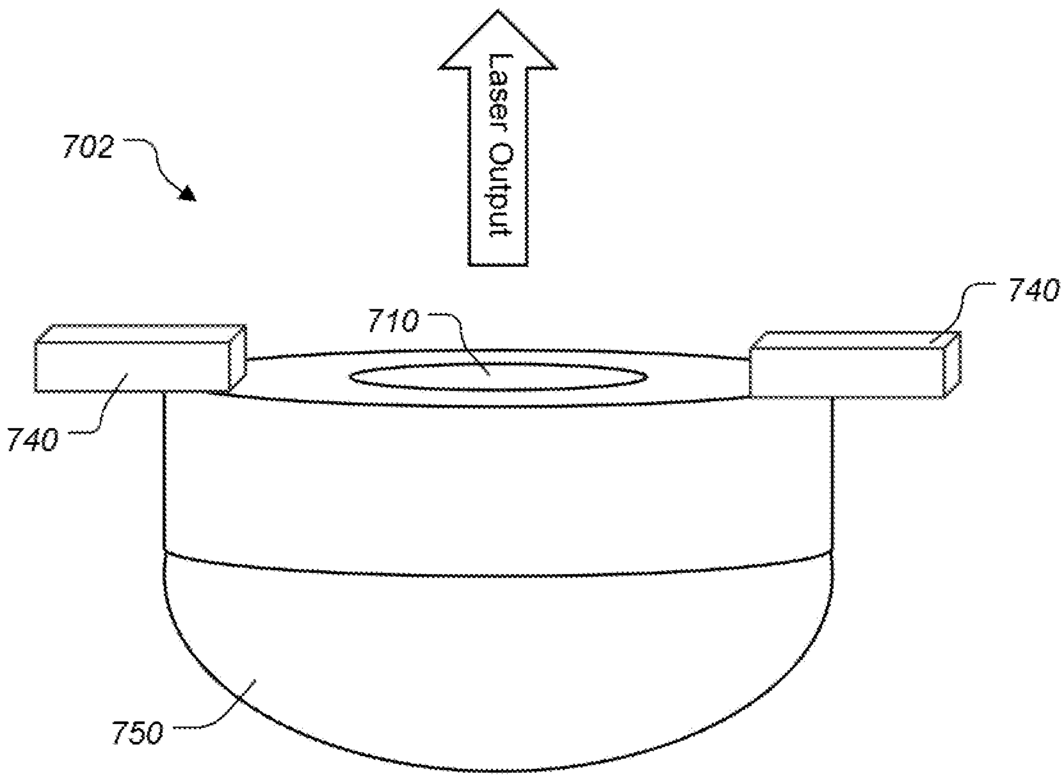
FIG. 7B is a partial side view schematic drawing of a surface emitting laser chip with tabs on its top surface.

FIG. 7B is a partial side view schematic drawing of a surface emitting laser chip 702 with tabs 740 on its top surface such that during fluidic assembly it cannot fall into the designated hole upside down. In addition, solder bump 750 can be added to the bottom of the surface emitting laser chip to assist in attaching the chip to the Si wafer after a brief thermal cycling to melt the solder. The weight of the solder on the bottom of the surface emitting laser chip can also facilitate the process of fluidic assembly or any other self-assembly methods since the bottom of the chip in heavier.

Figure 8A:
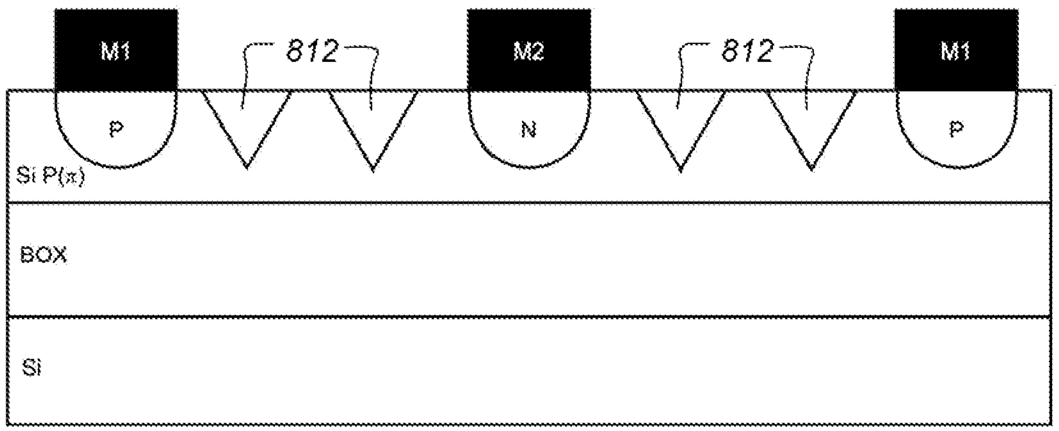
FIGS. 8A-8E are cross-sections of photodiodes according to some embodiments.
Figure 8B:
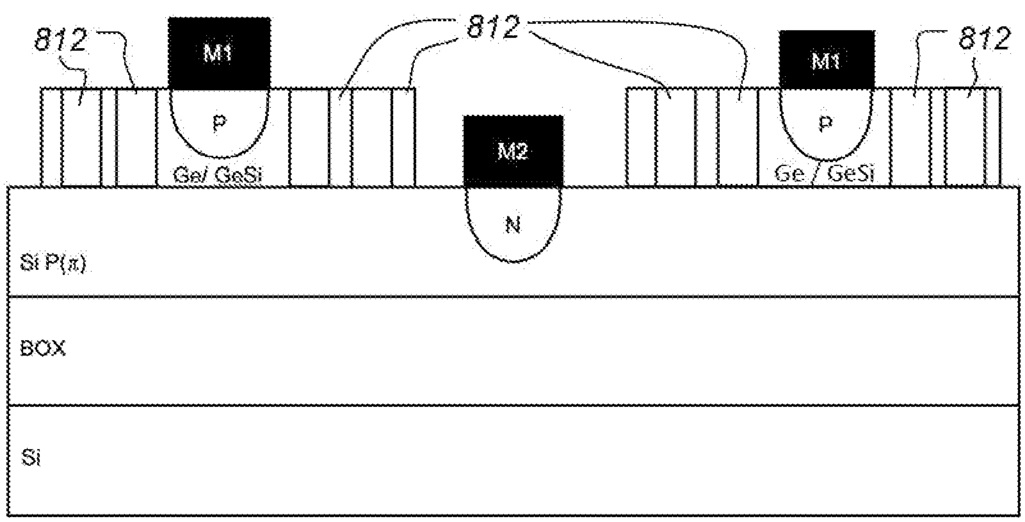
Figure 8C:
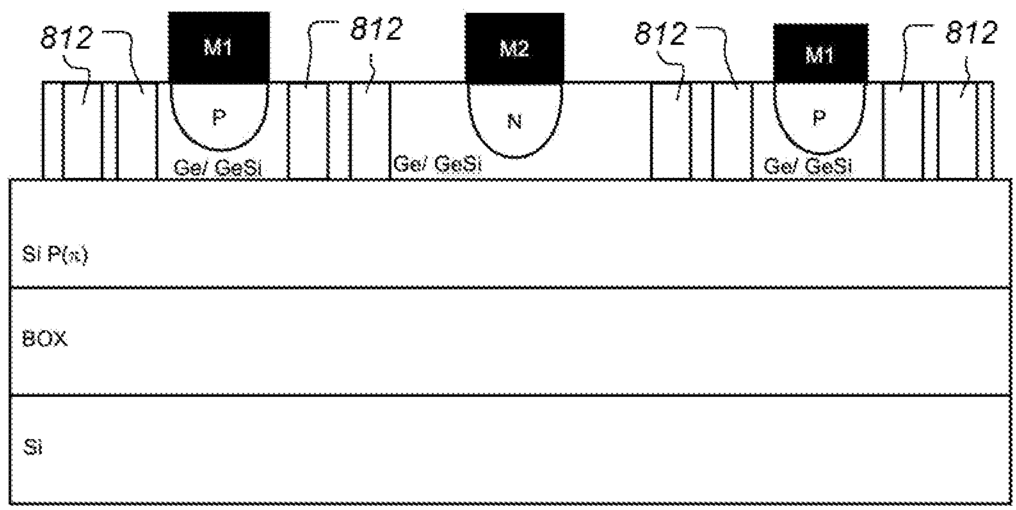

FIGS. 8A-8C are cross-sections of photodiodes according to some embodiments. The photodiodes shown in FIGS. 8A-8C share similar characteristics in terms of interdigit electrode spacing, hole dimensions, data rate and bandwidth.

FIG. 8A is a schematic cross-section of a silicon interdigitated photodiode with microstructure holes between the interdigits. A P well can be formed under interdigit M1 for example, and a N well can be formed under interdigit M2. The depth of the P and N wells can range from 10 nm-1000 nm or more, and in some cases approximately one half the thickness of the silicon device layer, and in some cases extending to the BOX layer. The silicon interdigitated photodiode is fabricated on a SOI wafer (silicon on insulator) with a buried oxide (BOX) layer ranging in thickness from 10 nm-2000 nm or more, and the silicon device layer can have a thickness ranging from 300 nm-1000 nm or more, and in some cases the thickness can range from 500 nm-1000 nm, and in some cases the thickness can range from 1000 nm-5000 nm or more. The Si device layer can be undoped or low doped, and in some cases can be low P dope such as $P^{--}$ ($\pi$), and in some cases the Si device layer can be $N^{--}$ ($\pi$). The spacing between the M1 and M2 can range from 300 nm or less, and in some cases the spacing between M1 and M2 can range from 300 nm-2000 nm, and in some cases the spacing between M1 and M2 electrodes can range from 1000 nm-10,000 nm, and in some cases the spacing between the M1 and M2 electrodes can range from 5000 nm-50,000 nm. Microstructure holes for enhancing the optical absorption and therefore the external quantum efficiency are etched into the Si with depths ranging from 300 nm-1000 nm or more, and in some cases approximately halfway into the device layer, and in some cases to the BOX layer. The hole cross-section can be an inverted pyramid, and in some cases can be cylindrical, and in some cases can be polygonal. The depth of the holes can have variations and the top lateral dimension of the holes can also vary in width. The spacing of the holes can be 0 (overlapping), and in some cases can range from 10 nm-500 nm, and in some cases from 0 nm-300 nm, and in some cases greater than 500 nm. The top lateral dimension of the holes can range from 500 nm-2000 nm, and in some cases from 600 nm-1,600 nm, and in some cases from 600 nm-1000 nm. The holes can be periodic and/or aperiodic, and in some cases can be randomly arranged. Wavelength can range from 750 nm-1000 nm, and in some cases from 800 nm-980 nm, and in some cases from 800 nm-900 nm. A reverse bias is applied between the P(M1) and N(M2) with bias voltages ranging from −1 volt to −100 volts or more, and in some cases from −1 volt to −35 volts. Data rate can range from 1 Gb/s to 50 Gb/s or more, and in some cases from 10 Gb/s to 25 Gb/s, and in some cases from 25 Gb/s to 50 Gb/s. In LiDAR applications the impulse response of the interdigitated photodiode to an impulse of light for example to an impulse of laser light, the rise time of the impulse response needs to range from a few picoseconds to a few nanoseconds. Depending on the resolution of the distance needed, for example for a 30 cm resolution, the rise time which is often defined as the 10-90% of the peak response need to be 1 nsec approximately, and for higher distance resolution, for example for a 1 cm distance resolution the rise time of the impulse response need to be approximately 30 psec or less. The number of pulses per second for LiDAR can range from 5 pulses/second to 1000 pulses/second or more. In this case the fall time can be significantly longer than the rise time. See for example ref. Hallman et al, Detection jitter of pulsed time-of-flight lidar with dual pulse triggering, Review of Scientific Instruments 85, 036105 (2014)

In some cases, in structures such as illustrated in FIGS. 8A-E as the reverse bias is increased the (EQE) can increase due to avalanche gain or multiplication. In some cases this lateral PIN where the I region can be π or ν can function as an avalanche photodiode and/or a single photon avalanche photodiode. In some cases, a high-density array of these lateral PIN photodiodes can be used for LiDAR imaging. The high-density array can have n×m photodiodes where n and m are any digits, for example 10×10, 100×100, 1,000×1,000 to name a few.

In structures such as illustrated in FIGS. 8A-E EQE can range from 20%-80% or more at certain wavelengths, and in some cases EQE can range from 40%-90% or more at certain wavelengths, and in some cases EQE can range from 40% to over 100% with avalanche gain at certain wavelengths. The EQE of interdigitated photodiode with microstructure holes can be greater than the EQE of a similar interdigitated photodiode without microstructure holes at certain wavelengths.

In structures such as illustrated in FIGS. 8A-C the P well is predominately under the M1 interdigit electrode, and the N well is predominately under the M2 electrode, and in some cases the P and N can be interchanged.

In structures such as illustrated in FIGS. 8A-C the width of the interdigits M1 and M2, and in some cases more than 2 interdigits can range from 300 nm to 3 nm, and in some cases from 150 nm to 90 nm, and in some cases from 90 nm to 15 nm, and in some cases from 10 nm to 3 nm.

FIG. 8B shows a Ge/GeSi on Si or on SOI wafer with interdigitated electrodes with microstructure holes in the Ge/GeSi layer, and with a lateral P, I or low dope, N structure where the P is in the Ge/GeSi and the N is in Si. In some cases lateral PINs can also be NIPs with the P and N interchanged. The Ge/GeSi is I or low dope and can be π or ν. The thickness of the Ge/GeSi can range from 200 nm-1000 nm or more, and in some cases 300 nm-1000 nm. The Si layer can be a π or ν or I with thickness ranging from 10 nm to 1000 nm or more, and the BOX layer thickness can range from 10 nm to 2,000 nm or more on a Si substrate. The P well formed in the Ge/GeSi layer can have a well depth ranging from 10 nm to 1000 nm or more, and the P well is confined under the M1 electrode. The N well confined under the M2 electrode in Si can have a depth ranging from 10 nm to 1000 nm or more. Microstructure holes are etched in the Ge/GeSi layer and can extend partially or entirely through the Ge/GeSi layer to the Si layer, and in some cases, can extend into the Si layer. The lateral dimension of the holes can range from 600 nm to 1800 nm, and the spacing between the holes can range from 50 nm to 300 nm or more. The microstructure holes can be circular, oval, square, polygonal, and/or any combination of shapes. The cross-section shape of the microstructure hole can be cylindrical, conical, polygonal, or any combination of shapes. In some cases, the P well can extend beyond M1 and can cover partially or entirely the top surface of the Ge/GeSi. The Si layer under the Ge/GeSi can be N doped and in some cases $N^+$ doped. In this case the PIN structure can be vertical.

In structures such as illustrated in FIGS. 8A-E, wavelength range can be from 800 nm to 1,600 nm or more, and in some cases 800 nm-1,100 nm, and in some cases from 1,000 nm to 1,400 nm, and in some cases from 1,250 nm to 1,350 nm, and in some cases from 1,500 nm to 1,600 nm or more. A reverse bias is applied between the P and N with voltages ranging from −1V to to 100V or more, and in some cases from −1V to −35V. As the reverse bias voltage increases avalanche gain or multiplication can occur. The EQE can range from 20% to 80%, and in some cases from 40% to 90%, and in some cases from 40% to 100% or more with avalanche gain/multiplication at certain wavelengths. The EQE of microstructure hole interdigitated photodiode can have an EQE higher than a similar interdigitated photodiode without holes at certain wavelengths. As in FIG. 8*a*, the microstructure holes can be periodic, aperiodic, and/or randomly arranged. The spacing between the interdigits can be similar to those in FIG. 8A with similar data rate bandwidth and rise time of the impulse response. M1 can be the anode, M2 can be the cathode and a reverse voltage bias is applied between M1 and M2. In some cases, the voltage bias between M1 and M2 can be a forward bias where the voltage at M1 is larger than the voltage at M2. In some cases, avalanche gain can be observed when M1 and M2 are reverse or forward biased however noise due to the avalanche gain can be lower in the case of reverse bias where the multiplication occurs in Si.

FIG. 8C is similar to FIG. 8B except the N well is in the Ge/GeSi layer as shown. Reverse bias is applied between P anode and N cathode. Optical signal can impinge from the top surface (interdigit surface) or the bottom surface, substrate surface. Wavelength of the optical signal can range from 800 nm-1800 nm, and in some cases from 800 nm-1600 nm. In some cases, the wavelength range is from 1000 nm-1400 nm, and in some cases from 1250 nm-1550 nm. The thickness of the Ge/GeSi can range from 300 nm-1000 nm or more, and in some cases from 500 nm-1000 nm. Data rate for optical interconnect application can range from 10 Gb/s-50 Gb/s or more, and in some cases from 25 Gb/s-50 Gb/s, and in some cases 100 Gb/s or more.

In structures such as illustrated in FIGS. 8A-E, the width of the interdigits can range from 300 nm to 100 nm, and in some cases from 100 nm to 20 nm, and in some cases from 20 nm to 3 nm. In some cases the width of the interdigits can be greater than 300 nm.

For LiDAR applications using structures such as illustrated in FIGS. 8A-E, the 10%-90% rise time can range from 1 psec to 100 psec, and in some cases from 100 pec to 1000 psec or more, and the fall time can be longer than the rise time.

With reverse bias in structures such as illustrated in FIGS. 8A-E the EQE can range from 10% to 100% or more with avalanche gain, in some cases 20%-80% with or without avalanche gain, and in some cases over 100% with avalanche gain at some wavelengths. Interdigitated photodetectors with microstructure holes can have higher EQE than a similar interdigitated photodetector without microstructure holes at certain wavelengths.

Figure 8D:
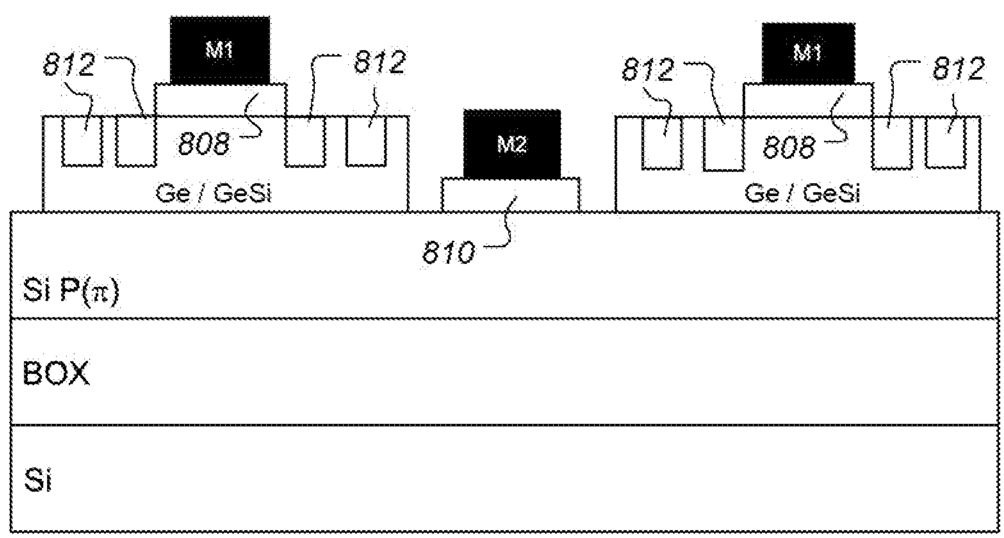

FIG. 8D shows a similar structure as FIG. 8B except that the PN junctions are replaced with metal/poly Si/semiconductor and/or metal dielectric semiconductor and/or metal semiconductor junctions. To reduce leakage current polySi and/or dielectric such as Si oxide, Al oxide, Hf oxide (layer 808) can be used between the metal and semiconductor. The oxide or dielectric can have a thickness ranging from 0.5 nm to 5 nm or more, and in some cases 1-2 nm. As shown in FIG. 8*d* a polySi layer or dielectric/oxide layer 808 can be inserted between the M1 electrode and the Ge/GeSi to reduce leakage. In some cases, the M1 electrode can be directly on the Ge/GeSi. In some cases where polySi 808 is used between the M1 and the Ge/GeSi interface the polySi can be doped N or P type or undoped or lowdoped, and can have a thickness ranging from 1-100 nm or more. As shown in FIG. 8D the M2 electrode can have a thin oxide/dielectric layer 810 between the M2 and the Si surface to form MOS (metal oxide semiconductor) junction. In some cases, the M2 can be directly on the Si surface to form a Schottky junction. Microstructure holes 812 are formed on the Ge/GeSi layer. The Ge/GeSi layer can have a thickness ranging from 300 nm-1000 nm or more, and in some cases 300 nm-900 nm. Reverse bias can be applied between the M1 and M2 electrodes where the M1 electrode has a more negative voltage than the M2 electrode. With this bias condition avalanche gain can be observed and can have a lower noise than biasing the M1 electrode at a higher voltage than the M2 electrode. In some cases, a voltage can be applied to the M1 and M2 electrodes where M1 electrode has a higher potential than the M2 electrode, and in some cases the M1 electrode can have a lower potential than the M2 electrode at certain biases.

Under voltage bias condition where avalanche gain is observed it is desirable that the avalanche gain or multiplication occurs in Si for the lowest noise in structures such as illustrated in FIG. 8B, and for this to occur the voltage bias between M1 and M2 should be reverse biased in the sense that M1 has a lower voltage or potential than M2.

Optical signals can impinge on the top surface (electrode surface) or from the bottom surface (Si substrate) in structures such as illustrated in FIGS. 8A-E. The BOX layer can be optional and in the case of Ge/GeSi on Si photodetectors the BOX layer can be optional. In some cases the Ge/GeSi layer can be grown in a recessed region of the Si such as a trench so that the M1 and M2 electrodes can be approximately on the same plane.

The lateral Ge/GeSi photodetector singly or in array can be monolithically integrated with CMOS/BiCMOS application specific integrated circuits (ASICs) in structures such as illustrated in FIGS. 8A-E. The CMOS/BiCMOS ASICs are not shown in this figure. Applications of Ge/GeSi on Si lateral photodetectors can include optical data communication, imaging and LiDAR to name a few. In the case of optical communication which depends on the data rate the lateral dimension of the photodetector can range from 30 microns-300 microns or more, and in some cases from 20 microns to 200 microns. For imaging and/or LiDAR applications the lateral dimensions of the photodetector can range from 50 microns to 1000 microns or more.

Figure 8E:
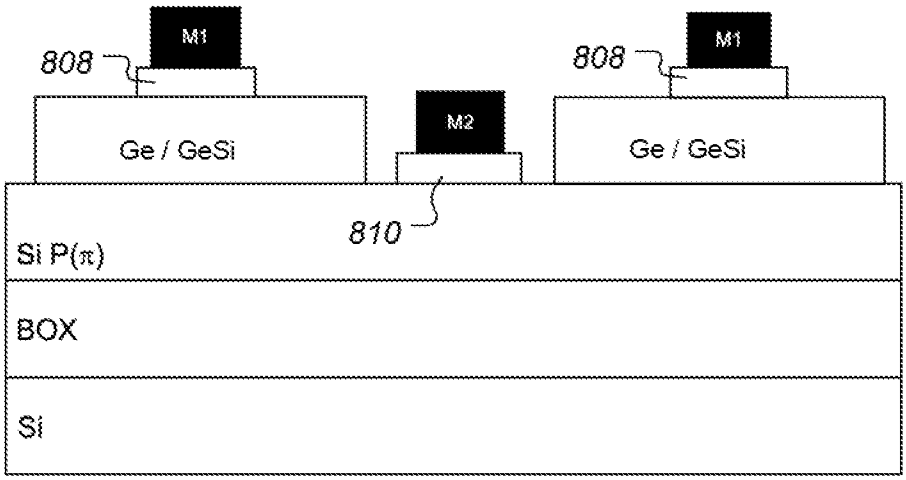

FIG. 8E is similar to FIG. 8D but without microstructure holes formed. In some cases, lateral Ge/GeSi on Si photodetectors can be with microstructure holes and without microstructure holes on the same chip that can be monolithically integrated with CMOS/BiCMOS ASICs. The BOX layer can be optional for Ge/GeSi on Si photodetectors.

A mixture P and N junctions, MOS junctions, Schottky junctions, metal polySi semiconductor junctions can be applied to lateral interdigitated photodetectors in any combination in structures such as illustrated in FIGS. 8A-E having both photodetectors and active electronic circuits, e.g., ASICs, on or in the same chip.

Reference Dushaq et al, Metal-germanium-metal photodetector grown on silicon using low temperature RF-PECVD, Optics Express Vol. 25, No. 25, 11 Dec. 2017 shows a metal-germanium-metal photodetector where both electrodes are in contact with Ge unlike in FIG. 8E, one electrode is on Ge and the other electrode is on Si.

Figure 9:
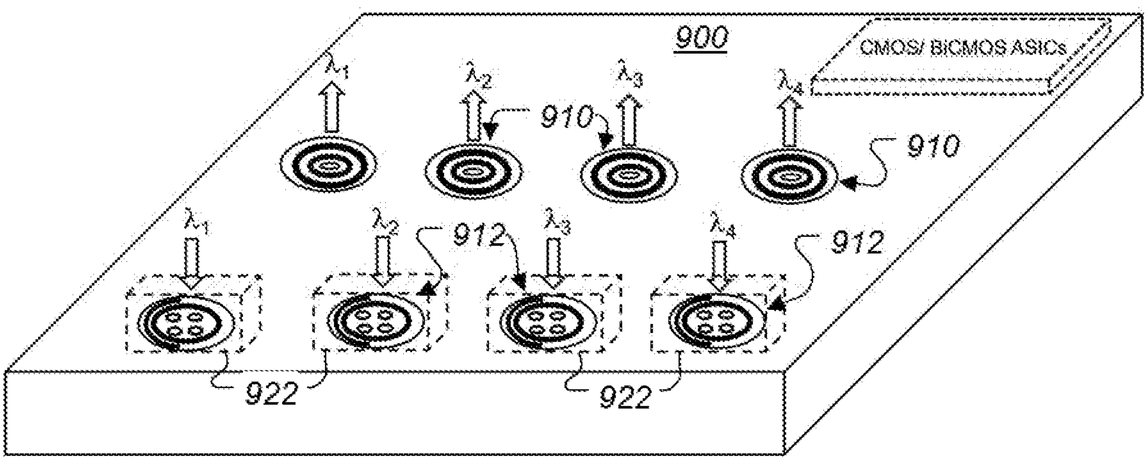
FIG. 9. is a simplified partial top view drawing of a single chip with detector and laser arrays, and where the detectors are monolithically integrated with CMOS/BiCMOS electronics, according to some embodiments.

FIG. 9. is a simplified partial top view drawing of a single chip with detector and laser arrays, and where the detectors are monolithically integrated with CMOS/BiCMOS electronics, according to some embodiments. On a single Si chip 900, Si/GeSi microstructure hole photodetectors 912 are monolithically integrated with CMOS/BiCMOS ASICs. The lasers 910 can be vertical cavity surface emitting lasers or edge surface emitting lasers that can be assembled on the chip using methods such fluidic assembly. Arrays of lasers 910 at the same or different wavelength can be used to illuminate the target in the case of LiDAR application, and the photodetectors 912 can detect at the same wavelength or different wavelengths. In the case of the detectors 912 detecting at different wavelengths, band pass filters 922 can be formed on the photodetectors 912 using techniques such as inkjet printing or 3D printing. In this figure, four example wavelengths, $\lambda_1$, $\lambda_2$, $\lambda_3$, and $\lambda_4$ are shown. Each laser 910 emits at a different wavelength $\lambda_1$, $\lambda_2$, $\lambda_3$, and $\lambda_4$ and the detector array can detect at the four different wavelengths $\lambda_1$, $\lambda_2$, $\lambda_3$, and $\lambda_4$. Multiple lasers with the same or different wavelength can increase the accuracy of LiDAR applications, see for example ref; Jo et al, High resolution three-dimensional flash LIDAR system using a polarization modulating Pockels cell and a micro-polarizer CCD camera, Optics Express Vol. 24, No. 26, December 2016. In order to reduce interference from other LiDAR systems such as other automotive systems, the LiDAR signal pulses can be coded into multiple pulses, and in some cases with different wavelengths, fired at a certain sequence of single or multiple pulses such that this coding and/or sequence can be unique or typically unique for individual LiDAR systems.

In structures such as illustrated in FIG. 9, for optical interconnect applications using different wavelengths lasers and with photodetectors with microstructure holes and with band pass filters on each of the photodetectors that can select a different wavelength, the aggregated data rate of this transceiver chip can range from 100 Gb/s-400 Gb/s on a single optical fiber using coarse wavelength division multiplexing (CWDM). And in some cases wavelength division multiplexing or dense wavelength division multiplexing (DWDM) can be used.

Figure 10:
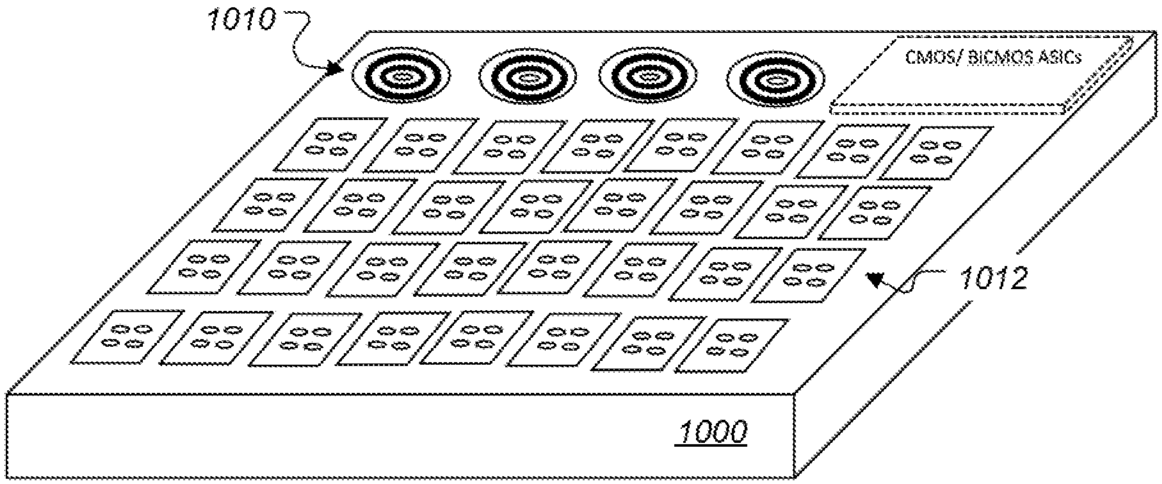
FIG. 10. is a simplified partial schematic top view drawing of a chip with lasers and 2D array of microstructure hole photodetectors that can be used for 3D imaging in LiDAR systems, according to some embodiments.

FIG. 10. is a simplified partial schematic top view drawing of a chip with lasers and 2D array of microstructure hole photodetectors that can be used for 3D imaging in LiDAR systems, according to some embodiments. The array of photodetectors 1012 can range from 5×5 to 1000×1000 or more, see for example ref; Hamamatsu, Photodetectors for LiDAR, https://www.hamamatsu.com/resources/pdf/ssd/Photodetector_lidar_kapd0005e.pdf. The chip 1000 can contain 1 or more lasers, and in some cases no lasers are included. The photodetector array with microstructure holes can be monolithic integrated with CMOS/BiCMOS ASICs. In some cases, band pass filters can be applied to some or all of the photodetector in the array for more accurate 3D imaging in LiDAR applications.

Structures as illustrated in FIG. 10, with such high density of microstructure hole photodetectors can be also used in ultra-high aggregated data rate in optical interconnect applications. Aggregated Data rates of 1 Tb/s can be achieved with single or multiple optical fiber bundles or ribbons. Multiple streams of optical signal at different wavelengths can be included in a single fiber using CWDM.

Figure 11A:
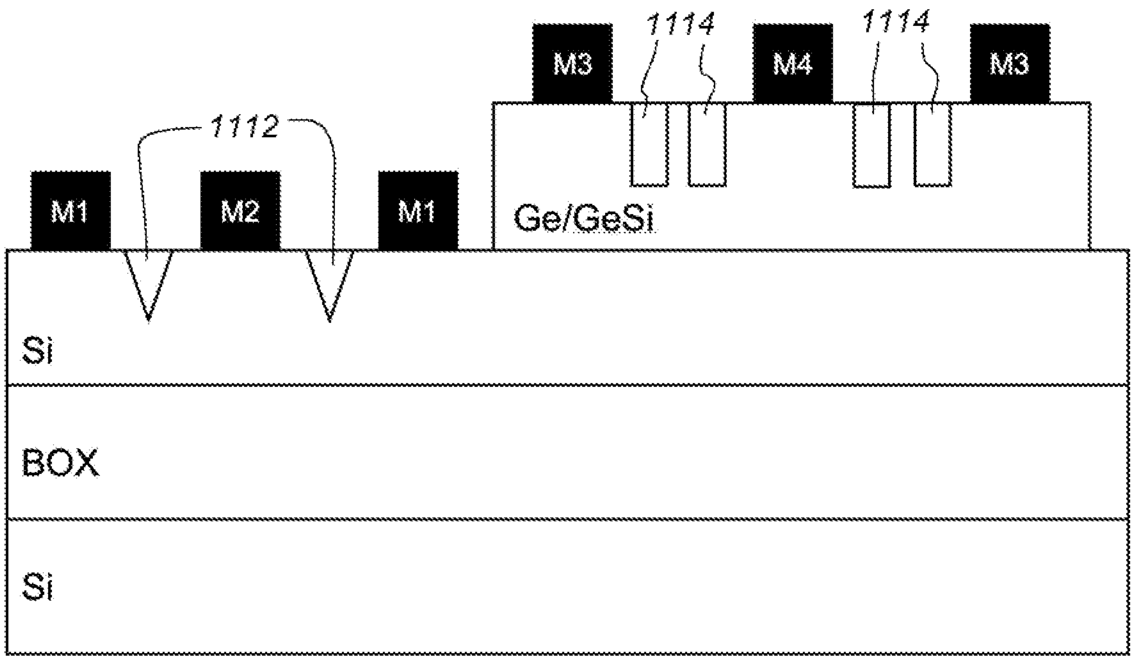
FIGS. 11A-B are partial simplified cross-section schematics of lateral photodetectors.

FIG. 11A is a partial simplified cross-section schematic of lateral photodetector that can include both a lateral Si photodetector and a lateral Ge/GeSi photodetector on a single chip that can be monolithically integrated with CMOS/BiCMOS electronics. The photodetectors can be single and/or 1D or 2D arrays. The photodetectors can be MSM and/or lateral PIN and/or lateral PIPN photodiodes that can operate in either the photodetector mode "no multiplication or gain" or in avalanche photodiode mode with multiplication or gain, and in some cases can operate in single photon avalanche photodiode mode also sometimes known as the Geiger mode. Ref. Renker, Geiger-mode avalanche photodiodes, history, properties and problems, Nuclear Instruments and Methods in Physics Research A 567 (2006) 48-56. Microstructure holes can be formed in the Si (1112) and/or Ge/GeSi (1114) photodetector. In some cases, microstructure holes may not be necessary in certain applications, and some lateral photodetectors may not have microstructure holes. In some cases, the BOX layer shown in FIG. 11A can be optional. And in some cases, one or more of the photodetectors can be a hybrid vertical structure as shown in FIGS. 2A-2D.

Figure 11B:
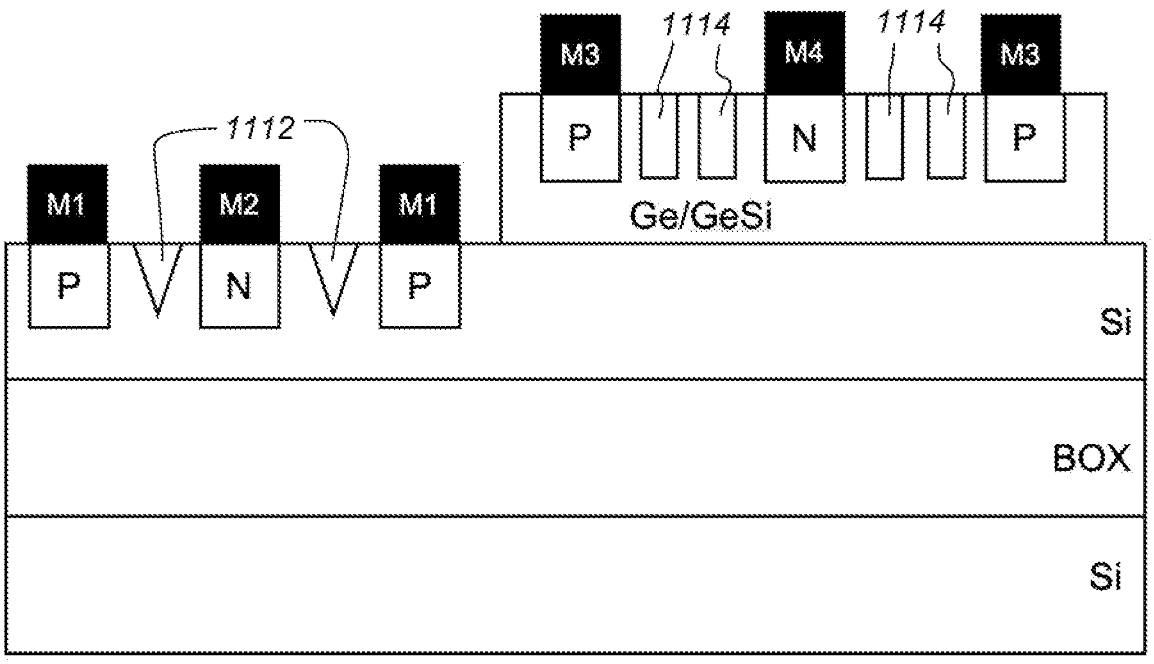

In some cases of structures such as illustrated in FIGS. 11A-B, M1 and M2 can be different metal such as M1 can be Al and M2 can be Cr, and in some cases M1 can be Al and M2 can be Au, Ni, Pt, W to name a few. In some cases, M1 or M2 can be Al, Au, Ni, V, Hf, Ti, Ta to name a few where M1 and M2 can have different metal or metal alloys or silicide. In some cases, M1 and/or M2 can have an oxide layer at the interface between M1 and the semiconductor such as Si and/or Ge/GeSi. In some cases, the barrier layer between M1 and/or M2 and the semiconductor can be a material other than oxide or metal oxide or Si oxide such as Si nitride, Si carbide, to name a few. The barrier layer which can be SiOx, HfOx, TiOx to name a few or SiNx, SiC for example can have layer thickness ranging from 0.2 nm to 10 nm in some cases the barrier layer can be poly and/or amorphous Si or other semiconductor such as Ge/GeSi. The same can be applied to M3 and M4 electrodes. The Si device layer can be low dope N or low dope P type, and in some cases intrinsic. The Ge/GeSi layer can be low dope N, or low dope P, and in some cases intrinsic. The width of M1, M2, M3, M4 can be different and can have width ranging from 3 nm-300 nm or more. The BOX layer in some cases can be optional. In cases without the BOX layer the Si substrate onto which the Si MSM are fabricated on can be low dope N, or low dope P, or intrinsic with resistivity ranging from 1 to 100 Ohm-cm or more. In some cases the Si photodetector as in FIG. 11A can operate at wavelengths within a range from 700 to 1100 nm.

FIG. 11B is a simplified partial cross-section schematic of lateral photodetectors that can include both lateral Si photodetectors and Ge/Ge on Si photodetectors similar to FIG. 11A where P and N junctions are used instead of metal semiconductor Schottky junctions and/or metal oxide semiconductor junctions. The photodetectors can operate in photodiode mode, avalanche photodiode mode, single photon avalanche mode. In some cases at least 1 photodetector can operate in the photodiode mode, and/or at least photodetector can operate in the avalanche photodiode mode, and/or at least one photodiode can operate in the single photon avalanche photodiode mode.

The BOX layer in FIGS. 11A-B can be optional, and the Si layer or wafer can be low dope N or low dope P or intrinsic with resistivity ranging from 1 to 100 Ohm-cm or more. The Ge/GeSi layer can be low dope N or low dope P or intrinsic.

Figure 12:
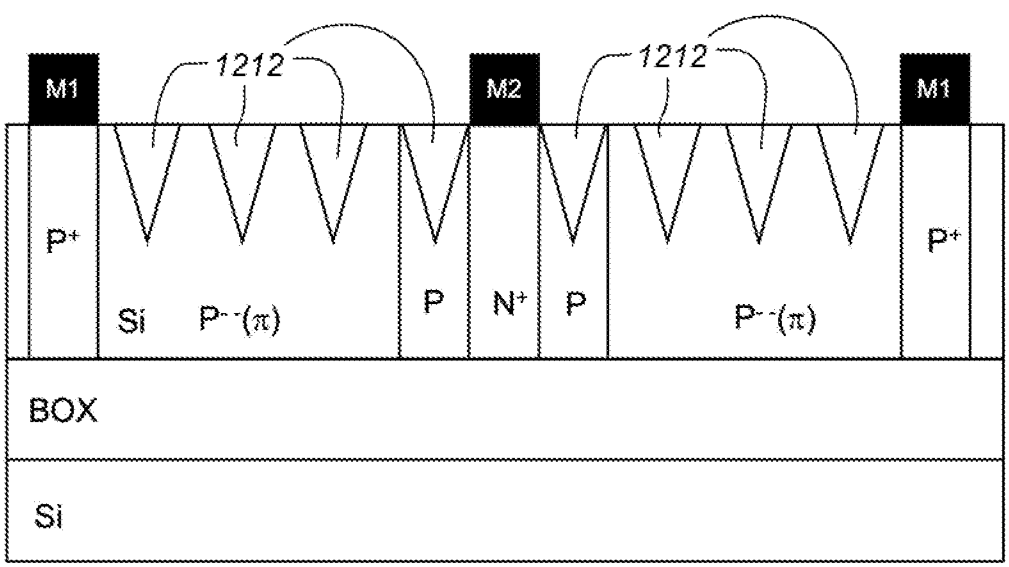
FIG. 12 is a partial cross-section of a lateral Si avalanche photodiode/single photon avalanche photodiode with P and N junctions, according to some embodiments.

FIG. 12 is a partial cross-section of a lateral Si avalanche photodiode/single photon avalanche photodiode with P and N junctions, according to some embodiments. The P and N junctions can extend to the BOX layer. In some cases, the lateral avalanche photodiode has a P $P^-$ PN, and in some cases P $P^-$ N structures, and in some cases the P and N can be interchanged. A reverse bias is applied between the anode M1 and the cathode M2 with bias voltage ranging from −3 volts to −200 volts, and in some cases from −10 volts to −50 volts. The $P^{-\,-}$ (π) Si layer can range from 1 micron to 10 microns or more, and in some cases from 2 microns to 10 microns. The spacing between the $P^+$ and $N^+$ can range from 1 micron to 10 microns or more, in some cases the spacing between the $P^+$ and $N^+$ can range from 1 to 10 microns. The lateral dimension of the photo sensitive area which can be a diameter, or diagonal, or a side of a rectangle, or polygon can range from 30 microns to 1000 microns or more, and in some cases from 30 microns to 800 microns. The microstructure holes 1212 can be formed in the $P^{-\,-}$ Si, and in some cases the microstructure holes can be also be formed in the doped layers such as the P layer. The microstructure holes can be inverted pyramids, conical, cylindrical, rectangular, and/or any combination of shapes. The spacing of the holes can range from 0 (touching, and/or overlapping) to 1000 nm, and in some cases from 0 to 300 nm. The microstructure holes can have different lateral dimensions, and/or can have different depths. The microstructure holes can extend partially into the $P^{-\,-}$ (π) region and in some cases the microstructure holes can extend to the BOX layer. The lateral dimension of the holes which can be the diameter or diagonal or one of the sides of a rectangle, can range from 500 nm to 1500 nm or more, and in some cases from 400 nm to 1200 nm, and in some cases from 600 nm to 1200 nm. Optical signals can impinge from the top surface, and in some cases from the bottom surface of the Si substrate where a window can be etched to the BOX layer. Optical signal can have wavelength ranging from 780 nm to 1100 nm, and in some cases 800 nm to 1000 nm. Data rate can range from 100s pluses per second to 1000s pulses per second or more for LiDAR applications, and for Datacom applications from 1 Gb/s to 25 Gb/s or more. In some cases, for operations using plastic optical fiber the data rate can range from 100 Mb/s to 10 s Gb/s. In some cases, the APD/SPAD can operate as a photodiode without gain and in some cases can operate as an avalanche photodiode with multiplication factor greater than 1, and in some cases with multiplication factor greater than 10, and in some cases with multiplication factor ranging from 1 to 1000 or more. In the SPAD mode the multiplication factor can range from 500 to 100,000 or more. In some cases, the Si APD/SPAD can be a 1D and/or 2D array that can be monolithically integrated with CMOS/BiCMOS ASICs. The 2D array of PD/APD/SPAD can be used for imaging and/or 3D imaging. For conventional Si APD see for example ref. Laforce, Low noise optical receiver using Si APD, SPIE vol. 7212, 721210 (Feb. 6, 2009) ref. Hamamatsu technical information SD-28 Characteristics and use of Si APD (avalanche photodiode), where the I or low dope layer can range in thickness from 20-100 microns.

In some applications microstructure holes may not be necessary as in FIGS. 3A, 4A, 5A, and in some cases photodetectors with microstructure holes and photodetectors without microstructure holes can exist on the same chip that is monolithically integrated with CMOS/BiCMOS ASICs. This can apply for devices shown in FIGS. 11A, 11B and 12. In some cases the microstructure hole photodetector and/or photodetectors without microstructure holes can be monolithically integrated with CMOS/BiCMOS ASICs.

In structures such as illustrated in FIG. 12, a reverse bias can be applied between the anode M1 and cathode M2 with voltages ranging from −3 to −100 or more, and in some cases −3 to −45 volts. In some cases, M1 and/or M2 can form Schottky contacts, and in some cases M1 or M2 can form metal oxide semiconductor junctions, and in some cases M1 and/or M2 can form P and/or N junctions. In some cases where the junctions are either Schottky and/or MOS (metal oxide semiconductor) the current voltage characteristics can be symmetric and/or almost symmetric such that gain such as avalanche gain can be observed in the forward and/or reverse voltage bias directions for APD/SPAD.

Lateral photodetector with microstructure holes can have a higher EQE than a comparable lateral photodetector without microstructure holes at certain wavelengths, and/or at certain bias voltages.

In the case where PN junctions are formed and where one of the interdigit electrodes is formed on a P junction for example such as M1 and shown in FIG. 12, and a second set of interdigit electrodes formed on N junction the lateral photodiode are operated with a reverse bias voltage between the anode (M1) and cathode (M2) for PD/APD/SPAD.

The microstructure holes in some cases can be in the I or low dope P Si region, and in some cases can also be in the P region in structures such as illustrated in FIG. 12. The microstructure holes can extend partially into the I or low dope P region, and in some cases can extend to the BOX layer. In some cases microstructure holes in the P or low dope region may not be necessary and super structures can be fabricated on the surface of the P or low dope region that can be made of high index dielectrics such as Hf oxide. In FIG. 12 the $P^+$, P, $N^+$ can extend partially into the device layer, and in some cases can extend to the BOX layer. Ref Iiyama et al, Silicon Lateral Photodiodes Fabricated by Standard 0.18 microns CMOS Process, ECOC 2009, September 2009, Vienna, Austria, shows a lateral avalanche photodiode without microstructure holes to enhance absorption. Reference Wegrzecka et al, Design and properties of Silicon avalanche photodiodes Opto-electronics Review 12 (1), 95-104 (2004).

Figure 13A:
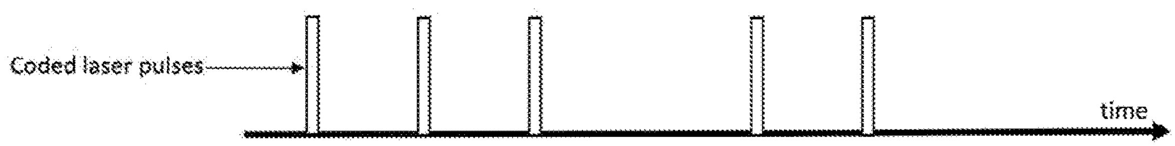
FIGS. 13A-B show laser pulses that can have a certain sequence of pulses for LiDAR applications in order to distinguish between different LiDAR signals that may exist in the same environment.
Figure 13B:
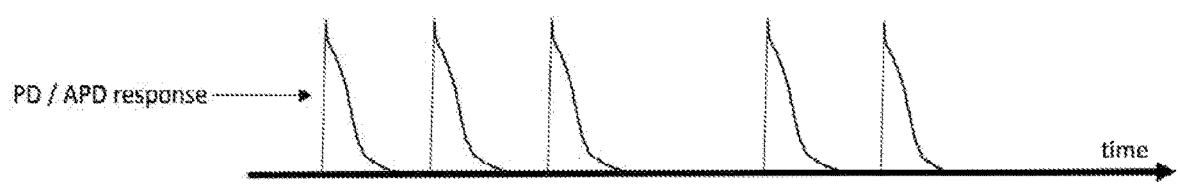

FIGS. 13A-B show laser pulses that can have a certain sequence of pulses for LiDAR applications in order to distinguish between different LiDAR signals that may exist in the same environment. In some cases, the sequence of optical pulses, such as shown in FIG. 13A can be coded to further distinguish from signals of other LiDAR units operating in the vicinity. The set of pulses depicted in FIG. 13B are the reflected optical signals as detected by the LiDAR photodetectors. This received sequence of electrical signals can be compared to the sequence of outgoing optical signals to authenticate that these optical pulses and electrical signals are from the same LiDAR unit. The coding schemes can be as illustrated, with pulse position modulation, or pulse width modulation, or wavelength modulation, to name a few.

The wavelength of the optical signal which can originate from a laser or light emitting diode (LED) can range from 800 nm to 1800 nm, and in some cases the optical pulses can have all the same wavelength, and in some cases the optical pulses can have different wavelength. In the case where plural optical pulses have different wavelength the respective photodetectors on the same chip can have bandpass filters to detect the selected wavelengths of the reflected optical pulses.

In some cases, more than one light source such as lasers or LEDs can be used to improve accuracy of imaging in LiDAR applications, see for example, ref. Chen et al, Accuracy improvement of imaging lidar based on time-correlated single-photon counting using three laser beams, Optics Communications, https://doi.org/10.1016/j.optcom.2018.08.017

Figure 14A:
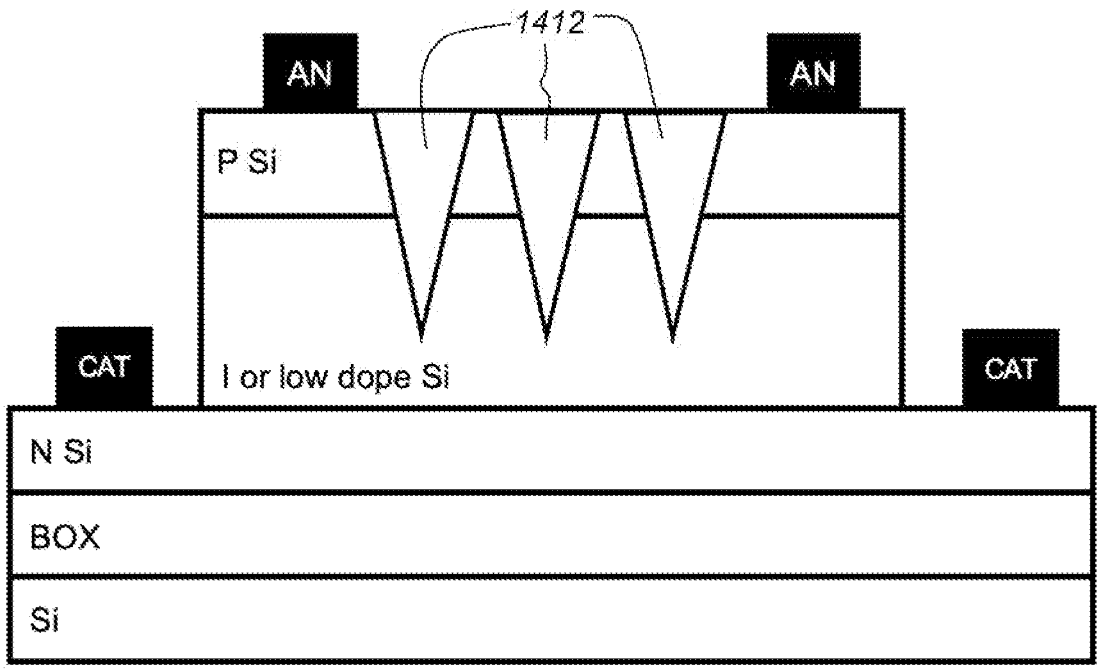
FIGS. 14A-C show experimental results for vertical PIN microstructure hole photodetector.
Figure 14B:
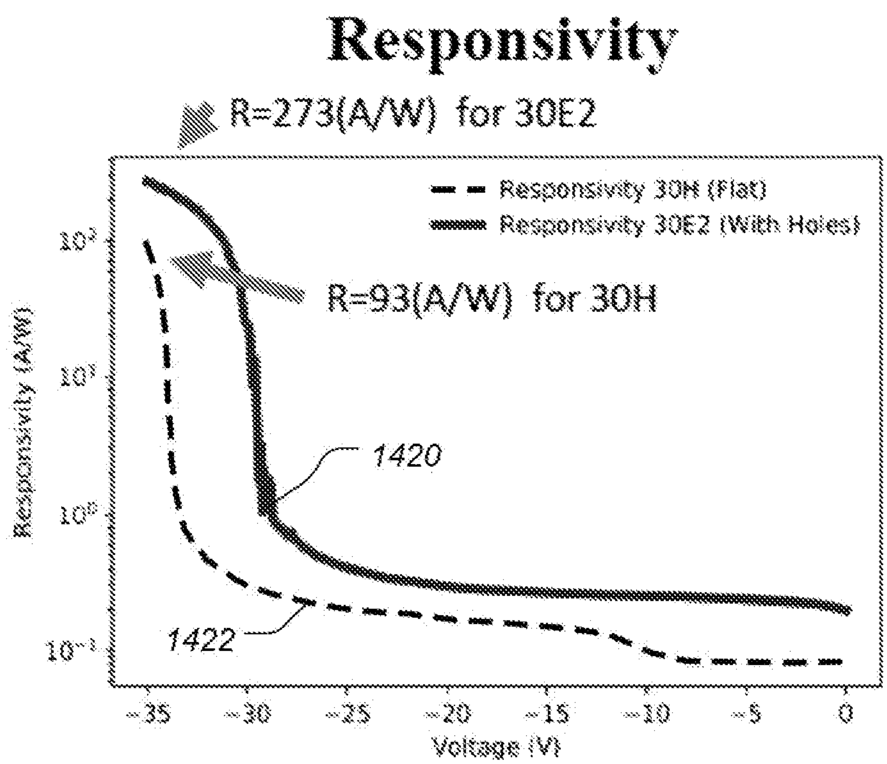
Figure 14C:
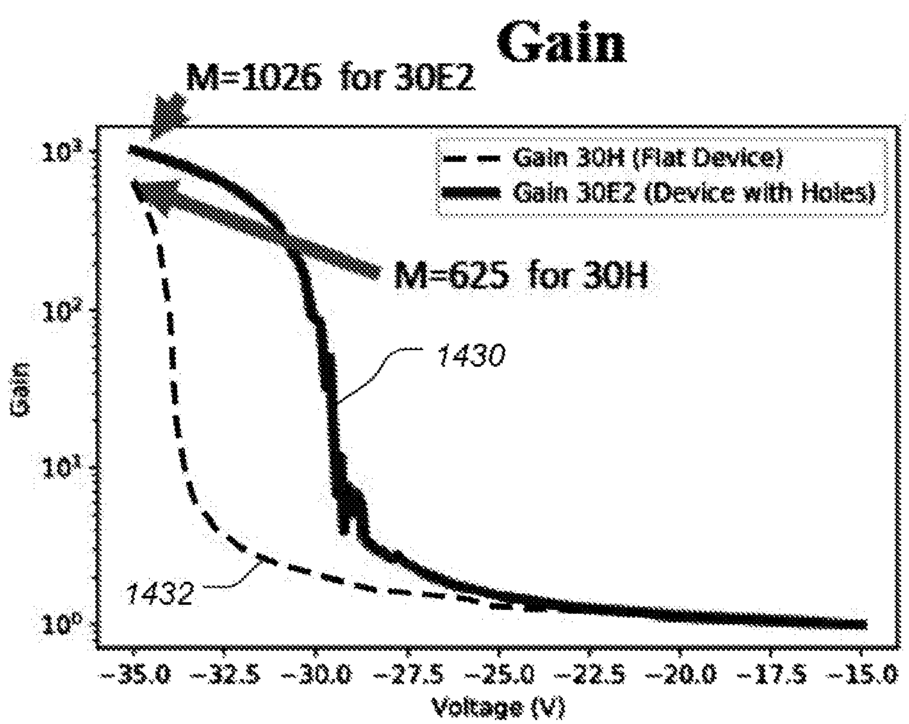

FIGS. 14A-C include two plots in FIG. 14B and FIG. 14C that show experimental results for vertical PIN microstructure hole photodetector shown in FIG. 14A. The PIN Si microstructure hole photodetector shown in FIG. 14A has an I or low dope layer of thickness 1-2 microns a $N^+$ Si layer with a thickness of approximately 0.5 microns and a top $P^+$ Si layer of approximately 0.3 microns with microstructure holes 1412 that are inverted pyramids with lateral dimension of approximately 600-800 nm with spacing of approximately 100 nm. The anode is formed on the P layer and the cathode is formed on the N layer, and a reverse bias is applied between the anode and cathode.

FIG. 14B shows responsivity as a function of reverse bias for optical signal at 850 nm. Curve 1422 is for the photodiode without microstructure holes and curve 1420 is for the photodiode with microstructure holes. As can be seen the photodiode with microstructure holes has a higher responsivity by almost a factor of three over a similar photodetector without microstructure holes. In addition, the gain or increase in responsivity for microstructure hole photodiode operating in the avalanche photodiode mode achieve gain or multiplication at a lower voltage than a similar photodiode without microstructure holes.

FIG. 14C shows similar curves as FIG. 14B except instead of responsivity multiplication is shown. Curve 1432 is for the photodiode without microstructure holes and curve 1430 is for the photodiode with microstructure holes. Multiplication for microstructure hole avalanche photodiode is over 1000 compared to a similar photodiode without microstructure holes the multiplication is less than 700.

The microstructure holes can enhance the electric field such that avalanche effects can occur at the lower voltage and with the higher field avalanche gain and/or multiplication can be higher than a similar photodiode without microstructure holes at the same voltage for example. In some cases, lateral structures PIN and/or PIPN microstructure hole photodiodes operating in the avalanche mode can have higher avalanche gain and/or multiplication than a similar photodiode without microstructure holes at a given reverse bias voltage. In some cases MSM lateral photodetectors can also exhibit avalanche gain at forward or reverse bias, and can have a higher avalanche gain and/or multiplication than a similar photodetector without microstructure holes at a given voltage.

With the addition of microstructure holes in vertical or lateral photodetectors described in this patent specification, the absorption layer which often is the I or low dope layer, and in some cases doped layers, can be thin with thickness ranging from 300 nm-5,000 nm, and in some cases from 500 nm-2,000 nm and can achieve a higher external quantum efficiency than a comparable photodetector without microstructure holes at certain wavelengths. In the case of APD/SPAD of either the vertical or lateral microstructure hole photodetector structures, the absorption region or layer can be 10× thinner than a conventional Si APD/SPAD at certain wavelengths. In some cases, it can be greater than 10× thinner, and in some cases it can be greater than 5× thinner to achieve comparable responsivity and/or multiplication at certain wavelengths. In addition, the microstructure hole APD/SPAD can have lower reverse bias voltage to achieve responsivity and/or multiplication as compared to a conventional Si APD/SPAD.

Silicon avalanche photodiode monolithically integrated with CMOS/BiCMOS ASICs with high multiplication are discusses for example in reference; Youn et al, A 12.5 Gb/s SiGe BiCMOS Optical Receiver with a Monolithically Integrated 850-nm Avalanche Photodetector, OFC/NFOEC Technical Digest 2012 OSA; where their responsivity is of the order of 0.01 A/W or less for multiplication factor of 1 at 850 nm.

Figure 15A:
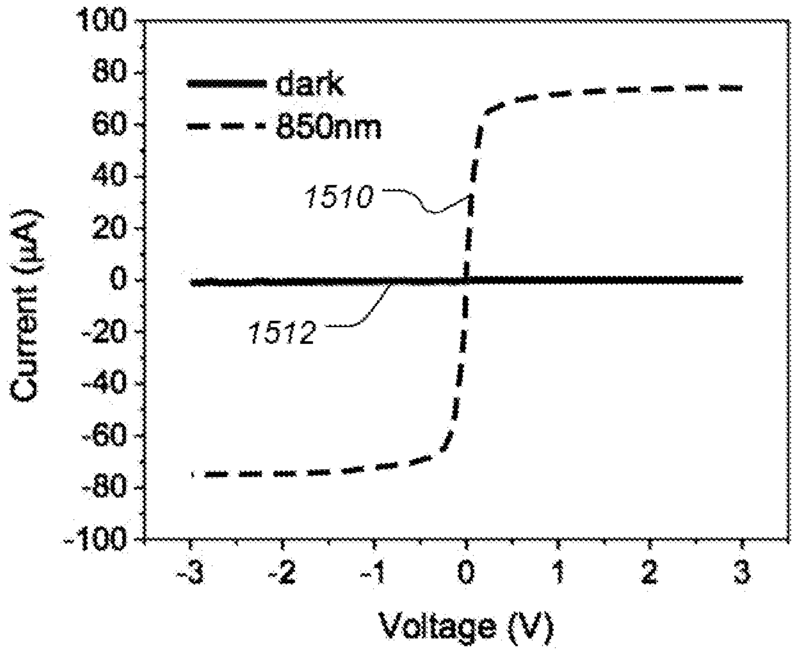
FIGS. 15A-B are plots showing experimental current-voltage (IV) characteristics of lateral Si MSM contacts with and without native oxide, according to some embodiments.
Figure 15B:
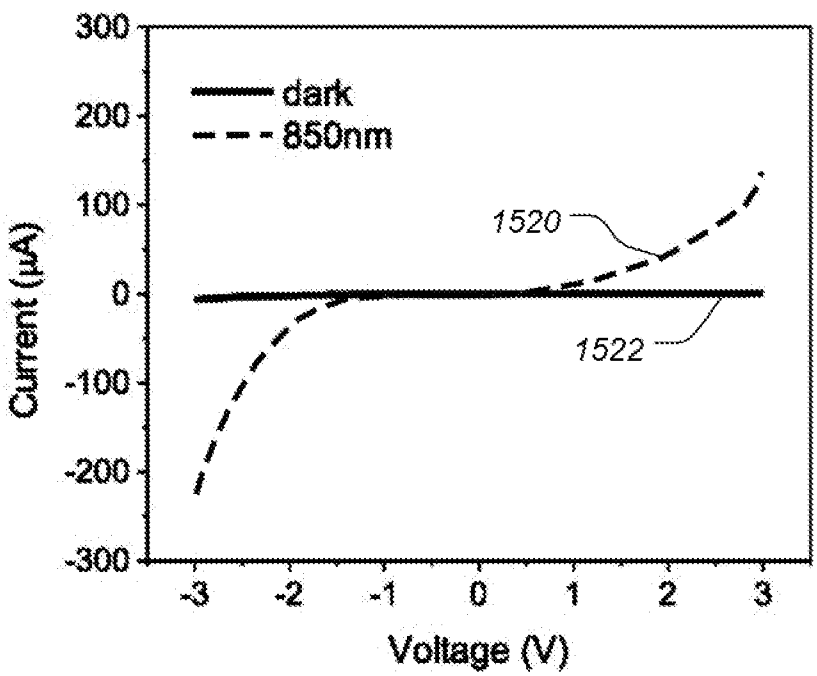

FIGS. 15A-B are plots showing experimental current-voltage (IV) characteristics of lateral interdigit Si MSM or Schottky contacts with and without native oxide, according to some embodiments. The Si layer is low P type doping with resistivity range of 10-20 Ohm-cm.

In FIG. 15A, curve 1510 shows a S type characteristic with illumination at 850 nm wavelength, where native oxide was removed with a buffer oxide etch and Al interdigits deposited. In FIG. 15B, curve 1520 shows a diode like characteristic when illuminated at 850 nm wavelength where native Si oxide was not removed and Al interdigits were deposited. Dark (non-illuminated) curves 1512 and 1522 are shown in FIGS. 15A and 15B, respectively.

The diode like IV characteristics as in FIG. 15B can have higher EQE and can have avalanche gain such that the EQE can be 100% or more at low bias of +/−3 volts or more. The spacing between the Al interdigits was approximately 1 micrometer, and the width of the interdigits is approximately 300 nanometers.

The structure of FIG. 15A can have gain such as photoconductive gain, and in some cases at higher bias can have avalanche gain. The structure of FIG. 15B can have avalanche gain at higher bias. Reference Li, et al. Silicon photodiodes with high photoconductive gain at room temperature, Optics Express, Vol. 20, No. 5 27 Feb. 2012.

FIGS. 16A-16D are experimental gain plots of an Si microstructure hole PIN photodiode in a vertical configuration. The plots show experimental avalanche gain at different wavelength from 850 nm to 990 nm illumination of microstructure hole photodiode as compared to a similar photodiode without microstructure holes.

Figure 16A:
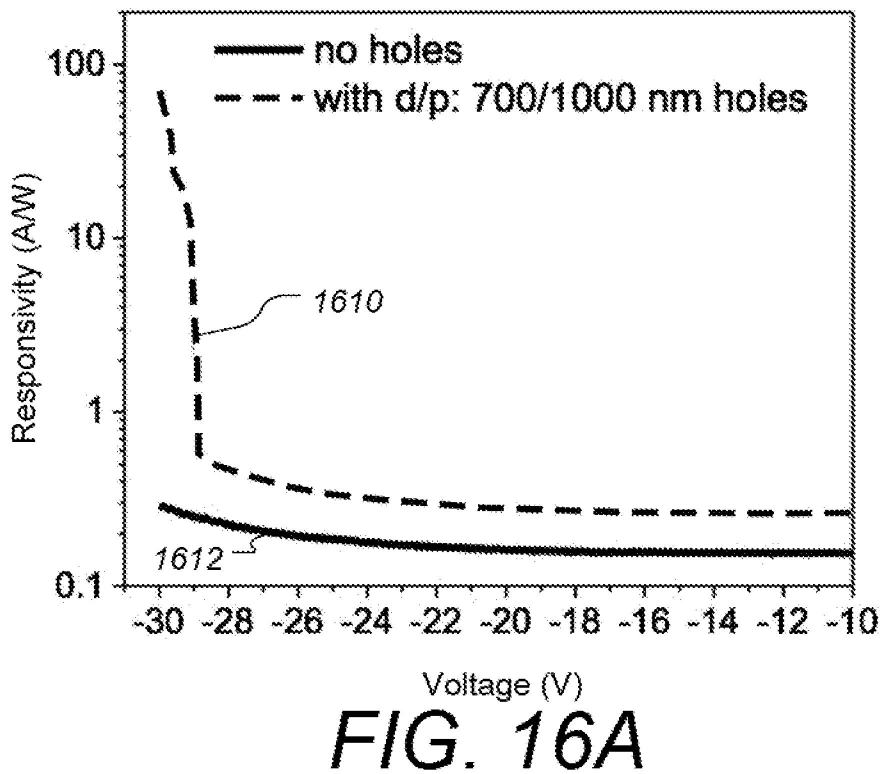
FIGS. 16A-16D are experimental gain plots of an Si microstructure hole PIN photodiode in a vertical configuration.

FIG. 16A shows experimental gain for illumination at 850 nm @ ~8 μW. Curve 1610 shows the microstructure hole PIN photodiode responsivity of approximately 80 A/W at approximately 30 volts reverse bias as compared to a similar Si PIN photodiode without holes with responsivity of approximately 0.3 A/W at approximately 30 volts reverse bias (curve 1612). The microstructure holes in FIG. 16A-16D have a diameter of 700 nm and a period of 1000 nm in a square lattice.

Figure 16B:
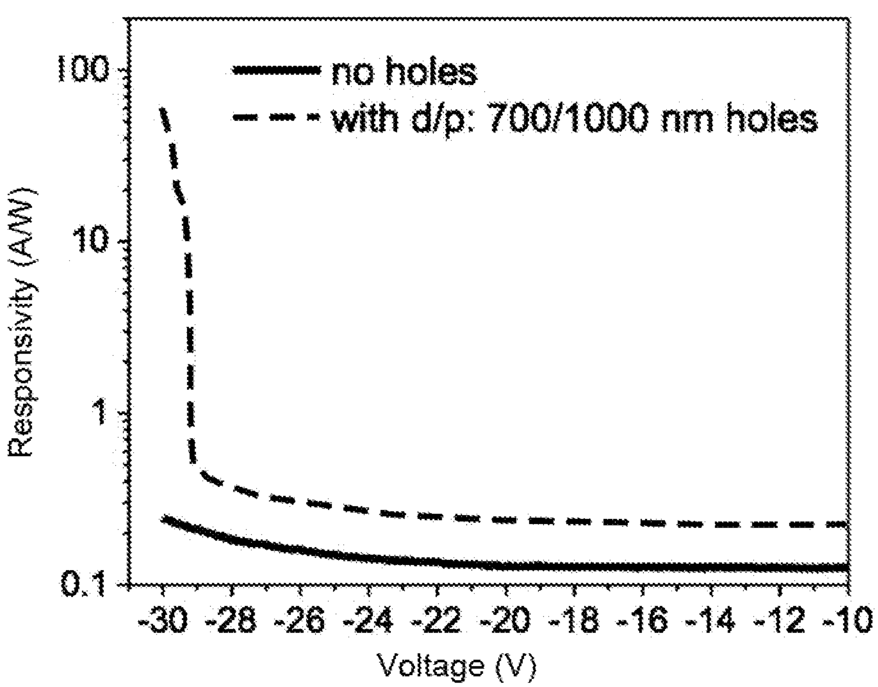
Figure 16C:
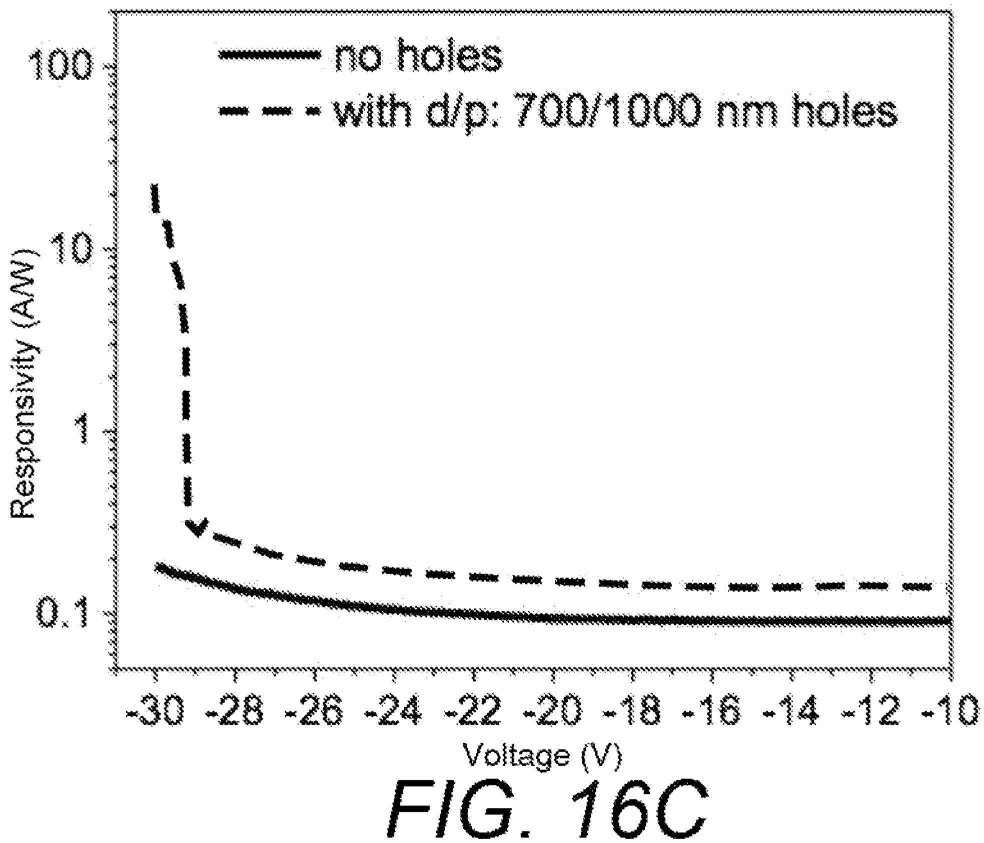
Figure 16D:
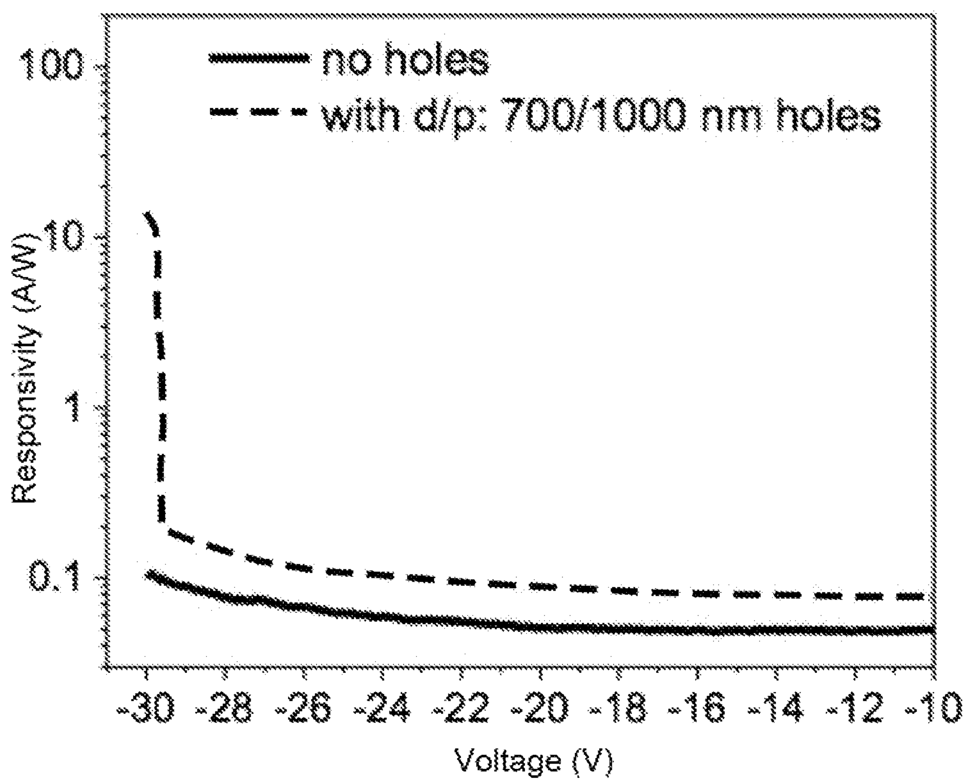

FIG. 16B shows experimental gain for the same device under 900 nm wavelength illumination @ ~8 μW. FIG. 16C shows the same device with 940 nm wavelength surface illumination 940 nm @ ~15 μW. FIG. 16D shows the same device with 990 nm wavelength surface illumination nm @ ~10 μW. In all cases the onset of avalanche gain with microstructure hole photodiode occur at a lower reverse bias voltage than a similar Si photodiode without holes. The responsivity of microstructure hole photodiode can be higher than the responsivity of a similar photodiode without microstructure holes at certain bias voltages.

Figure 17A:
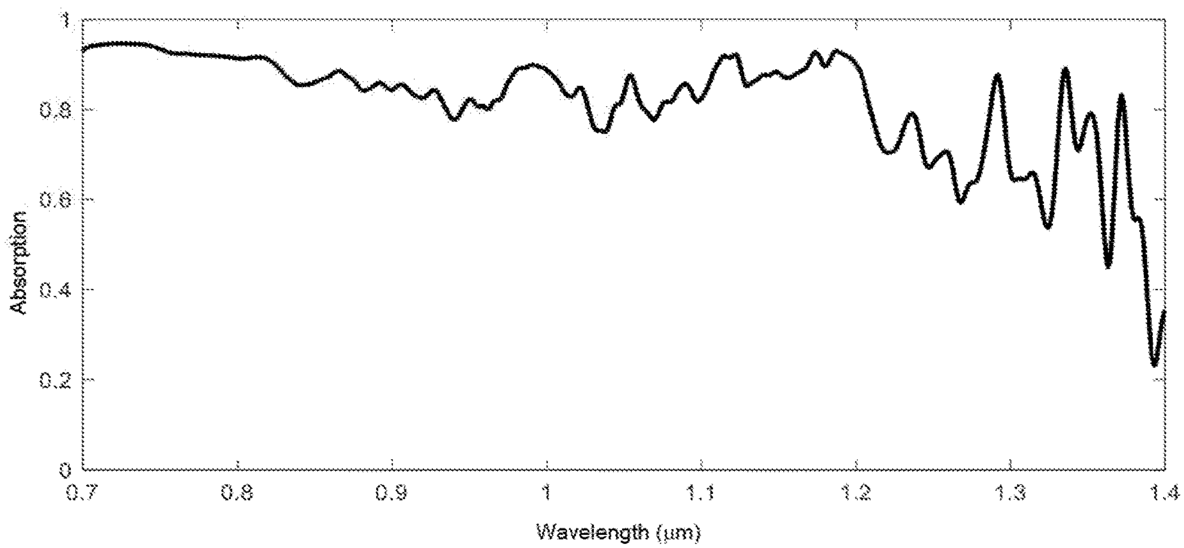
FIGS. 17A-17H are plots of shows FDTD (finite difference time domain) simulation of the optical field of various microstructure hole structures, according to some embodiments.

FIGS. 17A-17H are plots of shows FDTD (finite difference time domain) simulation of the optical field of various microstructure hole structures that can be either in a vertical or a lateral configuration, according to some embodiments. FIG. 17A shows an FDTD simulation of the optical field of a microstructure hole structure that has 400 nm Ge on Si bulk wafer of 675 micron thickness. The microstructure holes are in a square lattice with a period of 400 nm and a diameter of 1100 nm. Cylindrical holes are etched to a depth of 200 nm. The vertical axis shows absorption in the Ge layer and the horizontal axis shows the wavelength. The absorption is directly proportional to the external quantum efficiency (EQE). The ratio of EQE/absorption can range from 0.1-1. In cases where photo generated carriers are not lost to recombination and can be collected efficiently, the EQE can be approximately equal to the absorption, or equivalently the ratio EQE/absorption can range from 0.8-1. The optical signal is surface illuminated (microstructure hole side of the wafer) at normal incidence. The absorption or EQE can be 60% or higher at certain wavelength range of 700 nm-1350 nm, and in some cases the absorption or EQE can be 40% or greater at certain wavelength range of 700 nm to 1350 nm. Microstructure hole PD/APD/SPAD can have a higher EQE than a comparable PD/APD/SPAD without microstructure holes at certain wavelengths and/or at certain bias voltages.

Figure 17B:
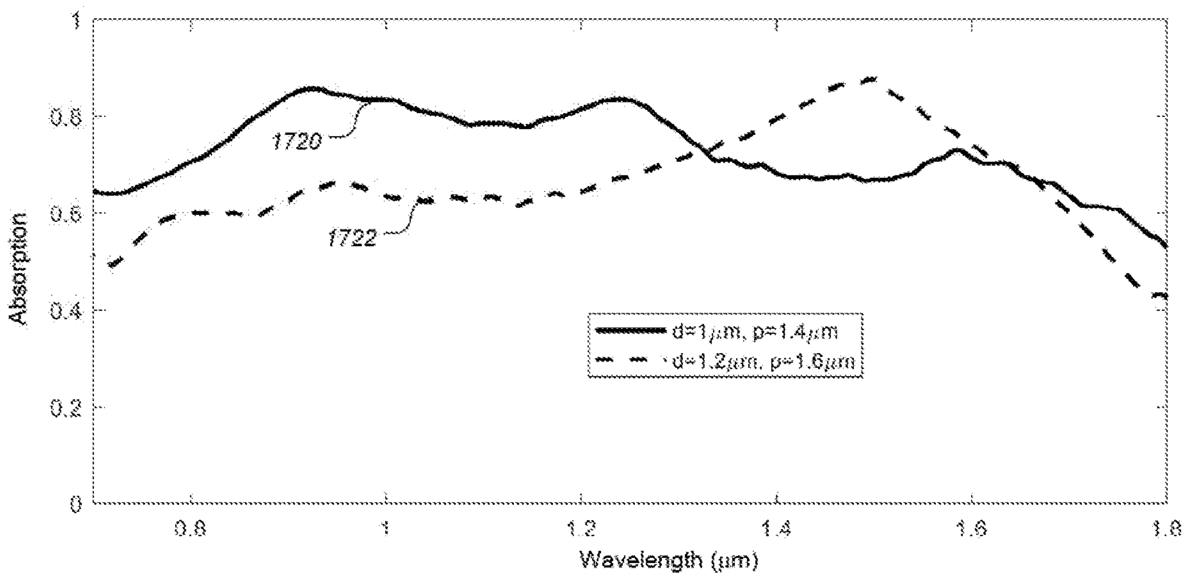

FIG. 17B shows a FDTD simulation of the optical field in microstructure hole Ge on Si. The optical signal illuminates the hole surface averaged over an angular distribution of +10 to −10 degree or normal incidence. The Ge layer is 800 nm thick on Si wafer. Cylindrical holes are formed to a depth of 400 nm. The solid curve 1720 is for holes with 1000 nm diameter and 1400 nm period in a square lattice, and the dashed curve 1722 are for holes with 1200 nm diameter and 1600 nm period in a square lattice. The vertical axis in absorption in the Ge layer, and the horizontal axis is wavelength from 800 to 1800 nm. Absorption and/or EQE can be greater than 40% at some wavelengths in the range of 800-1800 nm.

Figure 17C:
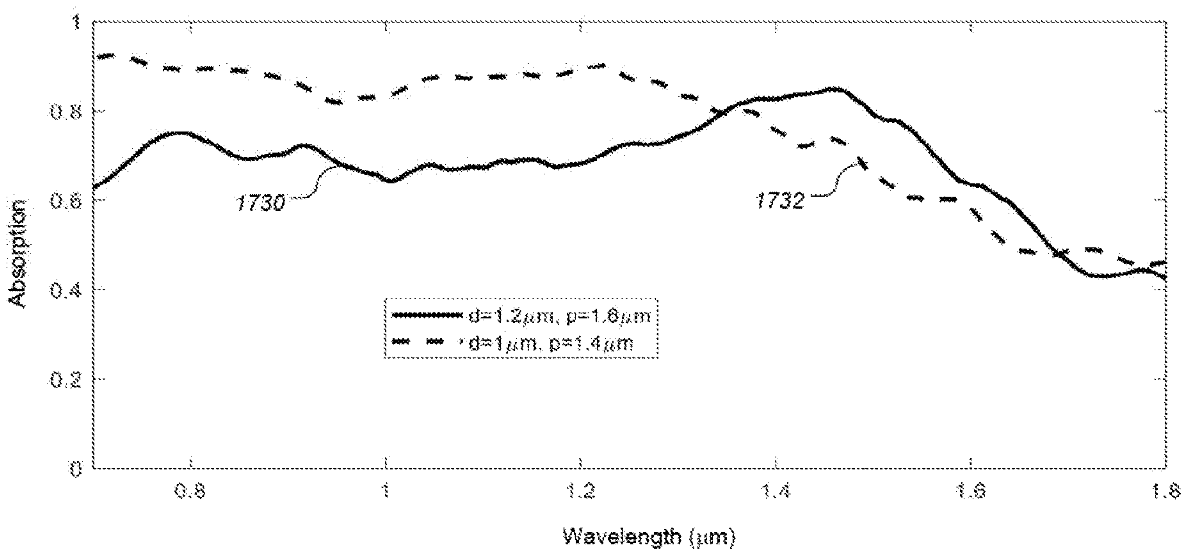

FIG. 17C shows a FDTD simulation of optical field of microstructure holes in Ge on Si. The Ge layer is 600 nm on Si wafer. Cylindrical holes with diameter 1200 nm and period 1600 nm in a square lattice with hole depth of 300 nm is shown in the solid curve 1730. The dashed curve 1732 shows holes with 1000 nm diameter and 1400 nm period in a square lattice. The absorption and/or EQE can be 30% or higher at certain wavelength in the range of 800-1800 nm.

Figure 17D:
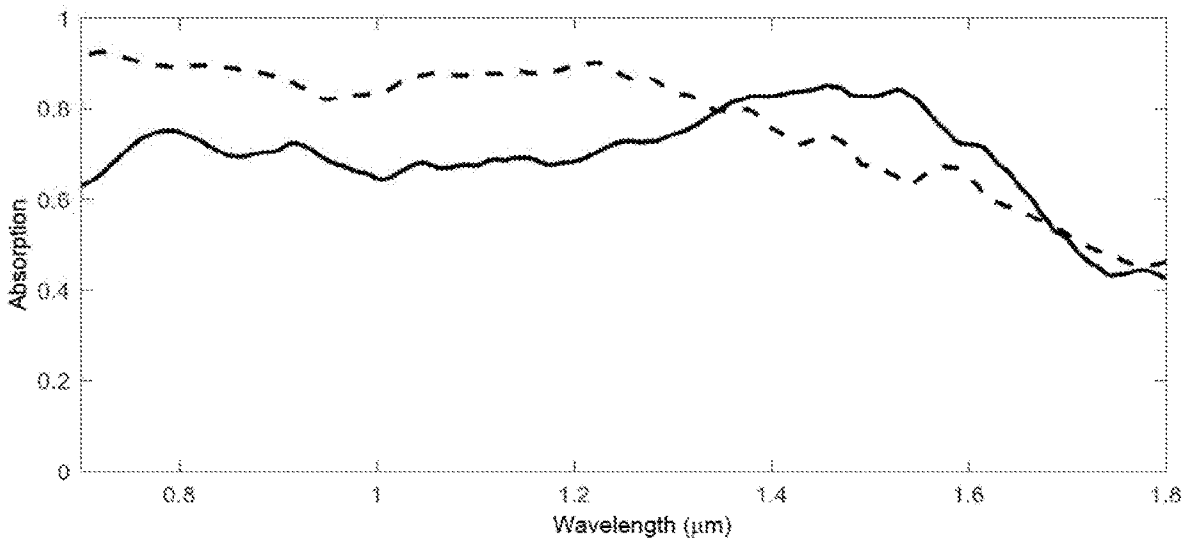

FIG. 17D is similar to FIG. 17*c* with an added Ge strain of approximately 0.2%.

Figure 17E:
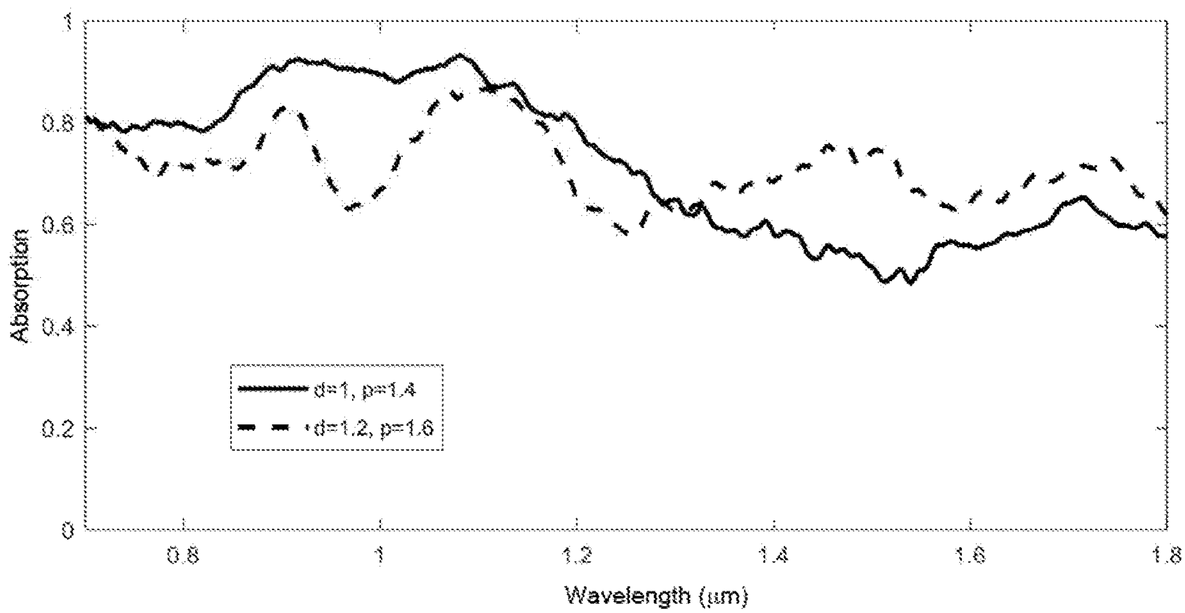

FIG. 17E is similar to FIG. 17B with the cylindrical holes etched to the Si wafer or a depth of 800 nm.

Figure 17F:
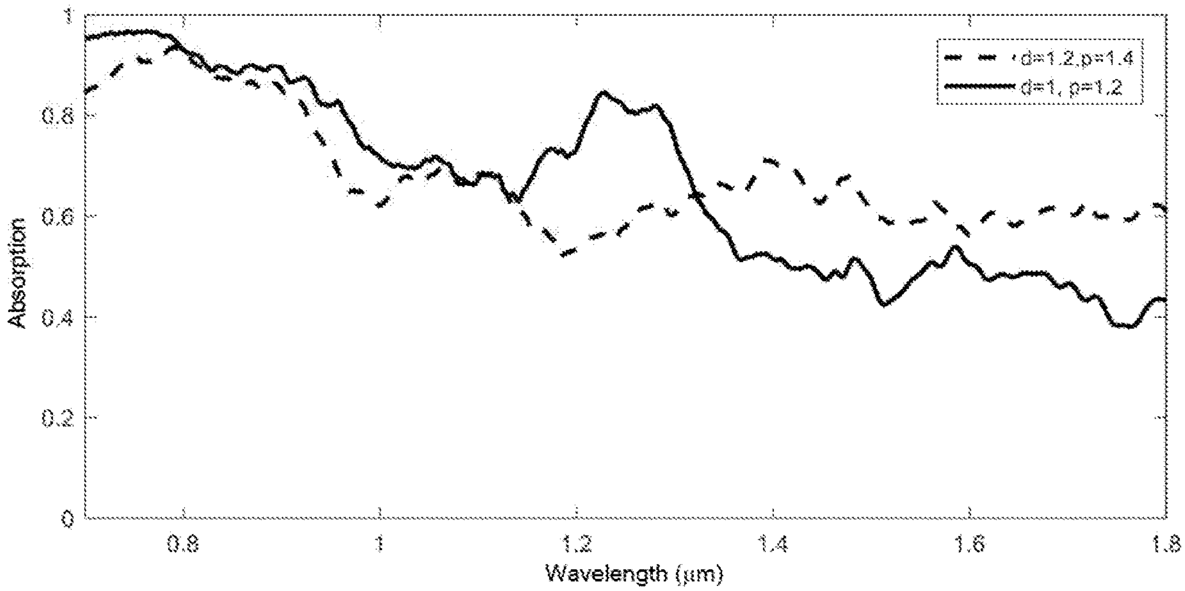

FIG. 17F is similar to FIG. 17C except with cylindrical holes etched to the Si or a depth of 600 nm.

Figure 17G:
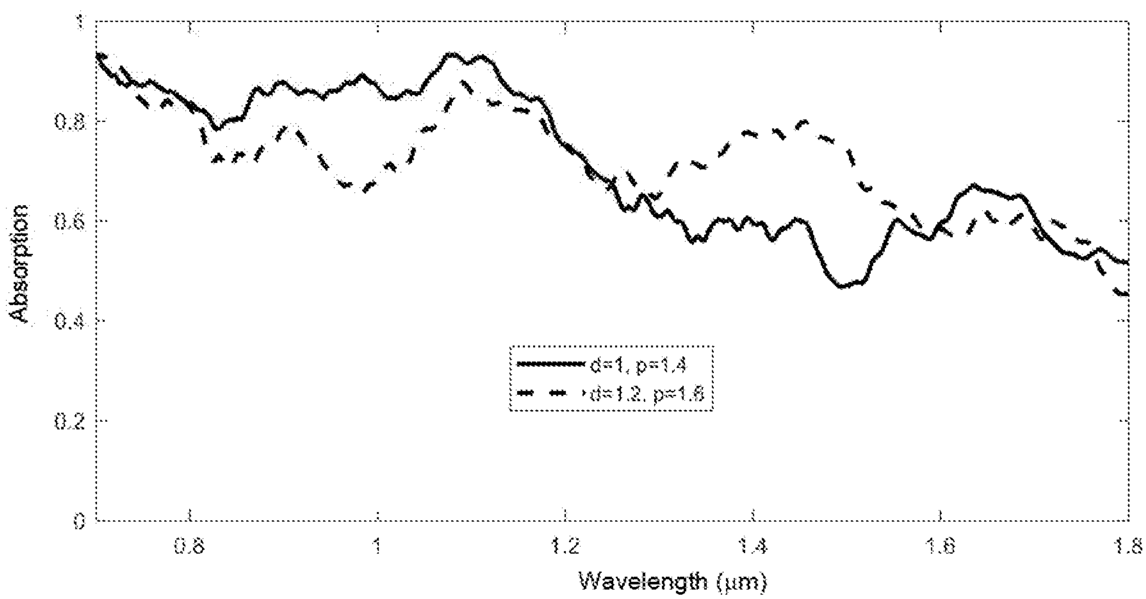

FIG. 17G is similar to FIG. 17C except with the cylindrical holes etched through the Ge into the Si to a total depth of 800 nm.

Figure 17H:
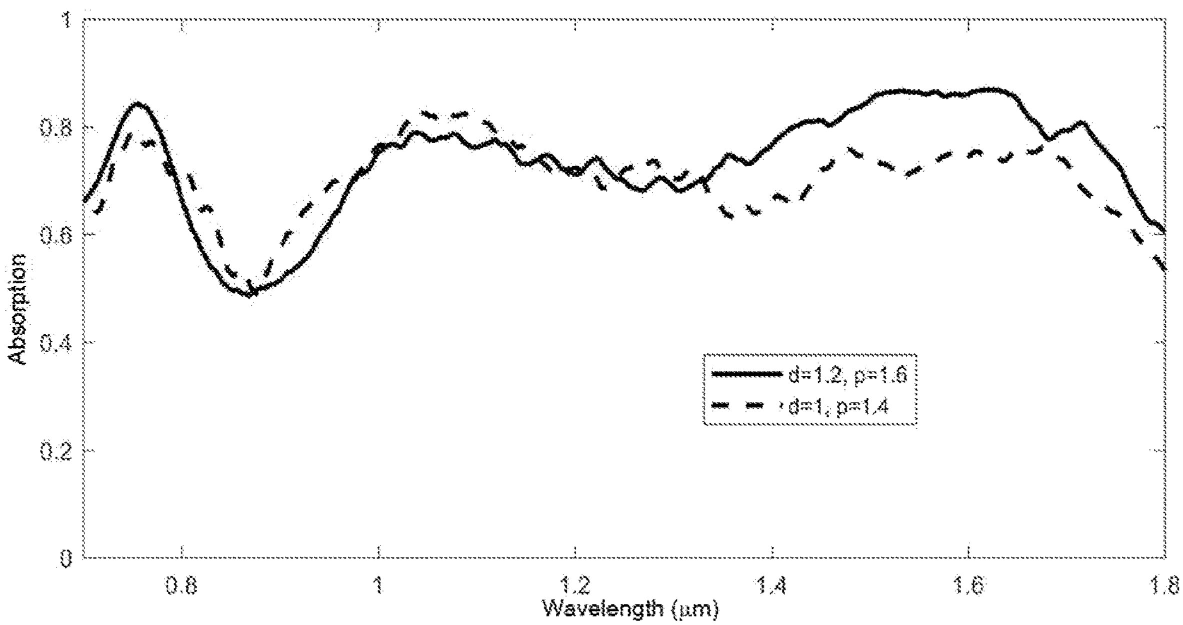

FIG. 17H is similar to FIG. 17B except with the cylindrical holes etched though the Ge into the Si with a total depth of 1000 nm.

Figure 18A:
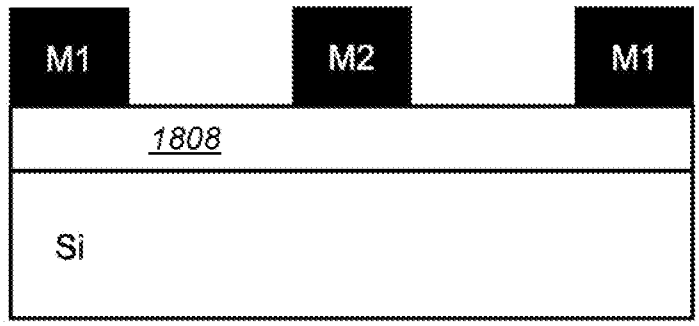
FIGS. 18A-B are simplified partial cross-sections of a lateral interdigitated photodetector with metal oxide semiconductor (MOS) junctions, according to some embodiments.
Figure 18B:
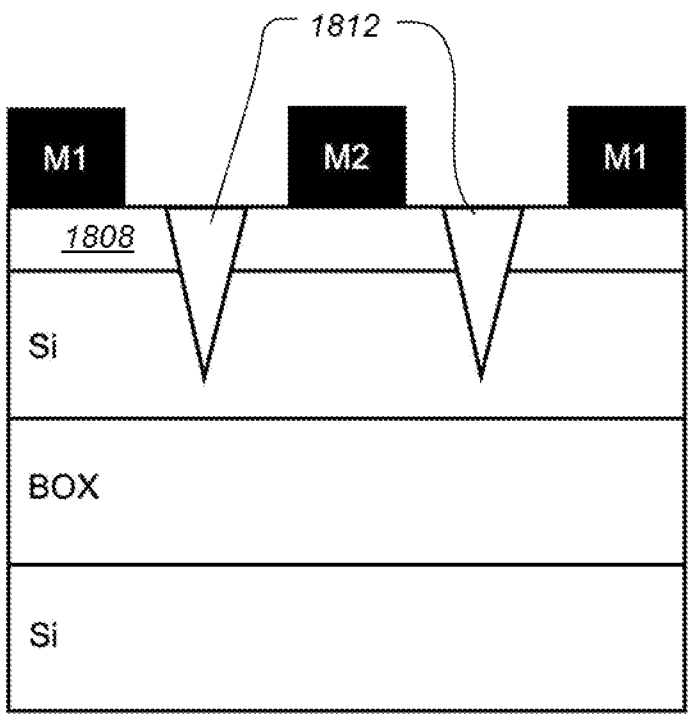

In all FIGS. 17A-17H the incident optical field is averaged over −10 to 10 degrees normal to the surface. The absorption and/or EQE can be 40% or higher at certain wavelength in the wavelength range of 800-1800 nm FIGS. 18A-B are simplified partial cross-sections of a lateral interdigitated photodetector with metal oxide semiconductor (MOS) junctions, according to some embodiments. In FIG. 18A, the M1 and M2 are Al electrodes and a 2 nm Al oxide layer 1808. Al Oxide 1809 is formed on Si using atomic layer deposition. The Si substrate or layer is low dope P type with a resistivity of 10-30 Ohm/cm, and in some cases greater than or equal to 10 Ohm/cm. The Al electrodes are deposited on the Al oxide 1808 with a width of 300 nm, and in some cases the width can range from 5 nm-600 nm. The spacing between the electrodes M1 and M2 can range from 100 nm to 10,000 nm or more, and in some cases the spacing can range from 30 nm-1,000 nm. In some cases, the spacing can be less than 30 nm. Light can be incident on the top surface containing the electrodes, and in some cases, light can be incident from the substrate side or the bottom surface. Bias can be applied to the M1 and M2 electrodes in either the forward or reverse direction. Wavelength range for the interdigit photodetector can range from 600 nm-1100 nm, and in some cases less than 600 nm.

FIG. 18B is similar to FIG. 18A with the addition of a BOX layer, thickness can range from 10 nm-2000 nm or more. The Si device layer on top of the BOX can be intrinsic or low dope P or N type with resistivity of 1 Ohm/cm or greater with a thickness range of 100 nm-5000 nm or more. An oxide layer such as Si oxide, Al oxide, Hf oxide, Ti oxide, Ta oxide, to name a few can be formed on the Si device layer. The oxide layer can have a thickness ranging from 1 nm-5 nm, and in some cases greater than 5 nm. In some cases, the oxide can be a dielectric layer other than oxide such as carbide, for example Si carbide, W carbide, and in some cases can be a nitride layer, for example Si nitride. Metal electrodes are formed on the oxide layer to form a MOS junction. In some cases, one of the electrodes can be MOS junction, and the other electrode can be a Schottky junction. Microstructure holes 1812 can be formed on the surface with etch depth into the Si device layer, and in some cases through the Si device layer to the BOX layer. The microstructure holes can be cylindrical, funnel, inverted pyramids, conical, rectangular, amoebic, and polygonal, or any combination thereof. The lateral dimension of the microstructure hole at the surface can range from 500 nm-1200 nm. The spacing between the holes can range from 0 nm-1000 nm or more, and in some cases 0 nm-500 nm. The holes can be fully or partially filled with dielectric such as Si oxide, Si nitride, Al oxide to name a few. A voltage bias can be applied between M1 and M2 electrodes in either the forward or reverse bias. The polarity of the voltage bias is chose to optimize the performance of the interdigitated lateral photodetector performance, for example high EQE, high speed, high gain, low noise to name a few. M1 and M2 can be metal forming MOS junctions, the metal can include, Al, Cu, W, Mo, Ni, Cr, Pt, Au, to name a few, and in some cases, can be metal alloys, and in some cases can be metal silicide. Light can impinge on the top surface (electrode surface) or in some cases from the bottom surface (substrate surface). In some cases the BOX layer can be optional.

Figure 19:
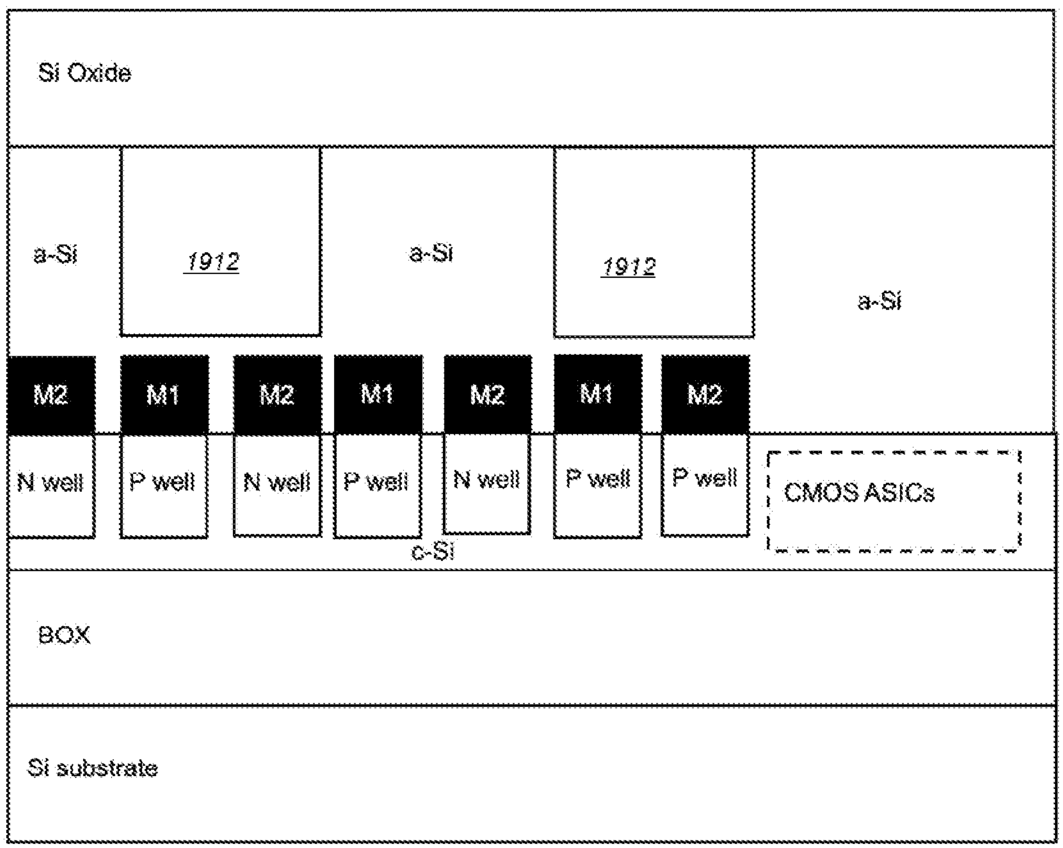
FIG. 19 is a simplified partial cross-section of an interdigitated lateral photodetector, according to some embodiments.

FIG. 19 is a simplified partial cross-section of an interdigitated lateral photodetector, according to some embodiments. The lateral photodetector can be a photodiode, an avalanche photodiode, or a single photon avalanche photodiode with proper P and N doping profiles such as PN, PIN, PIPN to name a few. A reverse bias is applied between the anode (M1) and cathode (M2). The interdigitated electrode can be metal and/or metal silicides. The interdigitated photodetector is fabricated on a Si on insulator wafer (SOI) and where the photodetector with its interdigitated electrodes is buried with amorphous Si, and where microstructure holes are formed in the amorphous Si and where the amorphous Si (a-Si) and the microstructure holes 1912 can be buried with an oxide or dielectric such as Si dioxide. The lateral dimension of the microstructure holes 1912 can be larger than the spacing between the interdigitated electrodes, and in some cases can include multiple electrodes within the lateral dimensions of the microstructure hole. Light impinges on the top surface opposite from the substrate surface. Arrays of photodetectors can be fabricated and connected to CMOS ASICs on a single chip. The thickness of the BOX layer can range from 10 nm to 2000 nm or more, and the thickness of the crystalline device layer which can be I or low dope P or N can have a thickness ranging from 10 nm to 100 nm and in some cases from 30 nm to 300 nm, and in some cases from 50 nm to 500 nm, and in some cases from 500 nm to 1000 nm. The depth of the P and N wells can be formed partially into the device layer or entirely in the device layer to the BOX layer. The spacing between the electrodes M1 and M2 can range from 100 nm to 1000 nm, and in some cases more than 1000 nm. In some cases, the spacing between the M1 and M2 electrodes can be periodic, and in some cases aperiodic, and in some cases random. P and N wells can be formed under the electrode, and in some cases the P and N doping can extend beyond the width of the electrode and in some cases the doping can include PIPN for example. The thickness of the electrodes can range from 50 nm to 500 nm, and in some cases to 1000 nm or more. The a-Si can be deposited on the photodetector using plasma enhanced chemical vapor deposition, chemical vapor deposition, thermal deposition such as electron beam and/or any other methods used in CMOS processing. The thickness of the a-Si can range from 100 nm-1000 nm and in some cases more than 1000 nm. The microstructure holes can be circular, rectangular, oval, and/or any other shapes, and can be cylindrical, trapezoidal, conical, and/or any combination of cross-section, and can have a surface lateral dimension ranging from 400 nm to 1300 nm and in some cases 700 nm-1000 nm. The microstructure holes 1912 and the a-Si can be partially or entirely buried by dielectric with a refractive index different from the a-Si for example Si dioxide, Si nitride to name a few. The reverse bias can have a voltage range of 1 V-35 V, and in some cases 0.7 V-3.3 V, and in some cases 3.3 V-15 V. The wavelength range of the incident photon that can be modulated signal such as for data communication or reflected signal such as for time-of-flight applications or optical images can range from 700 nm to 1100 nm.

The lateral dimension of microstructure holes 1912 in most cases mentioned in this patent specification are for microstructure holes not filled with any dielectric, e.g., filled only with air or vacuum where the optical refractive index is approximately 1. In the cases where the microstructure holes are filled fully or partially with the dielectric the lateral dimension of the microstructure hole can be reduced by the effective optical refractive index of the dielectric/voids in the microstructure holes. For example, a microstructure hole with lateral dimension of 800 nm that is not filled (e.g., in air) can have a lateral dimension of 533 nm when completely filled with $SiO_2$ which has an optical refractive index of approximately 1.5. Microstructure hole lateral dimensions can in some cases be reduced when filled with dialectic, where the refractive index is greater than 1 for example (lateral dimension of microstructure hole in vacuum or air)/(optical refractive index), and in some cases where the microstructure hole is partially filled with dielectric an effective optical refractive index can be calculated by the ratio of the volume of 1 or more dielectrics in the microstructure hole.

Figure 20A:
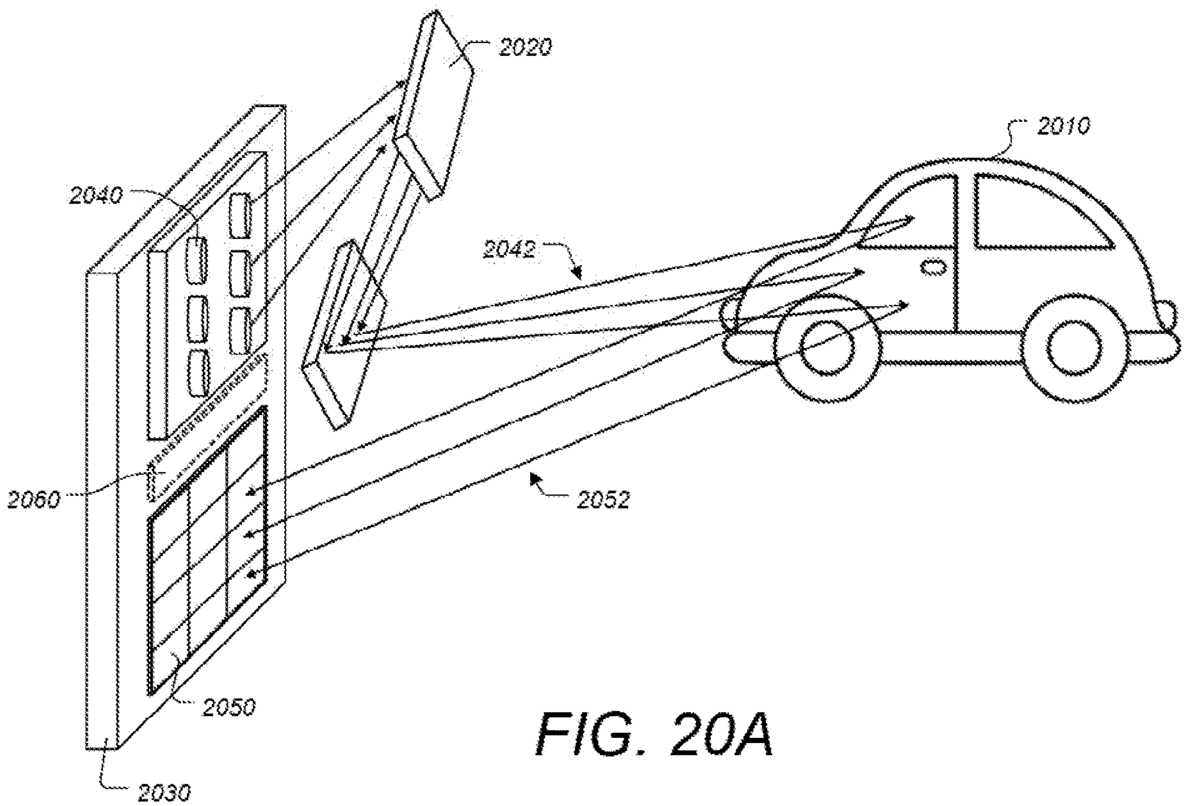
FIGS. 20A-D are schematics a LiDAR and/or camera system wherein detector arrays are monolithically integrated with CMOS/BiCMOS ASICs on one or more chips, according to some embodiments.

FIGS. 20A-D are schematics of a LiDAR and/or camera system wherein detector arrays are monolithically integrated with CMOS/BiCMOS ASICs on one or more chips, according to some embodiments. In FIG. 20A, detector array 2050 can be monolithically integrated with CMOS/BiCMOS ASICs 2060 and where the detector array 2050 can be a charged coupled device (CCD), CMOS based imager, photodetector, APD and/or SPAD. The laser sources 2040 can be assembled on the Si chip 2030 using fluidic and/or robotic assembly, and the electrical connections to the laser can be a back end of line (BEOL) process. The light source can be light emitting diodes (LED) laser diodes which can be edge surface emitting lasers, vertical cavity service emitting lasers, and/or any combination thereof. The light source single or multiple beam can be directed to scanning MEMS mirror 2020 such that a raster scan can be performed to illuminate a target object (outgoing light beam 2042 to target 2010), and the light source reflected from the target object (incoming light beam from target 2052) can be imaged onto detector arrays 2050. The Si micro mirrors 2020 for use in the raster scan can be a separate chip mounted above the light source. For example, see reference, Hofmann, MEMS mirror for low cost laser scanners, Fraunhofer, www.mini-faros.eu In some cases, the light source in the examples illustrated in FIGS. 20A-D can be pulsed or CW (constant wave) to illuminate target objects at certain wavelengths, with wavelengths ranging from 800-1600 nm. The reflected light from the target object that is illuminated by the light source can be focused into a detector array and can be a camera element using CCD and/or CMOS sensors. And in some cases, for higher sensitivity the sensor array can be APD/SPAD arrays.

In some cases, the light source in the examples illustrated in FIGS. 20A-D can be pulsed and a time of flight of the light pulse to the target object and detected by the detector array can be used in a LiDAR mode. With multiple laser beams and with MEMS micro mirror scanners 2020 a raster scan can be performed with greater spatial resolution, and shorter time than a single beam LiDAR. Only the very basic elements are shown, not shown are lens, micro mirror drivers, and other elements necessary to complete an imaging and/or LiDAR system. Single and/or multiple wavelengths of the light source can be used and the detector array can have filters to detect single or multiple wavelengths. In some cases, multiple arrays can be fabricated on a single Si chip with appropriate filters over each array to detect certain wavelengths. Ref. Vasile et al, Photon Detection with High Gain Avalanche Photodiode Arrays, IEEE transactions on Nuclear Science, Vol. 45, No. 3, June 1998. According to some embodiments the Ge photodetectors can have wavelength ranges from 700-2200 nm and the Si photodetectors can have wavelength ranges from 700-1100 nm. According to some embodiments, the Si photodetectors can operate at one or more of the following wavelengths: 905 nm, 940 nm, 980 nm and 1040 nm. According to some embodiments, the Ge/GeSi photodetectors can operate at one or more of the following wavelengths: 905 nm, 940 nm, 980 nm, 1040 nm, 1550 nm, 1650 nm and 1850 nm.

Figure 20B:
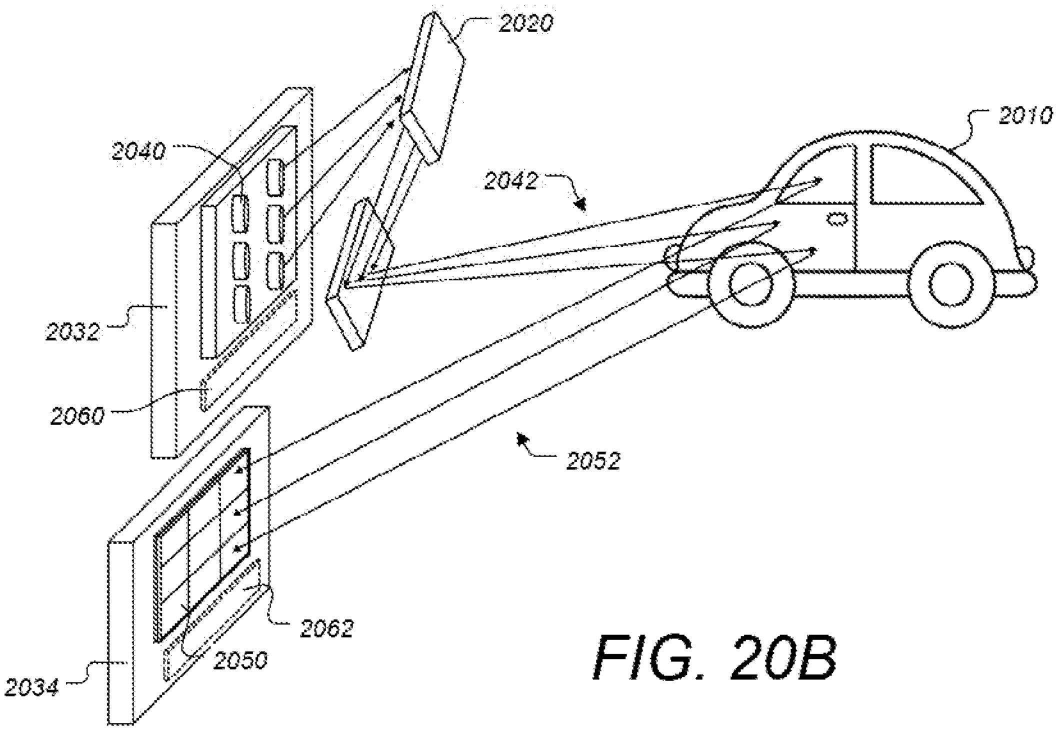

FIG. 20B is similar to FIG. 20A with the exception that the light source array is on one chip 2032 and the detector array or arrays on a separate chip 2034. Note that in this case each of the chips 2032 and 2034 have their own respective CMOS/BiCMOS ASICs 2060 and 2062. In some cases, multiple light source arrays, and multiple detector arrays can be used at 1 or more wavelength to improve 3D sensing of target objects and to minimize interference from other sources such as the sun.

Figure 20C:
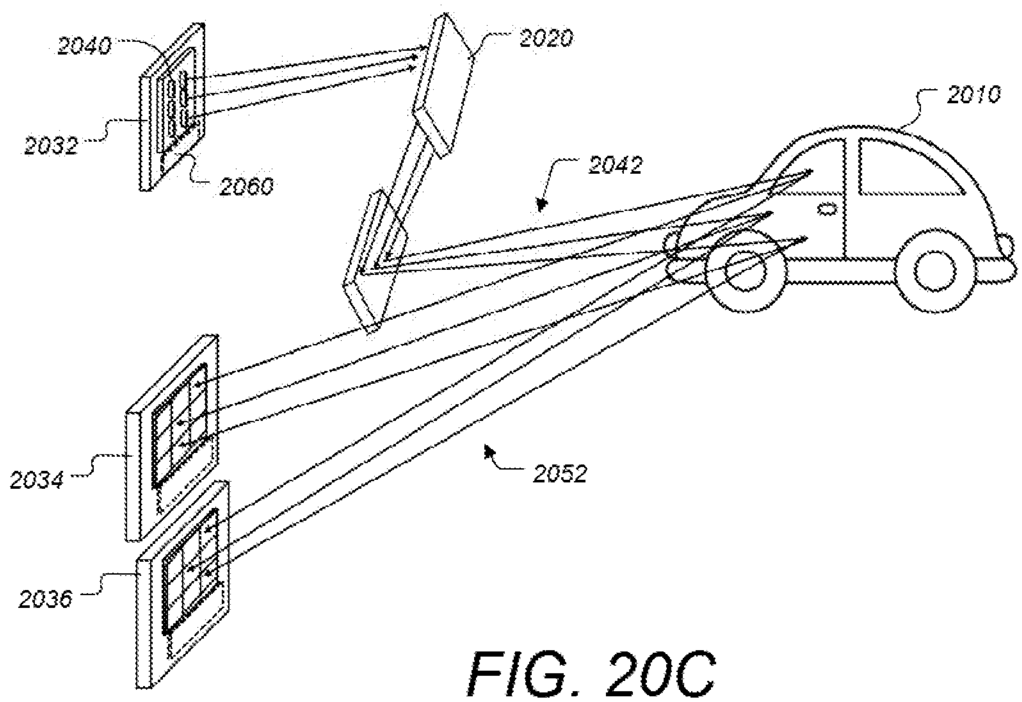

FIG. 20C shows a simplified schematic of a LiDAR system similar to FIG. 20B where array of light emitters such as surface emitting lasers with scanning micro-mirrors such as MEMS mirrors scans a target such as a car with multiple beams at the same or different wavelength and the reflected beam can impinge on 2 sets of high density 2D array of PD/APD/SPAD that are monolithically integrated with CMOS/BiCMOS ASICs. The high-density detector arrays 2034 and 2036 can be spaced apart by 2 to 20 cm or more to provide additional depth information, and in some cases more than 2 high density photodetector arrays can be used to provide additional depth information. In some cases the illuminator can be LED and/or lasers and can be used in addition to LiDAR mode and/or use to illuminate a target and the high density detector arrays can function in a manner similar to a camera and with the use of 2 or more high density arrays set apart by 6 or more cm can provide depth information such as 3D imaging similar to human eyes.

Figure 20D:
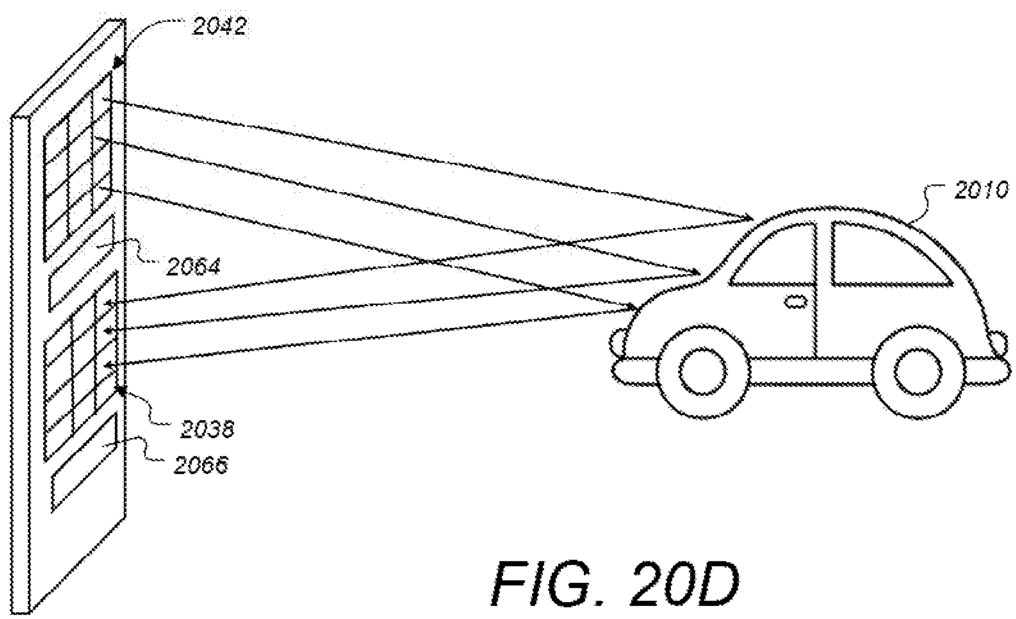

FIG. 20D shows a simplified schematic or a LiDAR and/or camera system where a high density array of illuminators such as surface emitting lasers 2042 can be used to illuminate the target 2010 and the reflection from the target impinges on a high density detector array 2038. In some cases the high density light emitters and the high density photodetector array can be implemented on a single Si chip where the detectors are monolithically integrated with CMOS/BiCMOS ASICs 2066, and where the emitter can be fabricated on the Si chip using selective hetero epitaxy of III-V material, wafer bonding of III-V material to Si, fluidic self assembly. In some case more than one CMOS/BiCMOS ASICs can be integrated as shown with CMOS/BiCMOS ASICs 2064. In some cases, the high density emitter and the high density detector array can be separate chips, and in some cases as in FIG. 20C multiple arrays of detectors spaced apart can be used to provide depth information. In some cases multiple high density arrays of optical emitters can be used. In some cases micro mirrors for scanning can be omitted.

SPAD monolithically integrated with CMOS ASICs are discussed in reference Zhang et al, A CMOS SPAD Imager with Collision Detection and 128 Dynamically Reallocating TDCs for Single-Photon Counting and 3D Time-of-Flight Imaging, Sensors 2018, 18, 4016; doi: 10.3390/s18114016.

Flash LiDAR can be implemented in some cases without the use of scanning mirrors; see for example reference, Baba et al, Development of an InGaAs SPAD 2D array for flash LIDAR, doi: 10.1117/12.2289270

Reference Beer et al, SPAD-based flash LiDAR sensor with high ambient light rejection for automotive applications, Proc. Of SPIE Vol. 10540 105402G-3; discusses using SPAD photodetectors for flash LiDAR applications.

Reference Niclass et al, Design and characterization of a 256×64-pixel single-photon imager in CMOS for a MEMS-based laser scanning time-of-flight sensor, Optics Express, 11863 Vol. 20, No. 11, 21 May 2012; discusses using SPAD array for imaging integrated with CMOS ASICs that can be used either as a flash LiDAR or a scanning LiDAR. In Niclass reference FIG. 3 a cross-section of the SPAD is shown, however the addition of microstructure holes in the deep N well and/or into the P substrate can enhance the absorption of the near infrared photons as described in this patent specification.

Monolithic integration of a thick Si photodetector with CMOS ASICs can be implemented by using the substrate as a photodetector, see for example reference; Lee et. al, A Back-Illuminated Tim-of-Flight Image Sensor with SOI-Based Fully Depleted Detector Technology for LiDAR Application, Proceedings 2018, 2, 789; doi:10.3390/proceedings2130789; however due to the thickness of the Si absorption layer the 10-90% rise time of the photodetector is in the nanosecond range. This can restrict the depth resolution to approximately 1 meter or more.

Figure 21A:
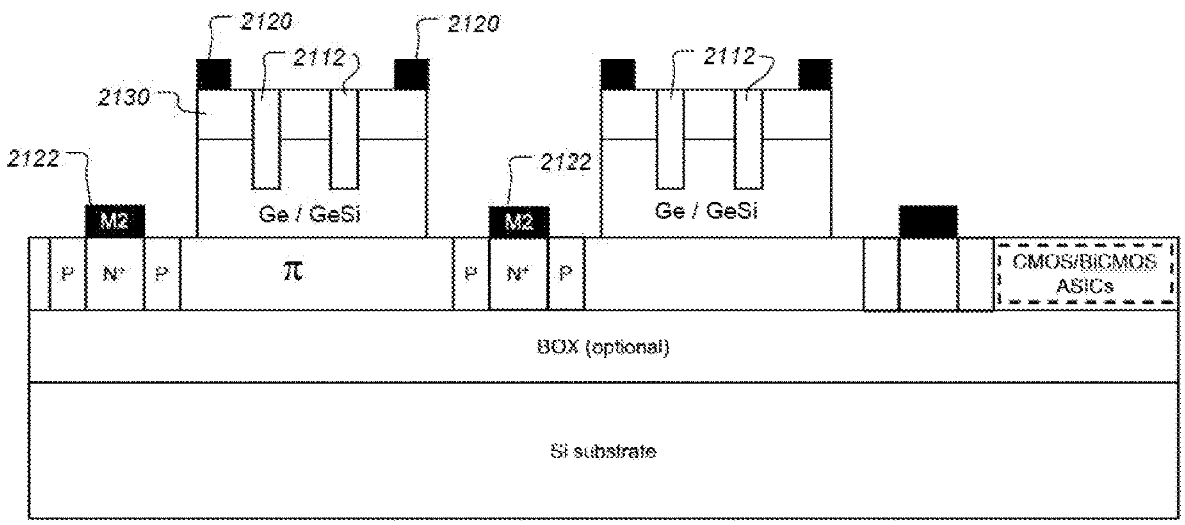
FIGS. 21A-21C are simplified partial schematic cross-sections of a lateral APD/SPAD Ge/GeSi on Si where the absorption of the optical signal are predominately in the Ge/GeSi and the multiplication such as avalanche gain occurs in the Si, according to some embodiments.
Figure 21B:
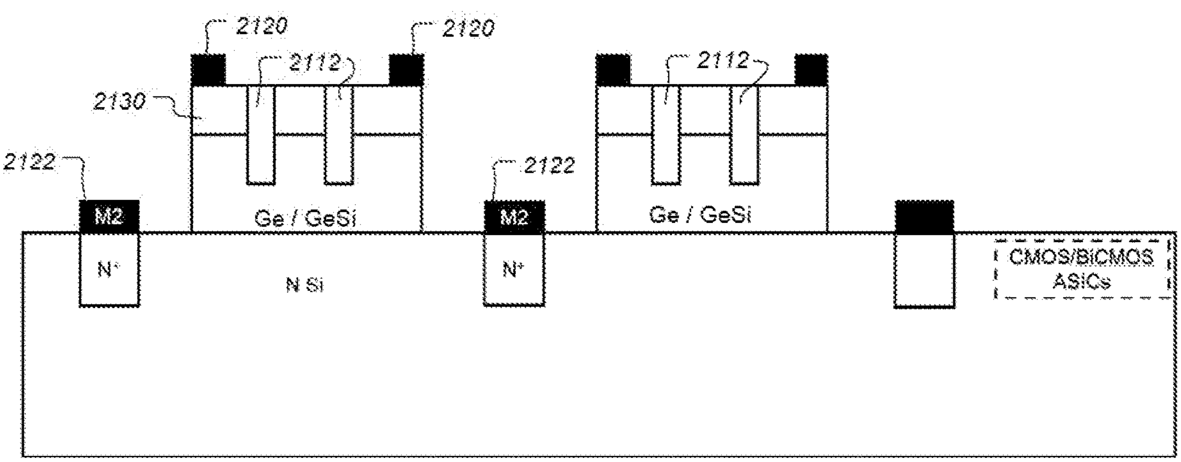
Figure 21C:
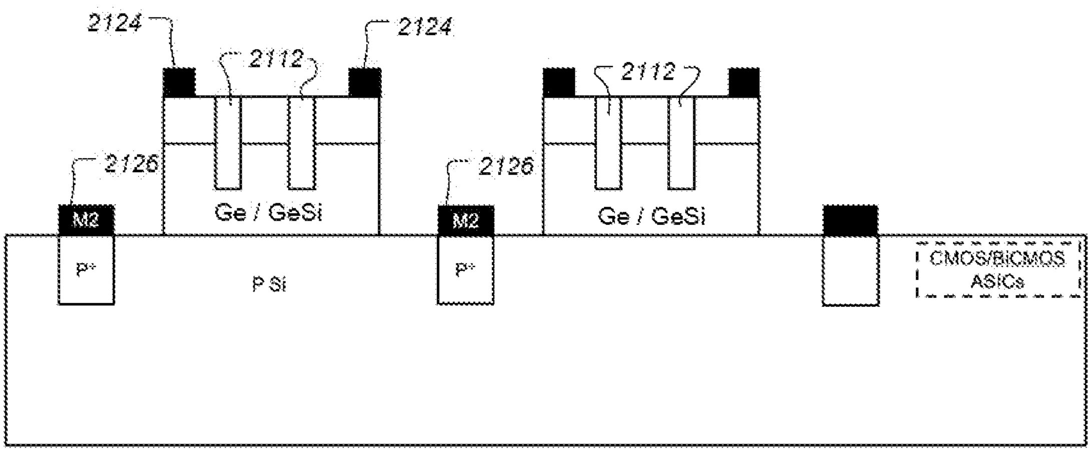

FIGS. 21A-21C are simplified partial schematic cross-sections of a lateral APD/SPAD Ge/GeSi on Si where the absorption of the optical signal are predominately in the Ge/GeSi and the multiplication such as avalanche gain occurs in the Si, according to some embodiments. The lateral APD/SPAD is surface illuminated where light can impinge on the top surface, and in some cases can impinge from the bottom surface (substrate surface), and in some cases the substrate can be thin and/or a via can be etched for a bottom illumination. In FIG. 21A, the structure consists of Ge/GeSi that can be selective area grown on I or low dope P Si (π). And in some cases, the Ge/GeSi can be grown uniformly on the I or low dope Si layer and Ge/GeSi can be etched in areas where the M2 or cathode 2122 is formed. P and $N^+$ regions can be formed in the I or low dope Si, and interdigit M2 2122 can form an ohmic contact with the $N^+$ region. The Ge/GeSi on the I or low dope Si can have a thickness ranging from 200 to 2,000 nm or more, and in some cases 300-1,000 nm, and can be I or low dope P or N type and $P^+$ Ge/GeSi layer or region 2130 can be formed on the I or low dope Ge. The P Ge/GeSi 2130 can have a thickness ranging from 10 nm to 300 nm or more and M1 interdigit electrodes 2120 can be formed on the P Ge 2130 forming an ohmic contact. In some cases, multiple M1 2120 can be formed on the P Ge/GeSi 2130. Microstructure holes 2112 can be etched into the P Ge 2130 and in some cases through the P Ge 2130 into the I or low dope Ge, and in some cases through the I or low dope Ge to the I or low dope Si. The cross-section of holes 2112 can be cylindrical, rectangular, trapezoidal, conical, to name a few, and can have a lateral dimension at the surface ranging from 600 nm to 1500 nm or more, and in some cases 800 nm-1400 nm. The spacing between the adjacent holes 2112 can range from 0 nm (touching and/or overlapping) to 1000 nm or more, and in some cases 100 nm-600 nm. The holes can be periodic, and/or aperiodic, and/or randomly spaced. A reverse bias is applied between M1 (anode) 2120 and M2 (cathode) 2122. Electric field extends from $P^+$ Ge/GeSi 2130 though the I or low dope Ge/GeSi and through the I or low dope Si to the $N^+$.

Ref. Novak et al, Lateral Avalanche Photodetector USPTO 2017/0338367 A1, discusses a lateral structure where the Ge is not electrically connected to an anode or cathode and operate predominately in a waveguide mode. In the current patent specification the Ge/GeSi is connected directly to an anode and/or cathode, as illustrated for example in FIGS. 21A-C and where electric fields penetrate from the $P^+$ region to the $N^+$ region, and where in addition optical signal is surface illuminated.

The wavelength range in devices as illustrated in FIGS. 21A-C can range from 800 nm to 1700 nm, and in some cases 800 nm-1800 nm, and in some cases 1100 nm-1550 nm, and in some cases 1150 nm-1550 nm. A reverse bias voltage is applied between the anode and cathode with a reverse bias voltage ranging from −2 volts to −50 volts or more, and in some cases from −10 volts to −45 volts. The BOX layer can be optional.

Ref Zhu et al, Waveguided Ge/Si Avalanche Photodiode With Separate Vertical SEG-Ge Absorption, Lateral Si Charge, and Multiplication Configuration, IEEE Electron Device Letter, Vol. 30, No. 9, September 2009, discusses a lateral Ge on Si APD where the light is coupled in a waveguide mode.

FIG. 21B is similar to FIG. 21A with the exception that the Si layer is N or $N^+$ and M2 forms and ohmic contact to the N or $N^+$ Si.

FIG. 21C is similar to FIG. 21B with the P and N interchanged (so that electrodes M2 are anodes 2016, and electrodes M1 are cathodes 2124).

FIGS. 21B and 21C can operate in the reverse bias, where reverse bias voltage is applied between the anode and cathode, with bias voltage ranging from −1 to −10 volts or more, and in some cases avalanche gain can occur at higher reverse bias voltages.

The lateral PD/APD/SPAD Ge/GeSi on Si photodetectors illustrated in FIGS. 21A-C can be monolithically integrated with CMOS/BiCMOS ASICs for signal processing and/or enhancement, and/or transmission.

Microstructure hole lateral PD/ADP/SPAD such as illustrated in FIGS. 21A-C can have a higher EQE than a comparable lateral PD/APD/SPAD without microstructure holes at certain wavelengths and/or at certain bias voltages. In some cases, microstructure holes may not be necessary for certain applications.

Lateral interdigitated PD/ADP/SPAD xxsy [such as shown in which FIGS. 21A-C can be fabricated in arrays or multiple arrays, and in some cases high density arrays of 1000×1000 photodetectors or more, and monolithically integrated with CMOS/BiCMOS ASICs electronics for applications in optical interconnect, imaging, 3D imaging, and/or LiDAR.

Figure 22A:
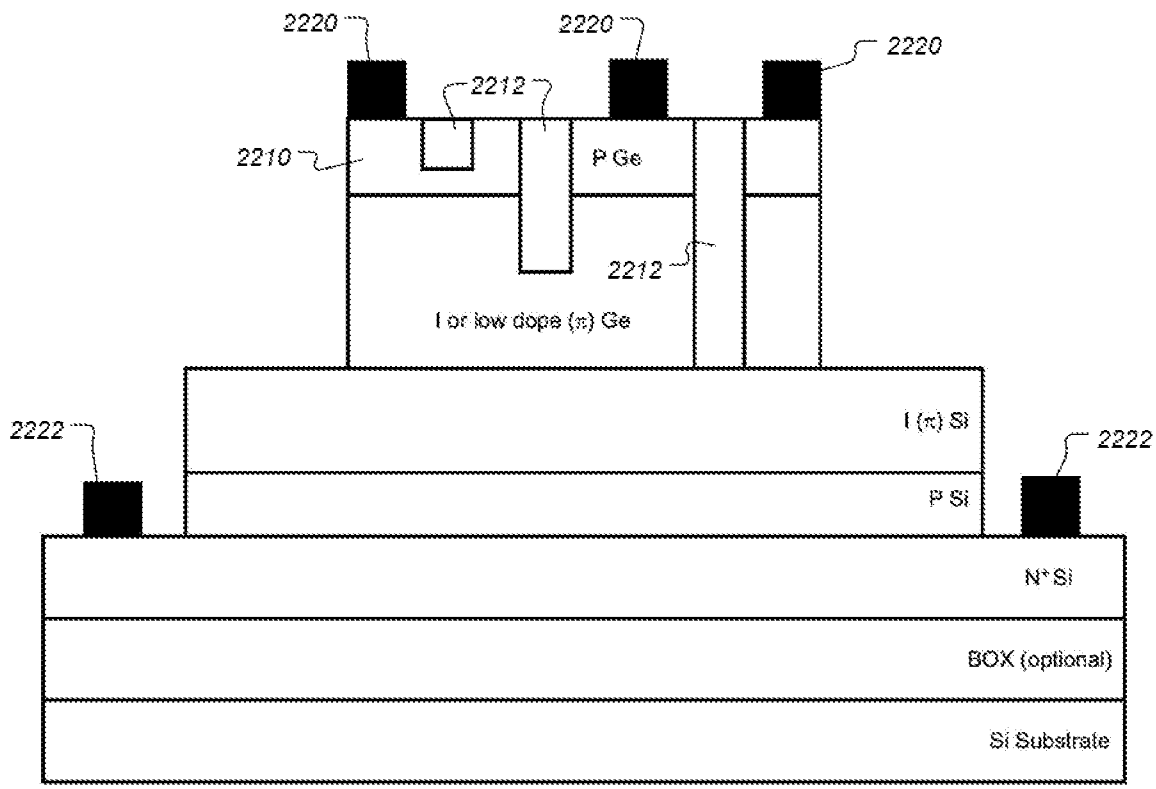
FIG. 22A shows a simplistic cross-section schematic of a interdigitated vertical Ge/GeSi on Si APD/SPAD with or without BOX layer, according to some embodiments.

FIG. 22A shows a simplified cross-section schematic of a interdigitated vertical Ge/GeSi on Si APD/SPAD with or without BOX layer, according to some embodiments. On a $N^+$ Si device layer or a $N^+$ Si substrate a P layer Si can be epitaxial grown followed by an I or low dope Si, followed by I or low dope Ge layer with or without a low temperature Ge/GeSi buffer layer, followed by a $P^+$ Ge/GeSi layer 2210. Thicknesses of the P Si layer can range from 5 to 100 nm, the I or low dope Si thickness can range from 5 to 500 nm, and the I or low dope Ge thickness can range from 50 to 1000 nm or more. The $P^+$ Ge 2210 thickness can range from 10 to 300 nm. Interdigitated anodes 2220 are formed on the $P^+$ Ge 2210 and interdigitated cathodes 2222 are formed on the $N^+$ Si. A reverse bias voltage is applied between the anode and cathode. The width of the anode and cathode interdigits can range from 5 nm to 300 nm or more. The thickness of the interdigit anode, cathode electrodes can range from 50 to 300 nm or more, and can be metal, or metal alloy, or a silicide. Microstructure holes 2212 can be etched into the $P^+$ Ge layer through the $P^+$ Ge layer 2210 and into the I or low dope Ge/GeSi layer and/or the microstructure hole can be etched to the I or low dope Si layer. In some cases, the microstructure holes 2212 can be etched into the Si. Light can impinge on the top surface and/or from the bottom surface (substrate side). The wavelength can range from 750 nm to 1800 nm and in some cases 850 nm-1550 nm, and in some cases 1040 nm-1550 nm. Data rates can range from 1 Gb/s or less to 50 Gb/s or more.

The microstructure holes 2212 can be cylindrical, trapezoidal, rectangular, inverted pyramids, funnel, and can have diameter ranging from 600 nm-1700 nm or more, and in some cases 600 nm-1300 nm. The spacing between the holes can range from 100 nm-500 nm, and in some cases more than 500 nm. The microstructure holes can be arranged in a periodic lattice such as a square or hexagonal lattice, and in some cases the microstructure holes can be aperiodic and/or random in both spacing and/or shape and/or depth.

Figure 22B:
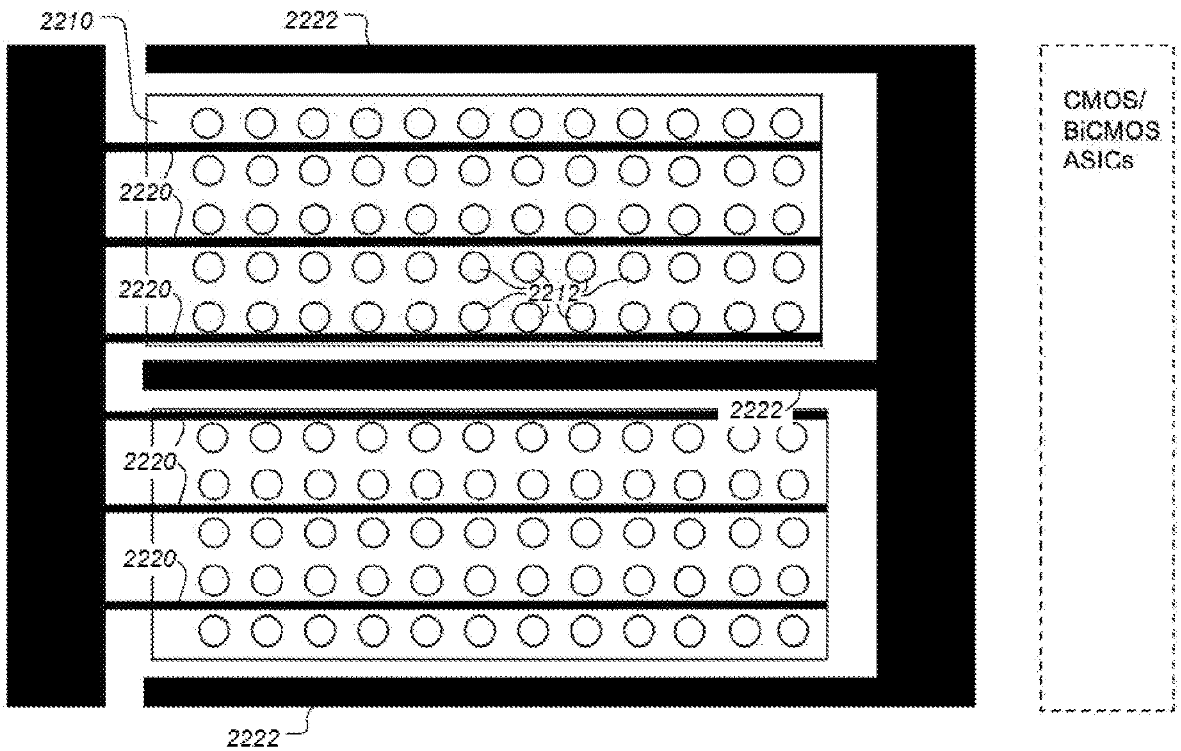
FIG. 22B shows a simple top view of the structure shown in FIG. 22A where the interdigit anodes and cathodes are connected to a transmission line and can be monolithically integrated with CMOS/BiCMOS ASICs, according to some embodiments.

FIG. 22B shows a simplified top view of the structure shown in FIG. 22A where the interdigit anodes and cathodes are connected to a transmission line and can be monolithically integrated with CMOS/BiCMOS ASICs, according to some embodiments.

Figure 23A:
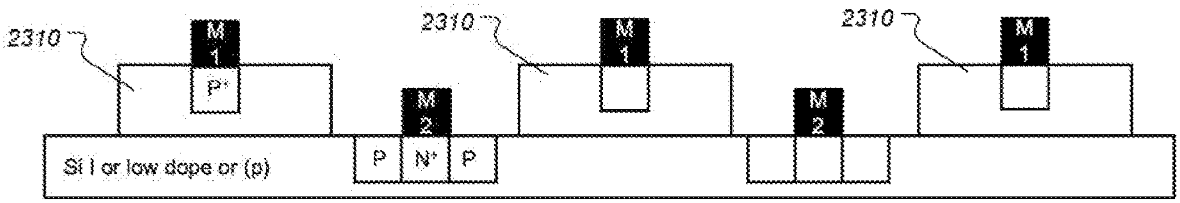
FIGS. 23A-B, 24A-B, 25A-B and 26A-B are schematic cross-sections of interdigitated lateral Ge/GeSi on Si APDs/SPADs, according to some embodiments.

FIGS. 23A-B, 24A-B, 25A-B and 26A-B are schematic cross-sections of interdigitated lateral Ge/GeSi on Si APDs/SPADs, according to some embodiments. In FIG. 23A shows an interdigitated lateral Ge/GeSi on Si PIPN APD/SPAD. The lateral Ge/GeSi APD/SPAD can be formed on a I or low dope Si substrate or on a I or low dope Si device layer on a SOI wafer. The I or low dope Si can be low dope N or low dope P as shown in FIG. 23A the Si layer is low dope P or π. P and $N^+$ wells can be formed in the Si layer with the M2 electrode forming an ohmic contact with the $N^+$ well. The I or low dope Ge/GeSi 2310 can be selective area grown on the I or low dope Si with thickness ranging from 100 nm-1000 nm or more. $P^+$ well can be formed in the Ge/GeSi 2310 and the M1 interdigit electrode can form an ohmic contact with the $P^+$ Ge/GeSi well. The width of the Ge strip 2310 can range from 200 nm to 2000 nm or more, and in some cases the width of the Ge/GeSi strip can range from 1000 nm to 10,000 nm or more. The length of the Ge/GeSi strip can range from 1 micron to 1000 microns or more, and in some cases from 20 microns to 1000 microns or more, and in some cases to 10,000 microns or more. The width of the interdigit electrodes M1 and M2 can range from 5 nm to 300 nm or more. The depth of the $P^+$ well in the Ge/GeSi can be partially into the Ge/GeSi, and in some cases through the entire depth of the Ge/GeSi 2310. The P and $N^+$ well in Si can be partially in the I or low dope Si device layer, and in some cases extending to the bottom of the I or low dope Si device layer to the BOX layer. A reverse bias voltage is applied between M1 (anode) and M2 (cathode). M1 and M2 are connected to a transmission line that carries the electrical signal to CMOS/BiCMOS ASICs integrated with the APD/SPAD detectors or detector array. Light can impinge from the top surface, and in some cases from the bottom surface. The wavelength of light can range from 800 nm-1800 nm, and in some cases from 1040 nm to 1550 nm, and in some cases from 900 nm to 1350 nm. Data rate can range from less than 1 Gb/s to greater than 50 Gb/s, and in some cases from 10 Gb/s to 50 Gb/s, and in some cases to 100 Gb/s or more. In certain applications optical pulses are used for imaging, and in some cases for distance ranging such as LiDAR, the optical pulse rates can range from 1K to 1M or more pulses per second. And in some cases can detect at 10M-100M or more pulses per second. The rise time of the APD/SPAD can range from 5 pico seconds or less to 300 pico seconds, and in some cases from 1 pico second to 100 pico seconds, and in some cases from 10 pico seconds to 50 pico seconds. Gain or multiplication factor can range from 100-1000 or more, and in some cases from 1000 to 1,000,000 or more, in some cases the gain or multiplication factor can range from 3 to 1000 or more, and in some cases from 500 to 5000 or more.

In some cases the Ge/GeSi 2310 can be grown on the Si layer, and Ge/GeSi strips can be formed by etching away the Ge/GeSi to the Si layer. In some cases, a low temperature Ge/GeSi buffer layer can be formed on the Si layer prior to the Ge/GeSi growth.

In some cases, multiple wells of P or N can be formed in addition to the wells shown in FIG. 23A.

Figure 23B:
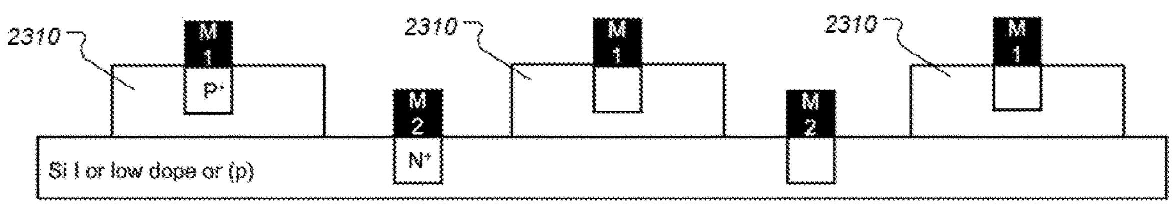

FIG. 23B shows a simple partial cross-section schematic similar to FIG. 23A but without the P wells in the Si.

Figure 24A:
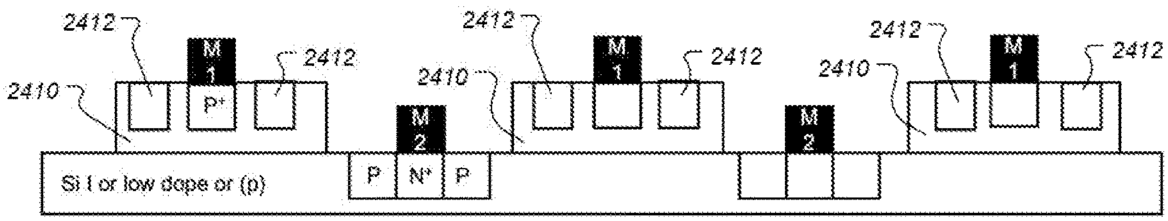

FIG. 24A shows a partial simplified cross-section schematic similar to FIG. 23A with microstructure holes in the Ge/GeSi. Microstructure holes 2412 can be etched into the Ge/GeSi layer or region 2410 with diameter ranging from 600 nm-1800 nm, and with spacing ranging from 0 nm-300 nm or more, and in some cases from 0 nm-1000 nm. The spacing of the microstructure holes 2412 can be different for different directions for example along the length of the strip the spacing can be 0 nm (touching) and along the width of the strip the spacing can be 300 nm-600 nm. In the case where the microstructure holes are touching, the holes can be inverted pyramids or conical shapes. The depth of the microstructure holes in the Ge/GeSi 2410 can be partially into the Ge/GeSi and in some cases through the Ge/GeSi to the Si layer.

Figure 24B:
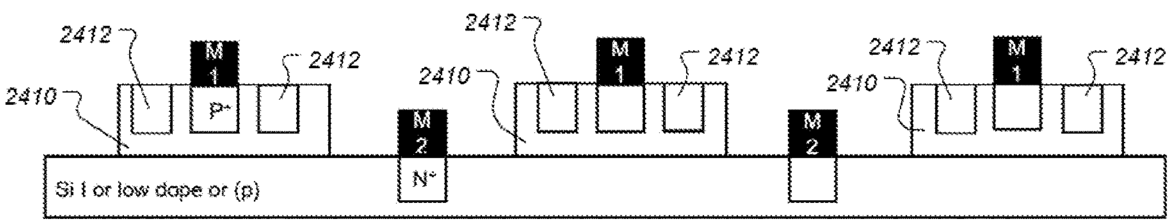

FIG. 24B is similar to FIG. 24A without the P wells in the Si.

Figure 25A:
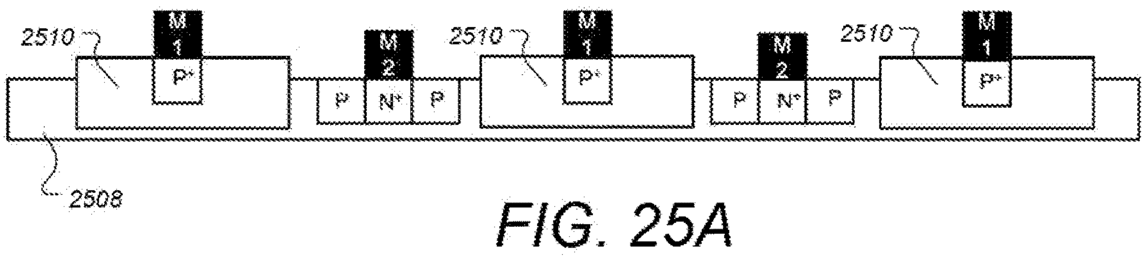

FIG. 25A is similar to FIG. 23A with the exception that Ge/GeSi 2510 is grown in a recessed trench of the Si 2508 such that the Ge/GeSi 2510 is predominately buried in a trench in Si 2508 using selective area growth for example. The surface can be planarized using methods such as chemical mechanical polishing. $P^+$ well can be formed in the Ge/GeSi and P and $N^+$ wells can be formed in the Si. M1 can form an ohmic contact to the $P^+$ (anode) and M2 can form an ohmic contact to the $N^+$ (cathode) and a reverse bias is applied between M1 and M2.

Reference Zhu et al, Waveguided Ge/Si Avalanche Photodiode With Separate Vertical SEG-Ge Absorption, Lateral Si Charge, and Multiplication Configuration, IEEE Electron Device Letters, Vol. 30, No. 9, September 2009; discusses Ge on Si APD in waveguide mode. In this patent specification all the photodetectors are top surface and/or bottom surface illuminated.

Figure 25B:
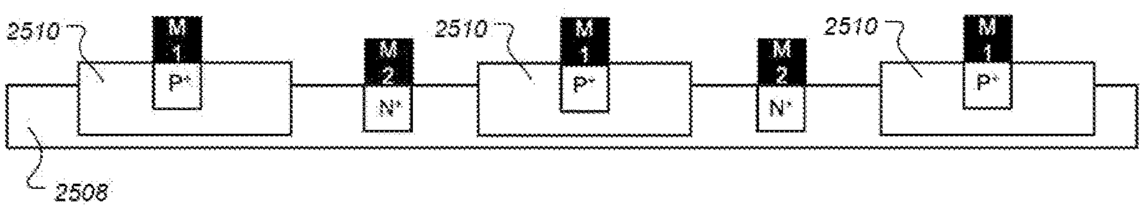

FIG. 25B is similar to FIG. 25A without the P well in Si 2508.

Figure 26A:
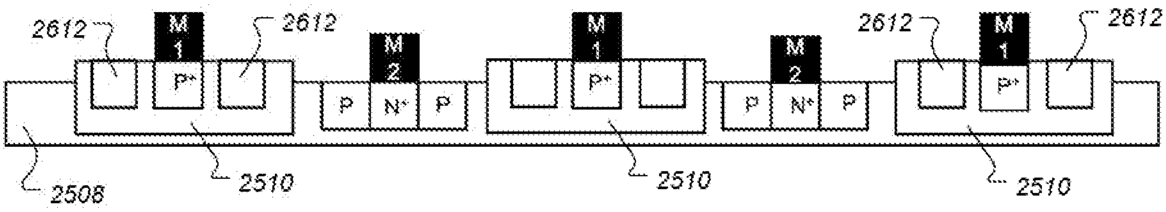

FIG. 26A is similar to FIG. 25A with the addition of microstructure holes 2612 in the Ge/GeSi. The microstructure holes are similar to those discussed in FIG. 24A.

Figure 26B:
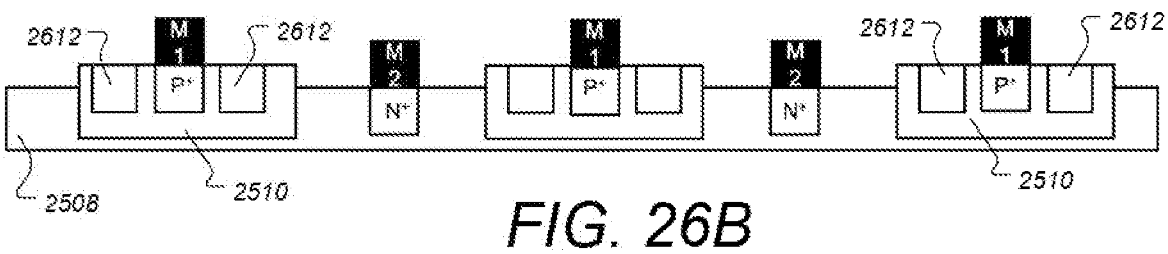

FIG. 26B is similar to FIG. 26A without the P well in Si 2508. Reference Kang et al, Monolithic germanium/silicon avalanche photodiodes with 340 GHz gain-bandwidth product, Nature Photonics 7 Dec. 2008, DOI: 10.1038/NPHOTON.2008.247 discusses a surface illuminated Ge on Si APD. Reference Martinez et al, Single photon detection in a waveguide-coupled Ge-on-Si lateral avalanche photodiode, Optics Express, Vol. 25, No. 14 10 Jul. 2017, discusses waveguide coupled lateral APD structure.

Photodetectors with microstructure holes can have a higher external quantum efficiency (EQE) than a comparable photodetector without microstructure holes. The photodetector can be a PD or APD or SPAD used for datacom or LiDAR or imaging. The photodetectors with microstructure holes can have EQE ranging from 2× to 10× or more than the EQE of a comparable photodetector without holes.

Figure 27A:
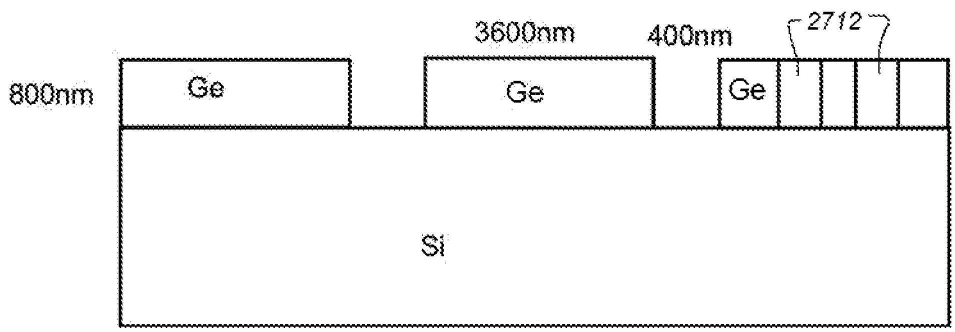
FIGS. 27A-B show a schematic cross-section and top view of Ge strips on Si with and without microstructure holes for use in FDTD simulation of optical absorption in the Ge strips.
Figure 27B:
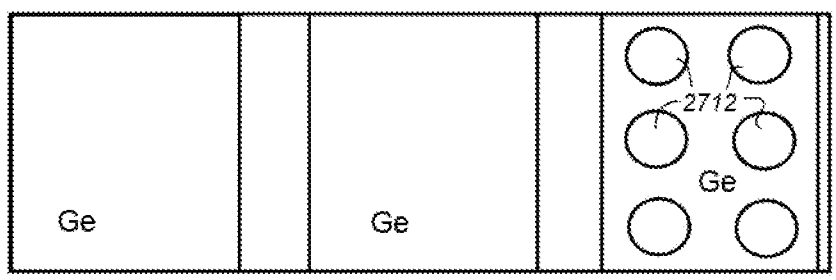
Figure 28:
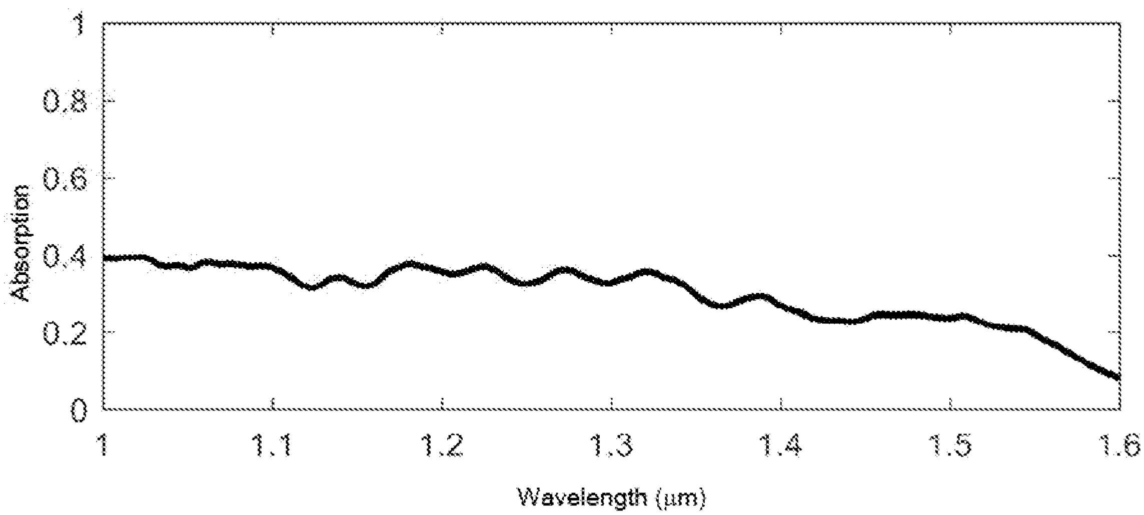
FIG. 28 shows a FDTD simulation of absorption of Ge strips on Si without microstructure holes vs wavelength from 1-1.6 microns.
Figure 29:
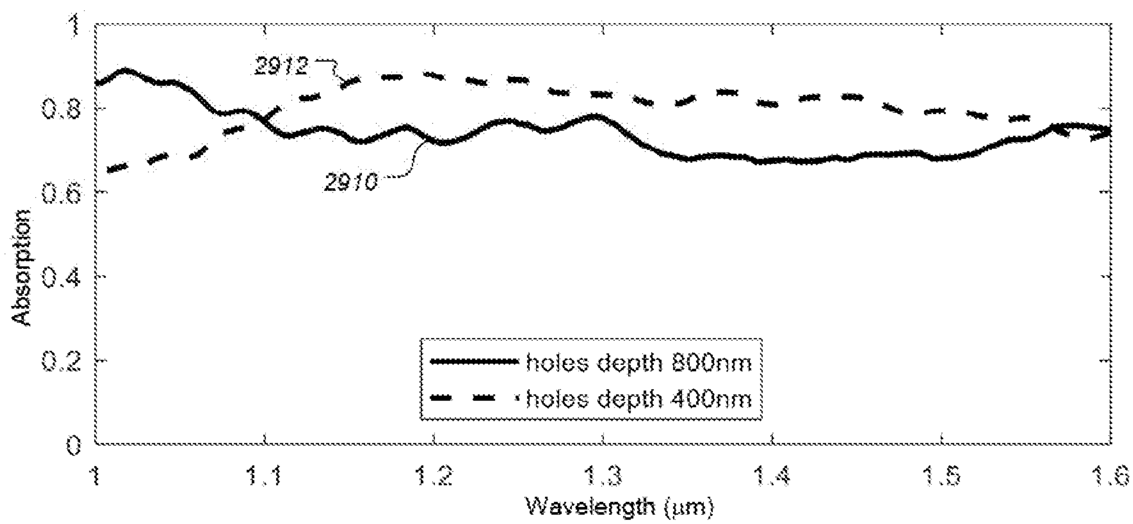
FIG. 29 shows FDTD simulation of optical absorption in Ge strips on Si with microstructure holes vs wavelength from 1-1.6 microns.

FIGS. 27A-B show a schematic cross-section and top view of Ge strips on Si with and without microstructure holes for use in FDTD simulation of optical absorption in the Ge strips. The FDTD simulation results are shown in FIGS. 28 and 29. The width of the Ge strips is 3600 nm and the gap between the strips is 400 nm, and the thickness of the Ge strips is 800 nm. The length of the strip is infinite for simulation purposes. For the FTDT simulation all the strips either have no microstructure holes 2712 or all the strips have microstructure holes. The microstructure hole diameter for the simulation is 1200 nm and the period is 1600 nm in a square lattice. The holes are circular and cylindrical. The depth of the microstructure holes are 400 nm and 800 nm.

FIG. 28 shows a FDTD simulation of absorption of Ge strips on Si without microstructure holes vs wavelength from 1 to 1.6 microns. The simulation averages over +/−10 degrees from normal incidence of the optical signal and averages over polarization. The absorption which is directly proportional to EQE is 40% or less in the wavelength range 1-1.6 microns.

FIG. 29 shows FDTD simulation of optical absorption in Ge strips on Si with microstructure holes vs wavelength from 1 to 1.6 microns. The simulation averages the angle of the incident photon over angle +/−10 degrees from normal and by the two orthogonal polarization with 1 polarization along the length of the Ge strip and another polarization along the width of the Ge strip. The dotted curve 2912 is for the case of holes that are etched to a depth of 400 nm. And the solid curve 2910 is for the case of microstructure holes that are etched through the Ge layer to a depth of 800 nm. The absorption ranges from 60-80% or more in the wavelength range from 1 to 1.6 microns. The EQE is directly proportional to absorption.

The EQE of photodetectors with microstructure holes can be higher than the EQE of photodetectors without microstructure holes at certain wavelengths. Ge strips on Si with microstructure hole diameter is 1200 nm, the period is 1600 nm in a square lattice with cylindrical cross-section, and with an etch depth of 400 nm and 800 nm in Ge.

Figure 30A:
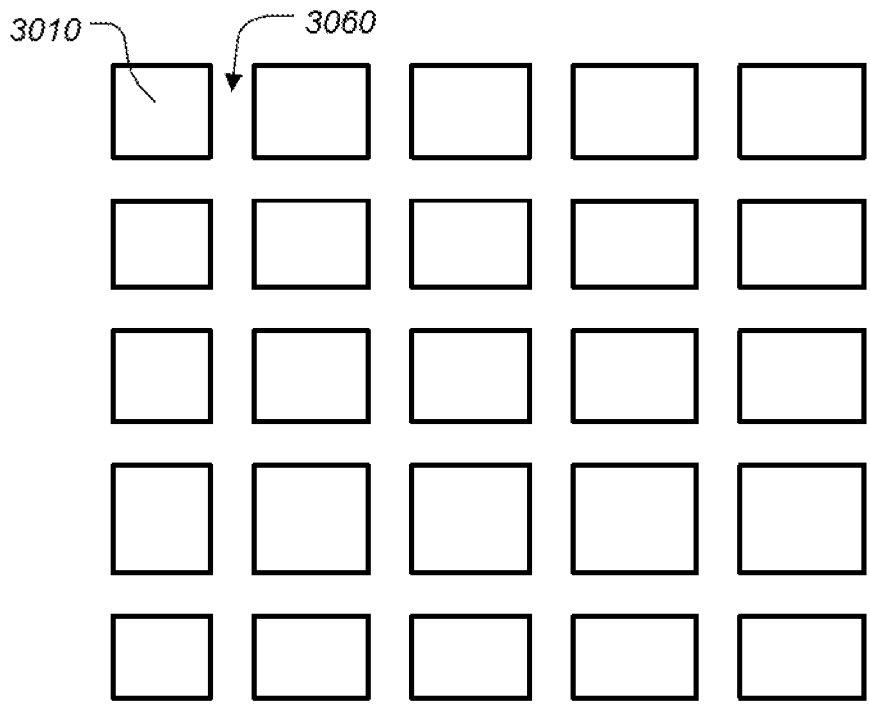
FIGS. 30A-B are simplified partial schematic top views of a semiconductor surface having holes configured as trenches, according to some embodiments.
Figure 30B:
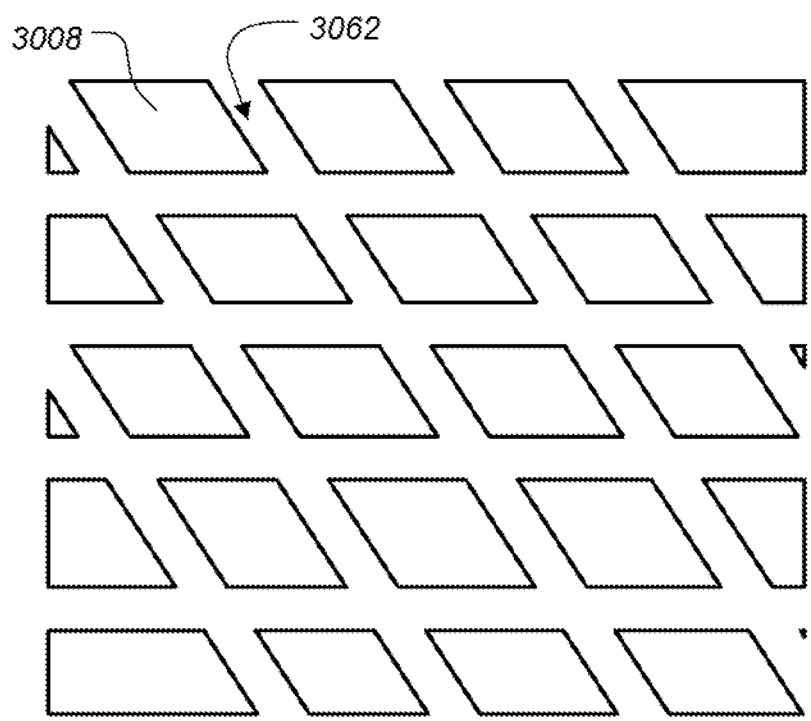

FIGS. 30A-B are simplified partial schematic top views of a semiconductor surface having holes configured as trenches, according to some embodiments. The semiconductor 3010 and 3008 can be: Si, Ge, GeSi and/or III-V material such as InP, GaAs, GaN to name a few. In this case the microstructure "holes" are "connected" to form trenches 3060 and 3062. The microstructure hole/trenches 3060 and 3062 are further configured to crisscross the surface of the semiconductors 3010 and 3008, respectively. Although the trench-shaped holes in FIGS. 30A-B are shown in straight lines, they could alternatively be formed in curved lines or a combination of straight and curved lines. The width of each trench is approximately one wavelength, and in some cases can be less than a wavelength, and in some cases can be more than a wavelength, and in some cases can have width ranging from 600 nm to 1600 nm, and can run the length of the photosensitive area. The depth of the trench can range from 100 nm to 1000 nm or more, and in some cases 50 nm to 300 nm. The spacing of the trench can range from 100 nm to 1000 nm or more, and in some cases 100 nm-600 nm.

Figure 31A:
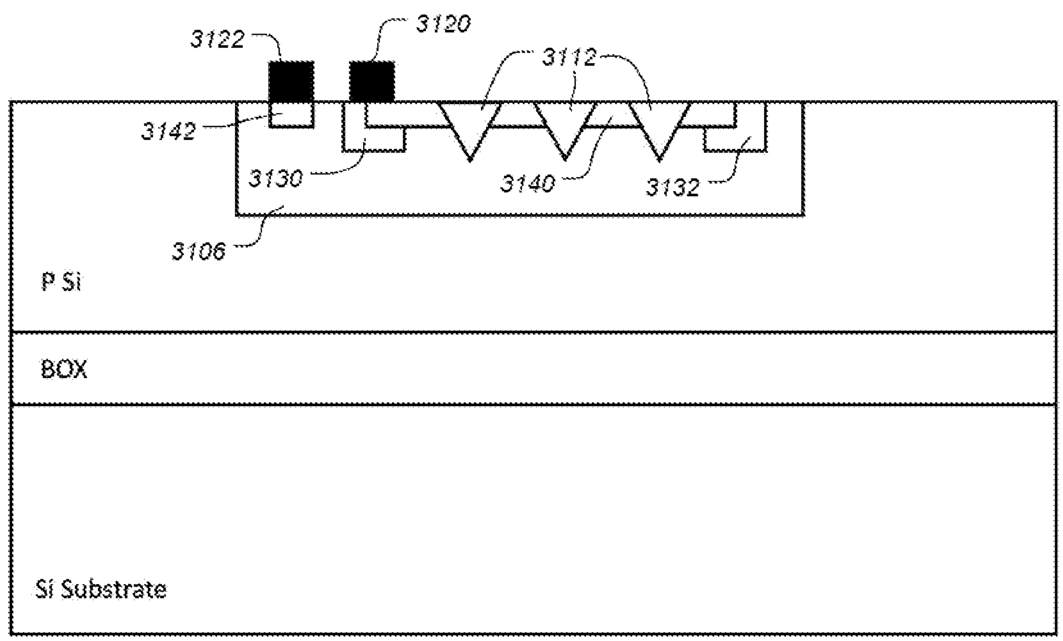
FIGS. 31A-B shows simplified partial cross-section schematics of a SPAD or APD or PD Si photodetector for imaging and LiDAR applications, according to some embodiments.
Figure 31B:
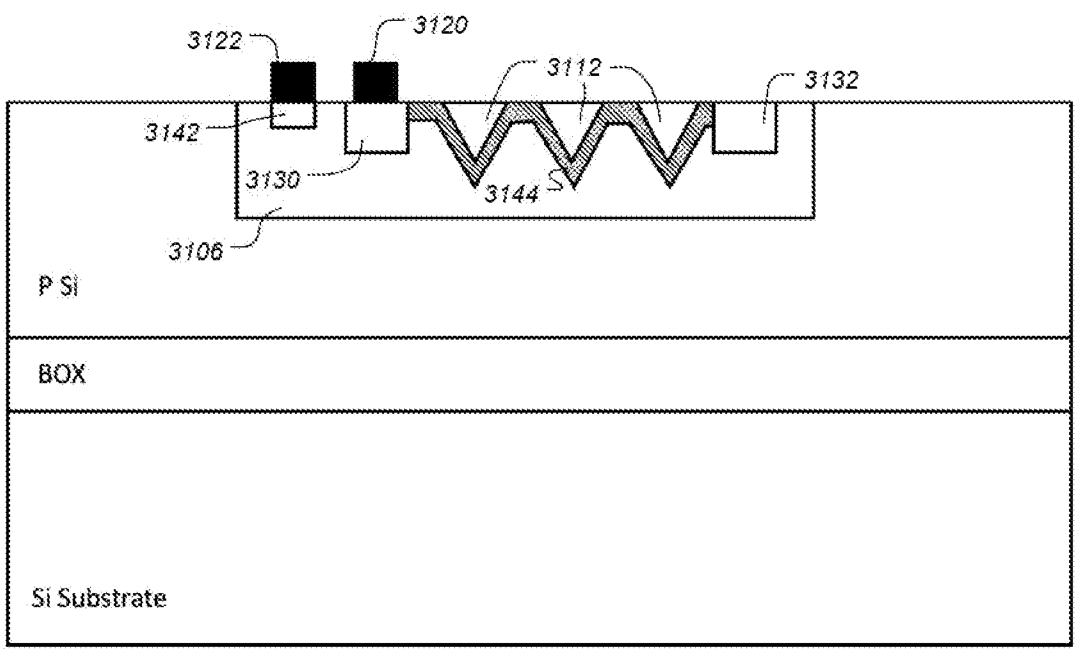

FIGS. 31A-B shows simplified partial cross-section schematics of a SPAD or APD or PD Si photodetector for imaging and LiDAR applications, according to some embodiments. The photodetector/APD/SPAD can represent a single pixel of a high-density array of PD/APD/SPAD fabricated in Si with or without a BOX layer and monolithically integrated with CMOS/BiCMOS ASICs. In a P type Si a N well 3106 is formed followed by P wells 3130 and 3132 and a $P^+$ shallow well 3140 as shown. The anode 3120 is formed on the P region, and the cathode 3122 is also formed on a P region 3142 as shown in FIG. 31A. The structure is a PNP photodetector and a reverse bias is applied between the anode and cathode. In some cases, the cathode 3122 can be formed on the N region 3106. In some cases, the structure can be a PN, and in some cases it can be NPN, and in some cases it can be a P lowdope N or P N, and in some cases the P and N can be interchanged. Microstructure holes 3112 such as inverted pyramids can be formed with hole dimension ranging from 400 nm to 1200 nm, and in some cases 600 nm-1000 nm, and in some cases 700-1200 nm, and in some cases more than 1200 nm. Cylindrical holes can also be formed, and in some cases funnel holes, and in some cases conical holes. The holes can be square, rectangular, polygonal, amoebic to name a few. The spacing of the holes can range from 50 nm to 600 nm, and in some cases 100 nm-1000 nm, and in some cases 50 nm-300 nm. The depth of the holes can range from 50 nm to 1000 nm or more, and in some cases 100 nm-500 nm, and in some cases 50 nm-800 nm. The microstructure holes can be periodic, and/or aperiodic and/or random. In the case of periodic microstructure holes it can have a square or hexagonal lattice. Optical signal or light reflected from objects can have wavelength ranging from 700 nm to 990 nm, and in some cases from 700 nm to 1050 nm. Not shown are passivation layers in the microstructure holes, and in some cases the microstructure holes can be filled with a dielectric layer. Also not shown are the integrated CMOS/BiCMOS ASICs and connecting transmission lines from the PD/ADP/SPAD to CMOS/BiCMOS electronics. The EQE of PD/ADP/SPAD with microstructure holes can be higher than a comparable EQE of PD/ADP/SPAD without microstructure holes. In reference Niclass et al, A 0.18 um CMOS Single-Photon Sensor for Coaxial Laser Rangefinders, IEEE Asian Solid-State Circuits Conference, Nov. 8-10, 2010 FIG. 1 shows SPAD micro pixel that can be integrated with CMOS electronics. Reference Niclass 2 et al, A 0.18-um CMOS SoC for a 100-m-Range 10-Frame/s 200×96-Pixel Time-of-Flight Depth Sensor, IEEE Journal of Solid-State Circuits, VOL. 49, NO. 1 January 2014. Reference Niclass 3 et al, A 100-m Range 10-Frame/s 340×96-Pixel Time-of-Flight Depth Sensor in 0.18 um CMOS, IEEE Journal of Solid State Circuits, VOL. 48, NO. 2, February 2013. Reference Ito et al, Small Imaging Depth LIDAR and DCNN-Based Localization for Automated Guided Vehicle, Sensors 2018, 18, 177; doi: 10.3390/s18010177. Reference Villa et al, CMOS Imager With 1024 SPADs and TDCs for Single-Photon Timing and 3-D Time-of-Flight, IEEE Journal of Selected Topics in Quantum Electronics, VOL. 20, NO. 6 November/December 2014.

With the addition of microstructure holes in the CMOS SPAD imagers of structures as illustrated in FIGS. 31A-B, the EQE at 870 nm, 905 nm, 940 nm wavelength can be 2×-10× or more higher than a comparable CMOS SPAD imager without microstructure holes. The increase in EQE with microstructure holes in CMOS imager can apply to PD/APD in addition to SPAD CMOS imagers.

FIG. 31B is similar to FIG. 31A with the exception that the microstructure holes 3112 are first etched followed by a shallow diffusion of $P^+$ dopants such as Boron to form shallow P well 3144.

Figure 32A:
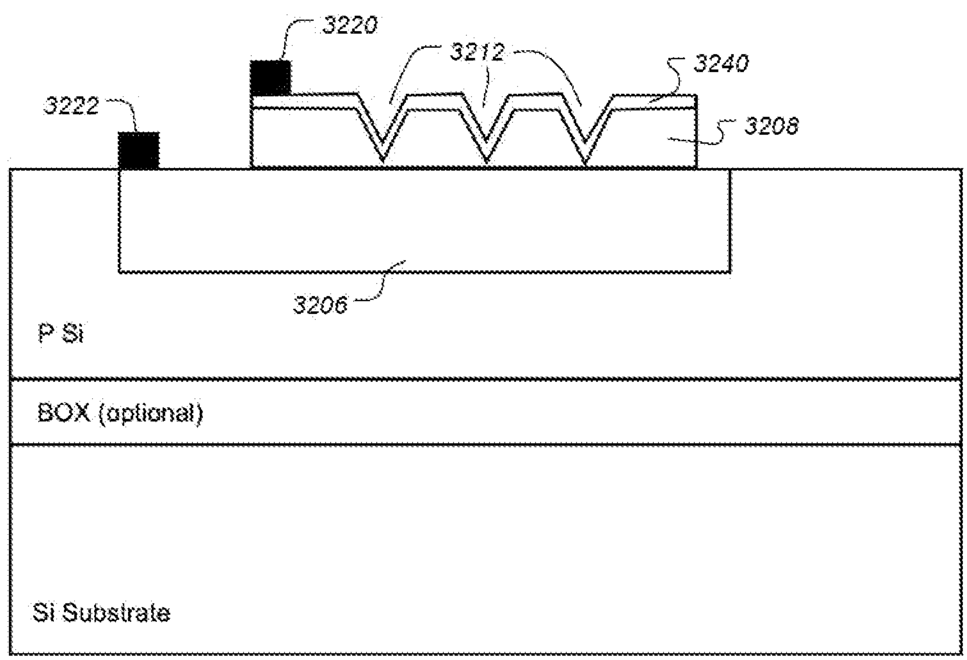
FIGS. 32A-B shows partial simplified cross-section schematics similar to FIG. 31B with the addition of a Ge/GeSi layer on top of the N well, according to some embodiments.
Figure 32B:
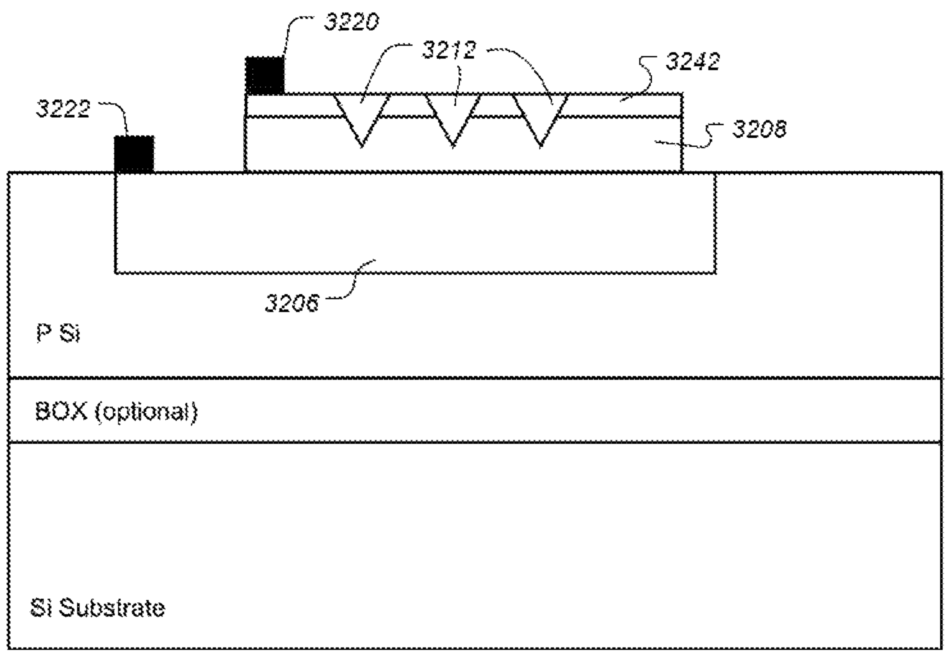

FIGS. 32A-B shows partial simplified cross-section schematics similar to FIG. 31B with the addition of a Ge/GeSi layer on top of the N well. The Ge/GeSi 3208 can be I or low dope P, and in some cases N with microstructure holes 3212 etched in the Ge/GeSi 3208. A $P^+$ layer 3240 can be grown over the top surface following the contour of the microstructure holes 3212, and in some cases the $P^+$ layer 3240 or region can be diffused with P type ions such as boron. In some cases, the $P^+$ 3240 can be polycrystalline Si, and in some cases $P^+$ amorphous Si. The anode electrode 3220 can be formed on the $P^+$ layer 3240, and the cathode 3222 can be formed on the N well 3206. A reverse bias is applied between the anode and cathode. The BOX layer in some cases can be optional. The photodetector can be PD/APD/SPAD and can be a high density 2D array for imaging LiDAR applications, and can be monolithically integrated CMOS/BiCMOS ASICs. As shown the structure is a PIN and in some cases can be PN, and in some cases can be PNP, and in some cases can be NP, and in some cases NPN, and in some cases PINP, and in some cases NIPN. Other doped regions including graded doped regions can be included. Light or optical signal can impinge from the top surface, and in some cases from the bottom substrate surface. Wavelength for detection can range from 800 nm to 1800 nm, and in some cases 800 nm-1550 nm, and in some cases 900 nm-1000 nm, and in some cases 900 nm-1550 nm. The thickness of the N well can range from 100 nm to 2000 nm or more, and in some cases can be less than 100 nm.

The microstructure holes 3212 can have a lateral surface dimension ranging from 500 nm to 1600 nm. The spacing between the microstructure holes can range from 50 nm to 800 nm. In some cases, the spacing can be more than 800 nm. In some cases, with conical holes the spacing can be 0 nm and in some cases can be intersecting. The depth of the microstructure holes can range from 100 nm to 1000 nm and in some cases greater than 1000 nm.

The Ge/GeSi layer 3206 can have a thickness ranging from 100 nm-1000 nm, and in some cases greater than 1000 nm. The Ge/GeSi can be selective area grown on the Si N well, with or without a low temperature buffer layer of Ge/GeSi, and in some cases the Ge/GeSi can be strain or in some cases can be no strain.

In some applications microstructure holes 3212 may not be necessary in the Ge, however photodetectors with microstructure holes can have a higher EQE or responsivity at certain wavelengths than a comparable photodetector without microstructure holes. The rise time of this photodetector structure can be in the 10s of pico seconds or less and can provide high depth resolutions in lidar applications. The number of pulses per second can range from 1K-1M, and in some cases greater than 1M.

For optical data communication using the new structures described in this patent specification, the data rate can range from 1 Gb/s-25 Gb/s, and in some cases 25 Gb/s-50 Gb/s, and in some cases greater than 50 Gb/s. For structures such as illustrated in FIGS. 32A-B xxsy, PAM4 can increase the data rate further by 2×, see reference Kerrebrouck et al, High-Speed PAM4-Based Optical SDM Interconnects With Directly Modulated Long-Wavelength VCSEL, Journal of Lightwave Technology, DOI 10.1109/JLT.2018.2875538

FIG. 32B is similar to FIG. 32A with the exception of a $P^+$ layer 3242 formed on the Ge/GeSi layer 3208 prior to etching microstructure holes 3212.

The microstructure holes 3212 can be passivated with amorphous semiconductor and/or dielectric, and in some cases the microstructure hole can be filled with dielectric.

In some cases of structures such as illustrated in FIGS. 23A-B, 24A-B, 25A-B26A-B, and 32A-B for example, balanced photodetector (PD/APD/SPAD) can be used to further reduce noise; for example see references Wang et al, InP-based Balanced Photodiodes Heterogeneously Integrated on SOI Nano-Waveguides, IEEE 976-1-5090-1602-0/16; Runge et al, Waveguide Integrated Balanced Photodetectors for Coherent Receivers, IEEE Journal of Selected Topics in Quantum Electronics, Vol. 24, No. 2 March/April 2018; Islam et al, Distributed Balanced Photodetectors for Broad-Band Noise Suppression, IEEE Transactions on Microwave Theory and Techniques, Vol. 47, No. 7 July 1999. Microstructure holes can be included on the balanced photodetectors to enhance the EQE at certain wavelengths. See also reference; Zheng et. al, Fluidic Hetergeneous Microsystems Assembly and Packaging, Journal of Microelectromechanical Systems, Vol. 15, No. 4, August 2006. See also reference, Park et. al, A First Implementation of an Automated Reel-to-Reel Fluidic Self-Assembly Machine, https://doi.org/10.1002/adma.201401573, Jun. 27, 2014.

Figure 33A:
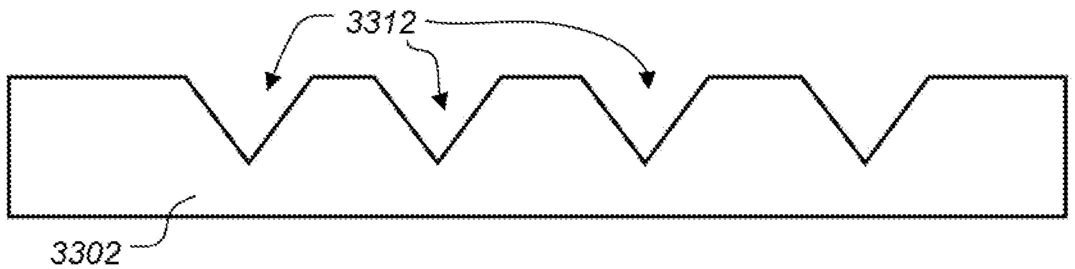
FIGS. 33A-C show simplified partial schematic cross-sections of microstructure holes formed on semiconductor surfaces, according to some embodiments.
Figure 33B:
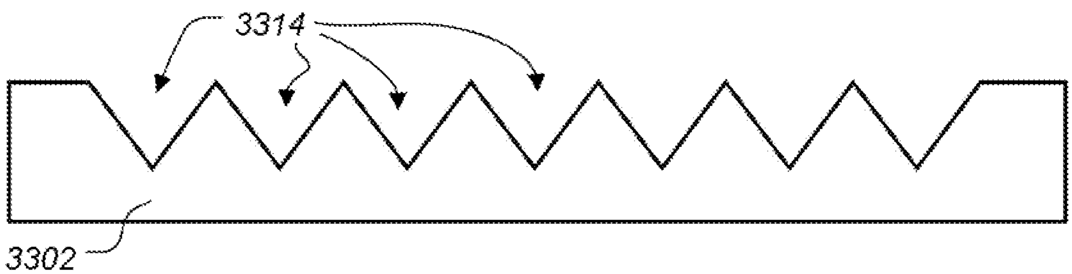
Figure 33C:
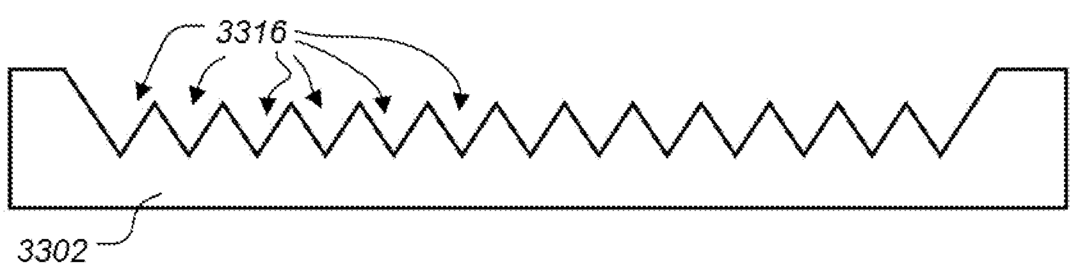

FIGS. 33A-C show simplified partial schematic cross-sections of microstructure holes formed on semiconductor surfaces, according to some embodiments. Holes 3312 formed in semiconductor material 3302 in FIG. 33A can have conical or inverted pyramid shapes. The holes 3312 can be spaced by a finite distance for example 50 nm to 1000 nm as shown. Holes 3314 of FIG. 33B illustrate that in some cases, the conical or inverted pyramid microstructure holes can touch. Holes 3316 of FIG. 33C illustrate that in some cases, the conical or inverted pyramidal microstructure holes can intersect.

In some cases, the microstructure holes on the surface of a photodetector to enhance EQE can include a combination of all 3 cases shown in FIGS. 33A-C. The holes can be passivated with dielectrics or with semiconductor that can be crystalline, polycrystalline, and/or amorphous and can be a semiconductor that is different than the semiconductor on which the microstructure holes are formed. In some cases, the microstructure holes can be partially or entirely filled with a dielectric.

The use of microstructure holes to enhance EQE of structures such as illustrated in FIGS. 33A-C can be applied to material other than semiconductor, for example polymers, graphene to name a few. In some cases, reverse bias is applied to generate an electric field to sweep out photo generated carriers. In some cases, a forward bias can be biased also to generate an electric field to sweep out photo generated carriers.

The EQE of photodetectors under reverse or forward bias with microstructure holes in all new structures described in this patent specification can be greater than the EQE of a comparable photodetector under reverse or forward bias at certain wavelength.

Figure 34A:
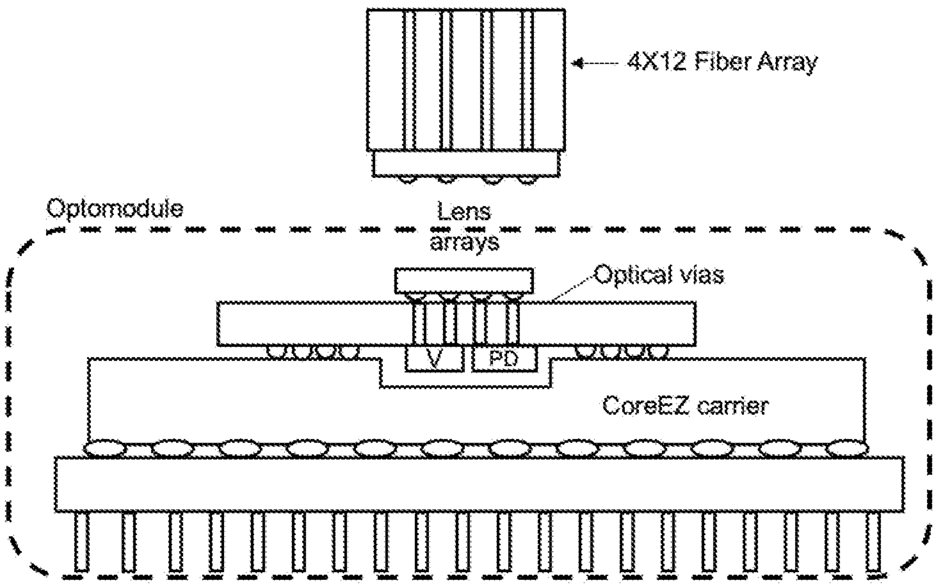
FIGS. 34A and 35A show known optical modules.
Figure 34B:
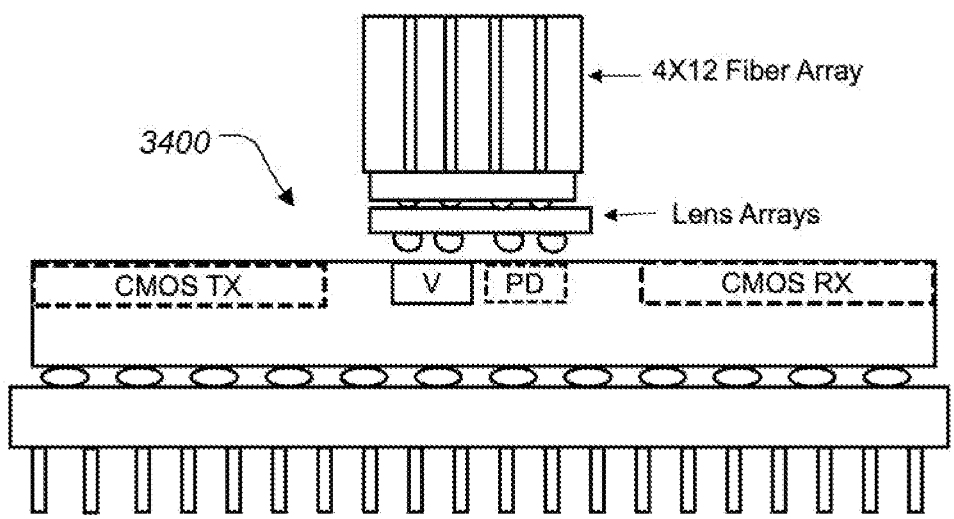
FIGS. 34B and 35B show optical modules, according some embodiments.

FIG. 34A shows a known optical module. For further details of the example shown see: IBM ref. Doany, High Density Optical Interconnects for High Performance Computing, OFC 2014 M3G1. The module consists of four separate components. FIG. 34B shows a condensed optical module, according to some embodiments of this patent specification. In this case, the separate components in the known example shown in FIG. 34A are "condensed" to a single component 3400. In particular, three of the components are monolithically integrated: (1) the photodetector array; (2) the CMOS/BiCMOS ASICs for driving the Vertical Cavity Surface Emitting Laser (VCSEL) array; and (3) the ASICs for amplifying and conditioning and/or processing the electrical signal from the Photodetector array. The fourth component, the VCSEL array, can be attached to the monolithically integrated Photodetector array and CMOS/BiCMOS ASICs using fluidic self-assembly, robotic assembly, Van Der Waals epitaxial lift off attachment, wafer bonding, hetero epitaxial to name a few. The electrodes of the VCSEL array can be attached to the transmission line of the CMOS/BiCMOS driver using a back end of the line process. This reduction in component parts can be a significant reduction in cost. As shown in FIG. 34B the single component 3400 can be directly attached to the PCB, motherboard, Pin Gate Array connectors (PGA). The aggregated data rate can be over 400 Gb/s with a 4×12 array of VCSELs and Photodetectors, where each channel can be 10 Gb/s or more.

For further details of a High density VCSEL array and detector array with 48 channels for onboard optical module, see reference Doany et al, Terabit/Sec VCSEL-Based 48-Channel Optical Module Based on Holey CMOS Transceiver IC, Journal Of Lightwave Technology, Vol. 31, No. 4, Feb. 15, 2013.

Figure 35A:
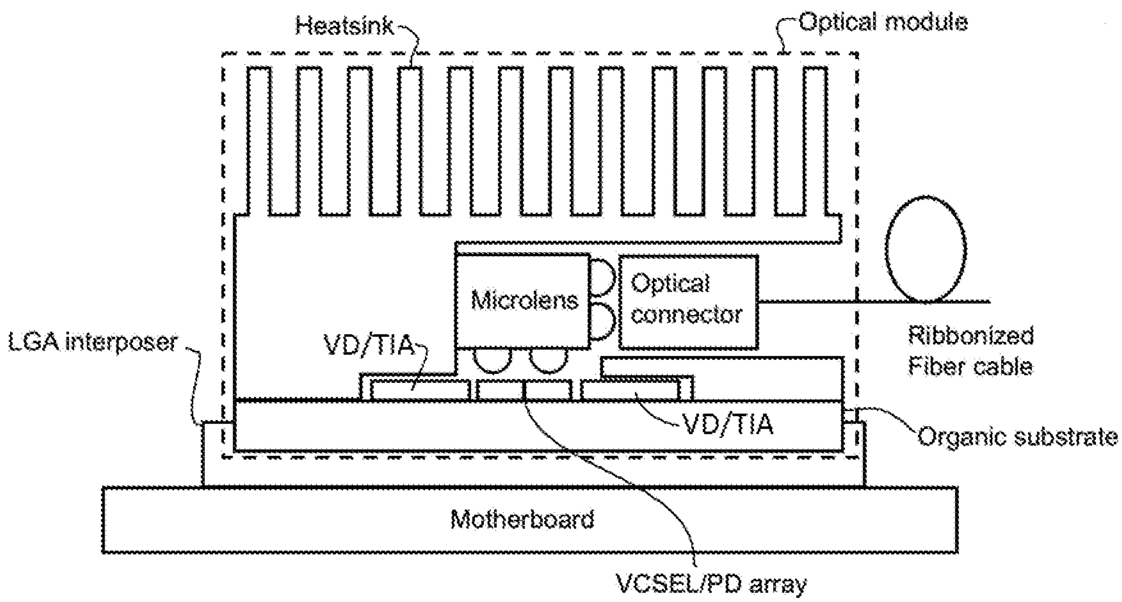
Figure 35B:
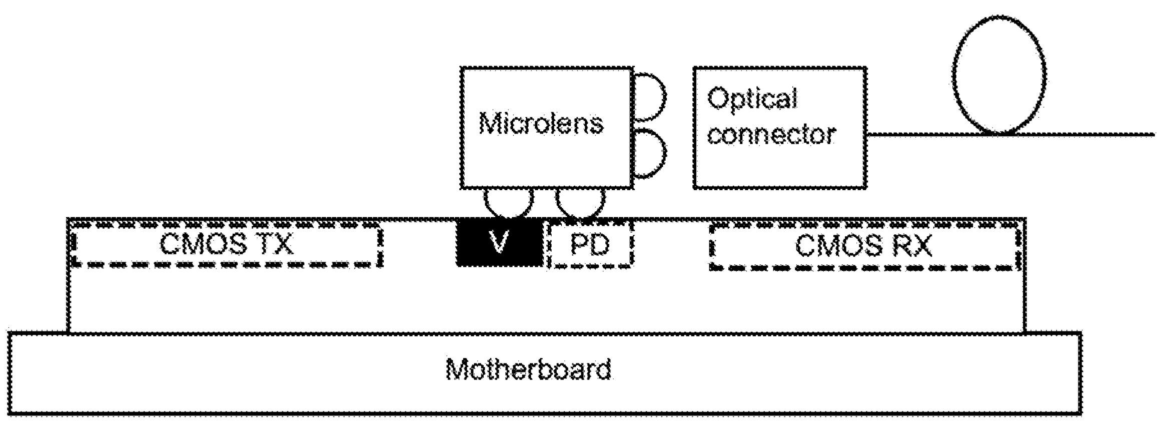

FIG. 35A shows a known onboard optical module. The optical module consists of six components, namely, the interposer, organic substrate, VCSEL driver, Trans-impedance Amplifier (TIA), VCSEL array, and Photodetector (PD) array. The module is attached directly to the motherboard/PCB. See, Ref, Nasu et al, >1.3 Tb/s VCSEL-Based On-Board Parallel-Optical Transceiver Module for High-Density Optical Interconnects, Journal of Lightwave Technology, Vol. 31, No. XX January, 2018. FIG. 35B shows an optical module according to some embodiments of this patent specification. In this example, the six components are reduced to a single component. The Photodetector array can be Si, GeSi, Ge on Si and is monolithically integrated with CMOS/BiCMOS ASICs, which include the laser driver and the TIA and other electronics for processing, conditioning and communication for the laser and the Photodetector arrays. The aggregated data rate for a 24 channel can be over 600 Gb/s where each channel can have a data rate of 25 Gb/s-28 Gb/s. The VCSEL array can be attached to the monolithically integrated chip at the wafer scale level using fluidic self-assembly, robotic assembly or other wafer scale assembly, and the electrodes of the VCSEL array can be attached the transmission line of the laser driver ASICs using a back end of the line process. This reduction in components greatly reduces packaging complexity and therefore the cost of the on-board optical module.

Monolithic integration of high density photo-sensing arrays for imaging with CMOS ASICs with inverted pyramid holes on the surface of the sensing absorption layer have shown extension of the optical sensitivity to 1000 nm wavelength, see for example Ref, Yokogawa et al, IR sensitivity enhancement of CMOS Image Sensor with diffractive light trapping pixels, Scientific Reports 7:3832 DOI: 10.1038s41598-017-04200-y. The CMOS image sensor operates at very low frames per second, typically in the millisecond range or longer. In addition, reference Yokogawa shows the inverted pyramid array on the surface of the absorption of the photo sensor without indications of applying external bias voltage for example reverse bias. The photo sensing may depend only on diffusing of photo carriers generated to collecting electrodes in a CMOS transistor.

With monolithic integration of PD/APD/SPAD arrays with CMOS/BiCMOS electronics in structures such as illustrated in FIG. 35B, the array size can be greater than 48 channels and in some cases the array size can be greater than 100 channels, and in some cases the array size can be greater than 1000 channels. The data rate for each channel can range from 10 Gb/s-25 Gb/s or more. By monolithically integrating, parasitics due to connecting the channel or PD/APD/SPAD to the electronics can be significantly lowered compared to wire bonding or soldier bump technology that may be required to attach the transmission lines of a detector array chip that is not integrated monolithically with the electronics. The parasitics can consist of capacitance, inductance, and/or resistance.

Figure 36A:
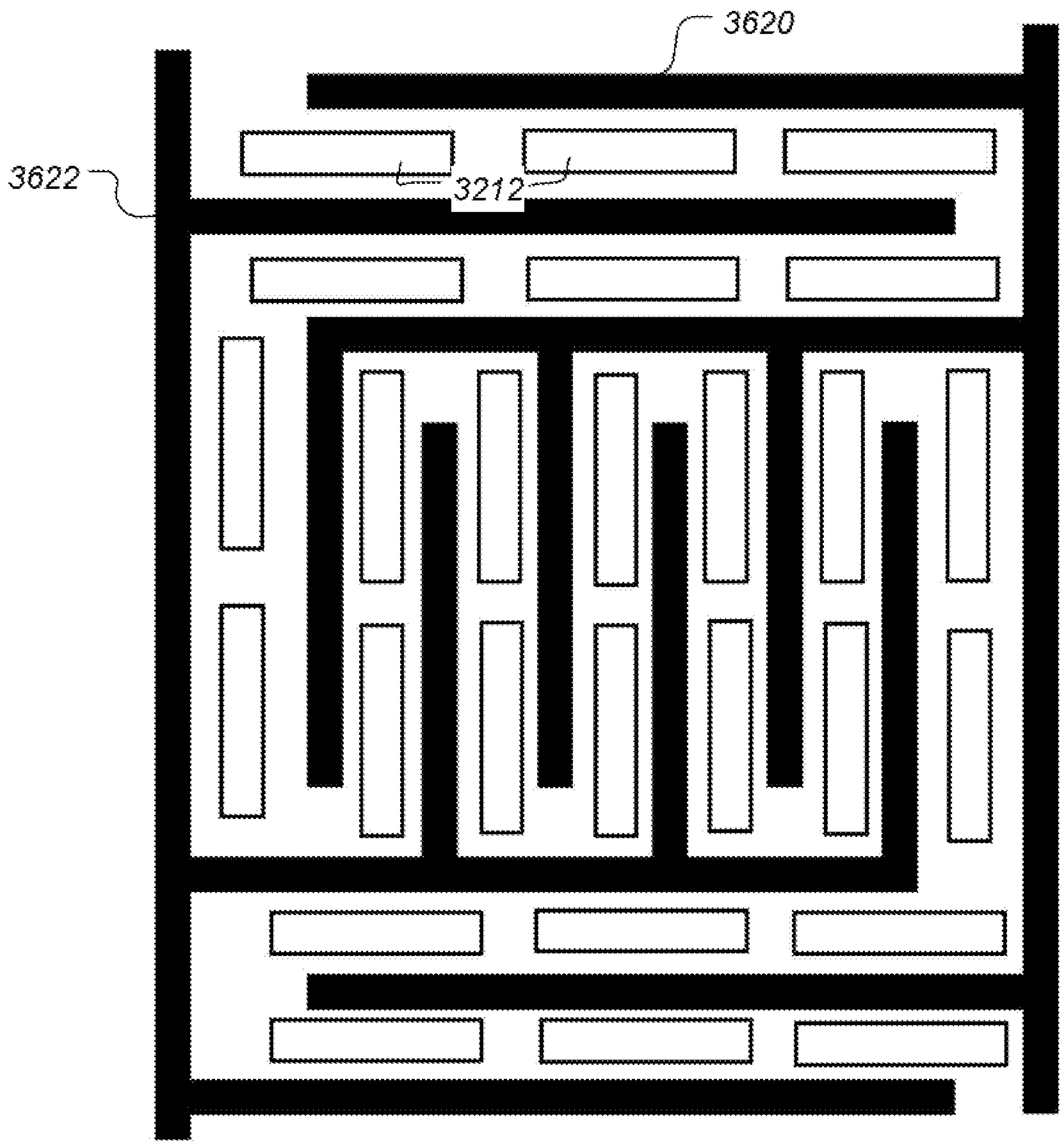
FIGS. 36A-B show simplified partial schematic top views of an interdigitated photodiode and elongated microstructure holes, according to some embodiments.
Figure 36B:
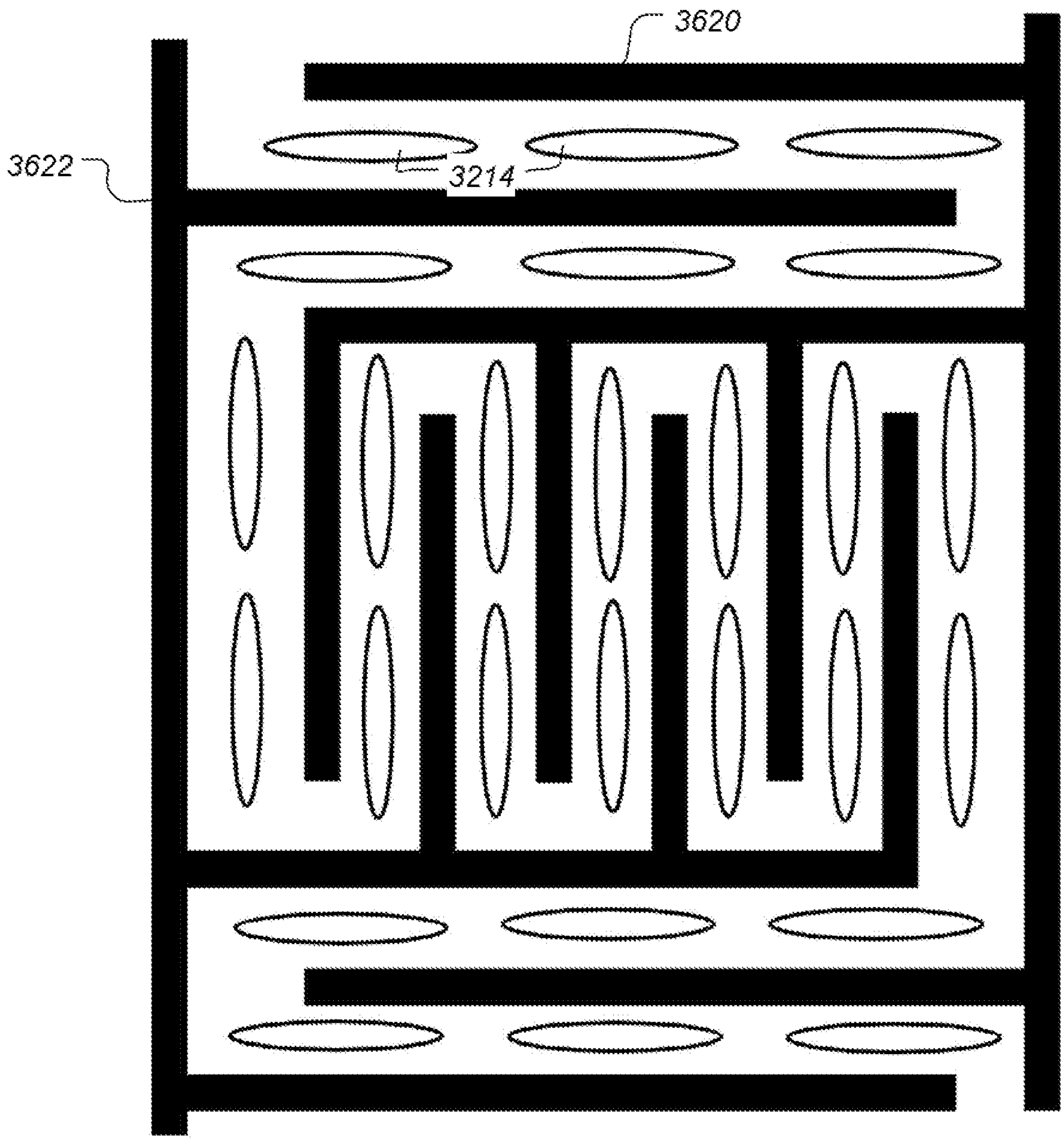

FIGS. 36A-B show simplified partial schematic top views of an interdigitated photodiode and elongated microstructure holes, according to some embodiments. The interdigits can be in two orthogonal orientations and the microstructure holes or islands can be elongated along the direction of the interdigit electrodes. In some cases the microstructure hole or island can be rectangular (holes 3212 in FIG. 36A), oval (holes 3214 in FIG. 36B), and/or polygonal to name a few. In the cases where the holes are elongated along the direction of the interdigit electrodes, the interdigit electrode spacing can be narrower for example less than 1000 nm. The dimension of the rectangular hole or island can range from 100 nm-1500 nm or more. For example, the narrow dimension of the rectangular hole can have dimensions ranging from 50 nm-1000 nm, and in the long direction the dimension can range from 400 nm-2000 nm or more.

In some cases of structures such as illustrated in FIGS. 36A-B, the spacing between the interdigit electrodes or p and n junctions can range from 100 nm to 1000 nm or more. The width of the electrode or p and n junctions can range from 10 nm to 500 nm. M1 (3620) and/or M2 (3622) interdigit electrodes can form Schottky, metal oxide semiconductor and/or ohmic to semiconductor and/or ohmic to p and/or n junctions.

Data rates of structures such as illustrated in FIGS. 36A-B and the other new structures described in this patent specification can range from 1 to 50 Gb/s or more and in some cases 10 to 30 Gb/s. In some cases the rise time (10-90% of pulse amplitude) can range from 1 to 100 psec and in some cases 10 to 50 psec and in some cases 100 psec to 10 nsec.

In structures such as illustrated in FIGS. 36A-B and the other new structures described in this patent specification, arrays of photodetector, PD/APD/SPAD, can have 4 to 1000 photodetectors or more and in some cases tens of thousands to millions of photodetectors monolithically integrated with CMOS or BiCMOS ASICs and electrically connected to the ASICs operating in a reverse bias in the cases with p and/or n junctions and in the cases with Schottky and/or MOS junctions the photodetector can operate in the reverse and/or forward bias. In the case of ohmic junctions to the semiconductor, bias can be either forward or reverse.

Lateral dimension of the photosensitive region of structures such as illustrated in FIGS. 36A-B and the other new microhole structures described in this patent specification can range from one micron to thousands of microns and in some cases more than one thousand microns.

FIG. 36B is similar to FIG. 36A except that the microstructure holes 3214 are oval shaped. Note that in some cases the hole can have other shapes such as diamond shaped holes. Note that in all such cases, one lateral dimension is larger than the orthogonal dimension. The oval shaped holes allow the electrodes to be closely spaced; for example the electrode spacing can range from 200 nm-1000 nm and in some cases from 200 nm-500 nm for high data rates, for example 20 Gb/s or more. Two lateral dimensions of the elongated holes can range from 100 nm-1500 nm, and in some cases 1 lateral dimension can range from 100 nm-1000 nm, and the second lateral dimension can range from 500 nm-2000 nm, and in some cases the first lateral dimension can range from 300 nm-500 nm, and the second lateral dimension can range from 500 nm-1500 nm.

Figure 37:
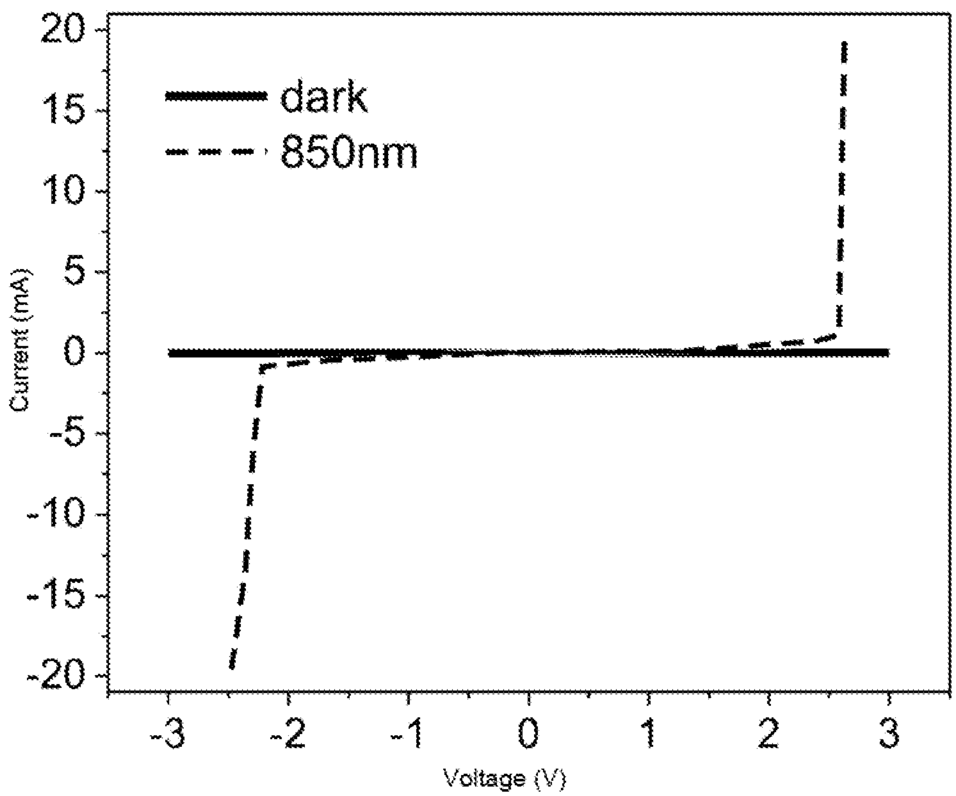
FIG. 37 shows current voltage characteristics "IV" of a metal oxide semiconductor junction under both M1 and M2 electrodes of an interdigitated photodiode, according to some embodiments.

FIG. 37 shows current voltage characteristics "IV" of a metal oxide semiconductor junction under both M1 and M2 electrodes of an interdigitated photodiode, according to some embodiments. The dashed IV curve shows a sharp breakdown at approximately 2.5 volts in either the reverse or forward voltage bias. This breakdown may be Zener breakdown which is due to tunneling through the oxide layer and can be controlled by the intensity of the absorbed photon in the semiconductor. The absorbed photon can cause a change in the number of minority carriers in the semiconductor which can affect the Zener breakdown voltage. This Zener breakdown can result in a responsivity at 850 nm of 7 A/W or more. Three types of gain can be observed in interdigitated metal semiconductor metal photodiodes, Zener gain, photoconductivity gain and avalanche gain.

Figure 38A:
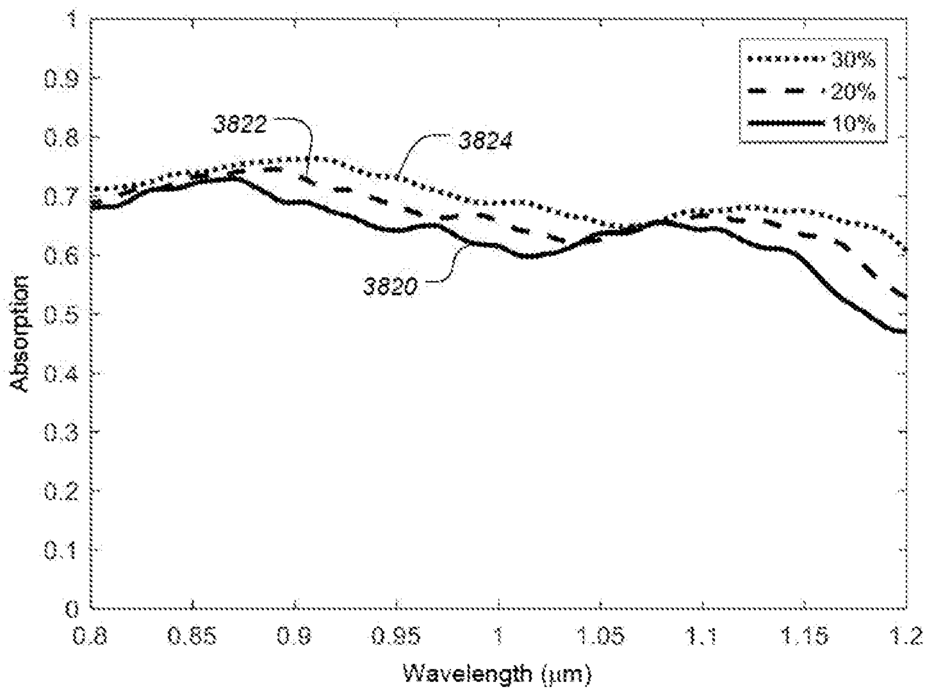
FIGS. 38A-C illustrate an FDTD simulation of a structure, according to some embodiments.
Figure 38B:
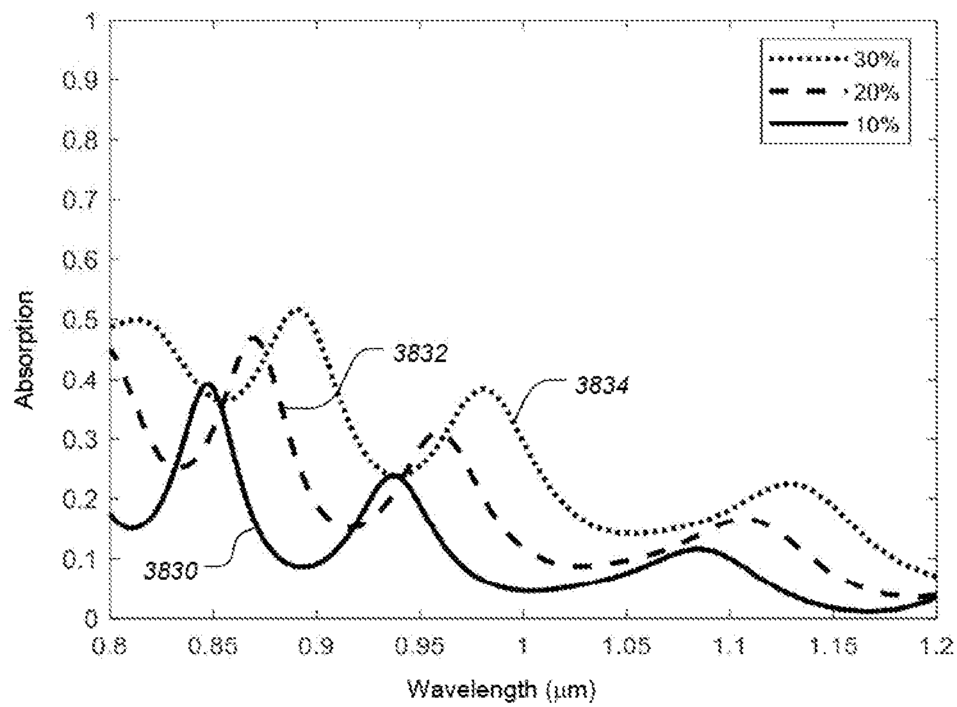
Figure 38C:
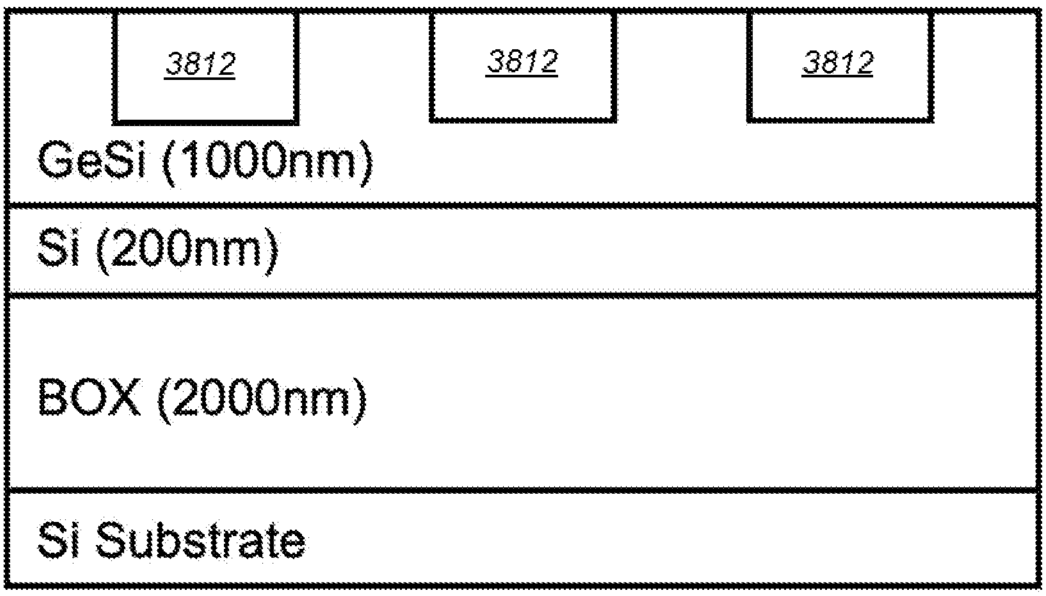

FIGS. 38A-C illustrate an FDTD simulation of a structure, according to some embodiments. The structure is shown in FIG. 38C, where a GeSi layer with varying concentration of Ge ranging from 10%-30% has a thickness of 1000 nm grown on Si device layer of 200 nm on top of a BOX layer of 2000 nm on Si substrate. The microstructure holes 3812 have a diameter of 700 nm and a period of 1000 nm in a hexagonal lattice, and light impinge on the surface of the GeSi layer. The optical signal is averaged over an angle of +/−10 degrees from normal incidence. FIG. 38A shows the FDTD simulation with Ge concentration of 10, 20, 30 percent in GeSi with microstructure holes. The vertical axis is absorption of the photons, and the horizontal axis is wavelength. The absorption is directly proportional to the external quantum efficiency. The solid curve 3820 shows absorption of GeSi with 10% Ge, the dashed curve 3222 shows absorption of GeSi with 20% Ge, and the dotted curve 3224 shows absorption of GeSi with 30% Ge.

FIG. 38B shows FDTD simulation of the optical field of a similar structure as in FIG. 38C but without microstructure holes, and with Ge concentration of 10 percent (curve 3830), 20 percent (curve 3832) and 30 percent (curve 3834) in GeSi. As can be seen the absorption or external quantum efficiency of a structure with microstructure holes can have higher absorption than a similar structure without microstructure holes at certain wavelengths.

With the addition of Ge in $Ge_xSi_{1-x}$ where x can range from 0.05 to 1 where 1 in pure Ge, the wavelength of the GeSi can be extended beyond 1000 nm as shown in FIG. 38*a*. With x=0.1 to 0.3 in $Ge_xSi_{1-x}$ the absorption in structures such as illustrated in FIGS. 38A-C and the other GeSi microhole new structures described in this patent specification which is directly proportional to the EQE can be greater than 50% from 800-1200 nm wavelength, and in some cases to 1350 nm. Photodetector PD/APD/SPAD comprising GeSi can be monolithically integrated with CMOS/BiCMOS ASICs. In some optical data center interconnect (DCI) applications the wavelength can range from 950 nm-1080 nm; for example see reference, Simpanen et al, Long-Reach 1060 nm VCSEL-SMF Optical Interconnects, DOI: 10.1109/ECOC.2018.8535524. Where 1060 nm was used for long reach (2 Km) optical data communication.

Figure 39A:
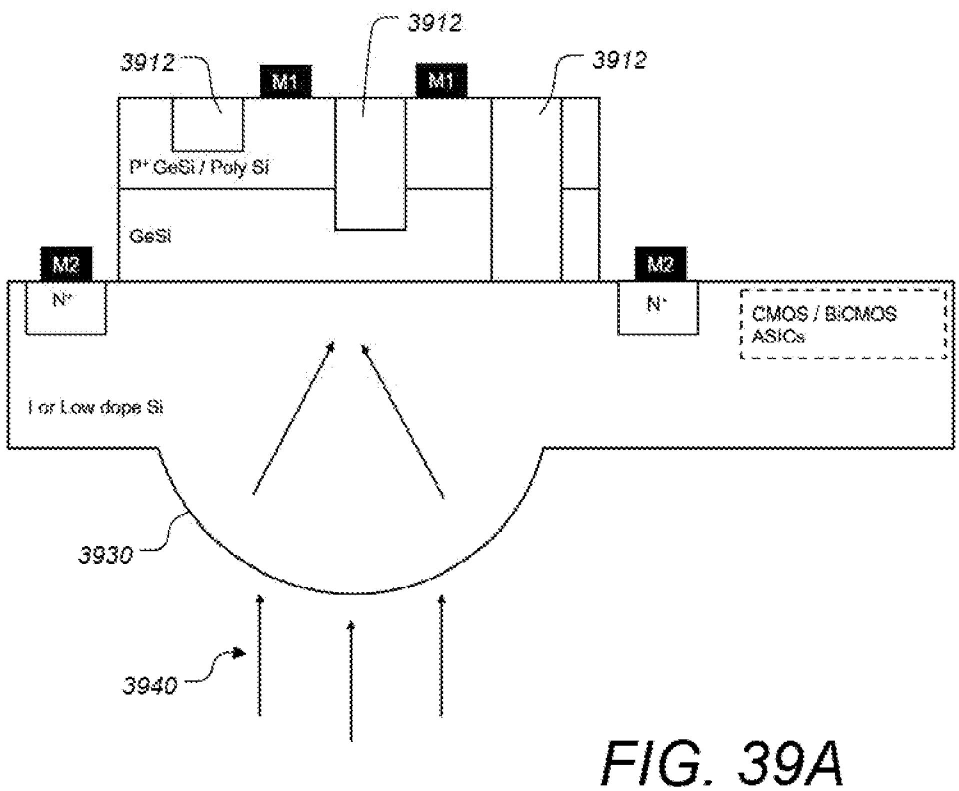
FIGS. 39A-C show partial simplified cross-section schematics of interdigitated Ge/GeSi on Si photodiode, according to some embodiments.
Figure 39B:
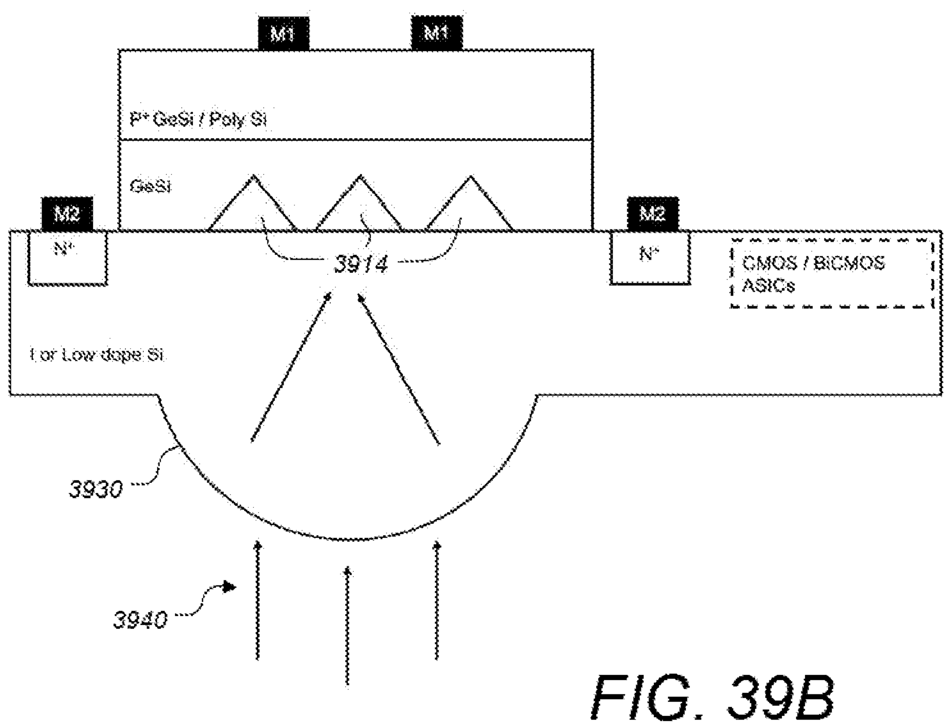
Figure 39C:
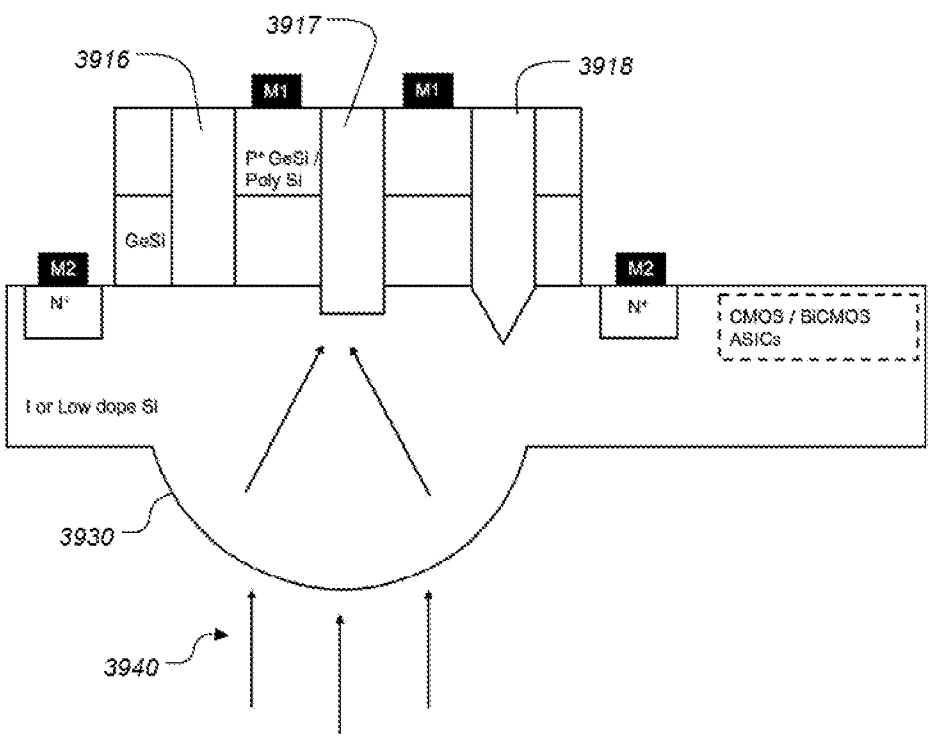

FIGS. 39A-C show partial simplified cross-section schematics of interdigitated Ge/GeSi on Si photodiode, according to some embodiments. In some cases the interdigitated Ge/GeSi on Si photodiode can be a vertical structure Ge/GeSi on Si photodiode with anodes and cathodes. For example, M2 can be cathode, and M1 can be anode. In the structure shown in FIG. 39A, microlens 3930 is formed on the bottom of the Si surface. Not shown are anti reflection coatings that can be applied to the micro lens. Light or optical signal impinge from the bottom surface, and the micro lens focus the light to the photodiode. The Ge/GeSi can be I or low doped grown on Si with or without a buffer layer. On top of the I or low dope Ge/GeSi a $P^+$ Ge/GeSi or polySi can be formed. The I or low dope Ge/GeSi can have thickness ranging from 100-1000 nm or more, and the $P^+$ Ge/GeSi or polySi can have a thickness range of 50 nm-500 nm or more. $N^+$ well can be formed in the Si which can be I or low dope P or N Si. Microstructure holes 3912 can be formed partially into the $P^+$ region, though the $P^+$ region into the I or low dope Ge/GeSi region, or through the $P^+$ region and through the I or low dope Ge/GeSi region to the Si. Cathode or M2 can be formed on the $N^+$ well, and anode or M1 can be formed on the $P^+$ region. A reverse bias is applied between the anode or M1 and cathode or M2. Arrays of this photodiode can be fabricated and monolithically integrated with CMOS/BiCMOS ASICs on a single Si chip. The number of photodetectors in the array can range from 4-over 1000, and in some cases in the 100,000 range, and in some cases in the 1,000,000s range. Wavelength range from 1000 nm-1800 nm.

FIG. 39B is similar to FIG. 39A with the exception that the Ge/GeSi region has pyramid "holes" 3914 composed of Si. Since Si has a lower optical index of refraction than Ge/GeSi and light is illuminated on the back surface the Si pyramids appears to be holes that are filled with Si, as in earlier examples microstructure holes can be filled with dielectrics such as Si dioxide for example.

FIG. 39C is similar to FIG. 39A where the microstructure holes 3916, 3917 and 3918 are etched to the Si region and in some cases etched into the Si region (3917), and in some cases etched to the Si followed by a wet etch to form an inverted pyramid (3918). The holes can be circular, rectangular, square, polygonal, oval, amoebic and/or any combination of shapes. In some cases, the holes can be cylindrical, funnel, trapezoidal, pyramidal, or inverted pyramidal.

The microstructure holes in structures such as illustrated in FIGS. 39A-E can have lateral dimensions ranging from 100 nm-2500 nm and in some cases from 500 nm-1200 nm, and in some cases from 600 nm-1200 nm, and in some cases more than 1200 nm. The spacing between the holes can range from 0 nm "touching or overlapping" to 1000 nm, and in some cases 100 nm-2000 nm, and in some cases 300 nm-600 nm, and in some cases more than 1000 nm. The holes can be periodic, and/or aperiodic, and/or random, and/or any combination of periodic, aperiodic, and/or random.

A reverse bias can be applied between the P anode and the N cathode of structures such as illustrated in FIGS. 39A-E, with reverse bias voltages ranging from −1 volt to −35 volts or more, and in some cases from −1 volt to −4 volts. Not shown are transmission lines connecting the anode and cathode to the CMOS/BiCMOS ASICs. High density array can be formed comprising of PD/APD/SPAD. The array size can range from 4 to 100 or more, and in some cases to 1000 or more, and in some cases to tens to hundred thousands or more, and in some cases to millions.

Figure 39D:
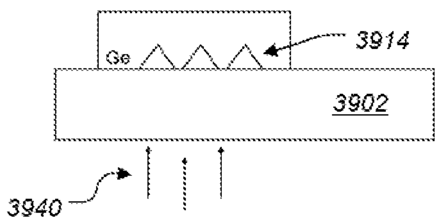
FIG. 39D shows a simplified cross-section of Ge on Si pyramids used for FDTD simulation.

FIG. 39D shows a simple cross-section of Ge on Si pyramids used for FDTD simulation. The Si pyramids 3914 are formed on Si substrate 3902 with a base side dimension of 750 nm, a period of 1000 nm in a square lattice. The Ge layer grown on top of the Si pyramids is 1 micron thick. Light and/or optical signal is illuminated from the bottom surface where the bottom surface has an anti-reflection coating.

Figure 39E:
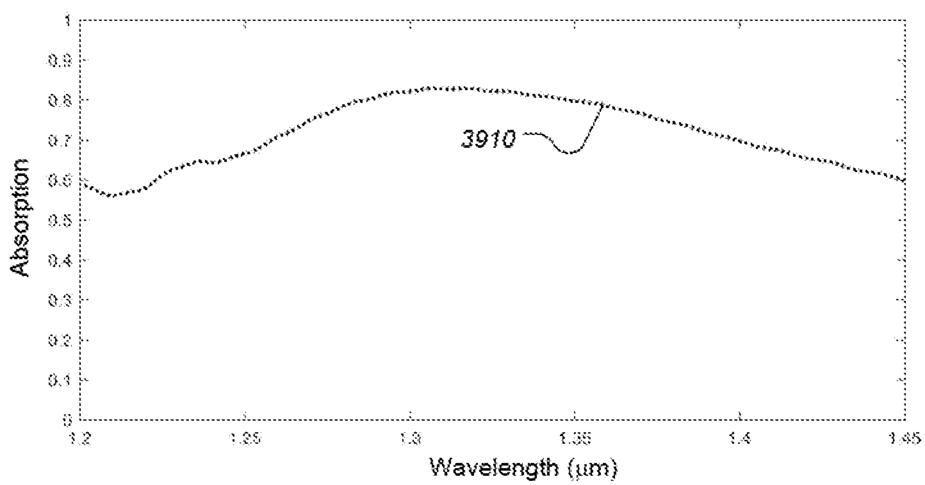
FIG. 39E shows the FDTD simulation of the structure shown in FIG. 39D.

FIG. 39E shows the FDTD simulation of the optical signal from 1200 nm to 1450 nm wavelength and where the vertical axis is the enhanced absorption. As can be seen the dotted curve 3910 shows enhanced absorption greater than 50% over the wavelength range. The EQE is directly proportional to the absorption and can have an EQE of 50% or more over this wavelength range at certain wavelengths, and in some cases 30% or more EQE at certain wavelengths, and in some cases 20% or more EQE at certain wavelengths.

Figure 40:
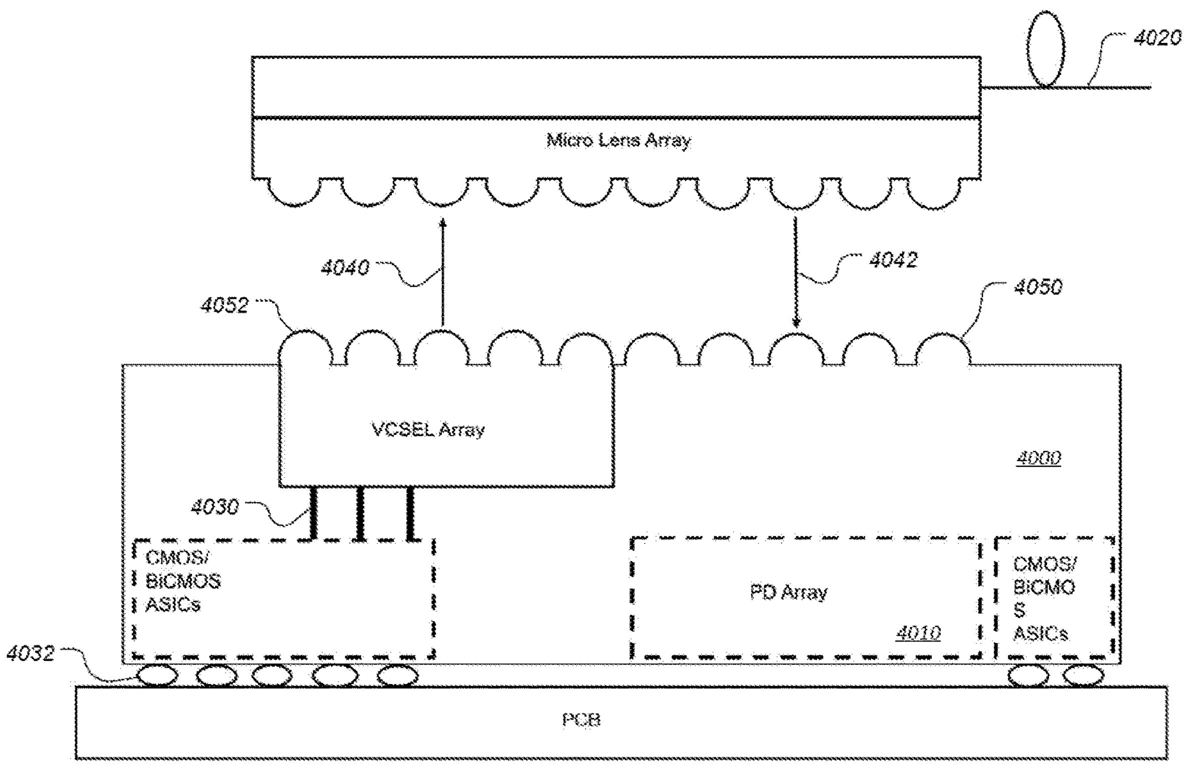
FIG. 40 shows a simplified partial cross-section of a monolithic integrated Photodetector array with CMOS/BiCMOS ASICs, according to some embodiments.

FIG. 40 shows a simplified partial cross-section of a monolithic integrated Photodetector array with CMOS/BiCMOS ASICs, according to some embodiments. The Photodetector in the array can be photodiode and/or avalanche photodiode, and/or single photon avalanche photodiode. The absorption layer of the Photodetector can be Ge/GeSi with Ge concentration ranging from 1% to 100% where 100% represents pure Ge, and in some cases the Ge concentration can be 10%-30%, and in some cases the Ge concentration can be 10%-60%. Micro lenses 4050 as in FIG. 39A-D are formed on the bottom surface of the Si 4000 to focus the light and/or optical signal into the Photodetector. The number of elements in a Photodetector array 4010 can range from 1 to 1,000,000 or more, and in some cases 12-96, and in some cases 24-96, and in some cases 100-1000, and in some cases tens of thousands, and in some cases hundreds of thousands, and in some cases in the millions. The photodetectors in the array can be electrically connected to the CMOS/BiCMOS ASICs and a bias voltage is applied to the Photodetectors. In some cases, the bias voltage is reverse bias, and in some cases the bias voltage can be forward biased in cases where the IV characteristics are approximately symmetric. In addition, CMOS/BiCMOS ASICs can be monolithically integrated to drive the VCSEL array. The CMOS/BiCMOS electronics for driving the VCSEL array can also have ASICs for signal processing, and/or waveform conditioning for optimal data transmission. The VCSEL array can be assembled on the back surface of the Si substrate using self-assembly such as fluidic self-assembly, robotic assembly, and/or any other assembly methods. Electrodes 4030 connect the CMOS/BiCMOS laser transmitter, laser driver, and ASICs, can be formed to connect the laser array using back end of line process. The VCSEL array can have micro lenses 4052 formed to focus the light to a similar micro lens that subsequently focus the light into parallel optic fiber ribbons 4020. The micro lens 4052 of the VCSEL array, and the micro lens 4050 for the Photodetector array can be tele-centric with the collecting micro lens that are used to connect to the optical fiber ribbons. The Si chip 4000 containing both the VCSEL array, the Photodetector array, CMOS/BiCMOS electronics can be mounted directly on a printed circuit board (PCB) using technologies such as soldier bumps 4032. Each channel can have data rates ranging from 1-25 Gb/s or more. Wavelength can range from 990 nm-1800 nm. In some cases, the VCSEL array can be assembled on the top surface as in FIG. 35. Also shown in FIG. 40 is transmitting optical signal 4040, receiving optical signal 4042.

Coupling between micro lens using telecentric lens design can increase tolerance due to optical misalignment of structures such as illustrated in FIG. 40. See for example reference, Kuo et al, Free-space optical links for board-to-board interconnects, Applied Physics A Materials Science & Processing, DOI: 10.1007/s00339-009-5144-z.

Wavelength at 1060 nm VCSEL or laser can be used for short reach optical datacenter interconnect applications, see for example reference; Heroux et. al, Energy-Efficient 1060-nm Optical Link Operating up to 28 Gb/s, Journal of Lightwave Technology, Vol. 33, No. 4, Feb. 15, 2015. See also reference; Heroux et. al, Low power CMOS-driven 1060 nm multimode optical link, OFC 2014. See also reference, Doany, High Density Optical Interconnects for High Performance Computing, OFC 2014.

Figure 41A:
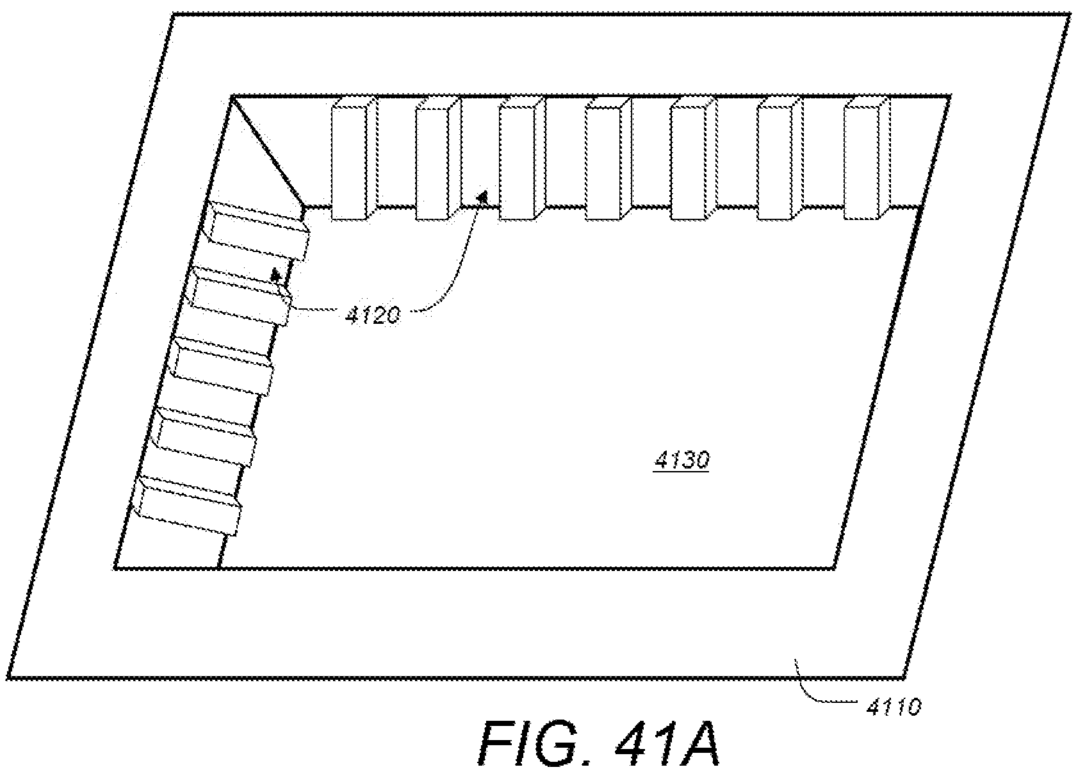
FIGS. 41A-C show simplified views of pits etched on a Si surface configured for fluidic self-assembly, according to some embodiments.
Figure 41B:
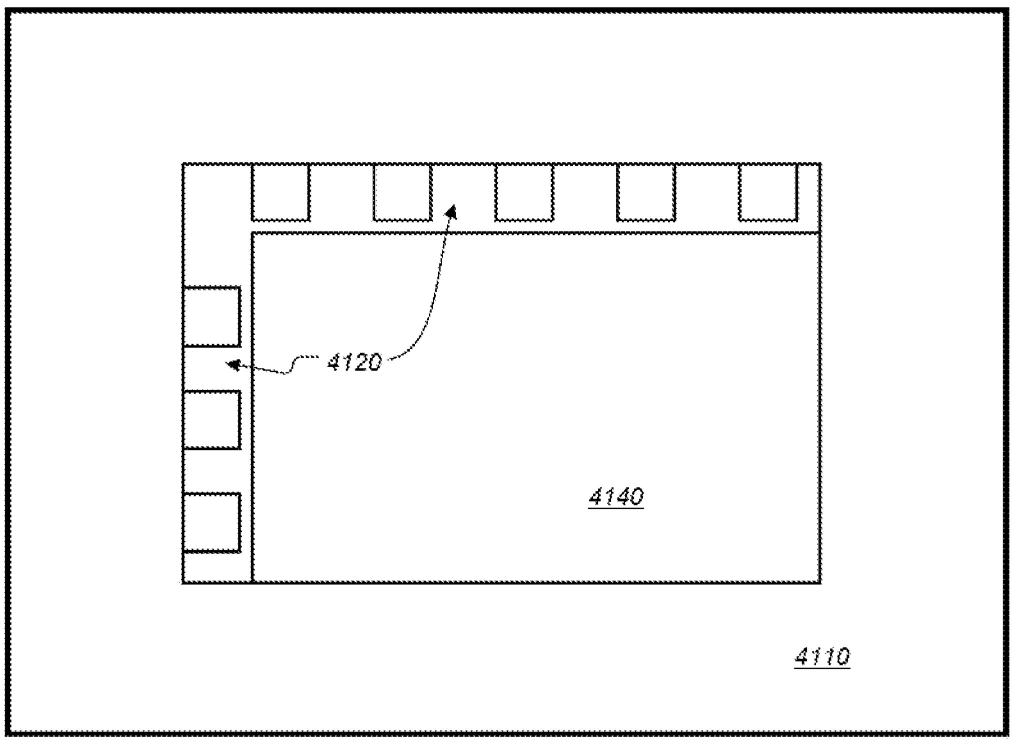
Figure 41C:
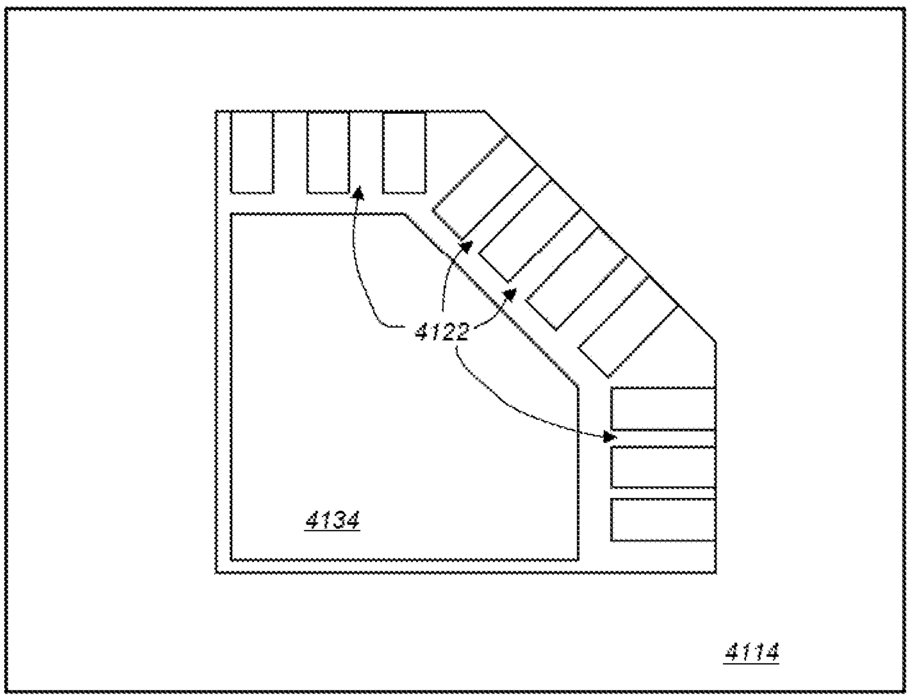

FIGS. 41A-C show simplified views of pits etched on a Si surface configured for fluidic self-assembly, according to some embodiments. FIG. 41A shows a 3D view of a rectangular pit etched on the Si surface 4110 for fluidic self-assembly. One or more side of the pit 4130 can have corrugations for example rectangular slots 4120 extending on the side wall of the pit partially and/or entirely from the surface to the bottom of the pit. As shown two of the side walls have slots etched into the side walls.

FIG. 41B shows a simplified partial top view of the rectangular pit 4130 etched into the surface of the Si 4110 for fluidic self-assembly and showing the slots 4120 etched into two of the side walls of the rectangular pit 4130. A surface emitting laser array chip 4110 is also shown fluidic assembled in the rectangular pit. The fluid in the slot can be heated such that the expansion of the fluid in the slots can push the laser array chip to the bottom right corner of the rectangular pit. This allows precision alignment of the optical components to micro lens assembly that couple the light from the VCSEL array that can have integrated micro lenses to external fiber ribbon. Not shown are electrical connections to the VCSEL array that can be made back end of line process. Also not shown are trans silicon vias (TSV) that can be used to connect the bottom of the VCSEL array to CMOS/BiCMOS ASICs. Once the VCSEL array chip is in position, and most or all the fluids have evaporated additional heat can be applied to solder the laser array to bottom electrodes using technology such as solder bump technology. The width of the slot can range from 1-100 microns or more, and the depth of the slot can range from 1-100 microns or more. The length of the slot can range from 1-100 microns or more.

FIG. 41C shows a simplified partial top view of a polygonal pit having five sides. Three of the five sides are etched with slots 4122. A VCSEL or laser array also polygonal with five sides 4134 is shown that can fit into the pit in only one orientation. The fluid in the slots 4122 can expand with temperature and can push the polygon shaped laser array chip to the bottom left corner for precision optical and electrical alignments. Not shown are tabs that can be formed on the surface of the laser array chip that can prevent the laser array chip from falling into the pit upside down for example. Not shown are the transmission lines that can be attached to the laser array to the CMOS/BiCMOS ASIC laser driver and other signal conditional and/or processing electronics. The advantage of slotting the side of the pit can increase the fluid volume that can expand with temperature, and can therefore act to position the laser array chip towards a predetermined corner that can allow precision optical and electrical alignments.

FIGS. 42A-B and 43A-B are partial simplified cross-sections of a Ge/GeSi on Si photodiode, according to some embodiments. The Ge/GeSi on Si photodiode can be interdigitated with M1 and M2 electrodes where M1 can be the anode, and M2 can be the cathode. The Ge/GeSi layer is a graded P type doped layer with doping at the higher level at the surface compared to the doping level at the Ge/GeSi interface with π Si. Microstructure holes 4212 can be formed in the Ge/GeSi and in some cases can extend into the π Si. $N^+$ wells are formed in the π Si. The wavelength of the optical signal that can impinge on the top surface and in some cases can impinge from the bottom surface range from 990 nm-1600 nm, and in some cases 1000 nm to 1350 nm. The photons are absorbed predominately in the Ge/GeSi region/layer and with a reverse bias between the anode and cathode the photo carriers are predominately electrons that are swept from the P type Ge/GeSi toward the $N^+$ Si cathode. Such a device can be called a unitary traveling carrier "UTC" photodiode. Such UTC photodiodes can have higher speed and/or data rate than photodiodes that have bi-polar carriers, see for example ref. Piels et al, 40 GHz Si/Ge uni-traveling carrier waveguide photodiode, DOI 10.1109/JLT.2014.2310780. Journal of Lightwave Technology.

The Ge/GeSi layer in structures such as illustrated in FIGS. 42A-B and 43A-B can have a thickness ranging from 200-1000 nm and in some cases 500-1000 nm and in some cases more than 1000 nm. The microstructure hole can be funnel, cylindrical, trapezoidal, pyramidal, and the lateral dimension at the surface can range from 300 nm to 1300 nm, and in some cases 600 nm-1200 nm and in some cases 800 nm-1500 nm, and in some cases greater than 1500 nm. The depth of the holes can range from 200 nm to 1000 nm, and in some cases more than 1000 nm. The spacing between the microstructure holes can be 0 "touching or intersecting" to 600 nm, and in some cases 100 nm-800 nm, and in some cases more than 800 nm. The microstructure holes can be partially in the Ge/GeSi, can extend through the Ge/GeSi to the Si interface, and in some cases into the π Si. The π Si layer can also be a low dope P or N Si layer with resistivity greater than 10 Ohm-cm and in some cases greater than 25 Ohm-cm, and in some cases 100-1000 or more Ohm-cm. A BOX layer can be beneath the I or low dope Si layer, and in some cases the I or low dope Si can be the substrate. In some cases, a microlens can be formed on the bottom of the Si substrate to focus light optical signal impinging on the bottom surface and focusing the signal to the photodector. The reverse bias applied the anode and cathode can range from −1 volt to −35 volts or more, and in some cases from −1 volt to −5 volts, and in some cases from −1 volt to −3.3 volts. The spacing between the M1 and M2 electrode can range from 500 nm to 1000 nm and in some cases greater than 1000 nm and in some cases less than 500 nm. The spacing between M1 and M2 in some cases can range from 300 nm to 3000 nm, and in some cases more than 3000 nm. Data rate can range from 1 Gb/s to 50 Gb/s and in some cases greater than 50 Gb/s and in some cases less than 1 Gb/s. In some cases, the data rate can range from 10 to 40 Gb/s. The rise time of the photodiode to an impulse response can range from 1 pico second to 100 pico seconds, and in some cases from 10 pico seconds to 100 pico seconds, and in some cases less than 30 pico seconds. The rise time can be defined as the 10-90% of the leading edge of the impulse response.

Figure 42A:
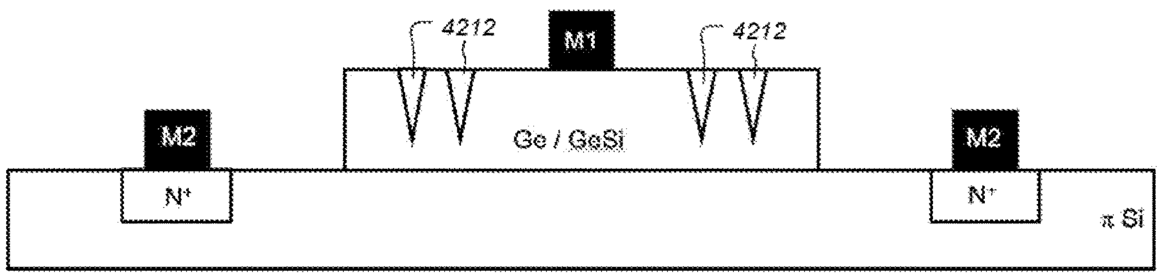
FIGS. 42A-B and 43A-B are partial simplified cross-sections of a Ge/GeSi on Si photodiode, according to some embodiments.
Figure 42B:
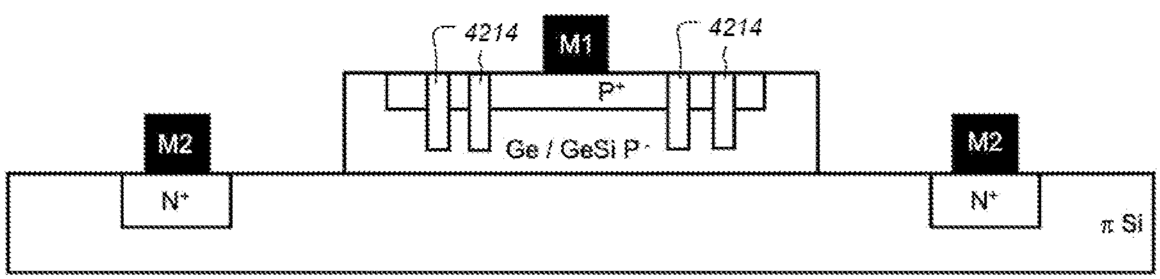

FIG. 42B is similar to FIG. 42A with the addition of a $P^+$ well on the top surface of the Ge/GeSi to ensure a graded doping, where the doping level at the surface is high, and the doping level decreases in depth towards the Si interface. The microstructure holes 4214 are also shown as rectangular instead of conical or pyramidal.

Figure 43A:
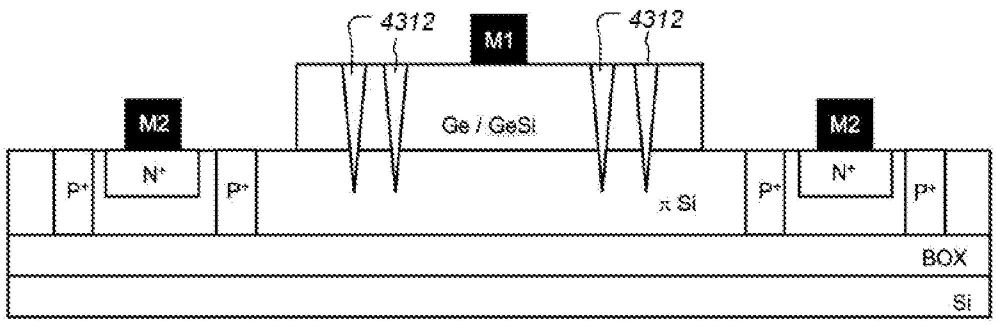

FIG. 43A is similar to FIG. 42A with the addition of a P charged well in the I or low dope Si. A BOX layer is included, and in some cases a BOX layer may not be necessary. The microstructure holes 4312 can be within the Ge/GeSi layer and in some cases can extend into the I or low dope Si region. A reverse bias is applied between the anode and cathode with the bias voltage ranging from −3 volts to −35 volts, and in some cases a higher negative potential than −35 volts. Avalanche gain can range from 3 dB-30 dB or more.

Figure 43B:
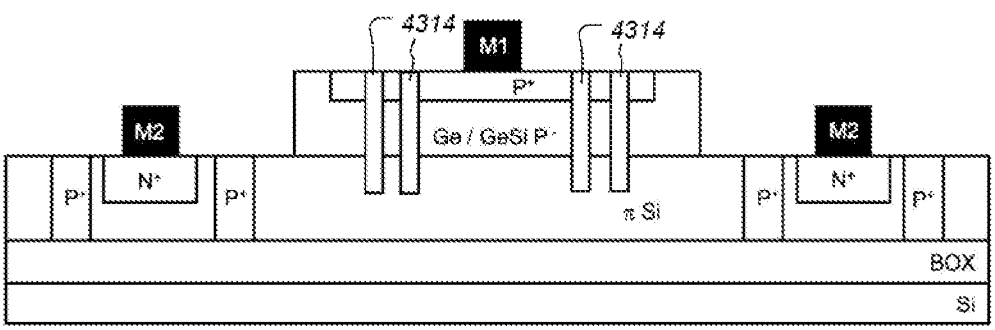

FIG. 43B is similar to FIG. 43A with the addition of a $P^+$ doped well in the Ge/GeSi layer that can be P doped or lightly P doped. The microstructure holes 4314 can be within the Ge/GeSi and in some cases can extend into the I or low dope Si. Optical signal can impinge on the top surface, and in some cases can impinge from the bottom surface.

FIGS. 42A-B and FIGS. 43A-B show partial simplified cross-section schematics of Ge/GeSi on Si where a BOX layer can be optional and where the Ge/GeSi layer or region is P doped and in some cases $P^-$ doped and in some cases $\pi$ doped such that when the optical signal that can impinge from the top surface and/or from the bottom surface electron/holes are generated in the Ge/GeSi and where the electron is a minority carrier and is swept toward the cathode when the photodetector is under reverse bias, and where the electrode on the P layer or region is the anode, and the electrode on the N region is the cathode. The photo generated electron can be a uni-traveling carrier (UTC) photodetector and since electrons have a higher drift velocity than holes, this UTC photodetector can be faster than a bipolar or hole dominated carrier photodetector; see for example reference Piels et. al, 40 GHz Si/Ge uni-traveling carrier waveguide photodiode, Journal of Lightwave Technology, DOI 10.1109/JLT.2014.2310780.

Wavelength in structures such as illustrated in FIGS. 42A-B and FIGS. 43A-B can range from 1100 nm to 1600 nm where photons are absorbed predominately in the Ge/GeSi regions, and in some cases wavelength can range from 900 nm to 1650 nm where photons are absorbed predominately in the Ge/GeSi regions and in some cases for top surface illumination the wavelength range can be 800 nm-1650 nm where the photons are absorbed predominately in the Ge/GeSi regions.

Not shown in FIGS. 42A-B and FIGS. 43A-B are the CMOS/BiCMOS ASICs that can be monolithically integrated with the UTC PD/APD/SPAD. An advantage of a UTC APD/SPAD is the reduction in noise since only electrons are involved in the ionization process.

Figure 44A:
FIGS. 44A-D, 45A-C and 46A-D show basic simplified steps for monolithic integration of microstructure holes photodetector with CMOS and/or BiCMOS ASICs, according to some embodiments.
Figure 44B:
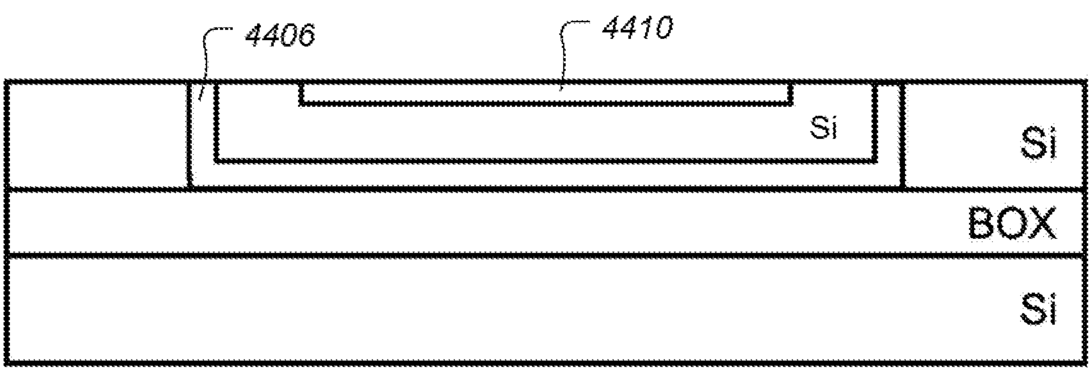
Figure 44C:
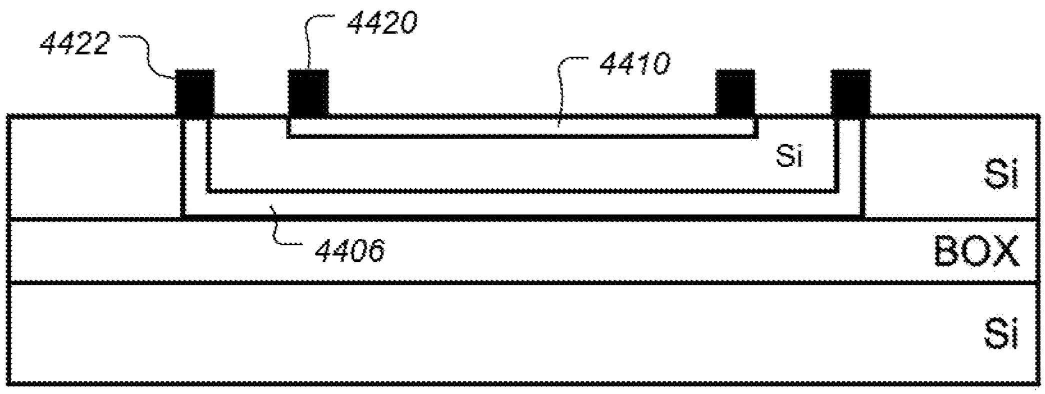
Figure 44D:
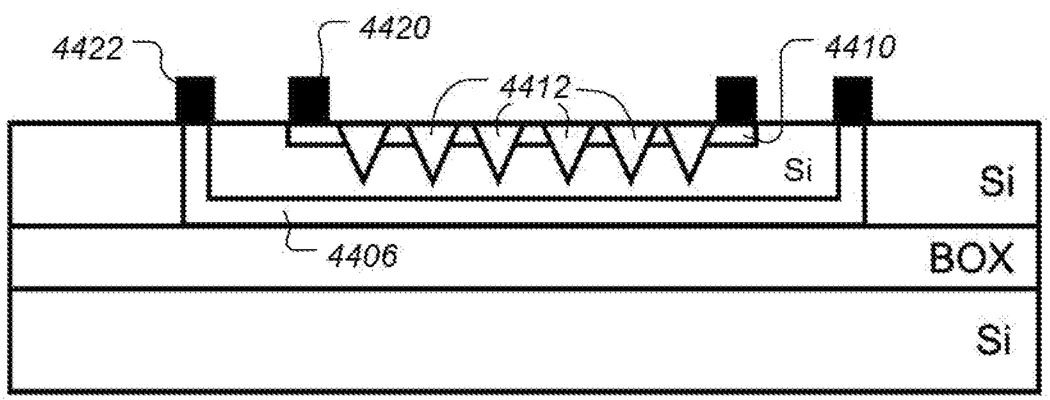

FIGS. 44A-D, 45A-C and 46A-D show basic simplified steps for monolithic integration of microstructure holes photodetector with CMOS and/or BiCMOS ASICs, according to some embodiments. FIG. 44A shows the starting material for a CMOS process consisting of a SOI substrate with a low dope P device layer. FIG. 44B shows the forming of deep N wells 4406 and a shallow P well 4410. The doped wells can be formed by diffusion of dopant ions and/or by ion implantation of dopant ions. FIG. 44C shows the formation of cathode 4422 and anode 4420 metals and/or silicide to contact the N and P regions. FIG. 44D shows the formation of microstructure holes 4412 which can be dry etched and/or wet etched. In the case of wet etch inverted pyramids can be formed.

Not shown in FIGS. 44A-D, 45A-C and 46A-D are isolation trenches for both electrical and/or optical between photodetectors and/or between CMOS ASICs. Also not shown are dielectric layers such as Si dioxide which can be deposited on the surface of the microstructure holes and/or the electrodes. Also not shown are anti-reflection coatings planarization layers, transmission lines from the photodetector to the CMOS/BiCMOS ASICs, and any other layers or components to complete the monolithic integration. Trans silicon vias (TSV) can be formed to connected electrodes, and/or any electrical contacts on the surface to electric contacts on the bottom surface that can be directly contacted to electrodes on a printed circuit board such that an interposer may not be necessary.

Figure 45A:
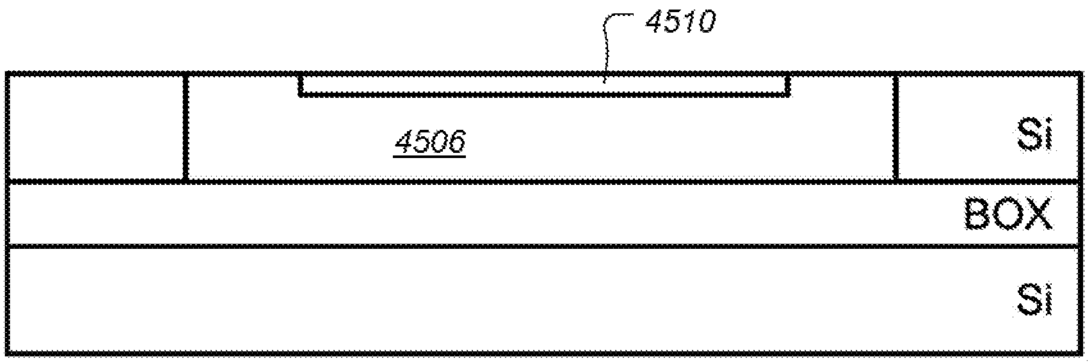
Figure 45B:
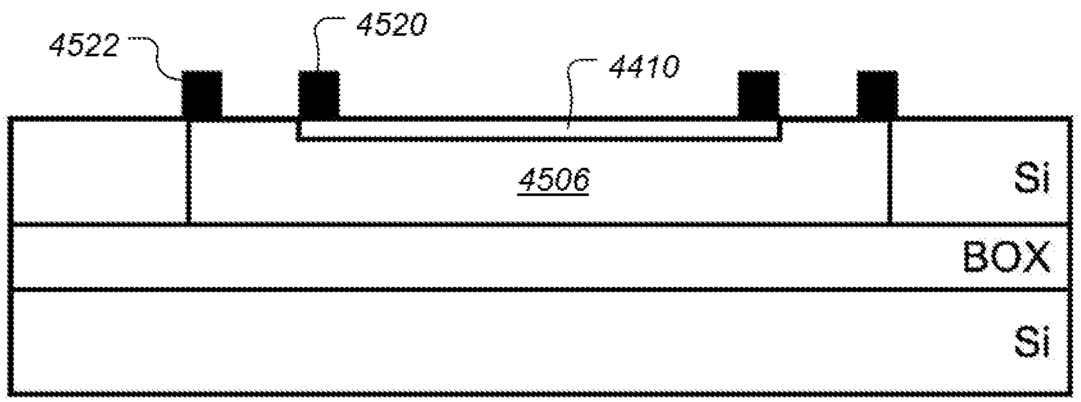
Figure 45C:
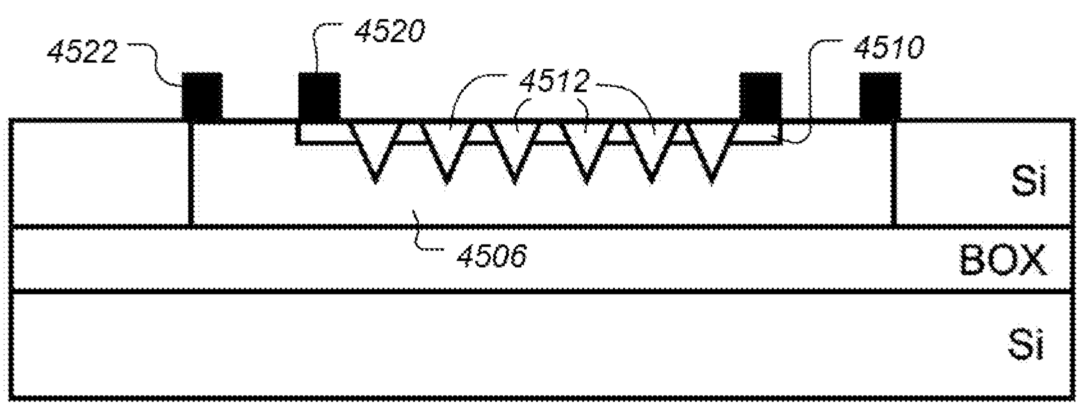

The starting point of FIGS. 45A-C is FIG. 44A. The process is similar to FIGS. 44B-D. In FIG. 45A low dope deep N well 4506 is formed followed by a highly doped shallow P well 4510. In FIG. 45B shows the formation of cathode 4522 and anode 4520. FIG. 45C shows the formation of microstructure holes 4512.

Figure 46A:
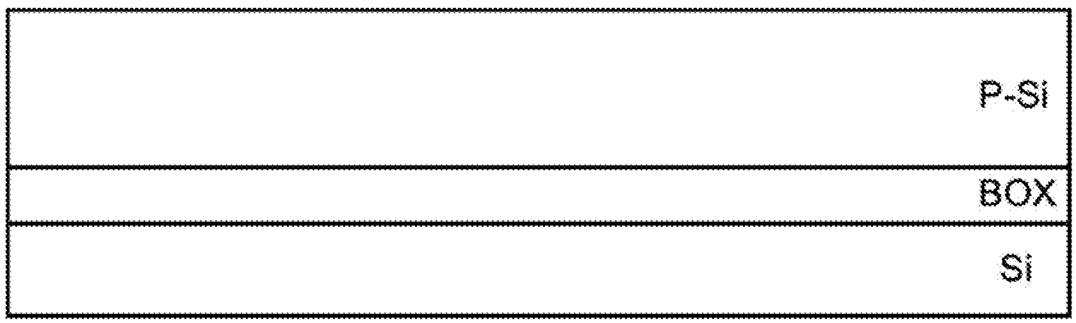
Figure 46B:
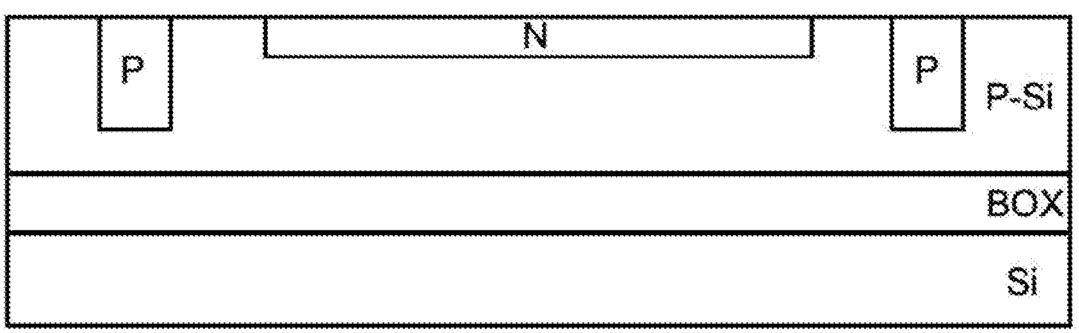
Figure 46C:
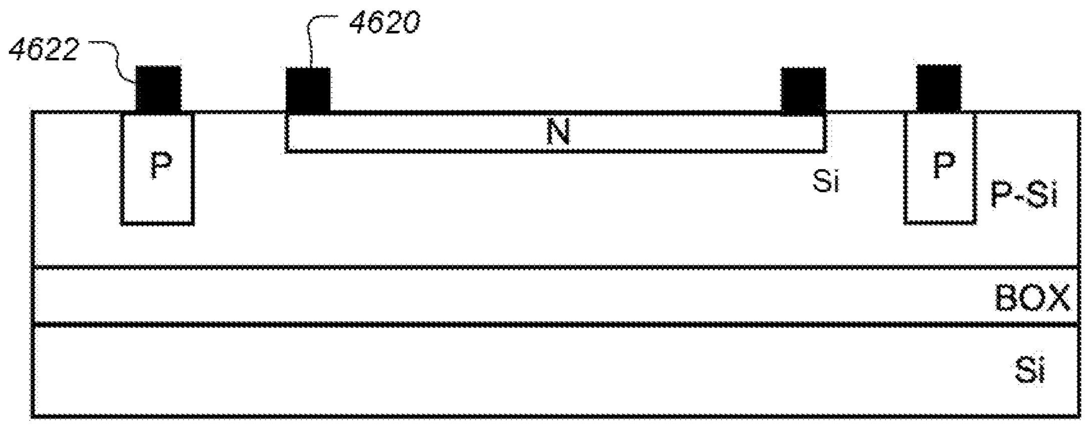
Figure 46D:
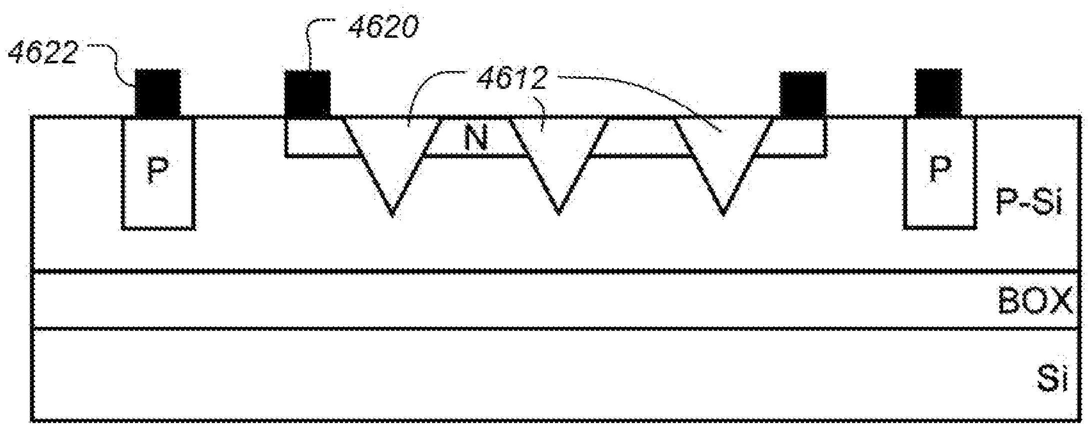

In FIG. 46A the starting material is shown. In FIG. 46B the shallow N well are formed in the P device layer, and shallow N well is formed on the surface. In FIG. 46C the cathode 4622 and anode 4620 electrodes are formed on the N and P surfaces respectively, and in FIG. 46C microstructure holes 4612 are formed.

Figure 47A:
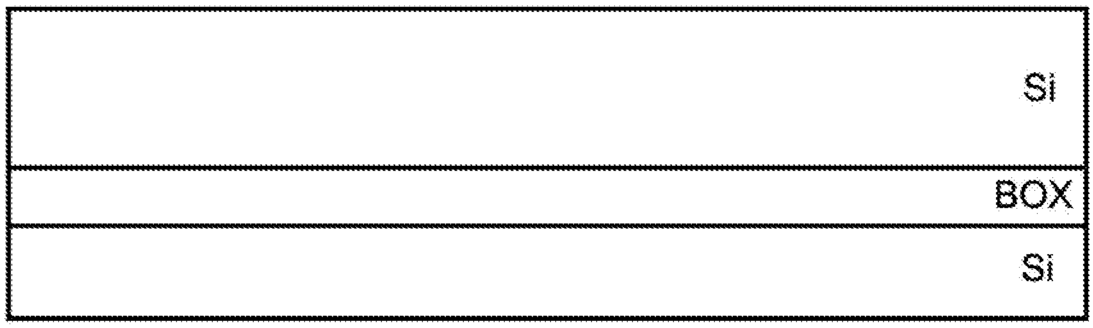
FIGS. 47A-C and 48A-C show a basic simplified processing steps to monolithically integrate interdigitated photodetector with CMOS/BiCMOS ASICs, according to some embodiments.
Figure 47B:
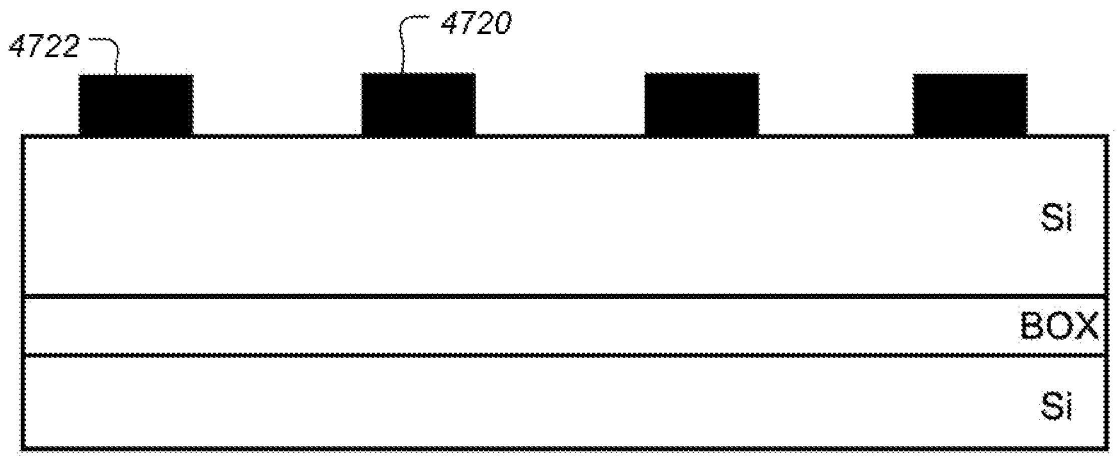
Figure 47C:
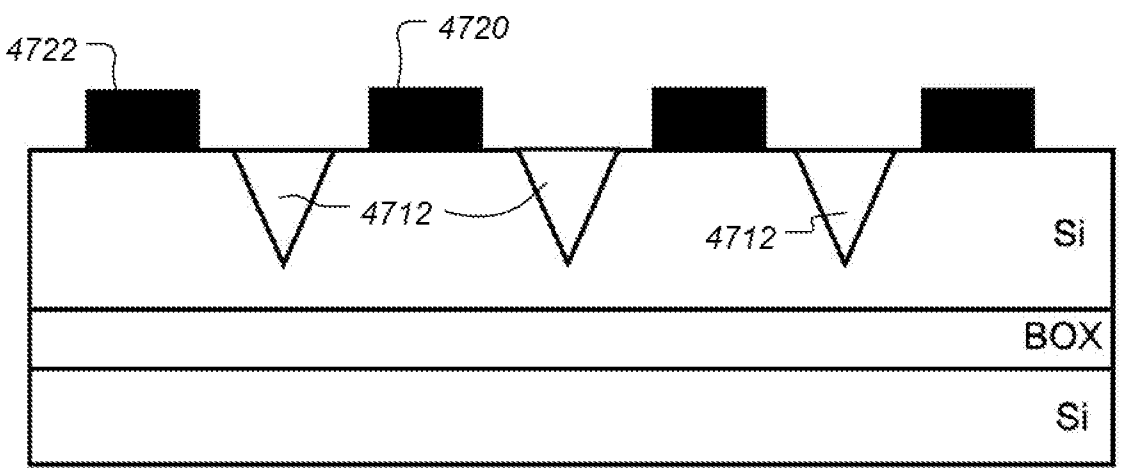

FIGS. 47A-C and 48A-C show a basic simplified processing steps to monolithically integrate interdigitated photodetector with CMOS/BiCMOS ASICs, according to some embodiments. FIG. 47A shows a basic starting material for CMOS/BiCMOS ASICs where SOI substrate is used and a device layer is a low dope P type semiconductor. FIG. 47B shows the formation of metal interdigits 4722 and 4720 on the surface of the low dope P semiconductor. FIG. 47C shows the formation of microstructure holes 4712 between the interdigitated electrodes. In this metal-semiconductor-metal (MSM) structure the biasing voltage can be either forward bias or reverse bias since the metal contact to the semiconductor can be Schottky contact or MOS contact and are back to back diodes.

Figure 48A:
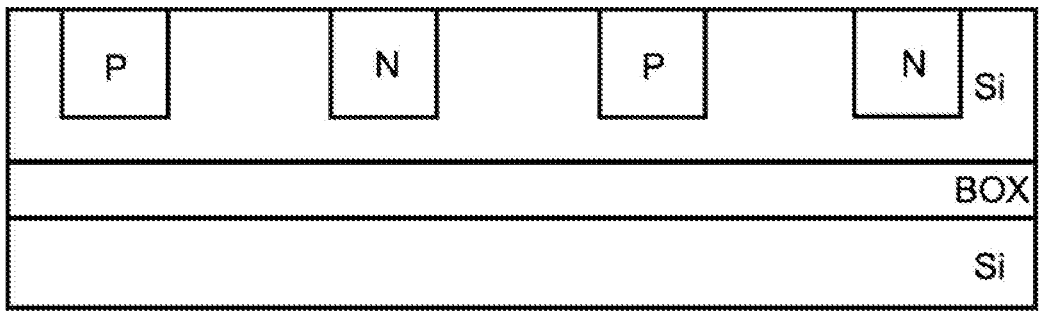
Figure 48B:
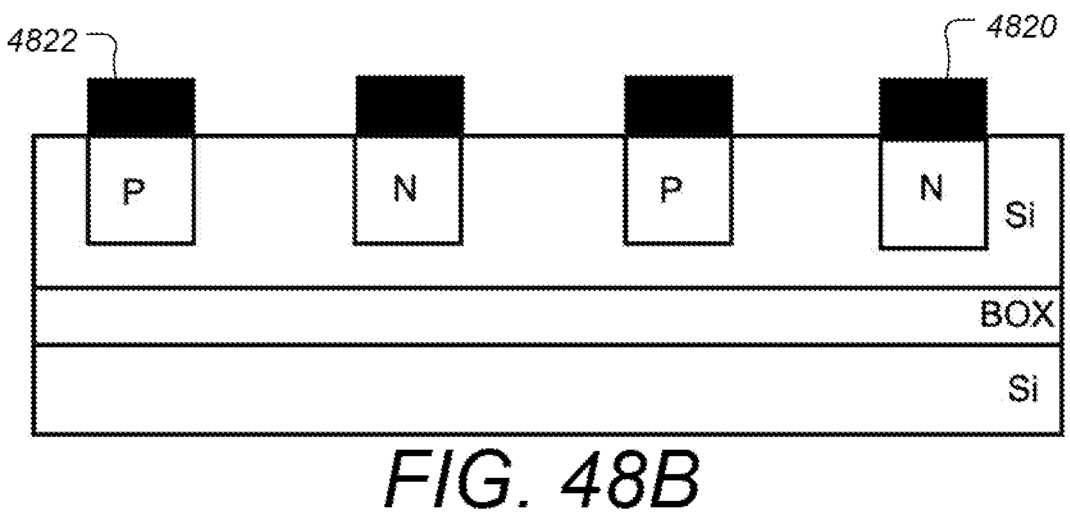
Figure 48C:
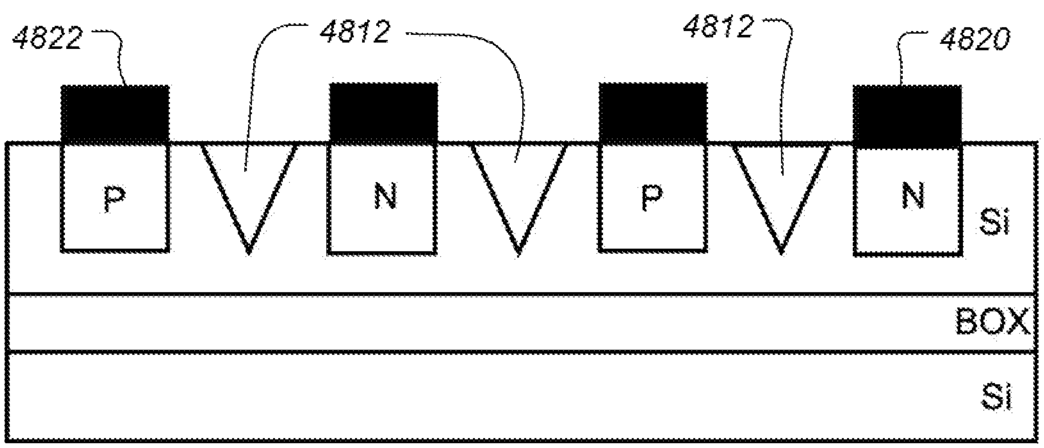

The starting point of the process shown in FIGS. 48A-C is also FIG. 47A. In FIG. 48A the P and N wells are formed. In FIG. 48B the interdigitated electrodes are formed over the P and N wells. And in FIG. 48C microstructure holes 4812 are formed.

In some cases in the structures illustrated in FIGS. 47A-C and 48A-C, Ge/GeSi layers can be grown on the $P^-$ device layer and the Ge/GeSi can also be $P^-$ doped, and P and N wells can be formed on the Ge/GeSi and/or Si and the processing steps are similar. In some cases the BOX layer may not be necessary. See for example FIGS. 42A-B and FIGS. 43A-B for Ge/GeSi on Si photodetectors.

FIGS. 49A-F show basic fabrication steps for Ge/GeSi on Si interdigitated photodiode that can be monolithically integrated with CMOS/BiCMOS ASICs, according to some embodiments. Arrays of these Ge/GeSi photodiodes can be monolithically integrated with CMOS/BiCMOS electronics.

Figure 49A:
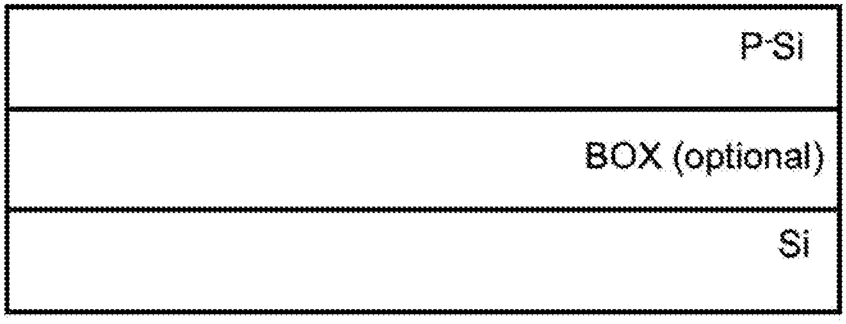
FIGS. 49A-F show basic fabrication steps for Ge/GeSi on Si interdigitated photodiode that can be monolithically integrated with CMOS/BiCMOS ASICs, according to some embodiments.

FIG. 49A shows a starting material, in this case SOI with a P device layer and in some cases the P device layer can be low doped or π doped. In some cases, the device layer can be N doped or low N doped and the P and N can be interchanged. In some cases, the starting material can be a low dope or π doped Si wafer without the BOX layer.

Figure 49B:
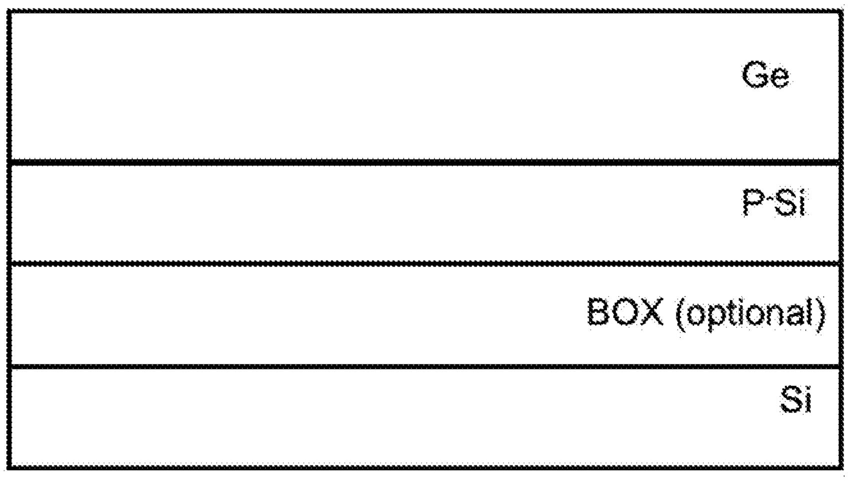

FIG. 49B shows the growth of Ge or GeSi on Si with or without a buffer layer, and the Ge/GeSi can be relaxed or strained. The thickness of the Ge/GeSi layer can range from 200 nm to 1000 nm or more.

Figure 49C:
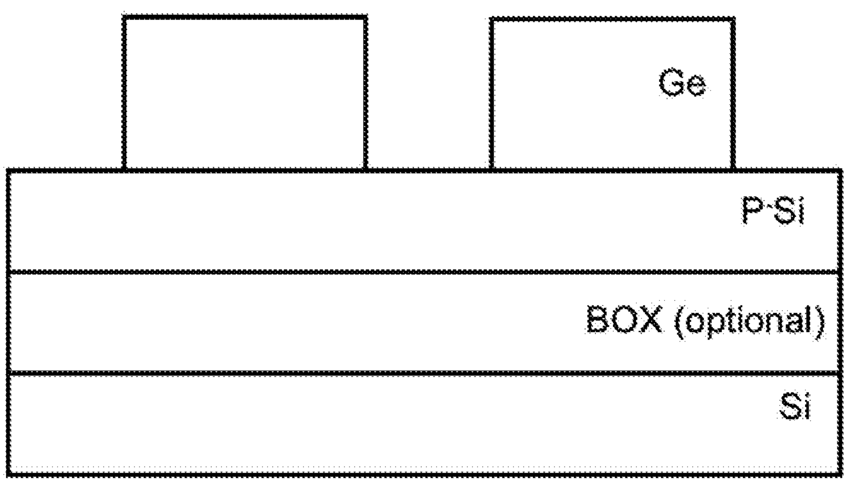

FIG. 49C shows etched trenches in the Ge/GeSi to the Si device layer. In some cases, the strips of Ge/GeSi can be formed by selective area growth such that etching trenches is not necessary.

Figure 49D:
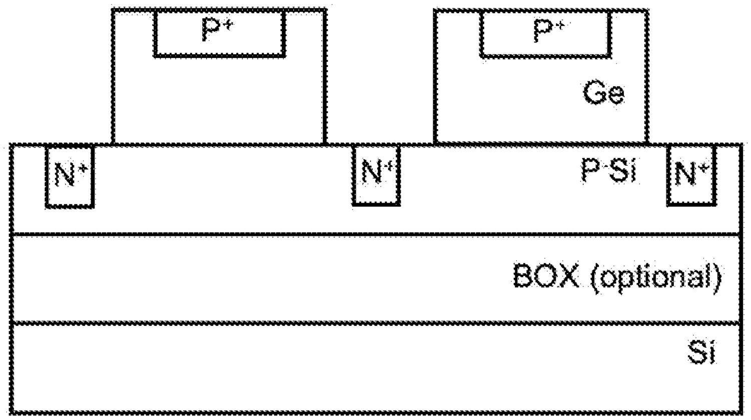

FIG. 49D shows the forming of $P^+$ wells in the Ge/GeSi and the $N^+$ wells in the low dope P Si.

Figure 49E:
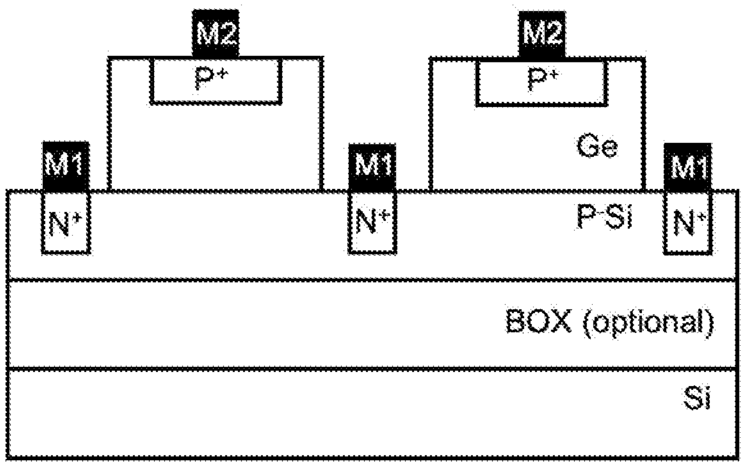

FIG. 49E shows the forming of ohmic contacts to the P and N wells and the M1 and M2 interdigitated electrodes which in some cases can be formed in separate steps.

Figure 49F:
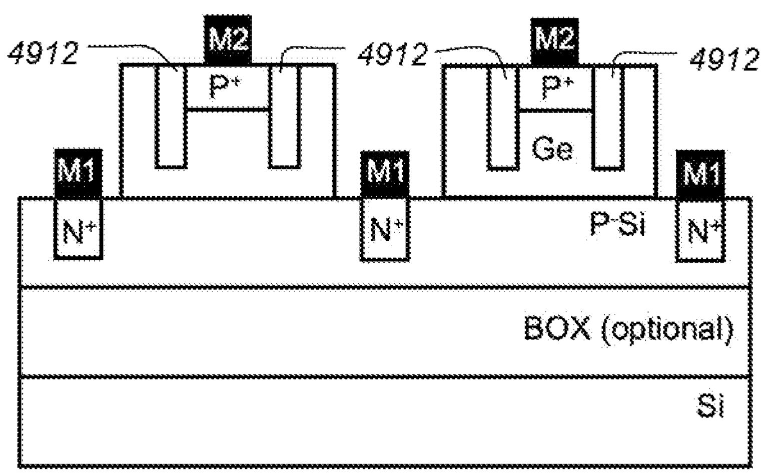

FIG. 49F shows the etching of microstructure holes 4912.

Not shown in FIGS. 49A-F are passivation layers that can partially or entirely cover the microstructure holes and any exposed edges of the Ge/GeSi. And in some cases passivation layers can cover the surface of the Si and any exposed edges of the Si. Also not shown are the CMOS/BiCMOS ASICs that can be monolithically integrated, transmission lines from the photodetector to the CMOS/BiCMOS ASICs, and any electrical optical isolation trenches to name a few.

Figure 50:
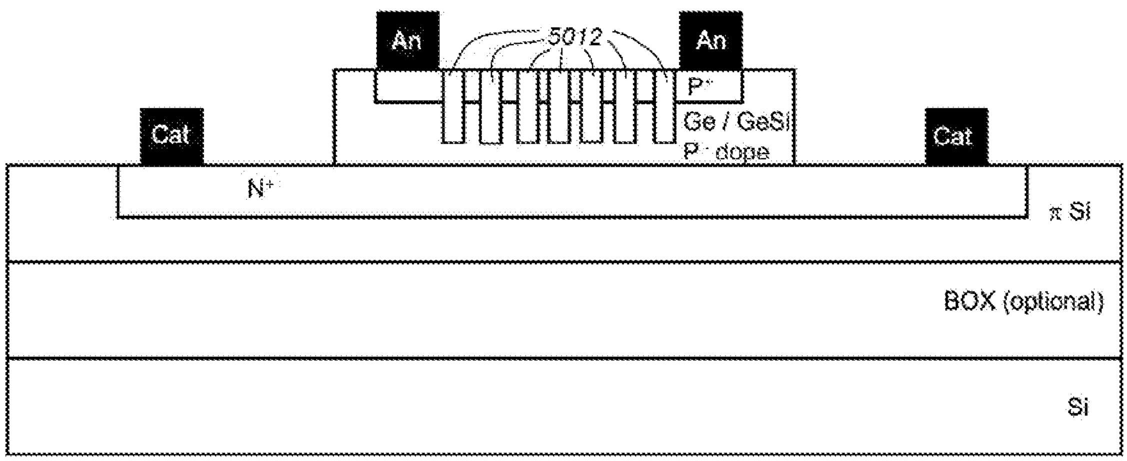
FIG. 50 shows a simplified partial cross-section schematic of a Ge/GeSi on Si photodiode that can be monolithically integrated with CMOS/BiCMOS ASICs, according to some embodiments.

FIG. 50 shows a simplified partial cross-section schematic of a Ge/GeSi on Si photodiode that can be monolithically integrated with CMOS/BiCMOS ASICs, according to some embodiments. The BOX layer can be optional. $N^+$ well can be diffused or ion implanted into the low dope P Si layer, and a low dope P Ge/GeSi can be grown on the $N^+$ Si with or without a buffer. The thickness of the Ge/GeSi can range from 300 nm-1000 nm, and in some cases more than 1000 nm. A $P^+$ well is formed on the surface of the Ge/GeSi. Anode can be formed on the $P^+$ Ge region and cathode can be formed on the $N^+$ Si region. Microstructure holes 5012 can be formed in the Ge/GeSi, and in some cases can be within the $P^+$ region, and in some cases can extend into the Ge/GeSi partially and in some cases can extend through the Ge/GeSi. The microstructure holes can be periodic and in some cases can be aperiodic, and in some cases can be periodic and aperiodic. The microstructure hole lateral dimension can range from 200 nm-1800 nm, and the spacing between the holes can range from 0 (intersecting)-800 nm, and in some cases can be greater than 800 nm. The microstructure holes can be cylindrical, funnel, conical, trapezoidal or any combination thereof. The shape of the holes can be circular, oval, amoebic, square, rectangular, triangular, polygonal, to name a few. Optical signal can impinge from the top surface, and in some cases can impinge from the bottom surface. A reverse bias is applied between the anode and cathode with bias voltages ranging from −0.5-−10 volts, and in some cases from −1-−3.3 volts, and in some cases greater than −10 volts for example −35 volts.

Data rate in structures such as illustrated in FIG. 50 can range from 10 Gb/s to 25 Gb/s and in some cases 25 Gb/s-50 Gb/s, and in some cases greater than 50 Gb/s, and in some cases less than 10 Gb/s. Wavelength range can range from 800 nm to 1650 nm and in some cases 950 nm-1200 nm, and in some cases 990 nm-1350 nm, and in some cases 1000 nm-1550 nm, and in some cases greater than 1550 nm.

Figure 51A:
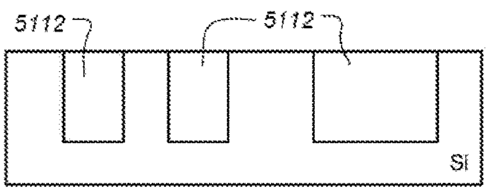
FIGS. 51A-D show simplified partial cross-section schematic examples of microstructure holes where microstructure holes can be defined as regions where the optical refractive index is lower than in the surrounding material, according to some embodiments.

FIGS. 51A-D show simplified partial cross-section schematic examples of microstructure holes where microstructure holes can be defined as regions where the optical refractive index is lower than in the surrounding material. For example, FIG. 51A shows microstructure holes 5112 etched in Si, and the holes have an index of 1 and Si has an index of 3.4.

Figure 51C:
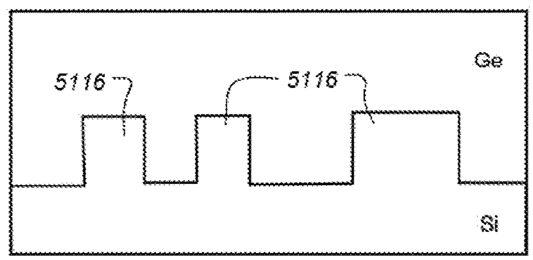
Figure 51B:
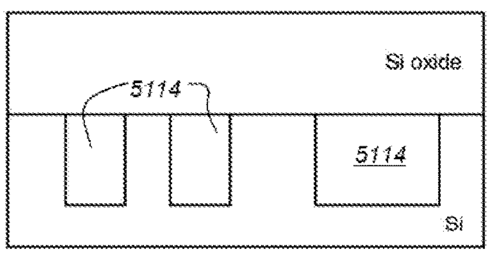

FIG. 51B is similar to FIG. 51A, and the microstructure holes 5114 are buried in a dielectric such as Si dioxide for example which can have an index of 1.5, and the Si can have an index of 3.4.

FIG. 51C shows another example of microstructure holes where the holes 5116 are composed of Si material with an index of 3.4, and the surrounding material is Ge which can have an index of 4 at certain wavelengths. In this example the microstructure holes are the Si protrusions.

Figure 51D:
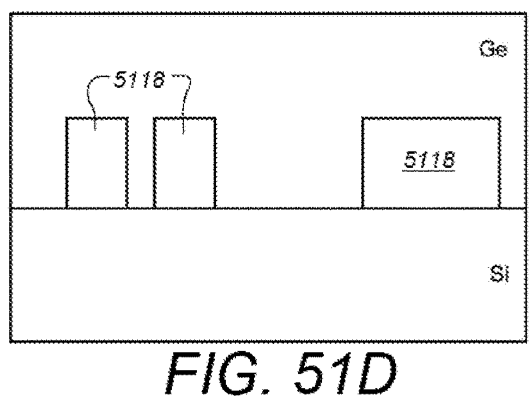

FIG. 51D shows dielectric islands formed on Si layer where the dielectrics can be Si oxide for example and Ge grown over the dielectric islands. In this example the microstructure holes 5118 are the dielectric islands which can have a refractive index ranging from 1.1-1.5, and the Ge can have a refractive index of 4 at certain wavelengths, and the Si can have a refractive index of 3.4 at certain wavelengths.

In the case of etching holes in Si in structures such as illustrated in FIGS. 51A-D, the dimension of the microstructure hole can range from 300-1300 nm or more where as if the microstructure holes have an index other than 1 the dimension of the microstructure hole can be divided by the refractive index within the hole. For example, if the holes are filled with Si dioxide the dimension of the hole can be divided by 1.2-1.5, and in some cases where the holes are Si islands, the dimensions can range from 150 nm-800 nm and in some cases more than 800 nm.

The microstructure holes in FIGS. 51A-D can be periodic, or aperiodic, or periodic and aperiodic. The lateral dimension of the holes can be the same, and in some cases can have one or more different lateral dimensions. The depth of the microstructure holes or the height of microstructure islands can be the same, or can have more than one depth or height.

Figure 52:
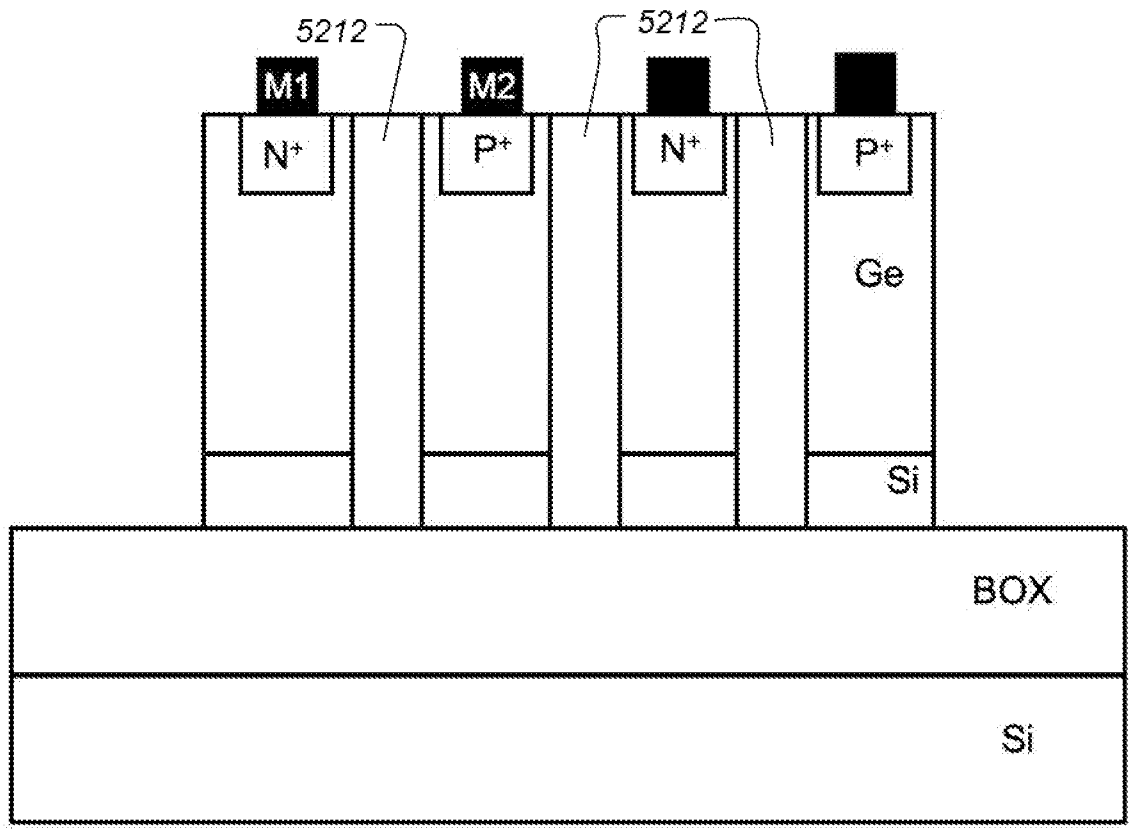
FIG. 52 shows a simplified partial cross-section schematic of an interdigitated Ge on Si SOI photodiode with lateral P and N wells with microstructure holes between the interdigits, according to some embodiments.

FIG. 52 shows a simplified partial cross-section schematic of an interdigitated Ge on Si SOI photodiode with lateral P and N wells with microstructure holes between the interdigits. The BOX layer on the Si substrate is approximately 100-150 nm thick and in some cases can be thinner than 100 nm. The Si device layer is I or low dope and has a thickness ranging from 10-50 nm, and the Ge layer grown on the Si device layer is I or low dope and has a thickness range from 250 to 400 nm. The $N^+$ and $P^+$ wells are formed in the Ge under the interdigitated metal electrodes M1 and M2. The $N^+$ and $P^+$ wells are approximately 100 nm wide, the depth of the well can range from 10 nm to 400 nm and in some cases can be partially in the Ge and/or entirely through the depth of the Ge layer; see for example Dehlinger et. al, High-Speed Germanium-on-SOI Lateral PIN Photodiodes, IEEE Photonics Technology Letters, Vol. 16, NO. 11, November 2004 FIG. 1 where such a structure has demonstrated response to 36 GHz as shown in FIG. 4. According to some embodiments microstructure holes 5212 are added with diameter or lateral dimension of 400 nm and in some cases 600 nm, and spacing between the holes of 200 nm in a square lattice which can further enhance the sensitivity and can have EQE greater than a comparable interdigitated Ge on Si SOI without microstructure holes at certain wavelengths. The microstructure holes 5212 can be partially etched into the Ge and in some cases through the Ge, and in some cases to the BOX layer. Not shown are passivation layers such as Si dioxide at the edge of the mesa and/or in some cases inside the microstructure holes. The passivation can coat the inside walls of the microstructure holes, and in some cases can fill the microstructure holes with Si dioxide, Si nitride, and/or other dielectrics. Reverse bias can be applied between M1 (cathode) and M2 (anode) with voltage range of 0.1 volt to 3.3 volts or more, and in some cases 0.3 volts to 1 volt. In some cases a reverse bias of 10 volts or more can result in avalanche gain. The M1 and M2 electrodes can be Al, or Ti/Al or Ni/Al and in some cases be a silicide. The width of the electrode can be smaller than the well for example 180 nm or less and in some cases can be 60 nm or less. The well width in some cases can be less than 200 nm for example 100 nm or less, and in some cases 50 nm or less. The lateral dimension of the photo sensitive mesa can be 10×10 microns squared and in some cases can be 30×30 microns squared, and in some cases can be 50×50 microns squared. In some cases the photo sensitive area can be less than 10×10 microns squared for example 5×5 or 1×1 in which cases the electrode width can be 14 nm or narrower. Optical signal can impinge on the top surface, and in some cases can impinge on the bottom surface or the substrate surface.

Figure 53A:
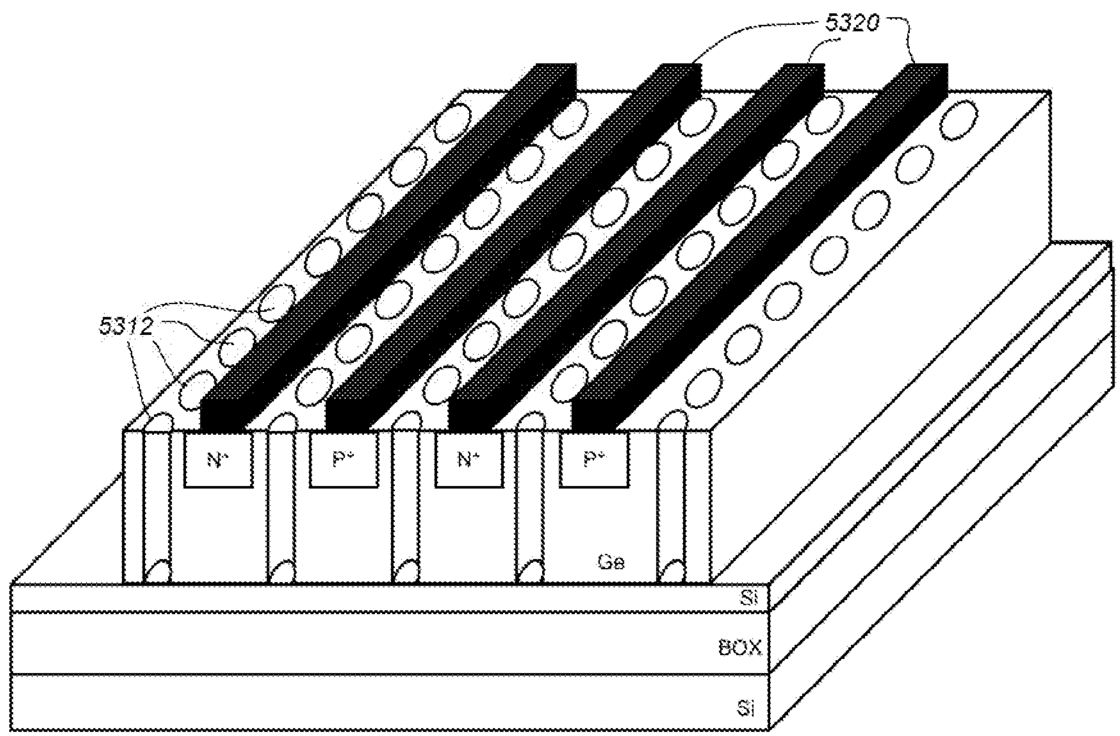
FIG. 53A shows a simplified 3D schematic of a Ge on Si SOI lateral PIN interdigitated photodetector, according to some embodiments.

FIG. 53A shows a simplified 3D schematic of a Ge on Si SOI lateral PIN interdigitated photodetector, according to some embodiments. The photodetector shown can be a photodiode, APD, SPAD. A thin layer of Ge with thickness ranging from 100-300 nm I or low dope can be grown on a thin layer of Si device layer with a thickness ranging from 5 to 200 nm on a BOX layer with thickness ranging from 10 to 1000 nm on Si handle layer/wafer. P and N wells can be formed in the Ge that can be $P^+$ or $N^+$ doped with depth ranging from 10 nm to 100 nm, and in some cases 10 nm-50 nm, and in some cases less than 20 nm. Interdigitated electrodes 5320 can be formed on the P and N region forming ohmic contacts to the P and N wells, and the metal can be Ti/Al, Cr/Al, Al, Ni/Al, Ti/Cu, Cr/Cu, Cu to name a few. Microstructure holes 5312 can be etched into the Ge and can be partially etched into the Ge, and in some cases through the Ge to the BOX layer, and in some cases through the Ge layer to the Si layer. The microstructure holes 5312 can have lateral dimensions ranging from 100 nm to 1000 nm or more, and in some cases 300 nm-1200 nm. The spacing between the interdigitated electrodes can range from 300 nm to 1000 nm and in some cases 200 nm-600 nm, and in some cases less than 200 nm, and in some cases more than 1000 nm. The width of the electrodes 5320 and the doped wells can range from 10 nm to 300 nm, and in some cases 30 nm-160 nm. The doped wells can be a little wider than the interdigitated electrodes.

Figure 53B:
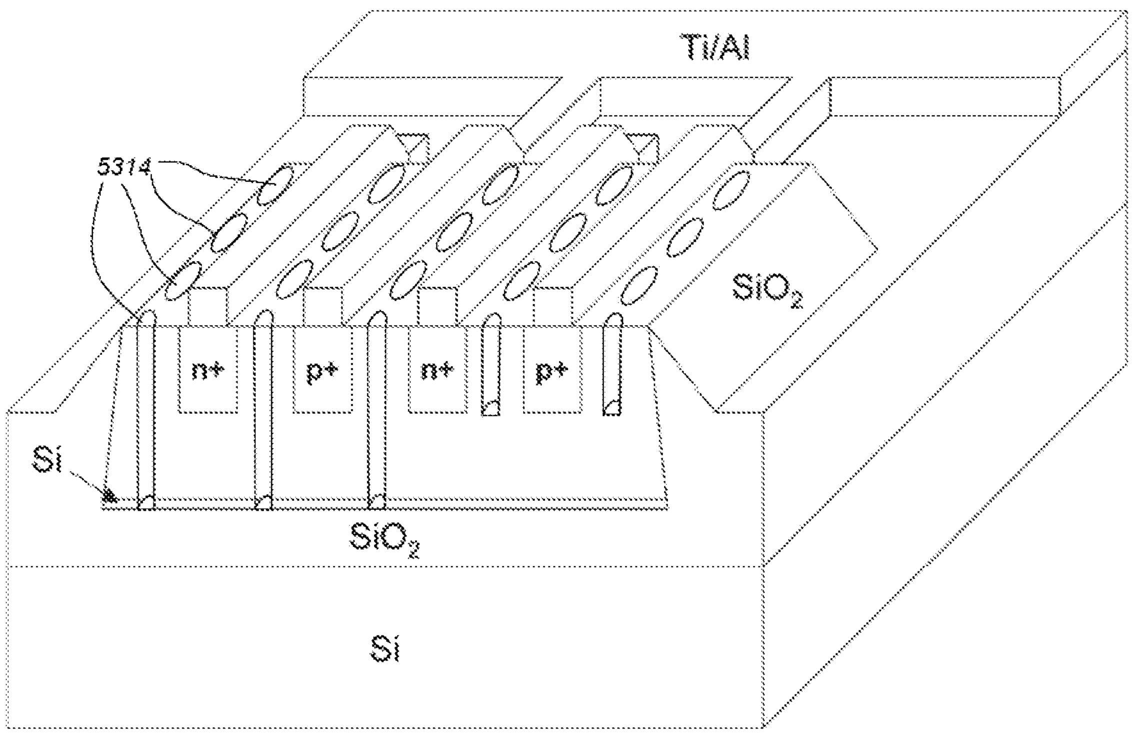
FIG. 53B shows a simplified 3D schematic of an interdigitated lateral PIN photodetector with interdigitated electrodes such as shown in FIG. 52.

The wavelength of the optical signal in structures such as illustrated in FIGS. 53A-B can range from 800 to 2000 nm, and data rate can range from 25 Gb/s to 50 Gb/s and in some cases 40 Gb/s-60 Gb/s or higher.

Very shallow P and N wells, with well depth of 5-20 nm and with $N^+$ $P^+$ or $N^{++}$ $P^{++}$ and/or degenerate doping, and in some cases P and N doping can be used in structures such as illustrated in FIGS. 53A-B to minimize the number of photo generated carriers in regions with low electric fields.

FIG. 53B shows a simple 3D schematic of an interdigitated lateral PIN photodetector with interdigitated electrodes such as shown in FIG. 52. See for example reference, Koester et. al, Ge-on-SOI-Detector/Si-CMOS-Amplifier Receivers for High-Performance Optical-Communication Applications, Journal of Lightwave Technology, Vol. 25, No. 1, January 2007, compatible with CMOS/BiCMOS process and where 15 Gb/s data rate was demonstrated. According to some embodiments of this patent specification, microstructure holes 5314 are added.

Figure 54A:
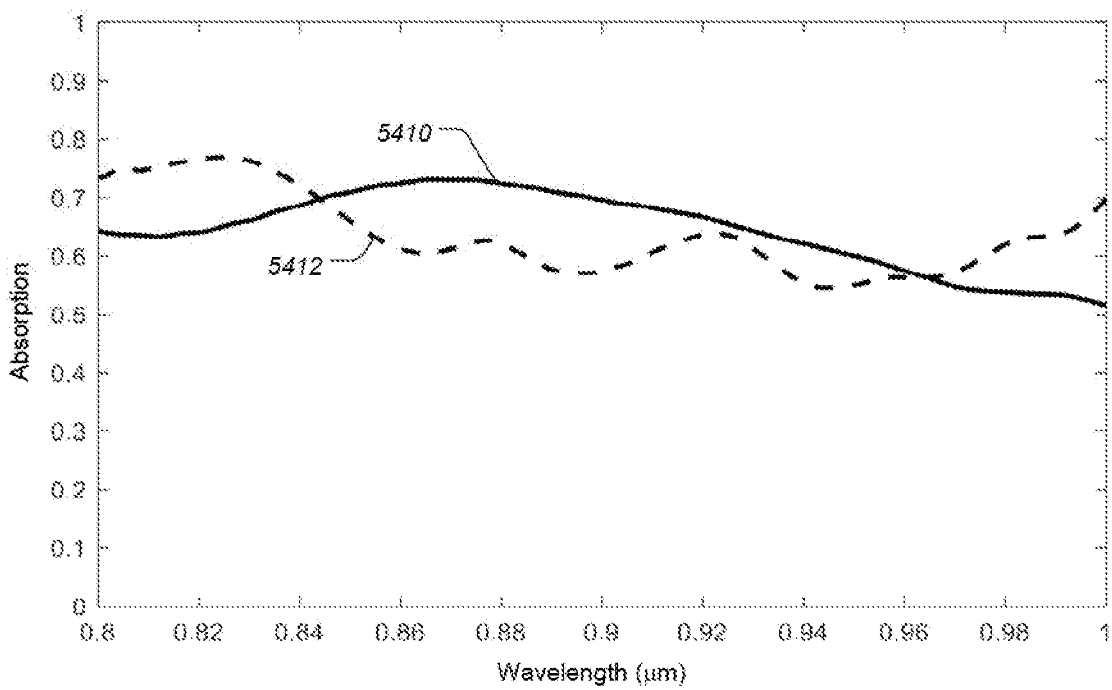
FIGS. 54A-C show FDTD simulated optical absorption of a structure such as shown in FIG. 52.
Figure 54B:
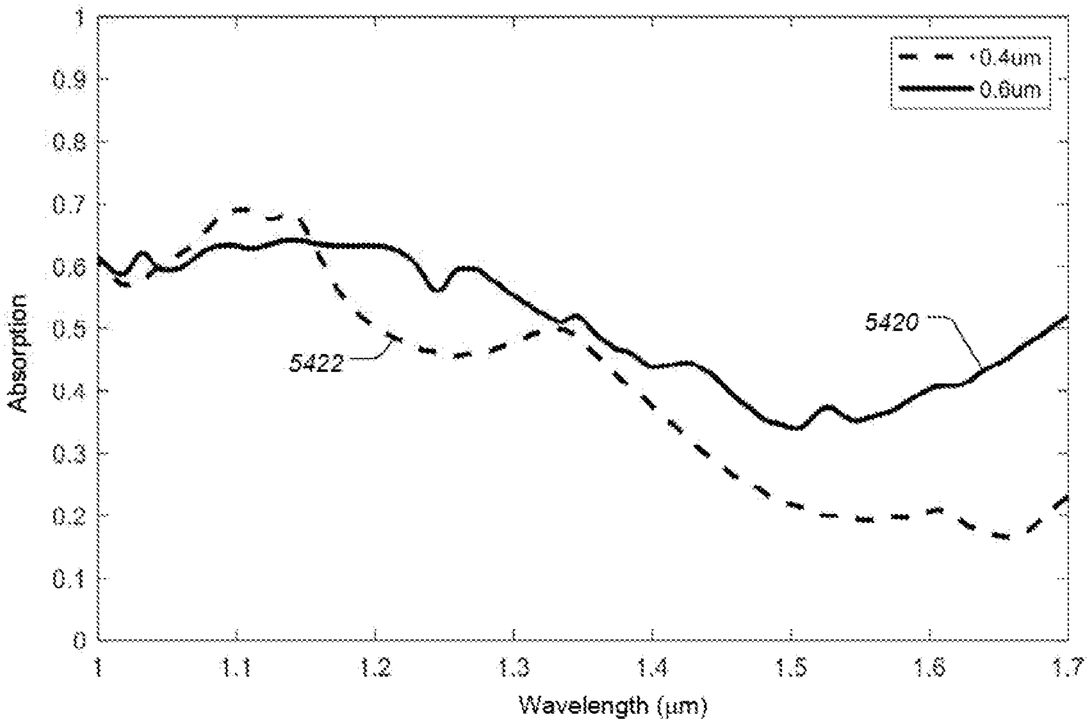
Figure 54C:
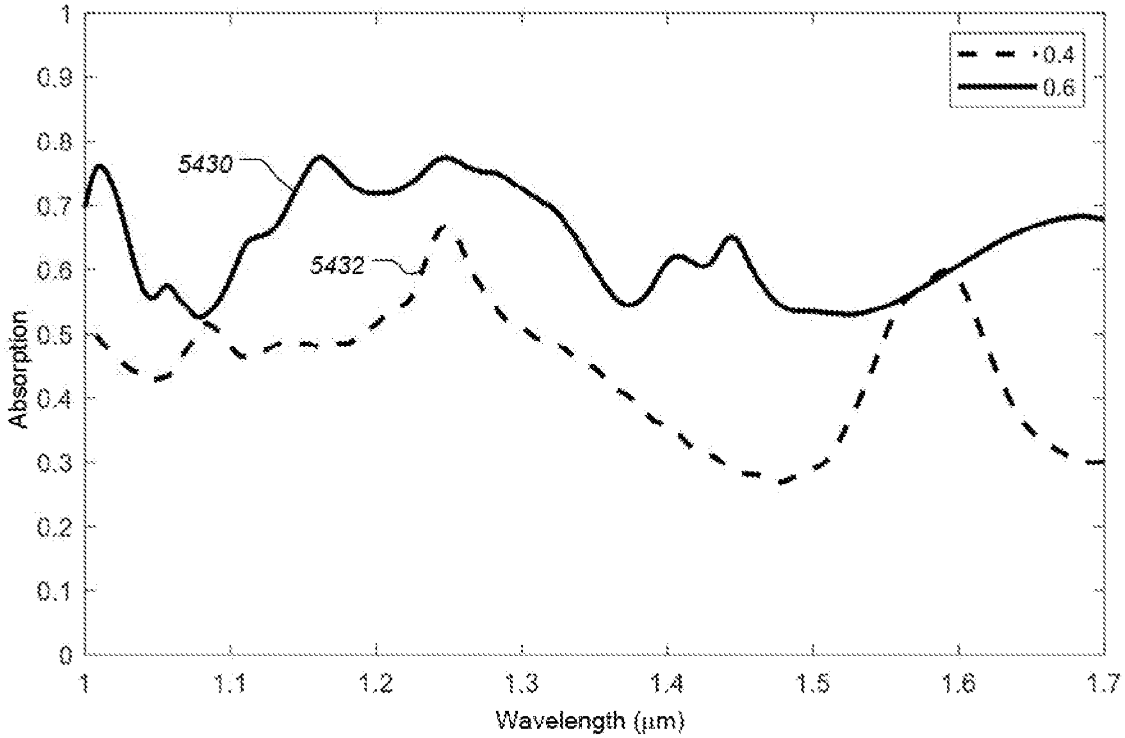

FIGS. 54A-C show FDTD simulated optical absorption of a structure such as shown in FIG. 52. In FIG. 54A the structure has cylindrical holes with diameter of 400 and 600 nm with spacing of 200 nm in a square lattice and with Ge thickness of 250 nm. The microstructure holes are etched through the Ge to a depth of 250 nm, Al electrode width of 180 nm. The absorption which is directly proportional to EQE is shown for wavelength range from 800 to 1000 nm. The solid curve 5410 is for holes of 600 nm, and the dashed curve 5412 is for holes of 400 nm diameter. The absorption or EQE can be greater than 50% at wavelength range from 800 to 1000 nm, the EQE of microstructure hole PD can be higher than a comparable PD without microstructure holes at certain wavelengths.

FIG. 54B shows FDTD simulation of a structure similar to that simulated in FIG. 54A with wavelength range from 1000-1700 nm where the microstructure holes are etched to ½ the depth of the Ge layer. The solid curve 5420 is for cylindrical holes with diameter of 600 nm, and the dashed curve 5422 is for cylindrical holes with diameter of 400 nm, and where the holes have a 200 nm spacing in a square lattice. The absorption or EQE can be greater than 30% at 1350 nm, and in some cases can be greater than 10% at 1350 nm.

EQE in the example of FIG. 54B can be as high as 70% at certain wavelengths and data rate can be 40 Gb/s or higher, and in some cases 40-60 Gb/s.

FIG. 54C is similar to FIG. 54B with the exception that the microstructure holes are etched through the Ge layer to the Si layer. The solid curve 5430 is for the case of cylindrical holes with a diameter of 600 nm and the dashed curve 5432 shows cylindrical holes with a diameter of 400 nm. Lateral interdigitated PIN Ge on Si SOI with microstructure holes can have an EQE higher than a comparable photodetector without microstructure holes at certain wavelengths. The EQE of the microstructure hole lateral PIN Ge on Si SOI can be 10% or higher at wavelength of 1550 nm. The absorption is directly proportional to EQE and in some cases can be equal to EQE.

Figure 55:
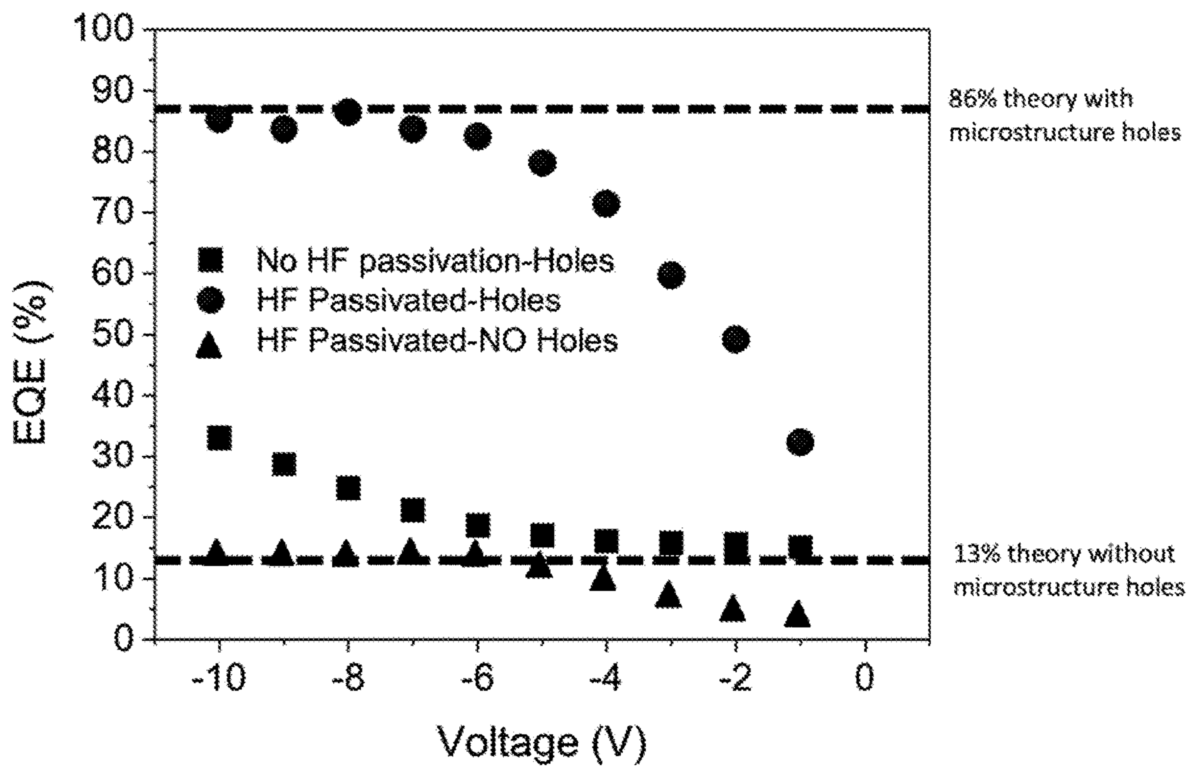
FIG. 55 shows experimental data of external quantum efficiency vs. reverse bias voltage of an interdigitated MSM photodetector on SOI where the device layer is 1 micron thick.

FIG. 55 shows experimental data of external quantum efficiency vs. reverse bias voltage of an interdigitated MSM photodetector on SOI where the device layer is 1 micron thick in structures such as illustrated in FIG. 47C and in other new lateral Schottky MSM structures described in this patent specification. The BOX layer is approximately 1 micron thick, and a handle Si substrate of approximately 700 microns thick. The device layer is low dope P type with a resistivity approximately 10-25 ohm-cm, and where the metal interdigits are Al forming a Schottky contact with the low dope P Si. Microstructure holes with 1000 nm diameter, and 1300 nm period in a square lattice. The holes are dry etched using drie (deep reactive ion etching) to a depth of approximately 600-800 nm. The width of the interdigit Al electrodes are 300 nm wide, and the spacing is 1000 nm wide. 850 nm wavelength impinge on the top surface using multimode or single mode fiber. The triangles in the graph shows the EQE of a controlled sample without microstructure holes, and as can be seen the EQE is approximately 13-14% which agrees with theoretical calculations. The squares is the EQE of a MSM photodetector with microstructure holes that is not passivated and as can be seen the maximum EQE attained is just over 30% at −10 volts. The circles shows the EQE of the same MSM photodetector with microstructure holes that are passivated with Hydrogen, and as can be seen, the EQE is approximately 85% which is close to the theoretical prediction of 86%. The theory is using FDTD simulation of the optical fields in the MSM structure with and without holes and with the metal interdigits fingers in place at 850 nm. As can be seen, passivation in this case using Hydrogen (3 second dip in diluted HF solution) can reduce surface recombination at the side walls of the holes to a point where virtually all the absorbed photons can be collected so that EQE is approximately equal to number of absorbed photons. Other passivation methods can include thermal oxide of the Si, deposition of dielectrics such as Al oxide, Si dioxide, Si nitride, Hf oxide to name a few using methods such as atomic layer deposition. The passivating oxides can be formed on the surface of the substrate and the surface of the side walls of the microstructure holes, and in some cases can partially and/or entirely fill the microstructure holes. This experimental data of EQE for a 1 micron device layer SOI shows good agreement with FDTD simulations for MSM structures.

Figure 56A:
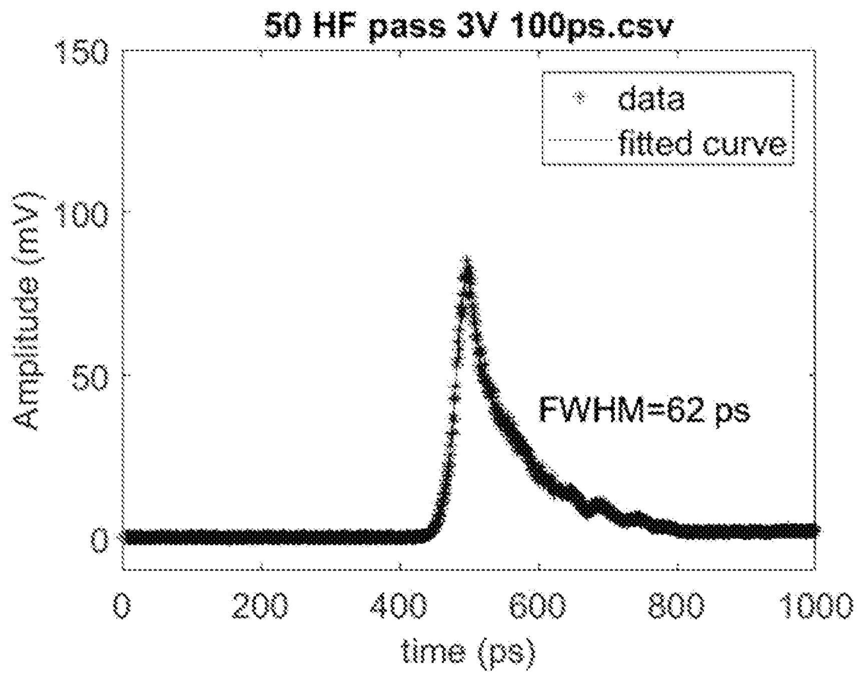
FIGS. 56A-D show the impulse responses at 850 nm wavelength of a device with EQE shown in FIG. 55.
Figure 56B:
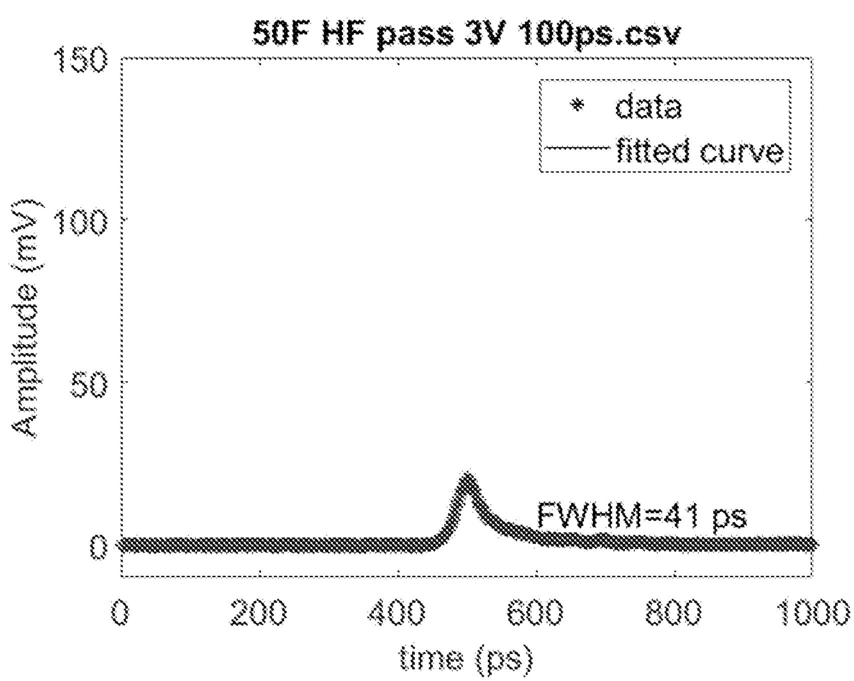
Figure 56C:
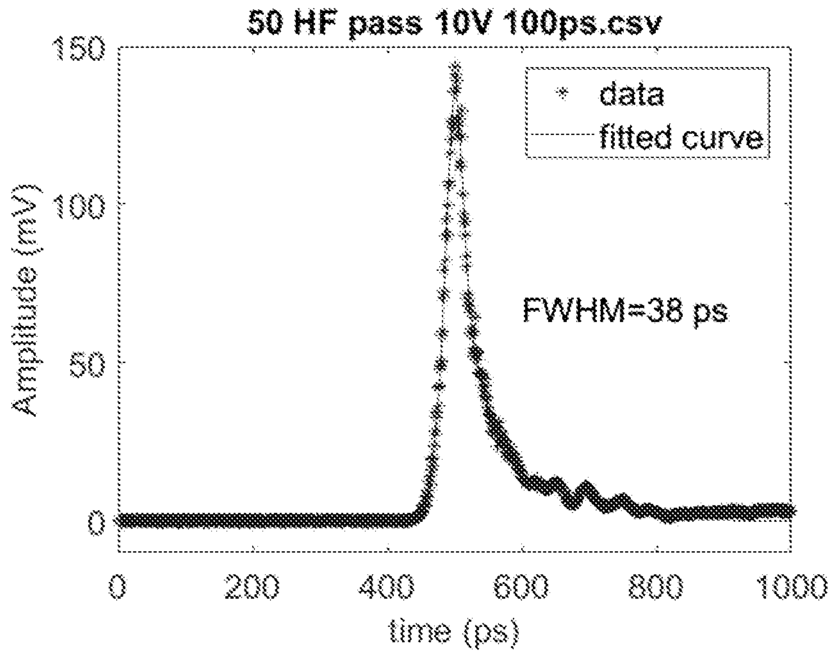
Figure 56D:
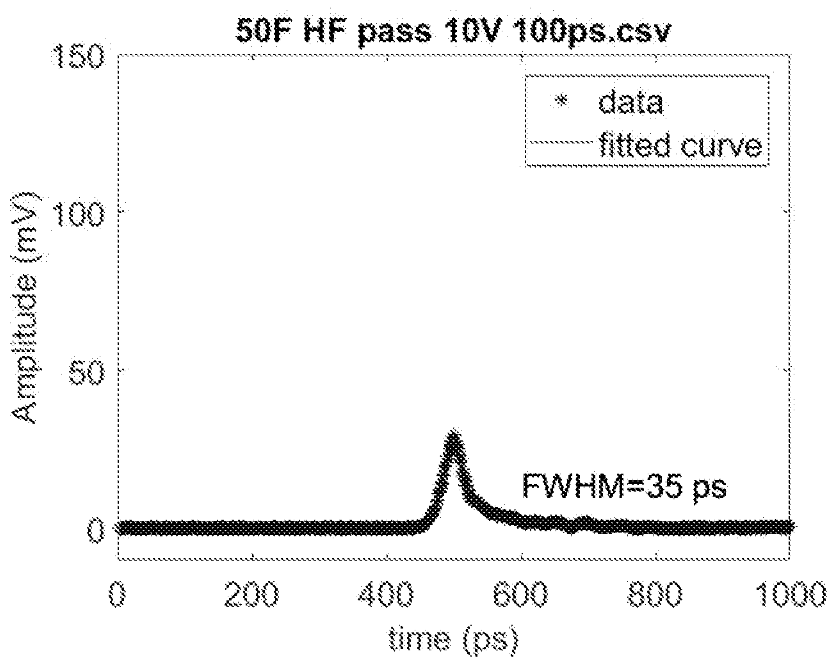

FIGS. 56A-D show the impulse responses at 850 nm wavelength of a device with EQE shown in FIG. 55. As can be seen, FIGS. 56A and 56C are for MSM with microstructure holes at 3 and 10 volt bias respectively, and FIGS. 56B and 56D are controlled samples on the same wafer without microstructure holes. As can be seen, the amplitude of the impulse response of the MSM without microstructure holes is significantly lower than for an MSM with microstructure holes and passivated with Hydrogen. The full width half max is 38 picoseconds and if the system time constants such as the laser pulse width and the response time of the sampling scope are deconvolved the full width half max can be significantly shorter than the 38 pico seconds measured for the MSM photodetector with 50 microns diameter. As can be seen, the rise time for the impulse response is approximately 10-20 picoseconds at the 10-90% amplitude level which can have a depth resolution in the millimeter range for time of flight applications such as LiDAR. For data center communications, data rates of 10-25 Gb/s can be obtained, and with thinner device layer of for example 0.5 microns and with spacing between the electrodes of approximately 400-600 nm and with electrode width ranging from 160 nm-60 nm and in some cases less than 60 nm, for example 30-14 nm, the data rate of the MSM photodetector can be greater than 25 Gb/s and in some cases 40-50 Gb/s, and in some cases 60 Gb/s or more.

Figure 57:
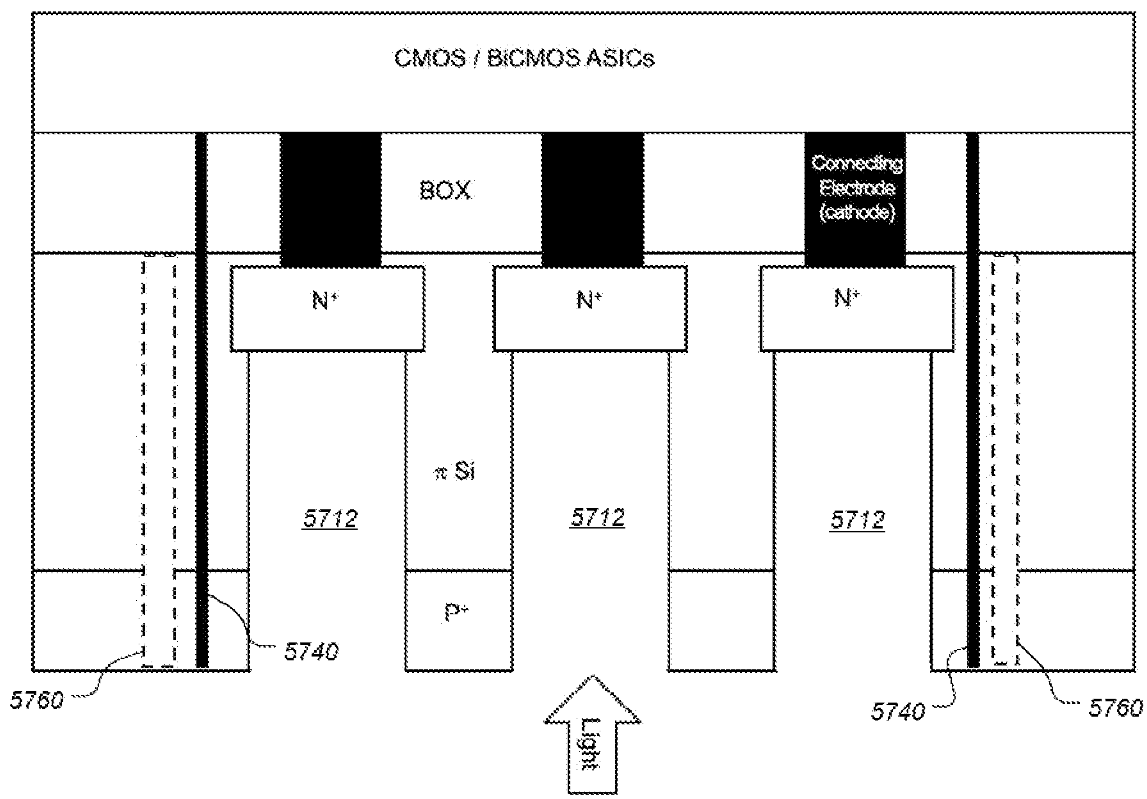
FIGS. 57-59 shows simple partial cross-section of a bottom illuminated CMOS/BiCMOS sensor array, according to some embodiments.
Figure 58:
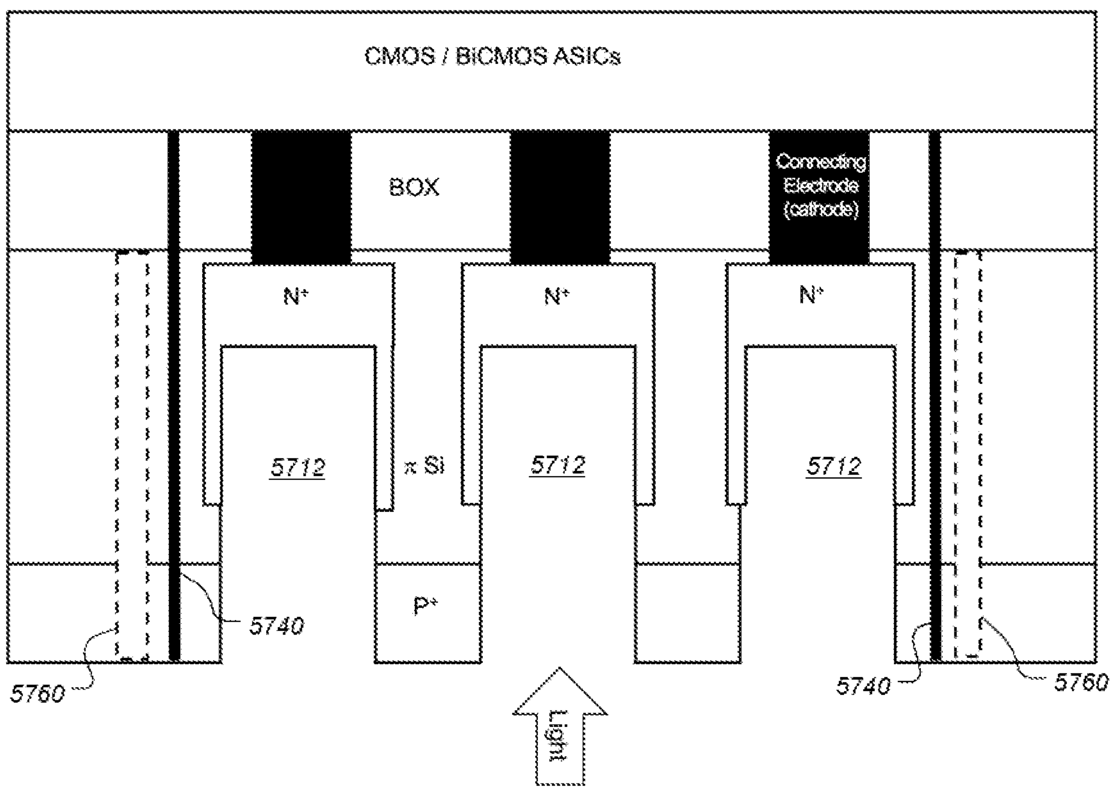
Figure 59:
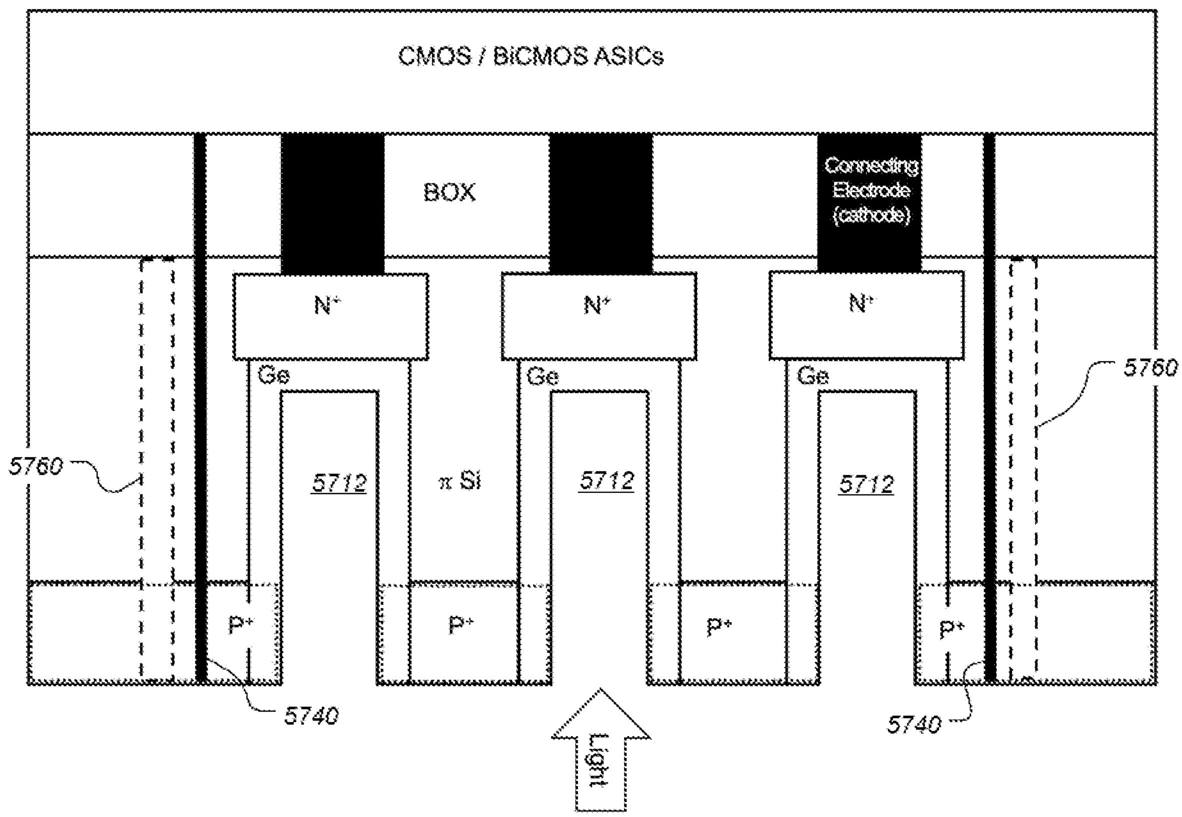

FIGS. 57-59 shows simplified partial cross-section of a bottom illuminated CMOS/BiCMOS sensor array, according to some embodiments. Microstructure holes 5712 enhance the absorption, and extend the operating wavelength of the sensor array which can be used for high speed optical data communication, time of flight applications such as LiDAR and imaging at near infrared wavelengths. CMOS/BiCMOS ASICs are fabricated in the device layer of a SOI wafer and where the handle wafer can be low dope P or N such as ν or π doping for example. The photodetectors are fabricated in the handle substrate of the SOI and where microstructure holes are etched into the handle substrate to within a few microns or less to the BOX layer. In FIG. 57, ion implantation can be used to form N wells and P wells on a π type handle wafer. Connecting electrodes 5740 from the CMOS ASICs can be formed to the N well through a via and the connecting electrode can be metallic, and in some cases can be metal silicide. Connecting electrodes 5740 can also be formed from the CMOS to the P layer through a via, and in some cases the P layer can have a metallization such as an anode and can be connected to a common ground instead of through TSV (trans silicon via). The N wells are cathodes, and the P wells are anodes, and a reverse bais can be applied between the anode and cathode. The handle wafer thickness can range from 200 microns to a few microns for example 3 microns. The microstructure holes 5712 can be etched in the handle substrate to within a few microns of the BOX layer, in some cases to within 3 mircons or less or the BOX layer, and in some cases to within 1 micron or less to the BOX layer. The microstructure holes can have a diameter ranging from 300 nm-1500 nm, and in some cases from 500 nm-1500 nm, and in some cases from 700 nm-1800 nm, and in some cases 800 nm-1200 nm. The spacing between the microstructure holes can range from 100 nm-600 nm, and in some cases more than 600 nm. The microstructure holes can be periodic, and/or aperiodic, and/or random. The microstructure hole diameter or lateral dimension can be the same and/or in some cases can vary within the same array. The microstructure holes can be circular, oval, square, rectangular, polygonal, and/or amoebic. The microstructure holes can be dry etched using DRIE for example and in some cases can be a combination of dry and wet etch using TMAH for example. The surface of the microstructure holes and of the Si can be passivated with native oxide and in some cases with dielectrics that can be deposited on the surface using atomic layer deposition for example to reduce surface recombination and thereby to increase the EQE. The passivation dielectrics can partially fill the microstructure holes, and in some cases fill the microstructure holes entirely. The N wells can be ion implanted and then activated with thermal anneal, and the P wells can also be ion implanted and activated with thermal anneal. In some cases the P and N wells can be formed by diffusion and/or a combination of ion implant and diffusion of dopant ions. By etching the microstructure holes, the N wells can be formed close to the BOX layer irrespective of the thickness of the π Si, for example in some cases the π Si can be 50 microns or thicker and with microstructure holes etched to within a few microns of the BOX layer the N wells can be ion implanted in close proximity to the BOX layer, and in some cases touching the BOX layer. Electrodes can be formed from the CMOS/BiCMOS ASICs to the N well cathode region, and anode can be formed on the P well and can be connected to the CMOS/BiCMOS ASICs. Optical signal which can be high data rate signal, time of flight optical pulses, or images can illuminate the back surface with wavelength range of 800-1100 nm, and in some cases 900-1060 nm, and in some cases 1000-1100 nm wavelength. With handle layer thickness of 10 microns or less data rates can be greater than 1 Gb/s. With handle layer thickness of 3 microns or less, data rates can be 10 Gb/s or more. EQE of microstructure hole back illuminated CMOS sensor array can be greater than a comparable back illuminated CMOS sensor array without microstructure holes at certain wavelengths. See reference Lee et. al, A Back-Illuminated Time-of-Flight Image Sensor with SOI-Based Fully Depleted Detector Technology for LiDAR Application, Proceedings 2018, 2, 798; doi:10.3390/proceedings2130798. Also see for example, Yokogawa et. al, IR sensitivity enhancement of CMOS Image Sensor with diffractive light trapping pixels, Scientific Reports 7:3832 DOI:10.1038/s41598-017-04200-y.

The isolation trenches 5760 for electrical and/or optical can be etched to the BOX layer, and in some cases the isolation trench can be partially etched into the handle layer and in some cases can be optional.

FIG. 58 is similar to FIG. 57 with the exception that the N wells can also be on the side wall of the microstructure holes 5712. In this structure the transit time of the photo generated carrier can be reduced due to the proximity of the P and N well as compared to the structure shown in FIG. 57 for example. The reduction in transit time can result in a faster photodetector. The sensor array can have array sizes ranging from 2×2 to 1000×1000 or more.

With N doping on the side wall of the microstructure holes in structures such as illustrated in FIG. 58, the handle layer of the SOI wafer can be thicker for example greater than 50 microns without significant loss in speed due to presence of applied electric field in the absorption regions. It should be noted that the P and N can be interchanged and the handle substrate can be low dope P or N with resistivity greater than 100 ohm-cm, and in some cases 1000 ohm-cm.

FIG. 59 shows a structure similar to FIG. 57 with the exception that Ge and/or GeSi alloy can be grown on the surface of the microstructure hole 5712. P and N wells are formed in contact to the Ge/GeSi layer. With the addition of Ge/GeSi the wavelength of back illuminated CMOS/BiCMOS sensor array can be extended to 1800 nm, and in some cases from 1000 nm-1600 nm. The EQE of a microstructure hole back illuminated array sensor can be greater than a comparable back illuminated sensor without microstructure holes at certain wavelengths.

The Ge/GeSi on Si structures illustrated in FIG. 59 can form a PD/APD/SPAD array.

Figure 60A:
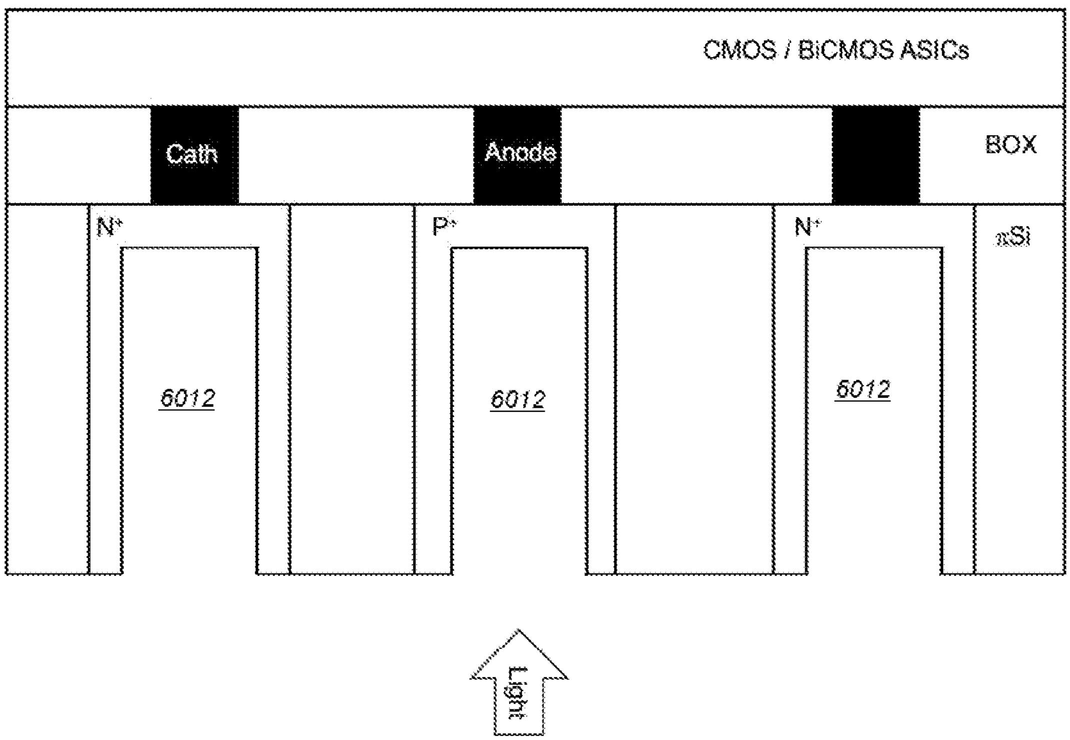
FIGS. 60A and 60B show a cross-section view and bottom view, respectively, of a microstructure hole back illuminated CMOS/BiCMOS sensor array, according to some embodiments.
Figure 60B:
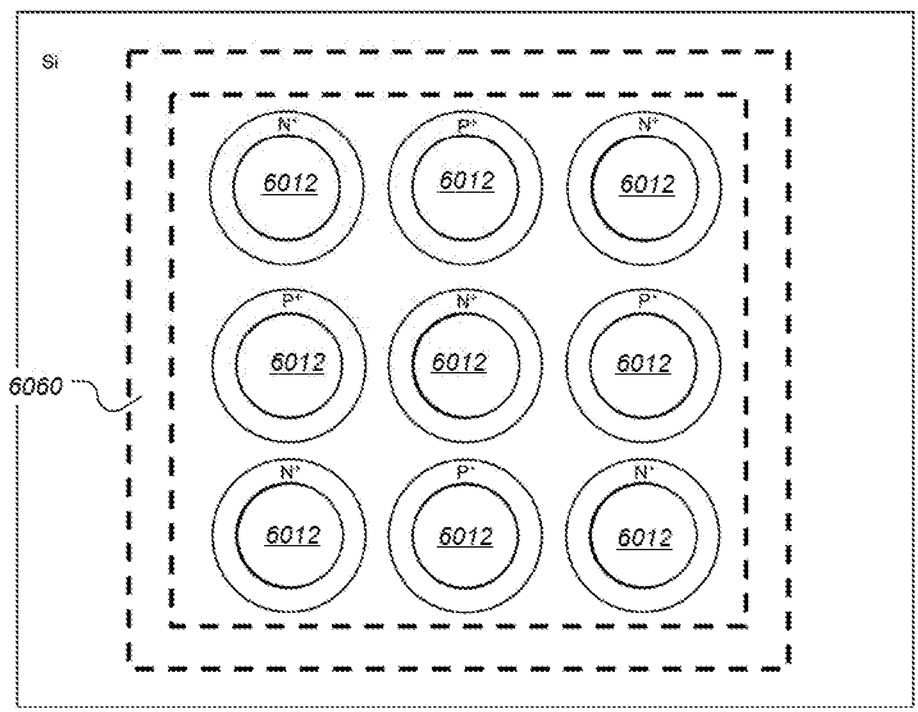

FIGS. 60A and 60B show a cross-section view and bottom view, respectively, of a microstructure hole back illuminated CMOS/BiCMOS sensor array, according to some embodiments. The microstructure holes 6012 are etched to within a few microns of the BOX layer for example less than 2 microns. The P and N dopant ions are diffused into the side wall of the microstructure holes, and adjacent microstructure holes can have a different dopant polarity as shown in FIG. 60. The PIN structure are lateral and provide strong electric fields within the absorption region, and where the handle wafer can have thicknesses ranging from 200-1 micron thickness. Reverse bias can be applied to the doped region of anode and cathode via connecting electrodes that can be metallic or metal silicide through the BOX layer to the CMOS/BiCMOS ASICs.

The microstructure holes 6012 can have a lateral dimension ranging from 400-1800 nm and in some cases 600-1200 nm and can be circular, oval, square, rectangular, polygonal, hexagonal, and/or amoebic and can have an etch depth ranging from 10 microns to 200 microns, and in some cases less than 10 microns. In some cases, the etch depth can range from 1 micron to 50 microns. The microstructure holes are dry etched using DRIE for example and can be a combination of dry and wet etch where the depth of the etch is not limited by facet angles such as in the case of inverted pyramids where the depth is limited by crystal planes of 54 degrees approximately. The microstructure holes can be periodic and/or aperiodic, and/or random. The holes can be passivated with a dielectric and can partially or fully fill the microstructure holes.

The lateral PIN of FIGS. 60A-B can be a photodiode and, in some cases, APD and in some cases SPAD arrays and in some cases can be a combination of PD, APD, SPAD in an array. A reverse bias can be applied between the N cathode and the P anode with reverse bias voltages ranging from 0.5 volt-3.3 volts, and in some cases 1 volt-10 volts, and in some cases from 1 volt-35 volts, and in some cases greater than 35 volts. The speed or data rate bandwidth or the 10-90% rise time can be determined by the photo generated carriers in the Si/GeSi/Ge transit time and capacitance. The CMOS/BiCMOS ASICs for data center interconnect applications can consist of trans-impedance amplifiers and other electronics needed for signal processing and communication of the processed electrical signal with other components in the data center, and in some cases the ASICs can also include electronics for biasing and controlling APD/SPAD devices and all the necessary electronics for conditioning, processing and transmission of the electrical signal, and in some cases the ASICs can also include electronics for image processing such as 3D image processing, and read out electronics, and necessary electronics for displaying an image, and in some cases the ASICs can also include time of flight electronics and necessary processing electronics to determine spatial and depth resolutions such as for LiDAR applications. Optical signal and/or optical image impinge on the bottom surface.

Ge and/or GeSi can also be grown within the holes as in FIGS. 59 and 60A to form a lateral Ge on Si PIN PD/APD/SPAD.

The data rate in structures such as illustrated in FIGS. 60A-B can range from 10 to 50 Gb/s or more, and in some cases 25-50 Gb/s or more, and the 10-90% rise time can range from 5 ps to 100 ps, and in some cases 10 ps-100 ps. The gain can range from 3 dB to 30 dB or more, and the wavelength range without Ge or GeSi can range from 500 to 1100 nm, and with Ge/GeSi can range from 500 to 2000 nm, and in some cases t800-2000 nm.

In SPAD mode the gain in structures such as illustrated in FIGS. 60A-B can range from 100,000-1,000,000 or more.

With doping profiles of PN, PIN, PIPN in structures such as illustrated in FIGS. 60A-B, the photodetector can be a photodiode or an avalanche photodiode, or a single photon avalanche photodiode. The spacing between the microstructure holes can range from 100 nm-500 nm. The thickness of the photodetector layer can range from 30 nm to-5000 nm, and in some cases 300 nm-3000 nm. The photodetector can be back illuminated CMOS image sensor or a front illuminated CMOS image sensor. A reverse bias is applied between the anode (P) and cathode (N) with a reverse bias voltage ranging from 0.7 V to 35 V and in some cases 0.7 V-3.3 V, and in some cases 3.3 V-15 V.

FIG. 60B is single pixel bottom view where the microstructure holes 6012 have lateral P and N doped regions, and the holes are arranged such that the neighboring holes have opposite doping polarities. An isolation trench can be included where the isolation trench can be partially etched into the bottom handle layer, and in some cases it can be fully etched to the BOX layer.

The microstructure holes 6012 can be circular, oval, polygonal, amoebic, and can be in a periodic or aperiodic or random arrangement. The microstructure holes can be cylindrical, funnel or conical shaped. The lateral dimension of the hole can range from 300 to 1500 nm and in some cases more than 1500 nm. In some cases, the lateral dimension of the holes can range from 500 to 1200 nm. The spacing between the holes can range from 100 nm to 600 nm, and in some cases from 300 nm to 1000 nm, and in some cases more than 1000 nm.

Figure 61:
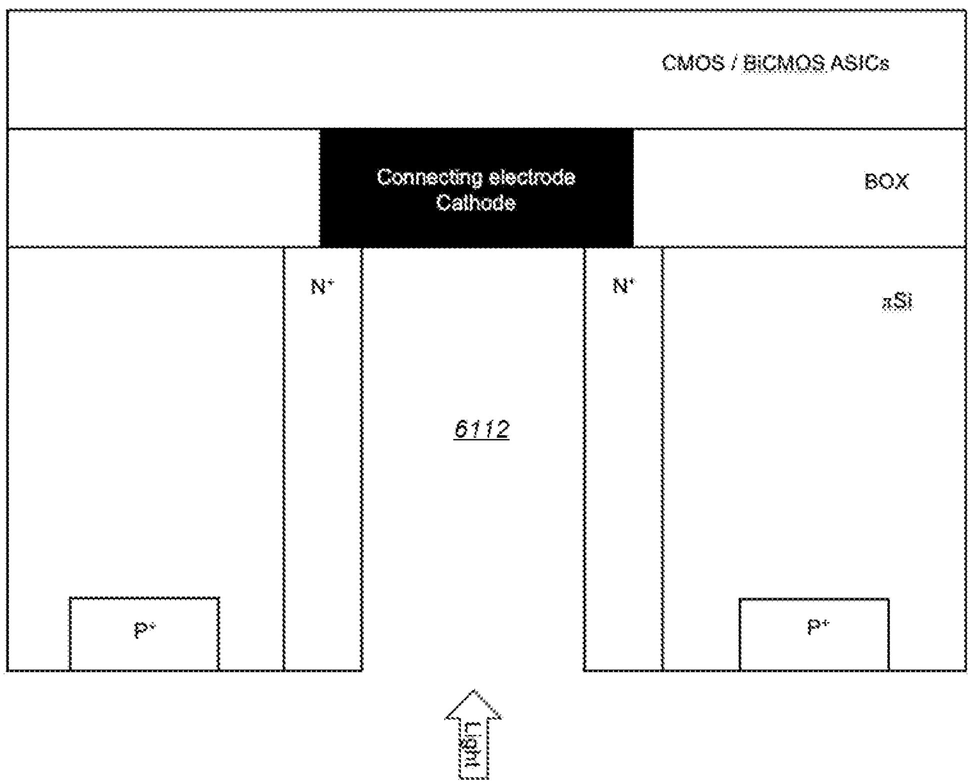
FIGS. 61 and 62 are simplified partial cross-sections of a microstructure hole bottom illuminated CMOS/BiCMOS sensor array, according to some embodiments.
Figure 62:
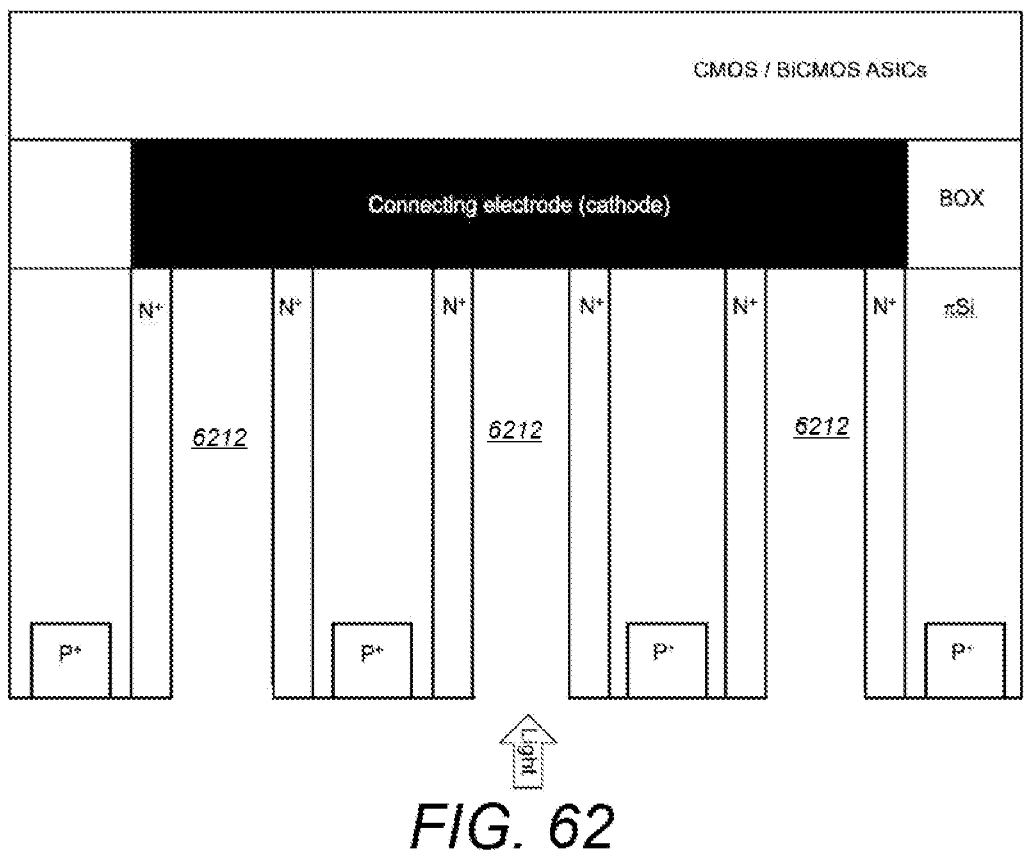

FIGS. 61 and 62 are simplified partial cross-sections of a microstructure hole bottom illuminated CMOS/BiCMOS sensor array, according to some embodiments. In FIG. 61, the microstructure hole 6112 can be etched to the BOX layer and N dopant ions are diffused into the sidewalls. P wells can be formed on the bottom surface. Connecting electrodes can be formed through the BOX layer from the CMOS/BiCMOS ASICs, and connect to the N doped layer to form a cathode. Anode metallization can be formed on the P layer and can be connected to the CMOS/BiCMOS ASICs through a common ground and/or through a TSV. Only one microstructure hole is shown however, multiple holes forming a periodic and/or aperiodic and/or random array can be formed.

FIG. 62 is similar to FIG. 61 except that multiple holes 6212 are shown and connected via a common electrode to the CMOS/BiCMOS ASICs. The number of holes connected can range from 1 to 1000 or more, and in some cases 1-100, and in some cases can be more than 1000 holes, for example 10,000-1000,000 holes or more.

Figure 63A:
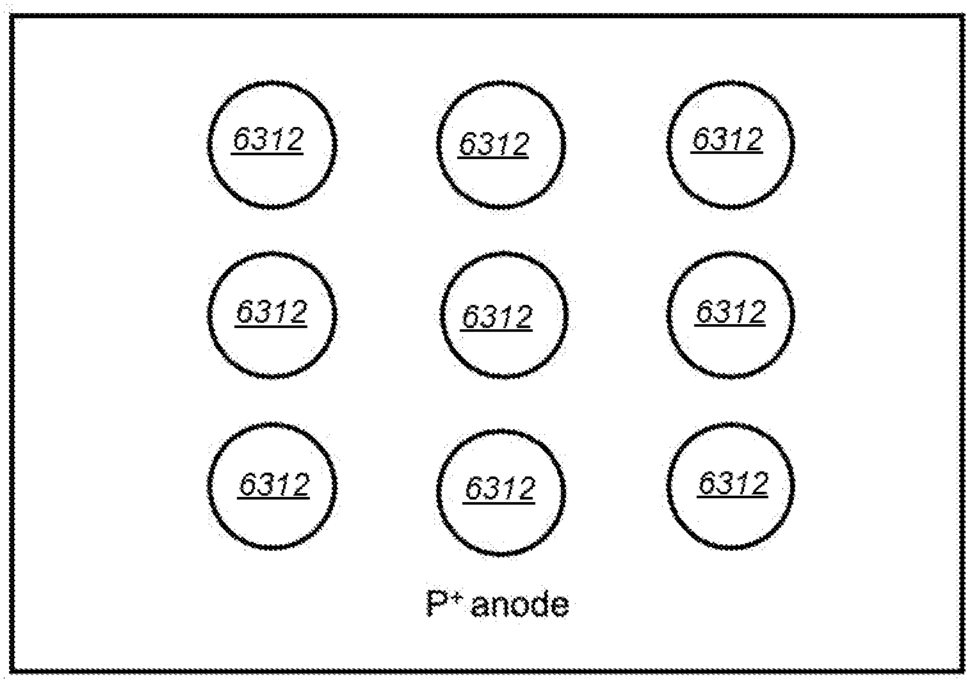
FIGS. 63A-B show a simplified partial bottom schematic views of a back illuminated CMOS/BiCMOS sensor array with circular holes, according to some embodiments.
Figure 63B:
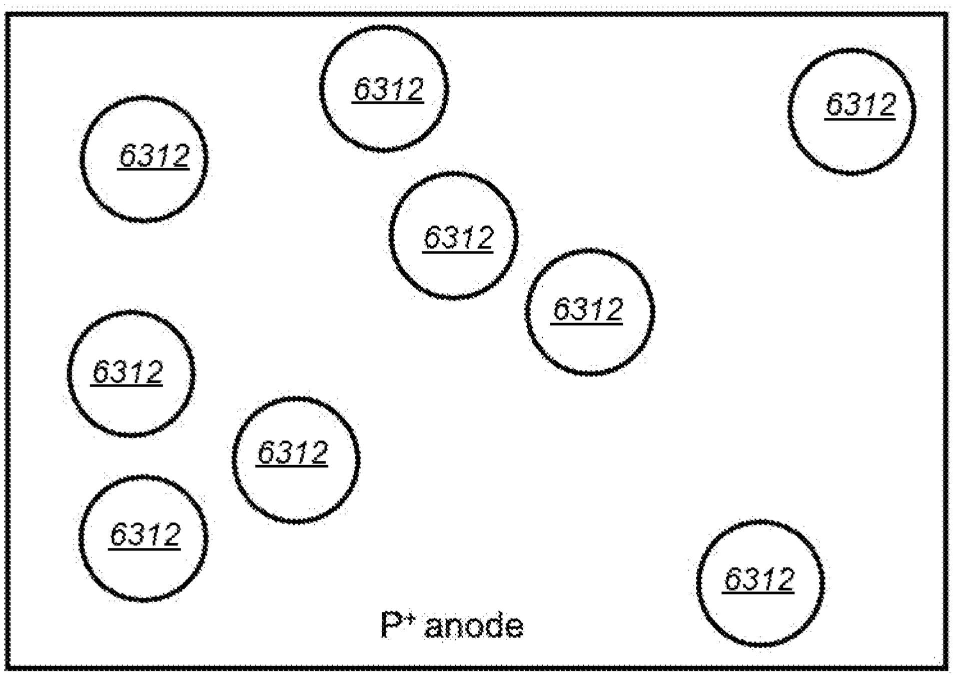

FIGS. 63A-B show a simplified partial bottom schematic views of a back illuminated CMOS/BiCMOS sensor array with circular holes. In FIG. 63A, periodic circular holes 6312 are arranged in a square lattice. FIG. 63B shows an aperiodic and/or random arrangement of microstructure holes 6312. Each pixel of the sensor array depending on the size of the pixel can contain anywhere from a single to 1000 microstructure holes or more, and in some cases from 5-30 microstructure holes, and in some cases 100 or more microstructure holes. In some cases, the number of holes can range from 1000 to 10,000 within a pixel or photosensitive area. The spacing between the microstructure holes can range from 100 nm to 600 nm, and in some cases more than 600 nm for example 1,000 nm.

Figure 64:
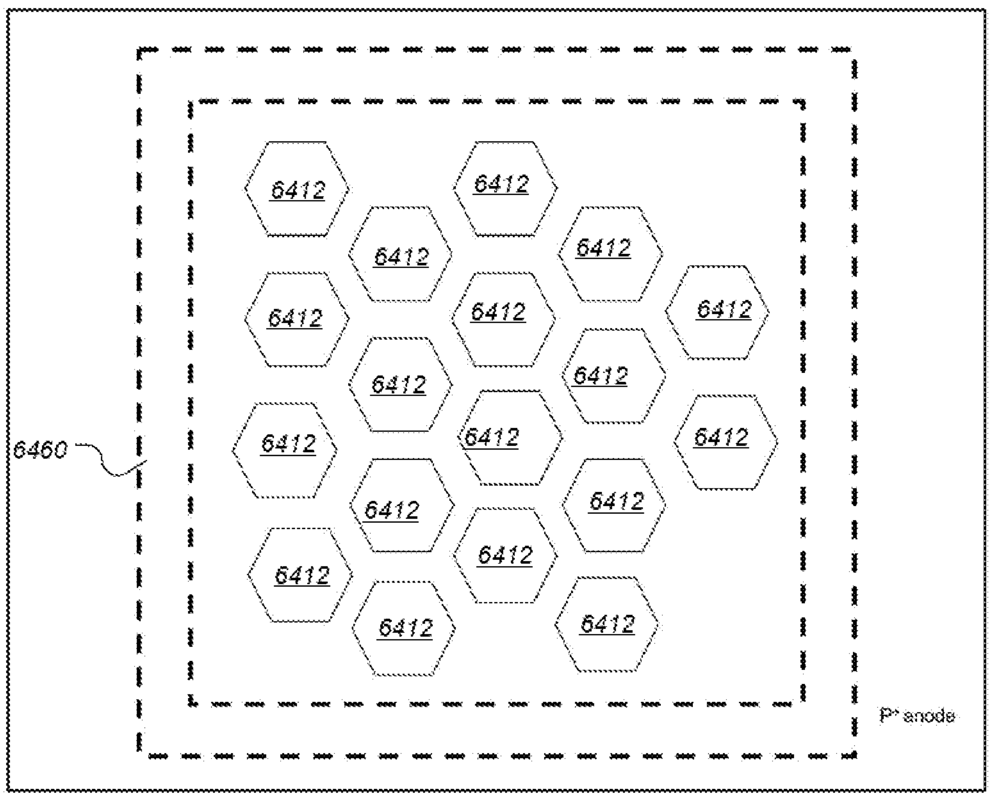
FIG. 64 is a diagram illustrating hexagonal holes in a hexagonal lattice, according to some embodiments.

FIG. 64 is a diagram illustrating hexagonal holes in a hexagonal lattice, according to some embodiments. The holes 6412 can be fabricated using dry etching and the depth of the holes can be etched to the BOX layer, and in some cases to within 1 or 2 microns of the BOX layer. The spacing between the hexagonal holes can range from 100-500 nm, and in some cases 300-600 nm. The lateral dimension of the hexagonal holes can range from 300 to 1800 nm, and in some cases 600-1200 nm, and in some cases 800-1000 nm.

An isolation trench 6460 can be etched into the bottom surface partially into the handle layer, and in some cases through the handle layer to the BOX layer. The isolation trench can be for electrical isolation between pixels and/or optical isolation between pixels. Shown in FIG. 64 can be a single pixel or multiple pixels in an array that can have 1-1,000,000 or more pixels and applications can include optical data communication, LiDAR and 3D imaging, and in some cases time of flight imaging.

Figure 65:
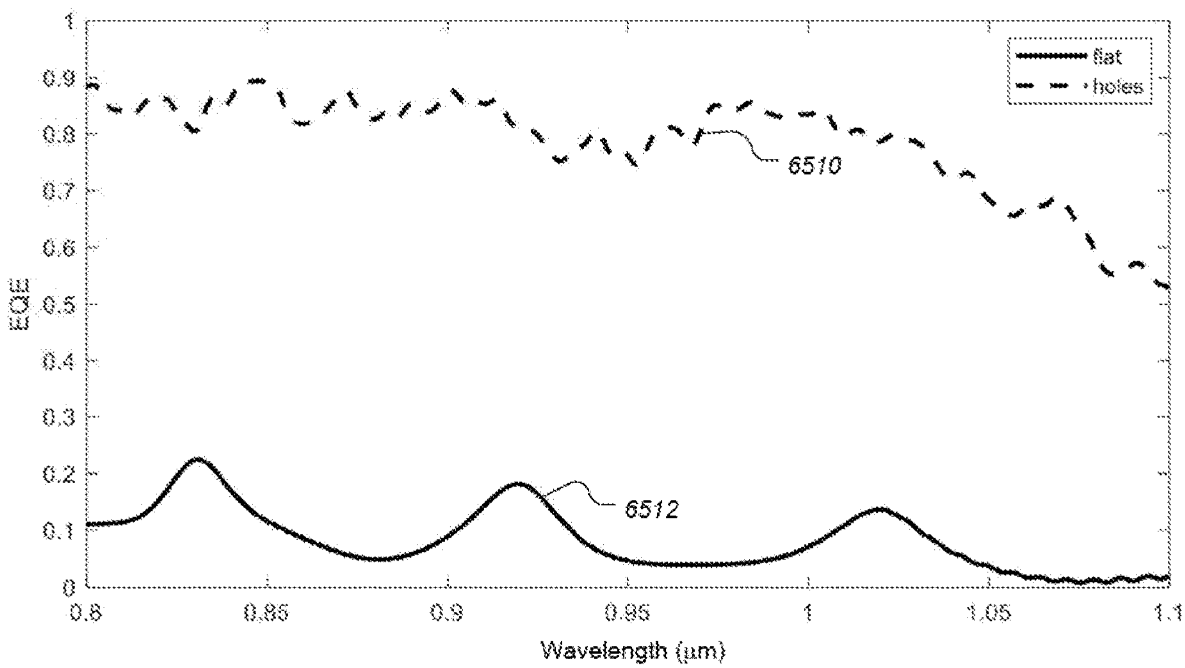
FIG. 65 shows a FDTD simulated optical absorption vs wavelength for a 1 micron device layer on SOI with microstructure holes diameter of 1000 nm and 1300 nm period in a square lattice.

FIG. 65 shows a FDTD simulated optical absorption vs wavelength for a 1 micron device layer on SOI with microstructure holes diameter of 1000 nm and 1300 nm period in a square lattice in structures such as illustrated in FIG. 47C and in other new lateral Schottky MSM structures described in this patent specification. The dashed curve 6510 shows absorption of the 1 micron Si layer on a BOX layer with microstructure holes with absorption greater than 30% from 800 to 1100 nm at certain wavelengths. The solid curve 6512 shows the absorption of a 1 micron Si layer without microstructure holes. As can be seen, the absorption by the layer with microstructure holes can be 20-30% or more greater than that of the absorption of a 1 micron layer without microstructure holes at certain wavelengths.

Figure 66:
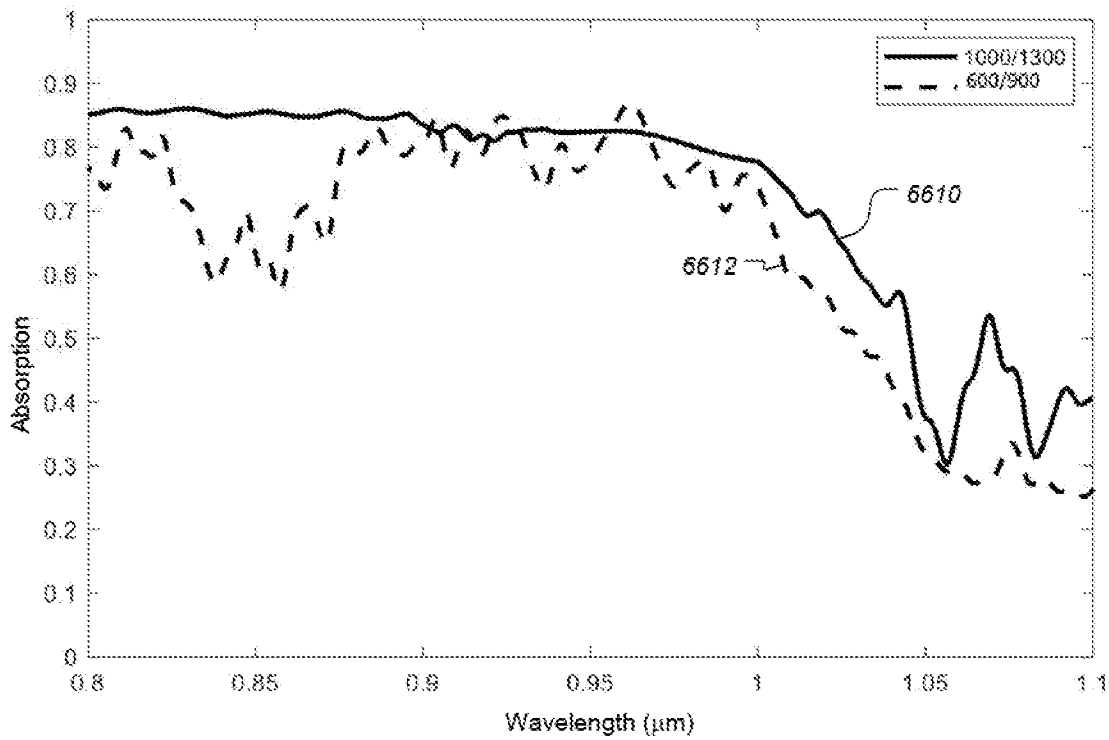
FIG. 66 shows a FDTD simulation of a 0.5 micron Si device layer on SOI structure.

FIG. 66 shows a FDTD simulation of a 0.5 micron Si device layer on SOI in structures such as illustrated in FIG. 47C and in other new lateral or vertical Schottky MSM structures described in this patent specification. The microstructure holes for the solid curve 6610 is 1000 nm diameter and 1300 nm period in a square lattice, and the dashed curve 6612 is for microstructure hole with 600 nm diameter and 900 nm period in a square lattice. As can be seen, the absorption to which the EQE is directly proportional to can be 10% or greater at 1100 nm wavelength.

Figure 67A:
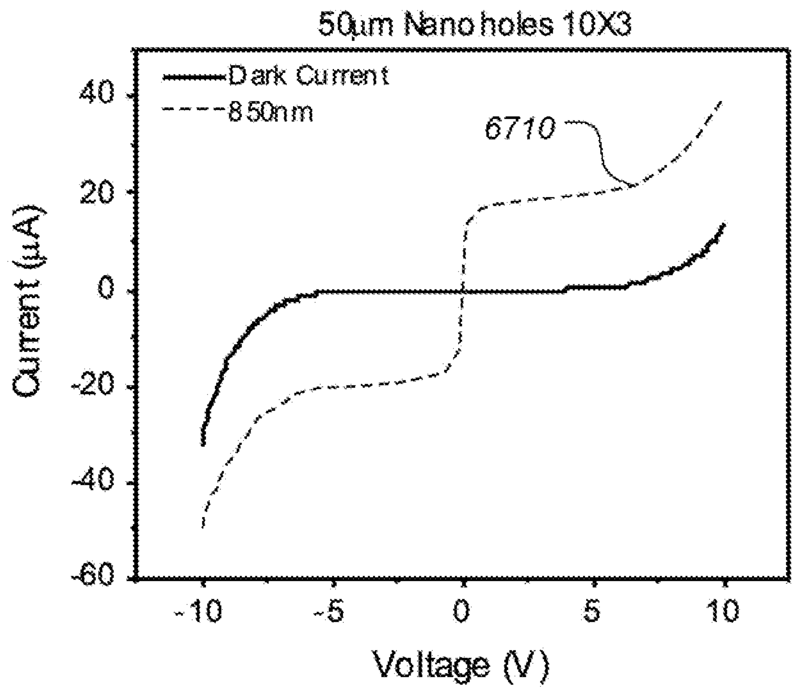
FIGS. 67A-B are linear and semi-log plots, respectively, of the IV characteristics with and without 850 nm wavelength illumination.
Figure 67B:
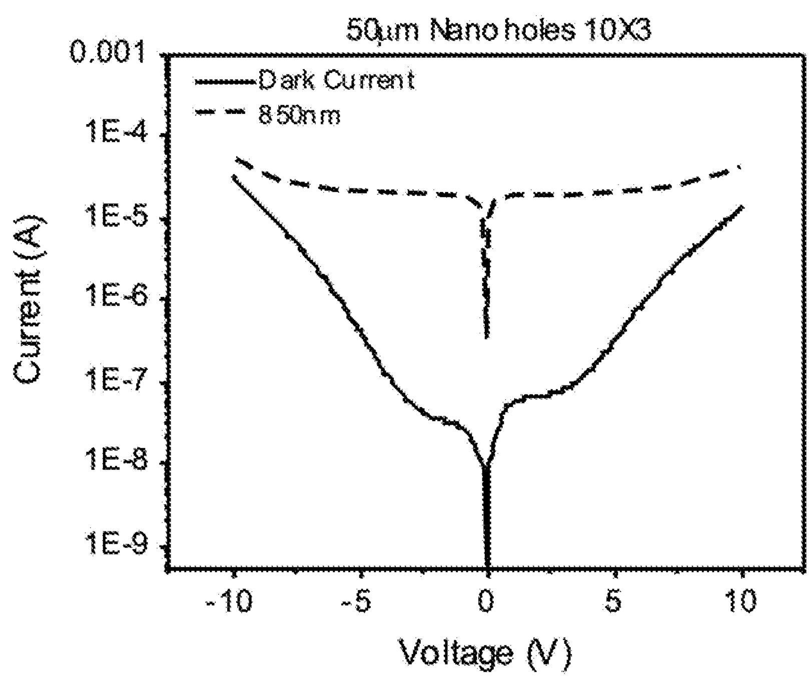

FIGS. 67A-B are linear and semi-log plots, respectively, of the IV characteristics with and without 850 nm wavelength illumination in structures such as illustrated in FIG. 47C and in other new lateral Schottky MSM structures described in this patent specification.

Illumination curve 6710 seen as in FIG. 67A is characteristic of back to back Schottky contacts of aluminum interdigitated electrodes to the Si device layer which have a resistivity ranging from 10 to 25 ohm-cm. The spacing between the interdigitated fingers is 1000 nm and the width of the interdigitated fingers is 300 nm and the lateral diameter of the photosensitive area of the interdigitated photodiode is 50 microns.

Figure 68A:
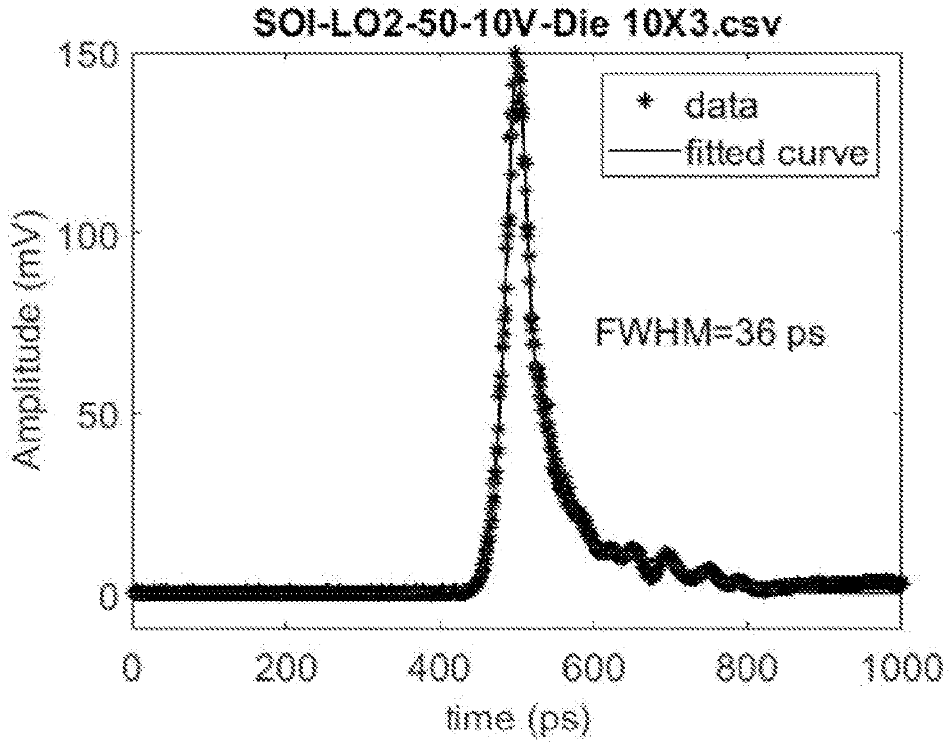
FIGS. 68A-D and 69A-D show impulse responses and eye diagrams of an interdigitated Si MSM with microstructure holes, according to some embodiments.
Figure 68B:
Figure 68C:
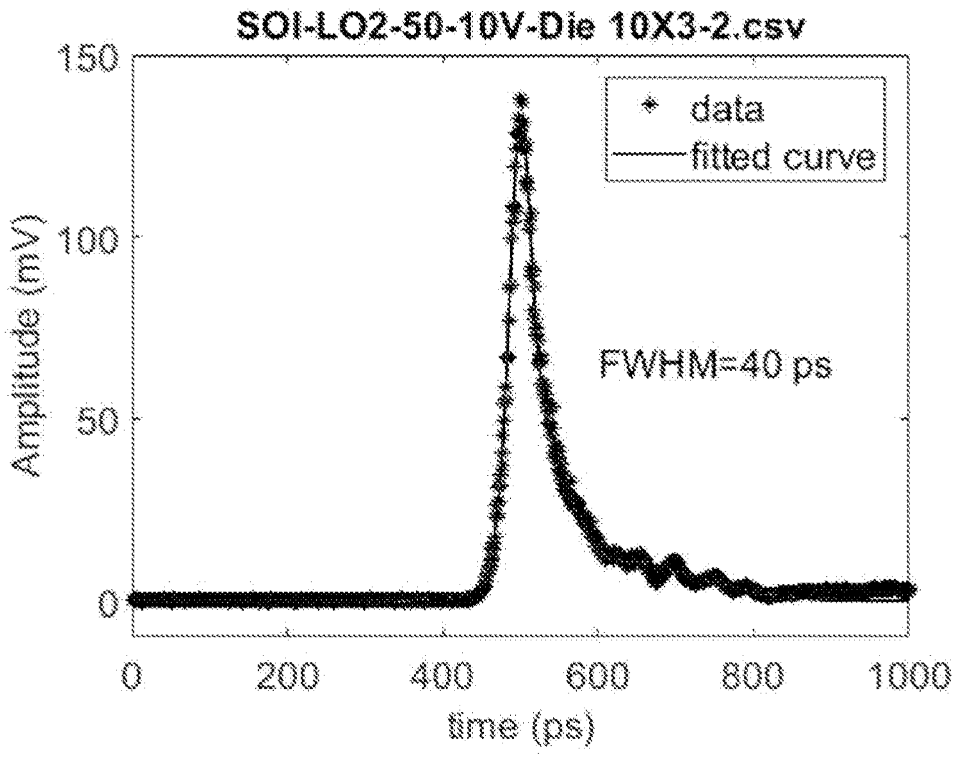
Figure 68D:
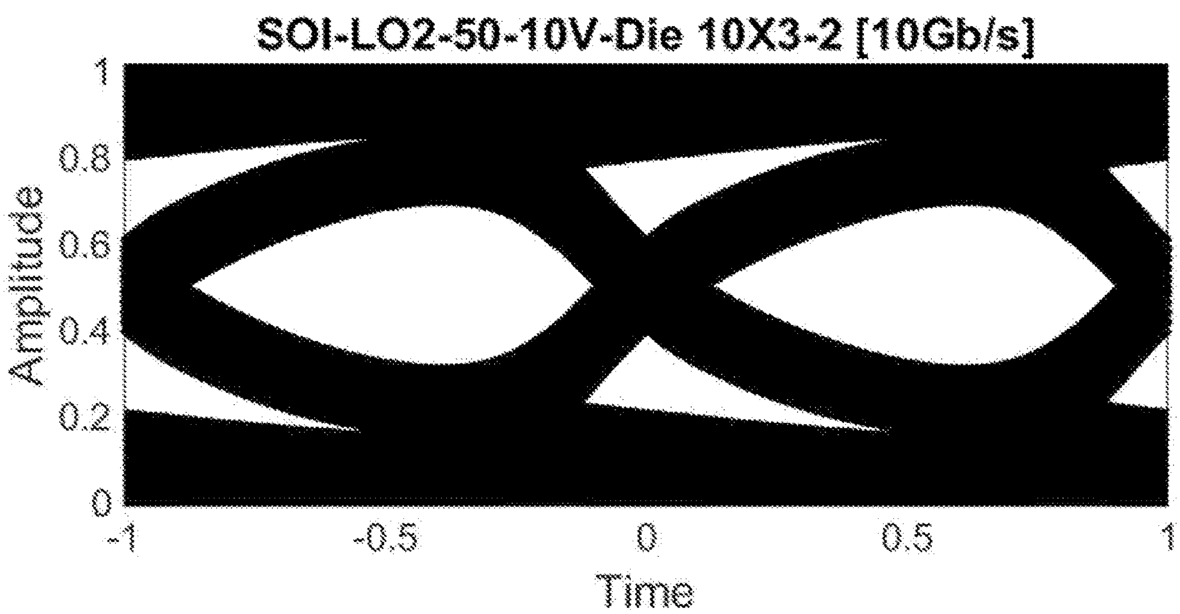
Figure 69A:
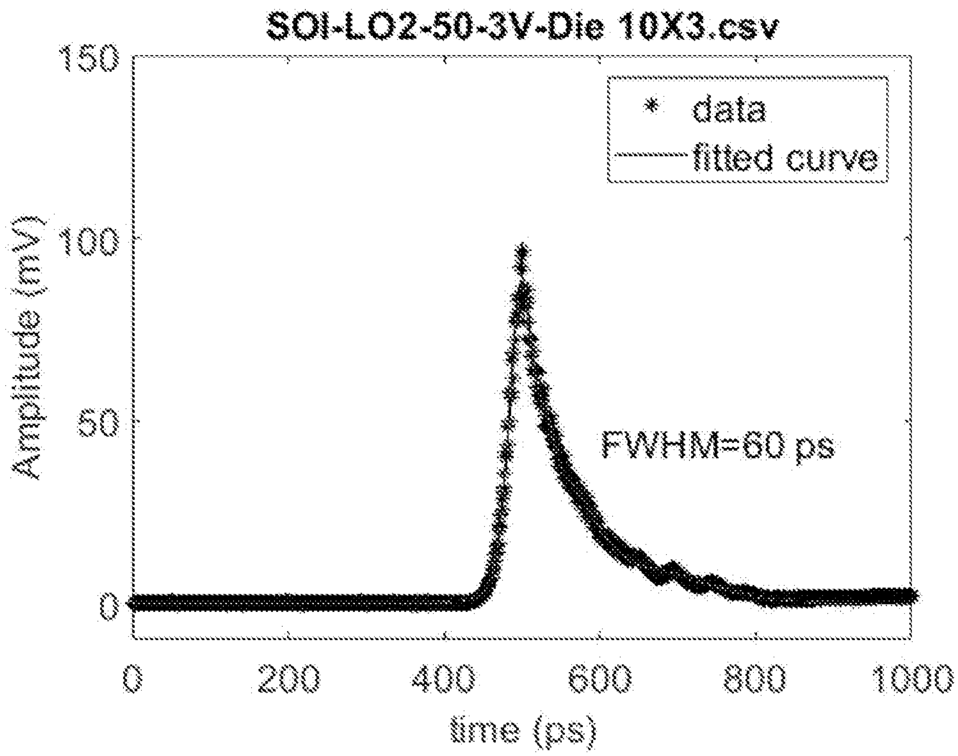
Figure 69B:
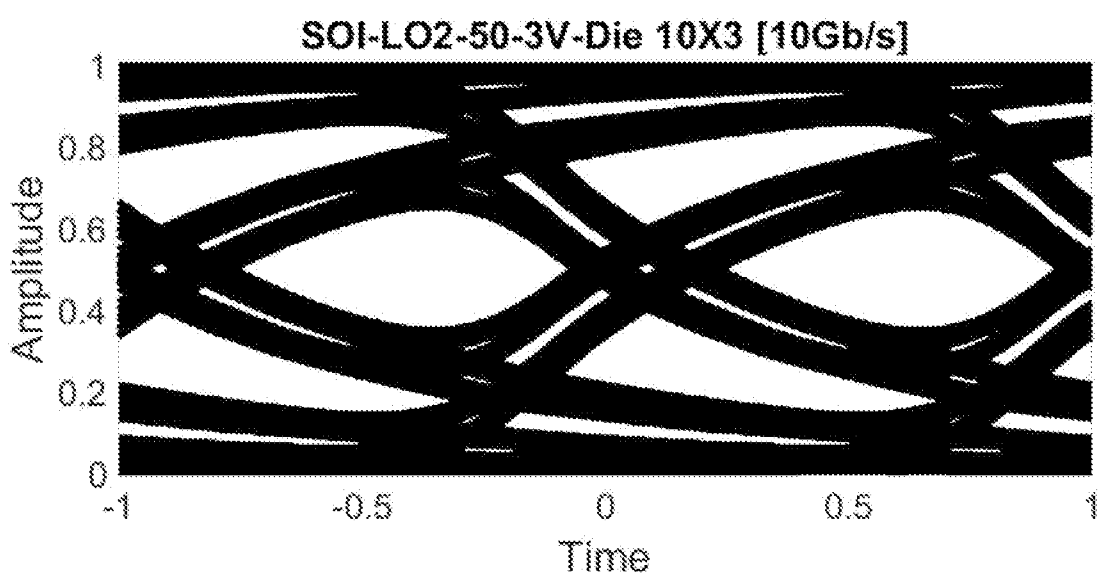
Figure 69C:
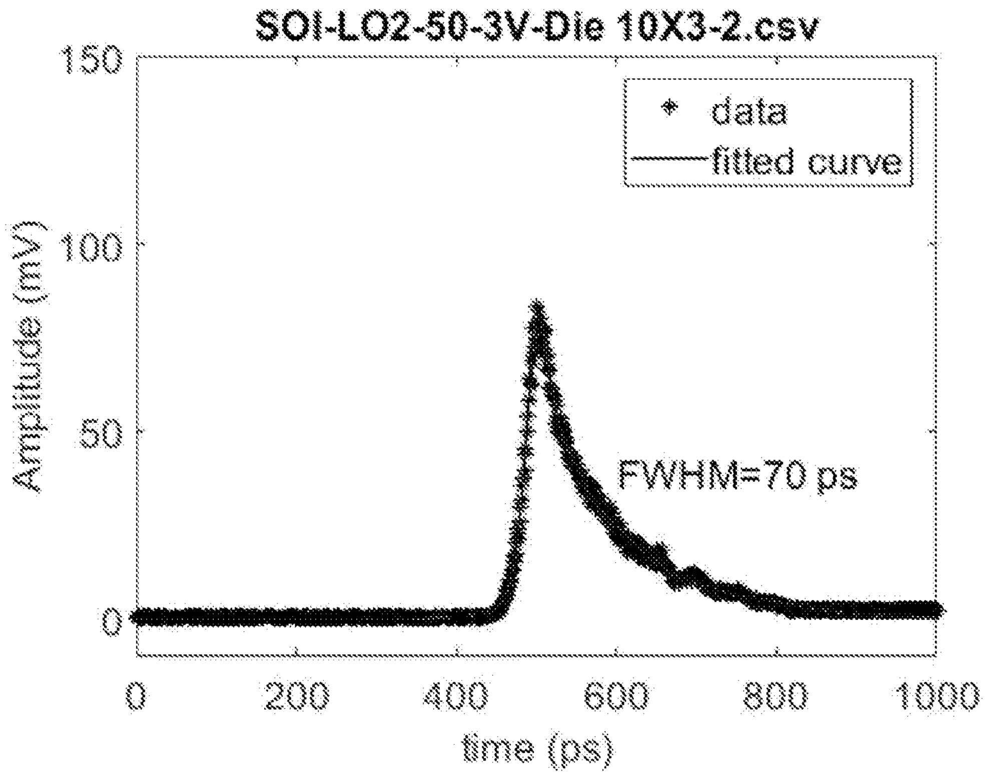
Figure 69D:
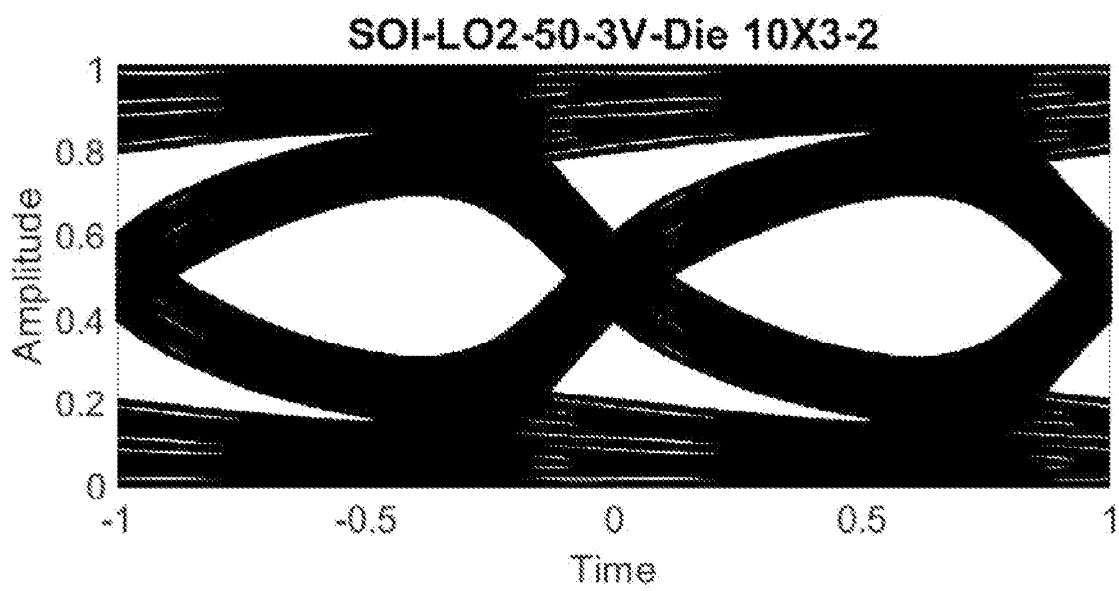

FIGS. 68A-D and 69A-D show impulse responses and eye diagrams of an interdigitated Si MSM with microstructure holes in structures such as illustrated in FIG. 47C and in other new lateral Schottky MSM structures described in this patent specification, according to some embodiments. The microstructure holes have diameter of 1000 nm and a period of 1300 nm in a square lattice with a 1 micron device layer on a SOI substrate. FIGS. 68A and 68C are two impulse responses for two different devices on the same wafer at 10 volts reverse bias. The consistency of the performance of the devices can be seen. The respective eye diagrams of FIGS. 68B and 68D at 10 Gb/s with a 10 volt reverse bias.

FIG. 69A-D are impulse responses and eye diagrams from the same devices as in FIG. 68A—but with a 3 volt reverse bias. The 10 Gb/s eye diagram shown below the impulse response where the eyes are open and can be used for 10 Gb/s data rate transmission in a DCI application.

Figure 70:
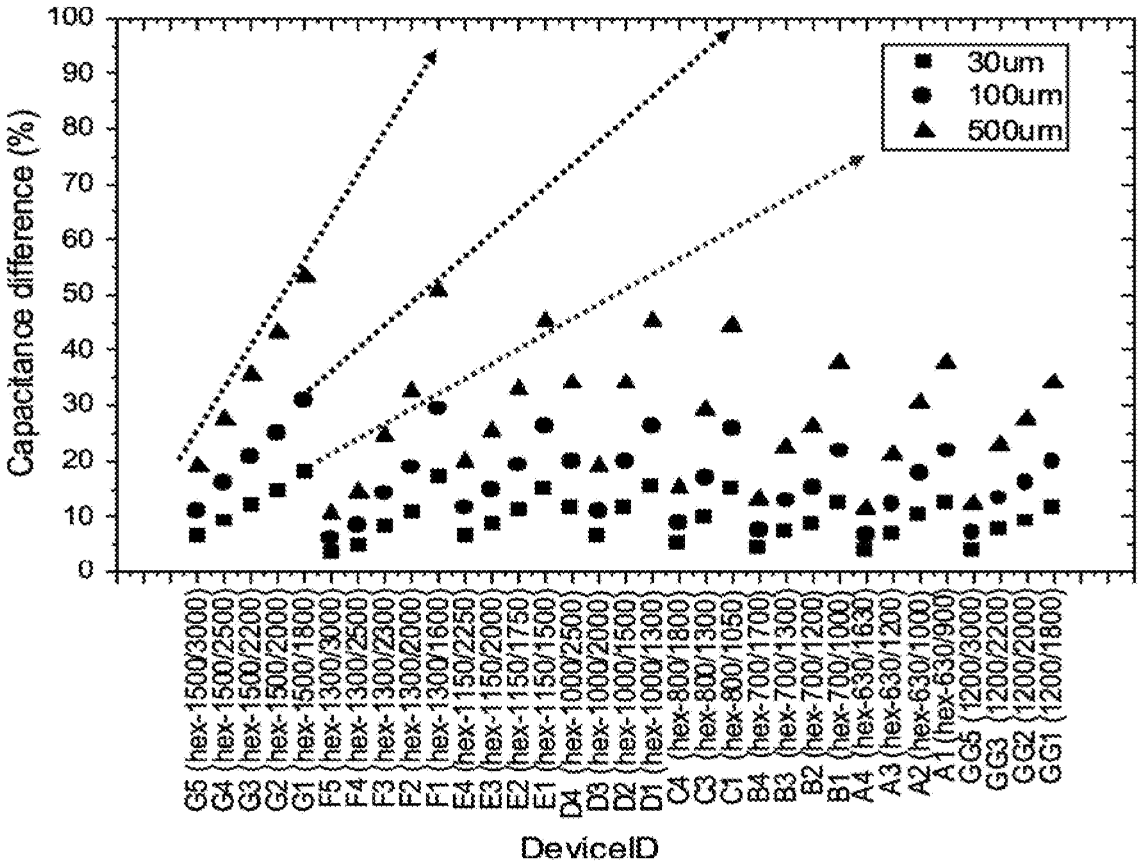
FIG. 70 shows the percentage of the capacitance change of a PIN/NIP vertical structure photodetector with and without microstructure holes.

FIG. 70 shows the percentage of the capacitance change of a PIN/NIP vertical structure photodetector with and without microstructure holes in vertical PIN structures such as illustrated in FIG. 14A. As can be seen in the experimental data the capacitance can be 50% or more less for a photodetector with microstructure holes as compared with a comparable photodetector without microstructure holes. This reduction in capacitance can result in a reduced RC time constant which can translate to higher speed or data rate bandwidth for a photodetector which can be a PD, APD, or SPAD than a comparable PD/APD/SPAD without microstructure holes.

Figure 71:
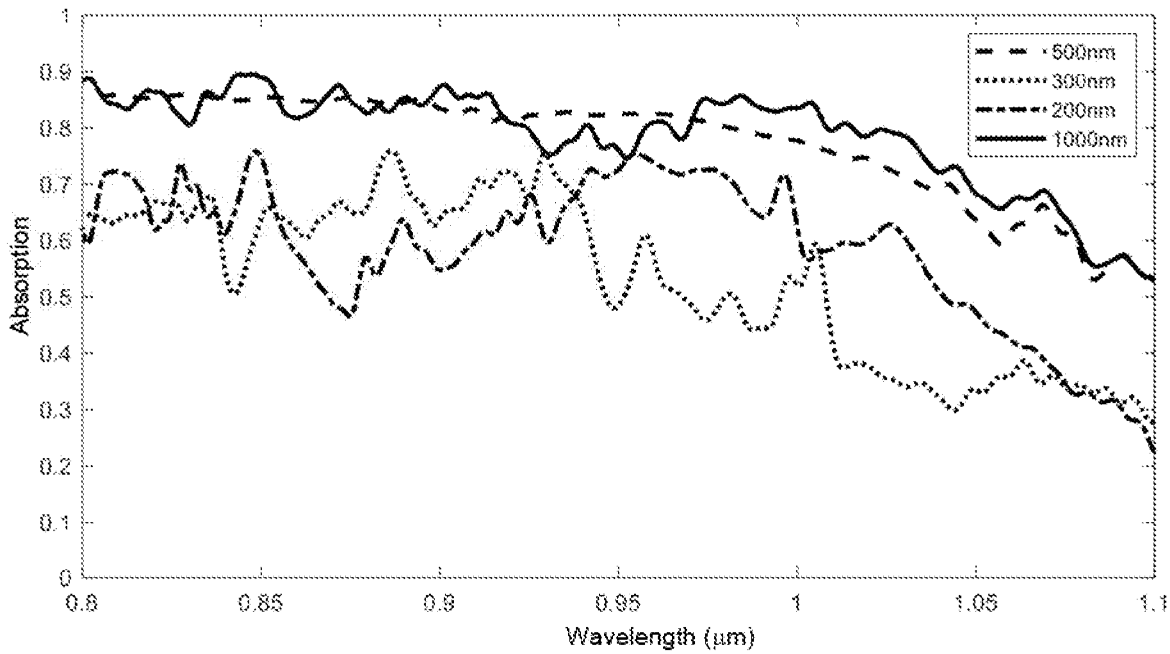
FIG. 71 shows FDTD simulated optical absorption in Si layers on SOI. The Si device layer range from 1000 nm-200 nm as shown in the plots.

FIG. 71 shows FDTD simulated optical absorption in Si layers on SOI. The Si device layer range from 1000 nm-200 nm as shown in the plots. Microstructure holes have lateral dimension of 700 nm and period of 1000 nm in a square lattice. The microstructure holes are cylindrical and are etched to the BOX layer. The vertical axis is absorption, and the horizontal axis is wavelength from 800-1100 nm. The absorption is proportional to EQE and in some cases can be approximately equal to EQE. The absorption can be 50% or greater at a wavelength of 1050 nm for thicknesses of 500 nm Si device layer, and can be 20% or greater for thicknesses of 200 to 300 nm device layer. With electrode spacing of 300 nm to 500 nm and with device layer of less than 500 nm data rates can be 30 Gb/s or higher and in some cases 25-50 Gb/s, and in some cases more than 50 Gb/s, and in some cases 100 Gb/s or greater.

Figure 72A:
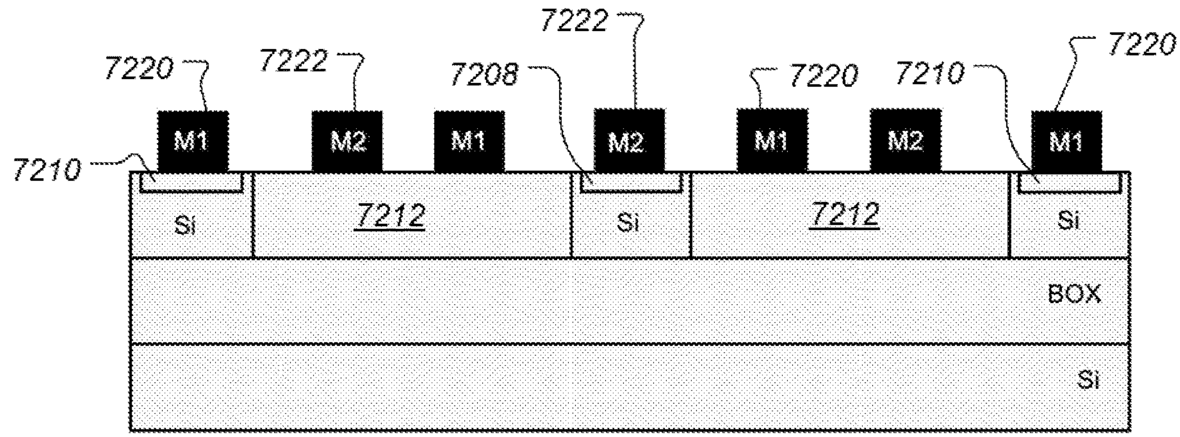
FIGS. 72A-B show simplified partial cross-sections of a Si MSM, according to some embodiments.
Figure 72B:
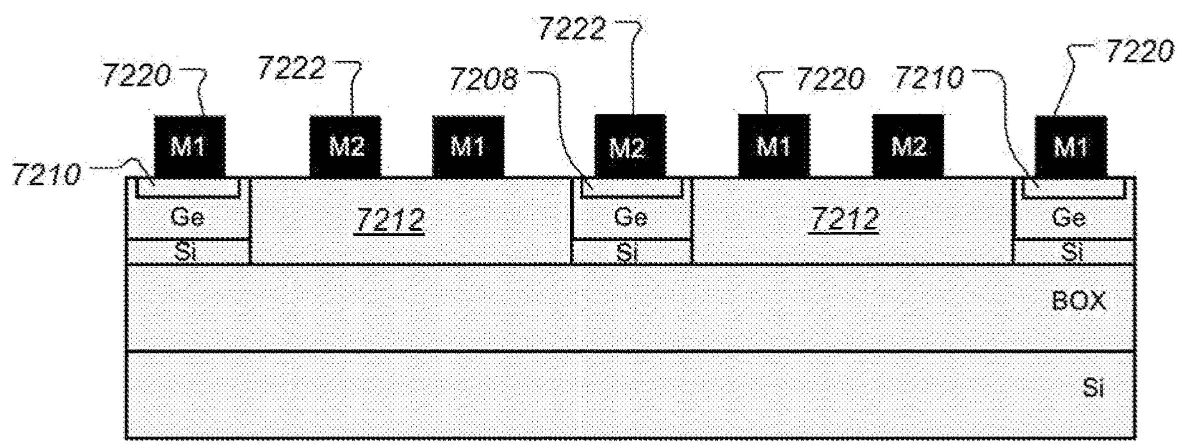

FIGS. 72A-B show simplified partial cross-sections of a Si MSM, according to some embodiments. The Si MSM can be monolithically integrated with CMOS/BiCMOS ASICs.

The device layer of the SOI can be very thin with thickness ranging from 50 to 500 nm, and in some cases 300-1000 nm. The interdigitated electrodes 7220 and 7222 can have width ranging from 20 to 160 nm, and in some cases 30-60 nm, and the spacing between the interdigitated electrodes can range from 100 to 600 nm. With such spacing and thickness the MSM can have data rates of 30 Gb/s or more, and in some cases 25-50 Gb/s, and in some cases 30-60 Gb/s, and in some cases 60-100 Gb/s or more. EQE can be 20% or greater at certain wavelengths, and in some cases 50% or greater at certain wavelengths, and in some cases 70% or greater at certain wavelengths, where the wavelength range can be from 800 to 1100 nm. The metal electrodes can form Schottky contacts to the or low dope Si, and in some cases PN junctions that can be medium or high doped wells 7210 and 7208 can be formed under the electrodes and where the electrodes form ohmic contacts to the P and N junctions. The depth of the P and N junctions can range from 10 nm to 500 nm, and in some cases more than 500 nm. Shallow PN junctions with depth ranging from 5 to 30 nm may be desirable to minimize the number of photo generated carriers in regions with low electric fields. The width of the P and N wells 7210 and 7208 can be the same or slightly wider than the width of the interdigitated electrodes. A reverse bias is applied between the P anode and N cathode. In the case of Schottky contacts the MSM can be operated both in the reverse and forward bias since the IV can be approximately symmetric.

Microstructure holes 7212 are etched partially into the Si device layer, and in some cases through the Si device layer to the BOX layer. The microstructure holes 7212 can be filled with Si dioxide and/or other dielectrics. The microstructure holes 7212 can be rectangular or oval where the narrow lateral dimension can range from 100 to 600 nm and the Y lateral dimension can range from 300 nm-1000 nm or more and in some cases from 600 nm to 1700 nm.

FIG. 72B is similar to FIG. 72A except with the addition of Ge/GeSi on Si that can be globally grown and/or selective area grown. The Ge layer can have a thickness ranging from 100 to 500 nm and the Si can have a thickness ranging from 10 to 300 nm or more. The BOX layer can be optional. The thickness of the BOX layer can range from 10 to 1000 or more on a Si handle layer or substrate. The Ge and the Si can be I or low doped. Wells of P and N can be formed in the Ge under the M1 and M2 electrodes. Wavelength can range from 800 to 2000 nm, and data rates can range from 25 to 50 Gb/s, and in some cases 40-60 Gb/s, and in some cases 60-100 Gb/s or more. A reverse bias is applied between the P anode, and the N cathode with voltages ranging from −1 volt to −3.3 volts, and in some cases for APD/SPAD the reverse bias voltage can range from −3.3 volts to −35 volts or more. The EQE can be 20% or more at certain wavelengths, and in some cases can be 50% or more at certain wavelengths, and in some cases can be 70% or more at certain wavelengths. Optical signal can impinge from the top and/or from the bottom surface.

Not shown in FIGS. 72A-B are CMOS/BiCMOS ASICs that can be monolithically integrated.

Applications for these lateral PIN interdigitated photodetectors described above can include data center interconnect, time-of-flight LiDAR, LiDAR imaging, and/or 3D imaging to name a few. Such detectors can be fabricated in arrays to increase the aggregated data rate bandwidth for data center applications and in some cases high density arrays for example 10,000-1,000,000 pixels for high resolution LiDAR imaging and/or 3D imaging.

The lateral dimension of the microstructure hole can be divided by the optical refractive index of the material that fills the microstructure hole in some cases.

Figure 73:
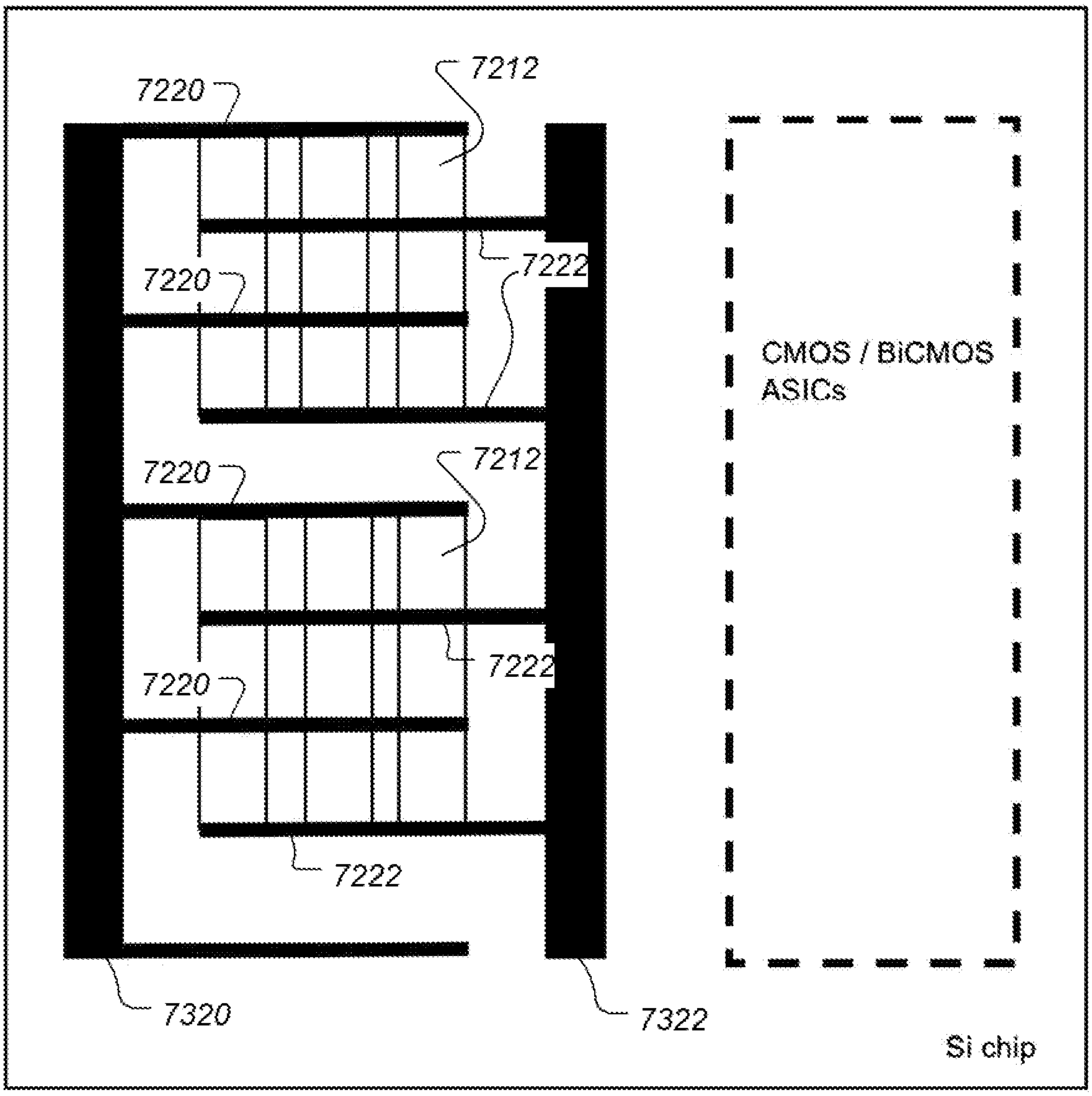
FIG. 73 shows a simplified partial schematic of a top view of the device depicted in FIGS. 72A-B.

FIG. 73 shows a simplified partial schematic of a top view of the device depicted in FIGS. 72A-B. The microstructure holes 7212 can have different lateral dimensions such as long and narrow. Such holes 7212 can be polarization sensitive and can be used for polarization optical multiplexing where selective polarization of light can increase the data bandwidth of an optical system in the case where polarization sensitivity of photodetectors is not desirable. The elongated microstructure holes can be formed in orthogonal orientations with corresponding interdigitated electrodes as discussed above.

With the interdigitated electrodes 7220 and 7222 crossing the microstructure holes as shown in FIG. 73 photo generated carriers in the Si or Ge/GeSi have a clear path to the electrodes and are not impeded by the microstructure holes which can result in a faster MSM photodetector. In such arrangements the spacing of the electrodes are not limited by the size of the microstructure holes.

Figure 74A:
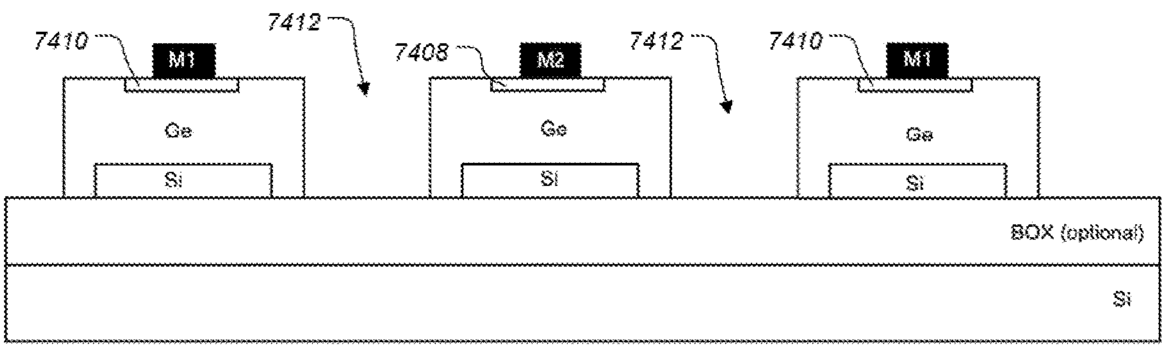
FIG. 74A-B shows cross-section schematics of Ge and/or GeSi selective area grown on regions where there is Si, according to some embodiments.
Figure 74B:
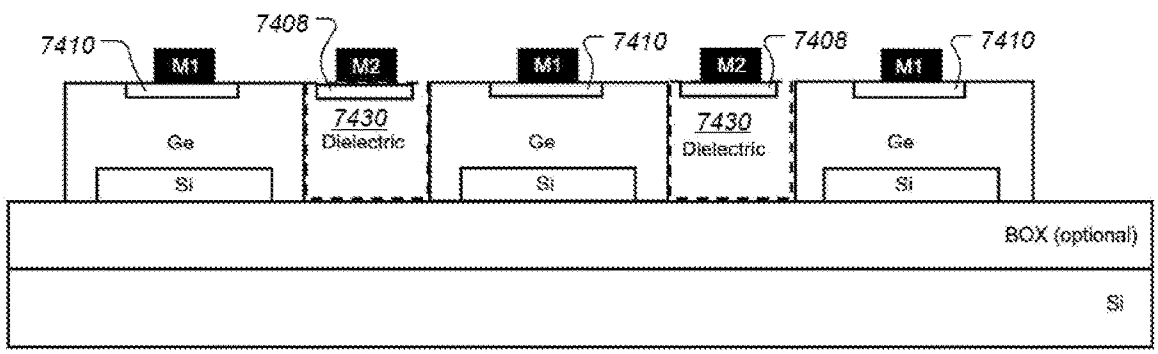

FIG. 74A-B shows cross-section schematics of Ge and/or GeSi selective area grown on regions where there is Si. In FIG. 74A, starting with a SOI wafer a front end of line process (FEOL) where Ge and/or GeSi photodetector can be fabricated prior to the CMOS/BiCMOS electronics or ASICs. A pattern of microstructure holes 7412 can be etched in the device layer to the BOX layer and where the BOX layer can be optional in some cases. In the case where the BOX layer is optional, a dielectric layer can be deposited on the Si surface where the holes are etched such as at the bottom of the holes. Ge and/or GeSi can then be grown on the Si surface to form a pattern of Ge/GeSi layer with microstructure holes. In this case the holes formed in Ge and/or GeSi are by selective area growth and not by etching such as dry etching or wet etching. The advantage of forming the microstructure holes by epitaxial growth is that the surface of the holes are not damaged by etching and can lead to reduced dark current, and/or recombination of photogenerated carriers. P wells 7410 and N wells 7408 can be formed in the Ge and/or GeSi as shown, and ohmic electrodes can be formed on the surface of the P and N wells. A reverse bais can be applied to the anode (P), and cathode (N) with reverse bias voltage ranging from −1 to −10 volts and in some cases greater than −10 volts. The electrodes can form the interdigit fingers M1 and M2 of an interdigitated lateral photodiode.

FIG. 74B is similar to FIG. 74A except that the holes are filled with a dielectric 7430, and the surface can be planarized using chemical mechanical polishing (CMP). Electrodes can be formed over the dielectric for example. An example of electrodes crossing the dielectric is shown in FIG. 73 where the electrode for example M2 crosses both the dialectic and the Ge and/or GeSi as shown in FIGS. 72A-B which can be a top view of FIG. 74B.

The lateral dimension of the microstructure holes can be divided by the optical refractive index of the material that fills the microstructure hole in some cases.

Figure 75A:
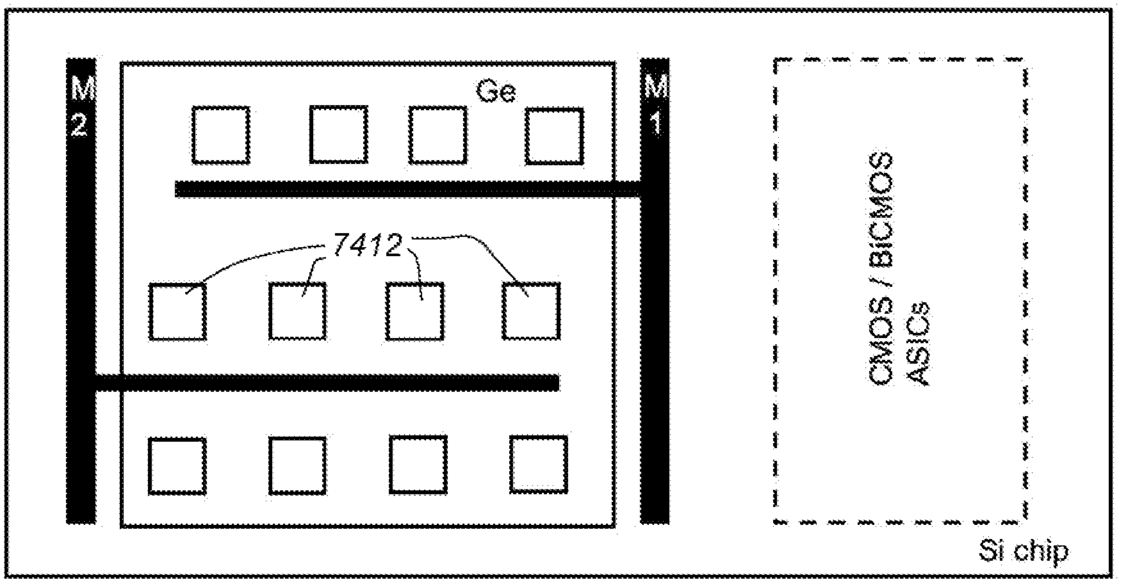
FIG. 75A shows a top view of the device shown in FIG. 74A.

FIG. 75A shows a top view of the device shown in FIG. 74A. Not shown in FIG. 75A is the transmission line connecting transmission line M1 and transmission line M2 to the CMOS/BiCMOS ASICs. In addition, a single photodetector is shown and multiple photodetectors such as photodetector array 1×4, 2×4 or higher order arrays can be integrated on a single chip and connected to corresponding CMOS/BiCMOS ASICs electronics for further signal processing.

Figure 75B:
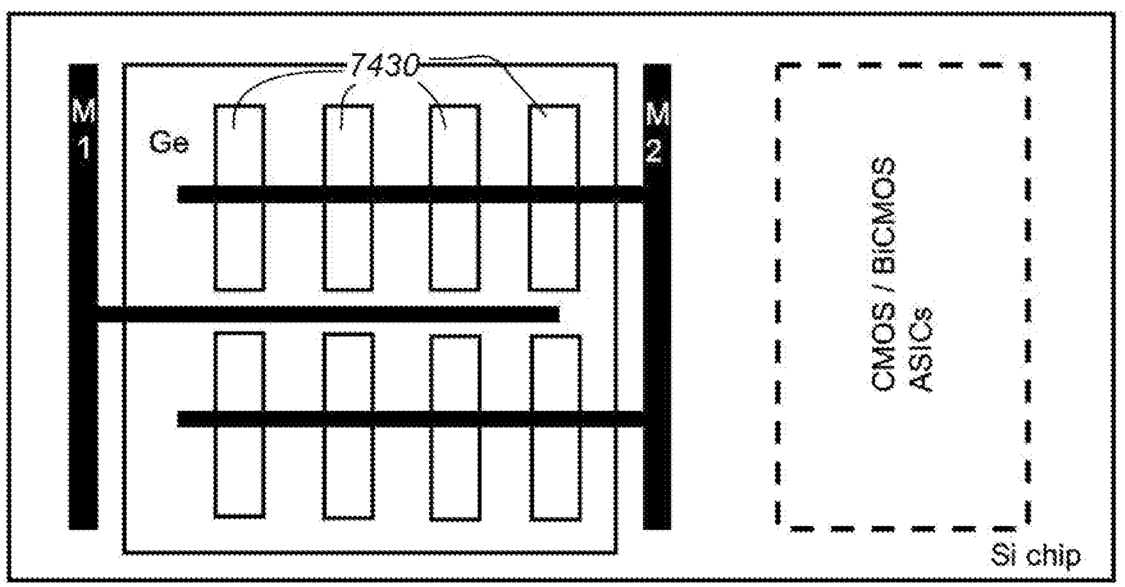
FIG. 75B shows a simplified top view of the device shown in FIG. 74B.

FIG. 75B shows a simplified top view of FIG. 74B, and not included are the transmission lines connecting the photodiode to the CMOS/BiCMOS ASICs, and in this case multiple detectors and be formed on a single chip and connected to the corresponding electronics for further signal processing.

Monolithic integrated photodetectors to corresponding CMOS/BiCMOS ASICs have significant reduction in parasitic capacitance and inductance that can significantly improve performance and yield. In prior art cases where the photodetector or photodetector arrays are wire bonded to corresponding CMOS/BiCMOS ASIC chips, and/or other electronic chips the parasitic inductance of the wire-bond can significantly degrade the yield such that active optical and electric testing may be required for each unit prior to shipping which can greatly increase the cost of a receiver optical sub assembly (ROSA). In the case of monolithic integrated photodetector/photodetector arrays with CMOS/BiCMOS ASICs with significant reduction in parasitic capacitance, resistance, and inductance as described in this patent specification the performance is significantly better in terms of bandwidth and sensitivity than in a wire bonded prior art device. In addition the monolithic integrated photodetector array and CMOS/BiCMOS ASICs described in this patent specification benefit from manufacturing uniformity and significantly higher yield such that only spot testing is required, and can therefore significantly reduce the cost of a ROSA.

Figure 76:
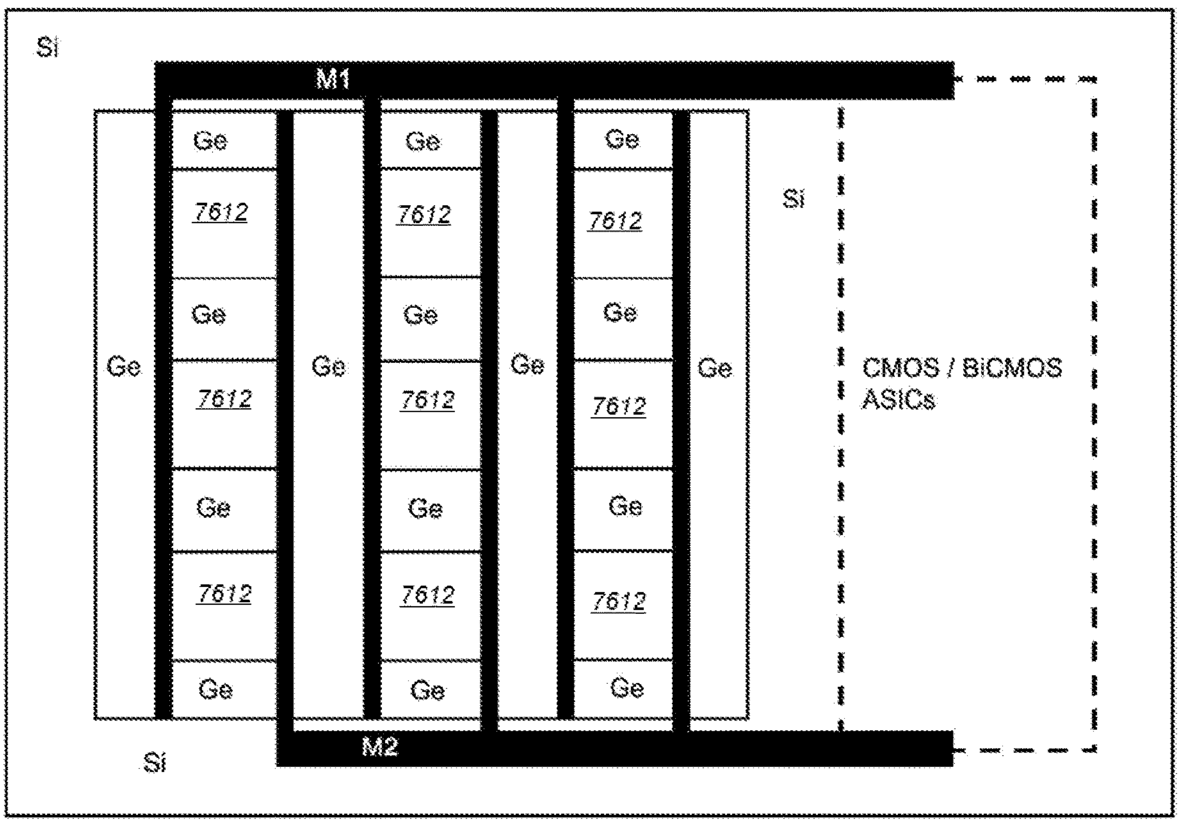
FIG. 76 shows a simplified top view of a device such as shown in FIG. 74A.

FIG. 76 shows a simplified top view of a device such as shown in FIG. 74A where two interdigitated electrodes are formed on the Ge and/or GeSi surface in close proximity to the holes 7612. In this configuration photocarriers generated in the Ge and/or GeSi can be quickly swept to the M1 and M2 electrodes formed as shown, and the photo-generated carriers do not have to go "around" a hole. This arrangement of electrodes can be on any interdigitated photodetector formed on Si and/or Ge and/or GeSi surfaces with microstructure holes that can be filled fully or partially with a dielectric according to embodiments described in this patent specification.

Figure 77A:
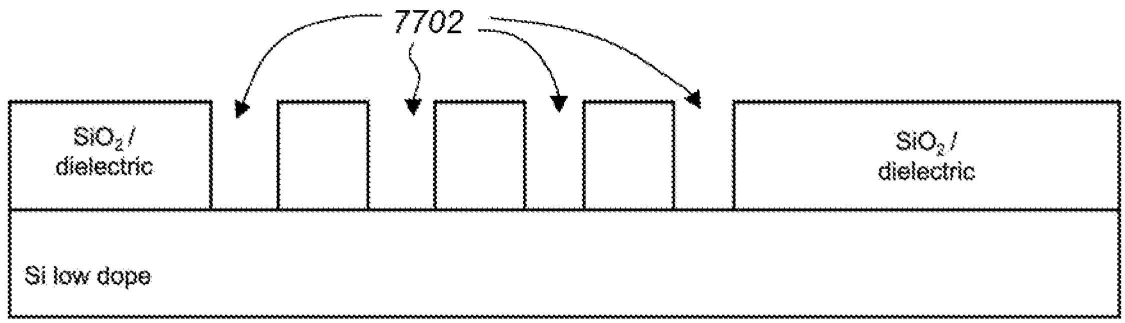
FIGS. 77A-B show a simplified partial cross-section and top view respectively of Si dioxide/dielectric deposited on a Si surface and where holes configured as slots form a pattern such as a cross-hatch, according to some embodiments.
Figure 77B:
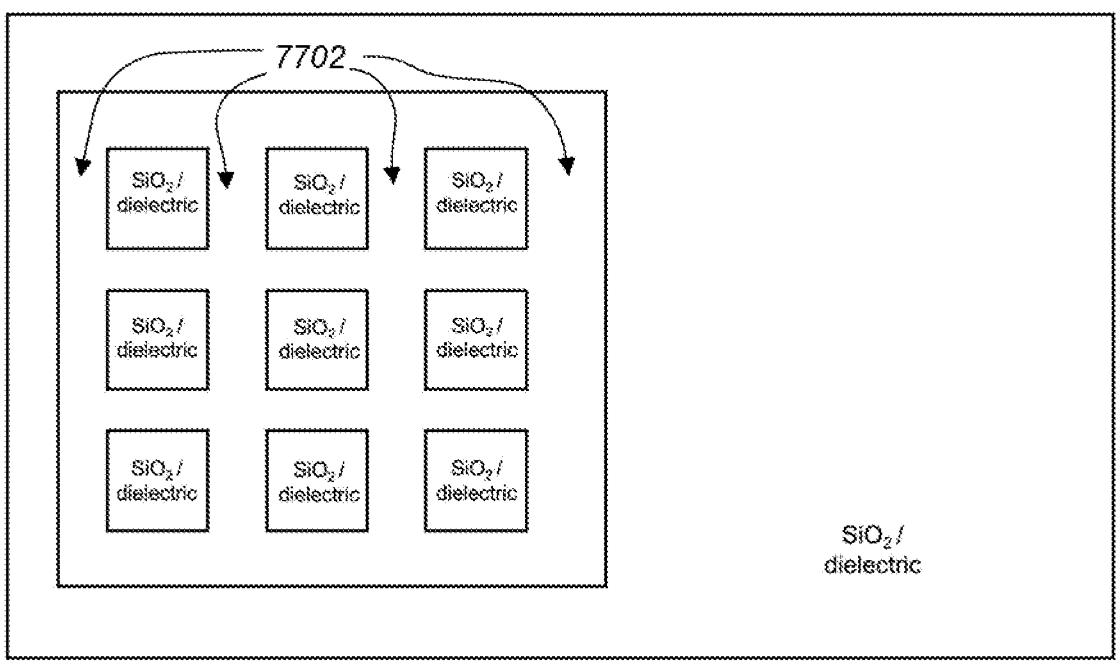

FIGS. 77A-B shows a simplified partial cross-section and top view respectively of Si dioxide/dielectric deposited on a Si surface and where holes configured as slots 7702 form a pattern such as a cross-hatch. The slots can be formed by etching to form Si dioxide/dielectric islands.

FIG. 77B shows an example where the Si dioxide/dielectric covers over areas with growth of Ge and/or GeSi are not desired. The exposed surface of Si as shown are areas where Ge/GeSi can be grown with or without a low temperature buffer of Ge and/or GeSi.

Figure 78A:
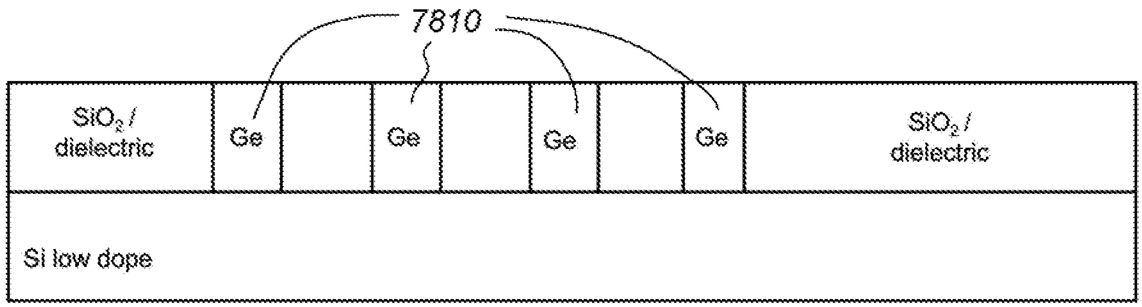
FIGS. 78A-B, 79A-B and 80 show simplified partial cross-sections and top views of selective area epitaxial growth of Ge and/or GeSi on Si and where the surface can be planarized using CNP for example, according to some embodiments.

FIG. 78A shows a simplified partial cross-section schematic of selective area epitaxial growth of Ge and/or GeSi on Si and where the surface can be planarized using CNP for example. The thickness of the Ge and/or GeSi 7810 can range from 100 to 400 nm and in some cases 200-600 nm, and in some cases 50-450 nm. The Ge and/or GeSi 7810 can be I or low doped N or P.

Figure 78B:
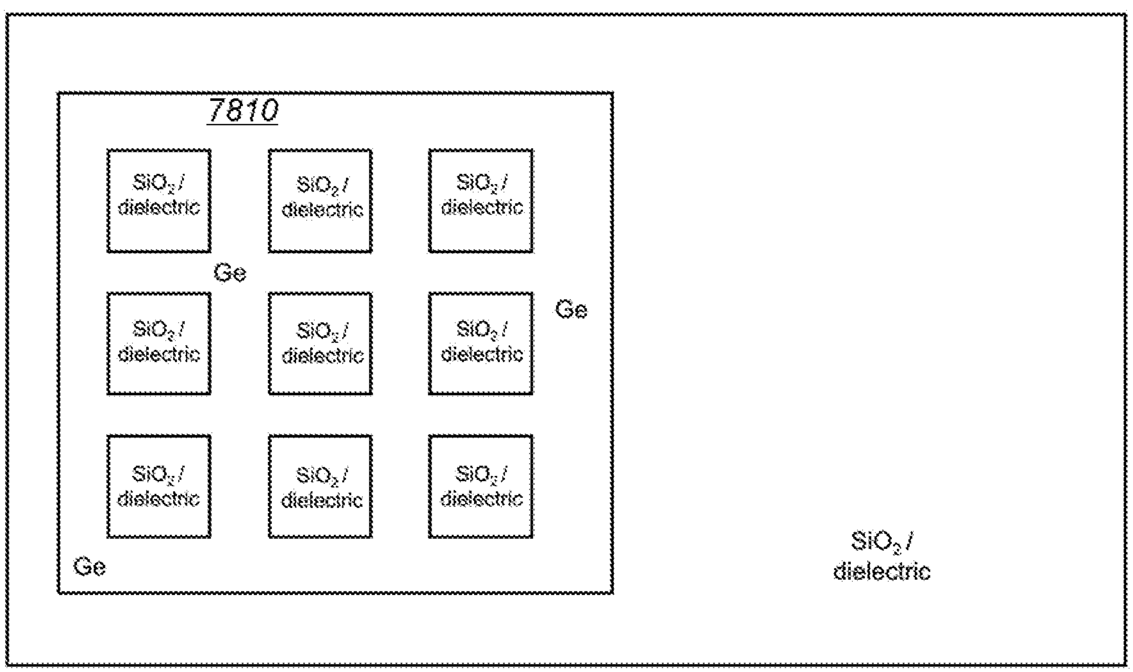

FIG. 78B shows a simple partial top view schematic of FIG. 78A showing areas where Ge and/or GeSi are selective area epitaxially grown in a cross-hatch pattern.

The lateral dimension of the microstructure hole can be divided by the optical refractive index of the material that fills the microstructure hole in some cases.

Figure 79A:
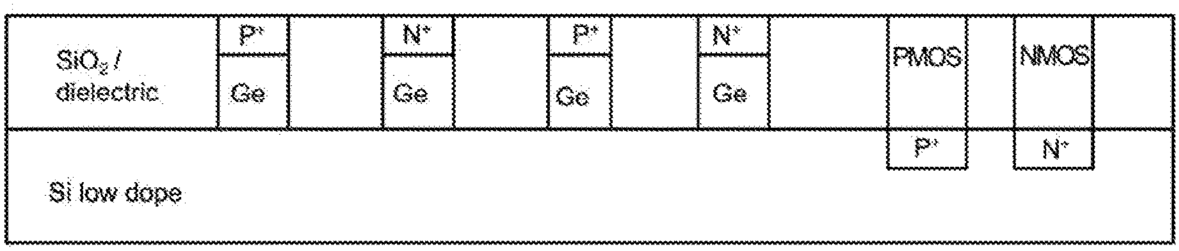

FIG. 79A shows a simplified partial schematic of the cross-section of FIG. 78B where $P^+$ and $N^+$ wells are formed on the Ge/GeSi and can be at the same time $P^+$ and $N^+$ wells formed for the PMOS and NMOS for example.

Figure 79B:
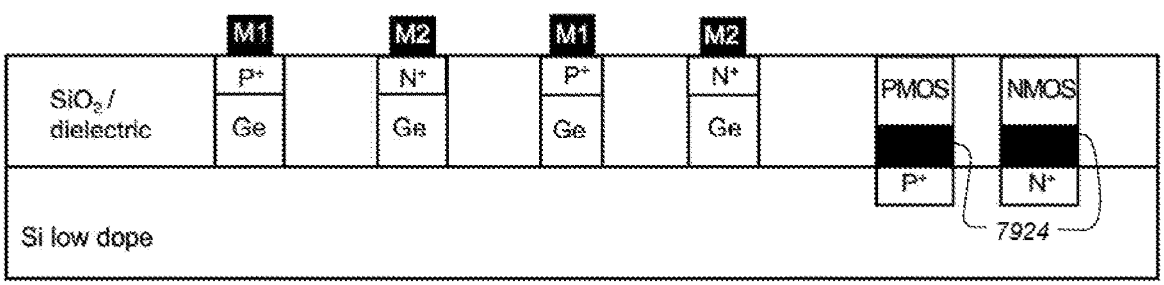

FIG. 79B shows a simplified partial cross-section schematic where ohmic electrodes are formed on the P and N wells and can be the M1 and M2 electrodes forming the interdigitated Ge and/or GeSi photodiode. Connecting electrodes 7924 are also shown formed between the PMOS and NMOS and the $P^+$ and $N^+$ wells below them.

Figure 80:
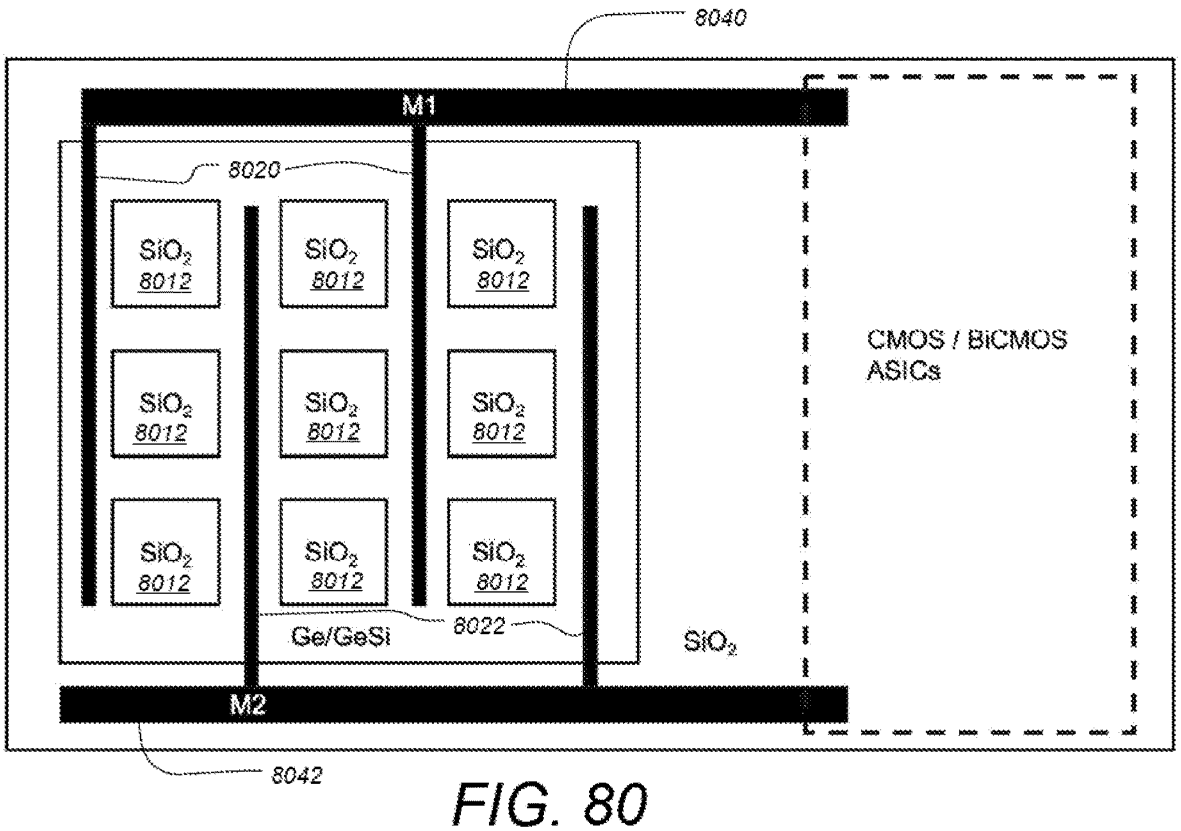

FIG. 80 shows a simplified partial schematic top view of FIG. 79B. The interdigitated electrodes 8020 and 8022 are connected to transmission lines that are connected to CMOS/BiCMOS ASICs electronics for further signal processing. Optical signal impinges on the top surface and in some cases can impinge from the bottom surface. The microstructure holes 8012 in Ge and/or GeSi layer formed by Si dioxide and/or dielectric islands can have a diameter or lateral dimension ranging from 400 nm to 1500 nm and in some cases from 400 nm-1200 nm. The shape of the microstructure holes 8012 can be square, rectangular, oval and circular. And in addition, the microstructure holes can be periodic and/or aperiodic. The spacing between the microstructure holes can range from 100 nm to 500 nm and in some cases 300 nm-1000 nm. The photodetector can be singular and/or multiple such as in a array and are connected to CMOS/BiCMOS electronics. The lateral dimension of the photodetector can range from 1 micron to 1000 microns or more. For optical data communication the lateral dimension of the photodetector can range from 5 microns-50 microns and in some cases from 50 microns-1000 microns or more. For LiDAR applications the lateral dimension can range from 10 microns-1000 microns, and in some cases more than 1000 microns. For imaging applications the lateral dimension can range from 1 micron to 100 microns, and in some cases greater than 100 microns. The wavelength can range from 800 nm to 1650 nm and in some cases 800 nm-1350 nm, and in some cases 1000 nm-1400 nm, and in some cases 1100 nm-1550 nm. Photodetectors with microstructure holes can have higher external quantum efficiency than an equivalent photodetector without microstructure holes at certain wavelengths. Data rate can range from 1 Gb/s to 100 Gb/s or more for data center interconnect applications. And for time-of-flight applications the 10-90% rise time can range from 1 picosecond to 100 picoseconds. For imaging the EQE of an imaging sensor with microstructure holes can be higher than the EQE of a similar imaging sensor without microstructure holes at certain wavelengths. A reverse bias is applied between the anode and cathode.

Figure 81A:
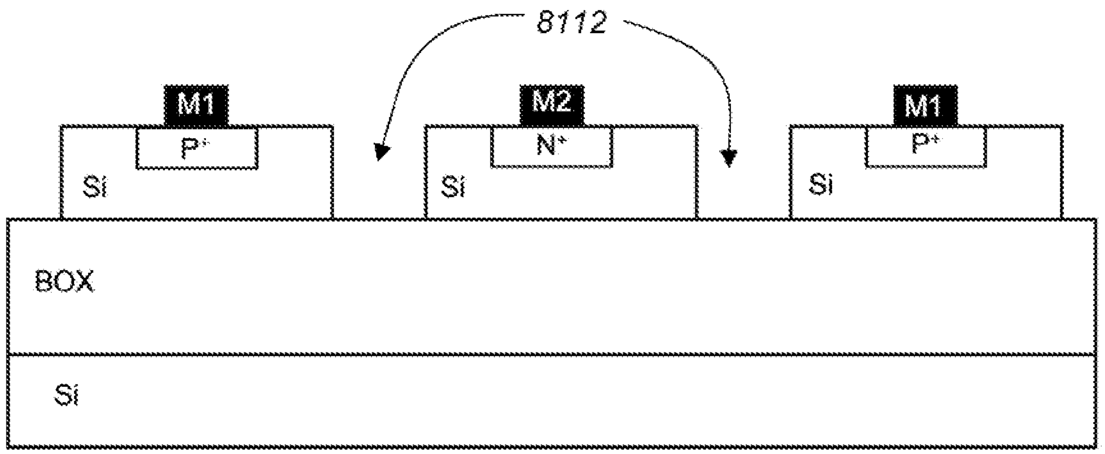
FIGS. 81A-D show simplified partial schematic cross-sections of an interdigitated Si photodiode on SOI wafer, according to some embodiments.

FIGS. 81A-D show simplified partial schematic cross-sections of an interdigitated Si photodiode on SOI wafer. In FIG. 81A, the microstructure holes 8112 are etched to the BOX layer, and in some cases into the BOX layer. P and N wells can be formed at the same time as the P and N wells for the PMOS and NMOS transistors. Ohmic electrodes can be formed on the $P^+$ and $N^+$ wells and can be the interdigitated fingers of a lateral Si photodiode with microstructure holes. In some cases, the microstructure holes can be filled with a dielectric and the surface can be planarized using CMP for example. The devices layer can have resistivity ranging from 10 to 1000 ohm-cm or more, and the thickness of the Si device layer can range from 40 nm to 2000 nm, and in some cases 100 nm-2000 nm. The microstructure holes lateral dimension can range from 400 nm-1200 nm, and the spacing between the microstructure holes can range from 100 nm to 600 nm, and in some cases more than 600 nm. The microstructure holes can be arranged in a periodic array and/or can be arranged periodically, and in some cases can be random.

Figure 81B:
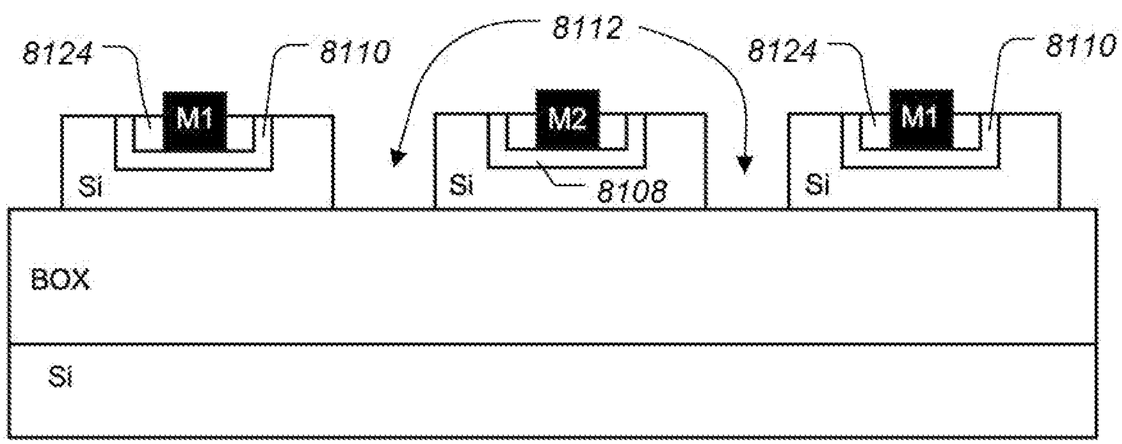

FIG. 81B is similar to FIG. 81A except a trench 8124 is etched in the Si to a depth ranging from 100 to 1000 nm and where N wells 8108 and P wells 8110 can be formed into the side walls and bottom of the trench 8124 as shown. An ohmic contact electrode can be formed in the trench which can be the M1 and M2 interdigits of a lateral PIN photodiode with microstructure holes.

Figure 81C:
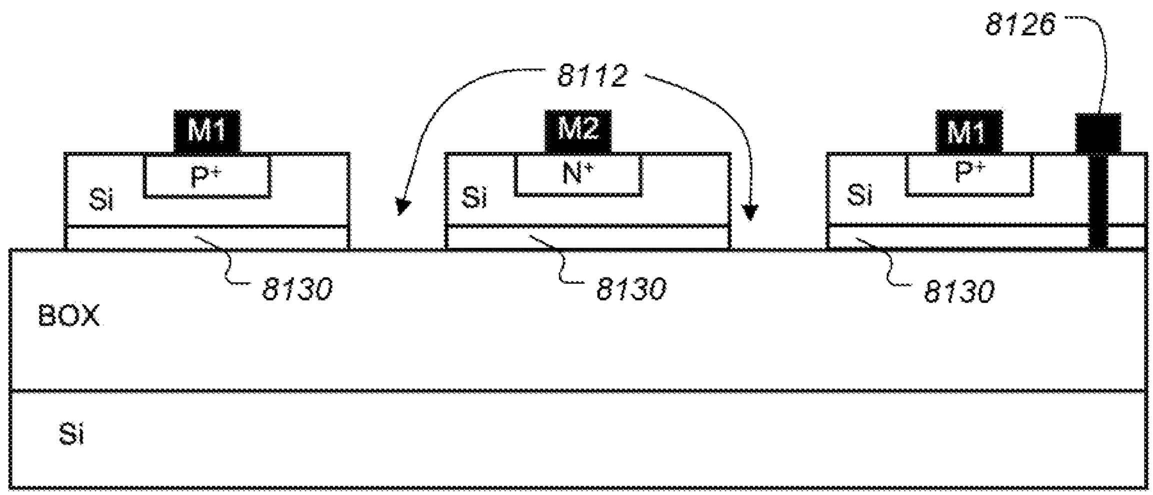
Figure 81D:
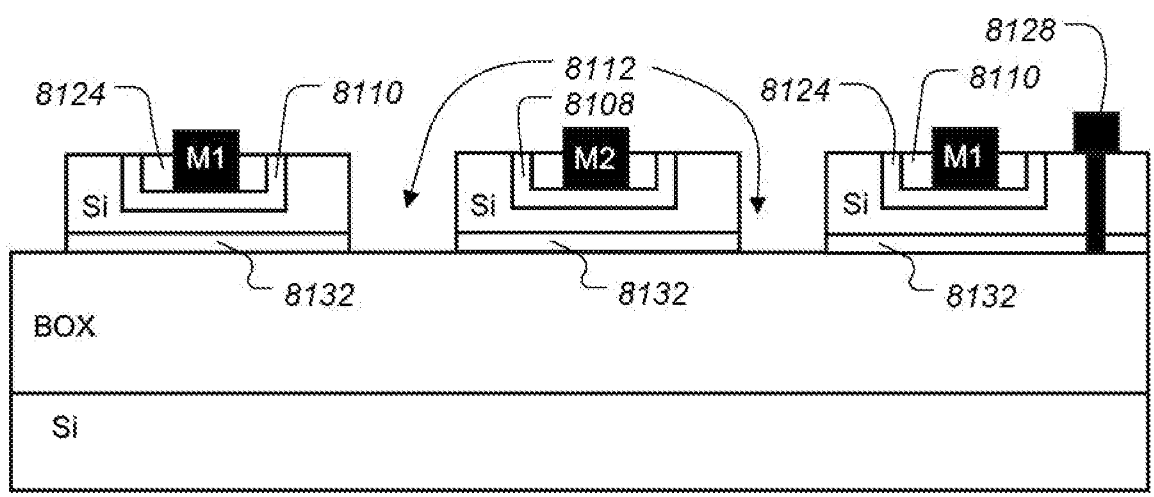

FIGS. 81C and 81D are similar to FIGS. 81A and 81B respectively. In the case of FIG. 81C a deep $P^+$ region 8130 is formed close to the Si BOX interface. The $P^+$ region 8130 extends over the entire region of the photo sensitive area and can be formed by deep ion implantation of boron ions for example. An anode electrode 8126 is formed from the surface to the deep $P^+$ region. A reverse bias is applied between the anode which includes the anode M1 and the cathode M2. The electric field between the deep $P^+$ anode 8126 and the shallow cathode can assist in sweeping out the photo-generated carriers to the anode and cathode under a reverse bias.

FIG. 81D is similar to FIG. 81B with the exception of a deep $N^+$ region 8132 extending over the entire bottom surface of photo-sensitive region which can be formed by ion implantation of phosphorous, and/or nitrogen ions for example. A deep electrode contact 8128 is made to the $N^+$ region forming the cathode. A reverse bias is applied between the M1 anode, and the M2 cathode, and the deep cathode. P and N can be interchanged.

Figure 82A:
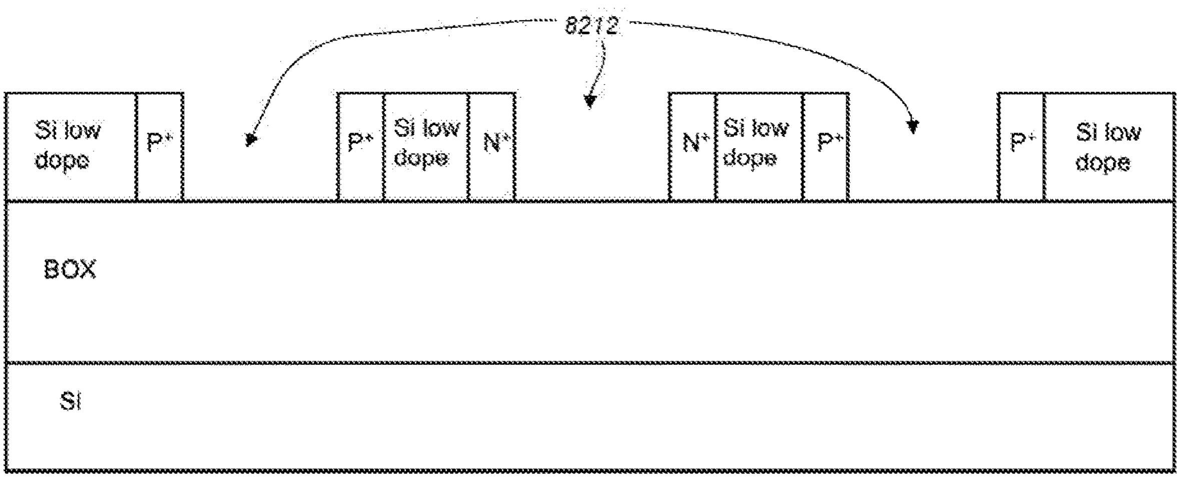
FIGS. 82A-C show simple partial cross-sections and top views of Si lateral PIN photodetectors with microstructure holes formed, according to some embodiments.

FIG. 82A shows a simple partial cross-section of a Si lateral PIN photodetector with microstructure holes formed on an SOI wafer. The microstructure holes 8212 are etched into the device layer partially or fully. As shown the microstructure holes are etched to the BOX layer. The Si device layer can have a thickness ranging from 120 nm to 2000 nm and in some cases from 1000 nm to 2000 nm, and in some cases 200 nm-1000 nm. The Si device layer can be I or low dope P or N and have resistivity ranging from 10 to 1000 ohm-cm or more. P and N wells are formed into the side walls of the microstructure holes and in some cases where partially etched holes in the device layer the P and N wells can be formed in the side walls of the holes and at the bottom of the holes. The microstructure holes 8212 can be circular, oval, rectangular, square, polygonal for example. The lateral dimension of the microstructure hole can range from 400 nm to 1200 nm, and in some cases 600 nm-1000 nm, and in some cases greater than 1200 nm. The spacing of the holes can range from 100 nm to 500 nm, and in some cases from 300 nm-1000 nm, and in some cases 600 nm-1500 nm, and in some cases greater than 1500 nm.

Figure 82B:
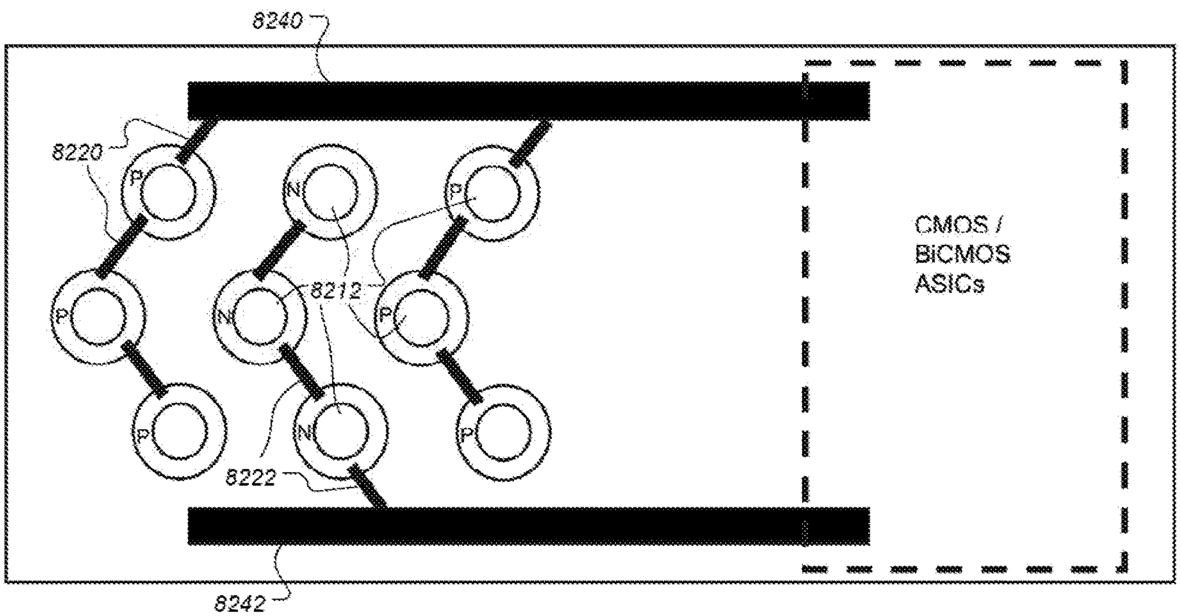

FIG. 82B shows a top view schematic of FIG. 82A where the microstructure holes 8212 are arranged in a hexagonal pattern. Connecting electrodes 8220 are formed connecting the P holes to the P transmission line 8240, and connecting electrodes 8222 are formed to connect the N holes to the N transmission line 8242. The connecting electrodes can also form an ohmic contact to the $P^+$ and $N^+$ regions. In some cases additional electrodes can be formed on the $N^+$ and $P^+$ region and connect to the connecting electrodes. And in some cases transparent metal conducting oxide can be formed on the $P^+$ and $N^+$ region to reduce series resistance. Photo-generated carriers in the Si between the microstructure holes can easily be swept to the anode or cathode and the bandwidth of the device is not determined by the thickness of the device layer, but rather by the distance between the $P^+$ and $N^+$ microstructure holes which can be engineered with a distance ranging from 100 nm to 1000 nm, and in some cases 200 nm-600 nm. The transmission line connects to CMOS and BiCMOS ASICs, not shown are isolation trenching optically and/or electrically that may be needed for optimum performance of the photodetector and the electronics. A single photodetector is shown however multiple photodetectors such as an array can be formed connecting to appropriate CMOS/BiCMOS ASICs for further signal processing and transmission to other electronic components. In addition the entire monolithic integrated chip can be hermetically sealed using a dielectric and/or polymer and eclectic contacts can be formed solder bump technology and trans silicon vias at the bottom of the chip, and in some cases the solder bump can be on the surface of the chip. The lateral dimension of the photodetector can range from 1 micron to 1000 microns or more. The microstructure holes can be arranged in a periodic pattern or can be arranged aperiodically. This structure in a slight variation can be formed on the back surface of a SOI wafer as discussed earlier.

Figure 82C:
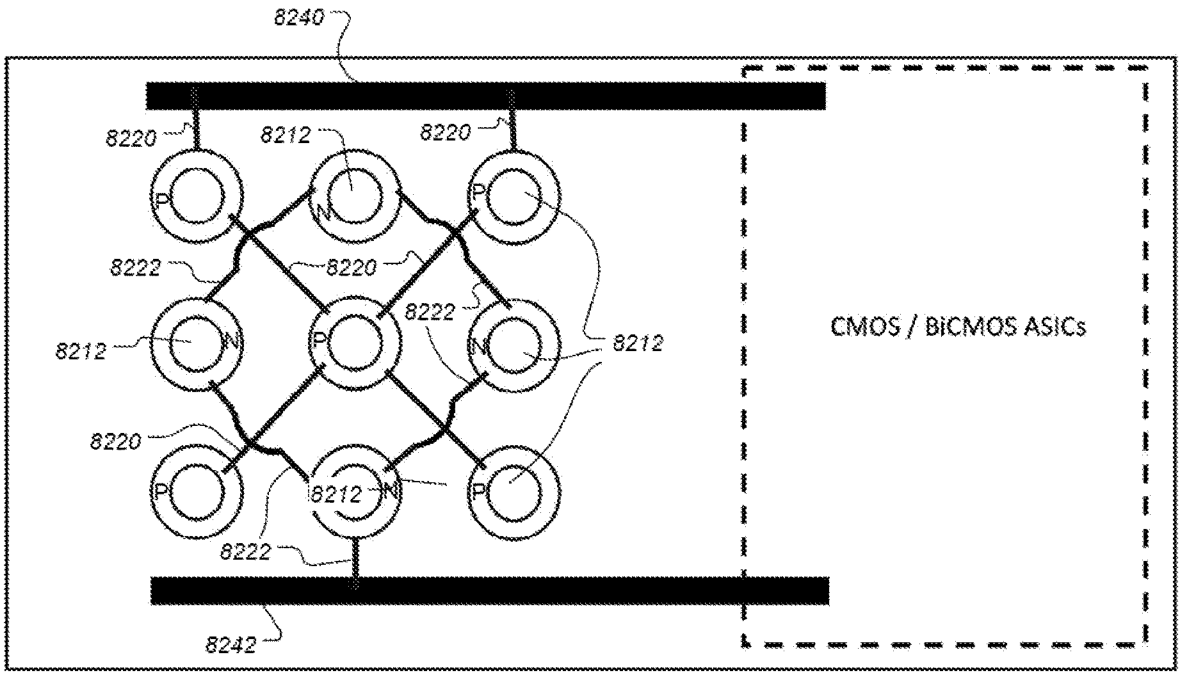

FIG. 82C is similar to FIG. 82B except the microstructure holes 8212 are arranged in a square pattern and where each microstructure hole with a certain polarity can be surrounded by a microstructure hole of the opposite polarity, and where the connecting electrodes can criss-cross each other separated by a dielectric.

FIGS. 83A-C and 84A-C show FDTD simulations of optical absorption of microstructure holes on SOI wafer, according to some embodiments.

Figure 83A:
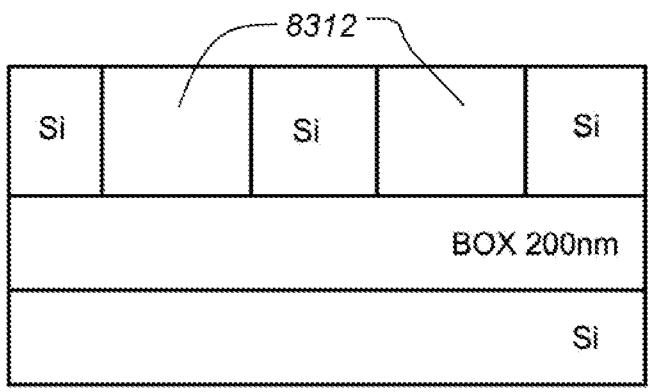
FIGS. 83A-C and 84A-C show FDTD simulations of optical absorption of microstructure holes on SOI wafer, according to some embodiments.

FIG. 83A shows a simplified partial cross-section schematic of the microstructure holes in Si device layer with thickness ranging from 100-120 nm and the microstructure holes have dimensions of 600 nm diameter, and period of 800 and 900 nm in a square lattice and where the holes are etched to the BOX layer. The BOX layer is 200 nm on Si substrate. The optical field is normal incident.

Figure 83B:
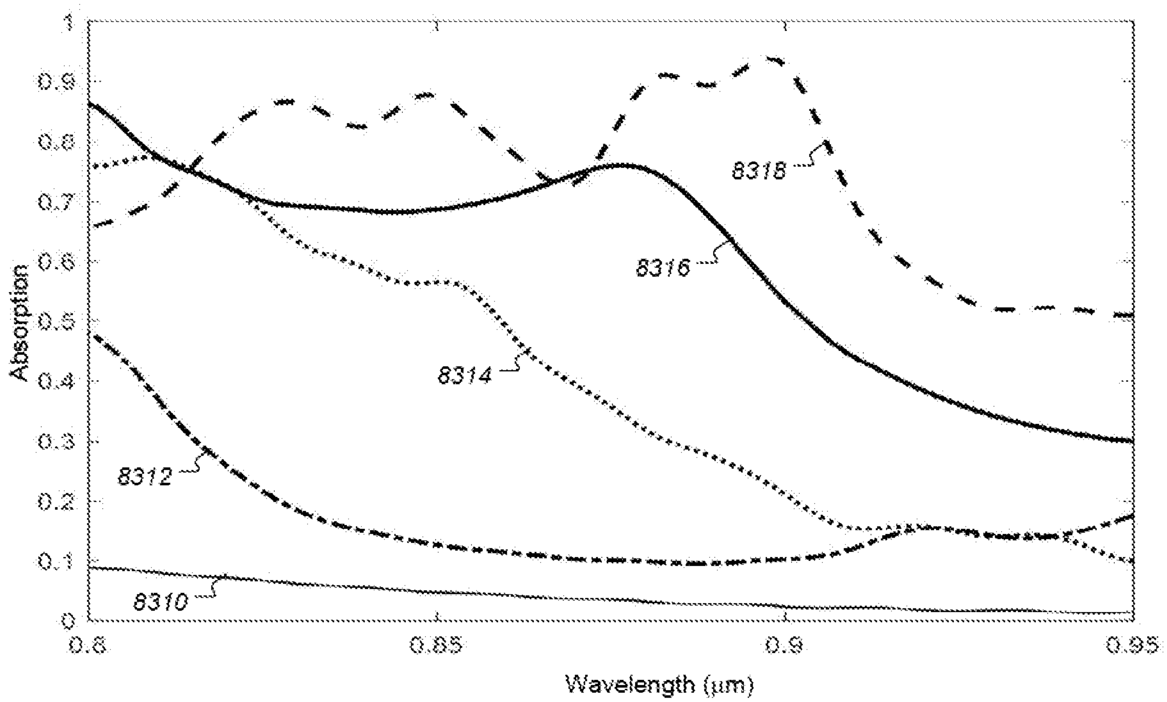

FIG. 83B shows the optical absorption vs wavelength for wavelength ranging from 800-950 nm. The various curves show the absorption vs wavelength for microstructure holes with 600 nm diameter, 800 and 900 nm periods, and Si device layer of 100 and 120 nm. In addition, a Si device layer of 100 nm without holes is also shown (curve 8310). Curve 8312 is for 800 nm period and 100 nm device layer. Curve 8314 is for 900 nm period and 100 nm device layer. Curve 8316 is for 800 nm period and 120 nm device layer. Curve 8318 is for 900 nm period and 120 nm device layer. As can be seen device layer with microstructure holes can have a high absorption than a comparable structure without microstructure holes as certain wavelengths. The external quantum efficiency is directly proportional to the absorption and in some cases can be approximately equal to the absorption.

Figure 83C:
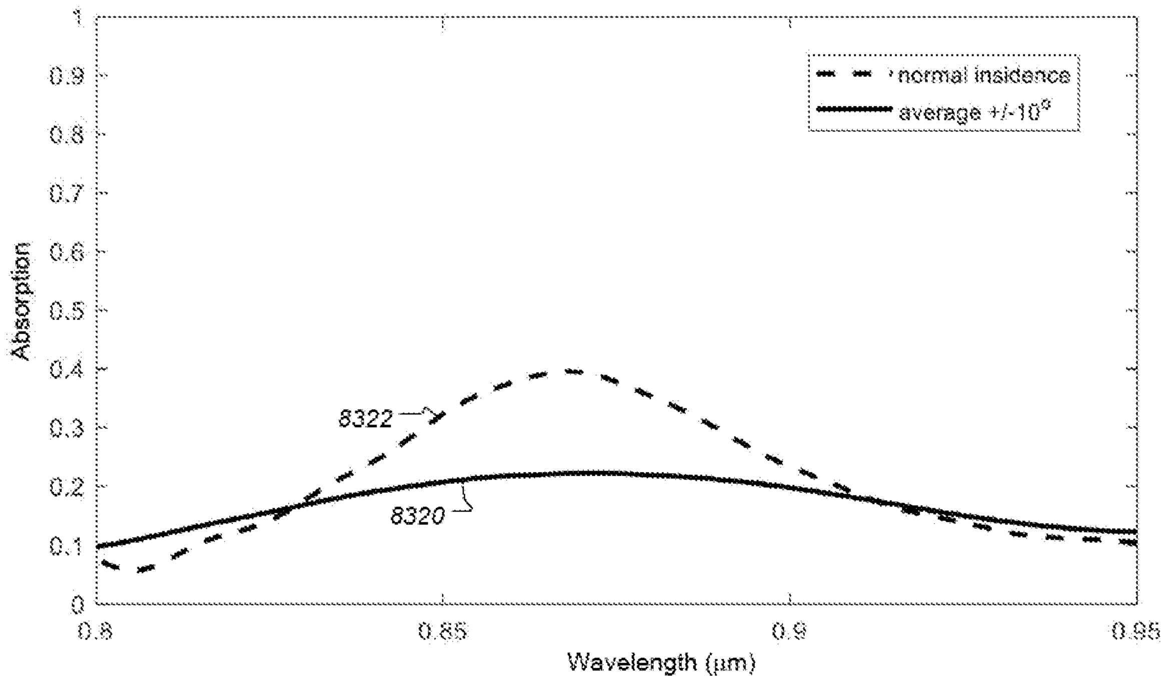

FIG. 83C shows the absorption vs wavelength for the case of a device layer of 70 nm thickness with holes of 600 nm diameter and 800 nm period for normal incident (curve 8322) and for incidents average over +/−10° (curve 8320).

Figure 84A:
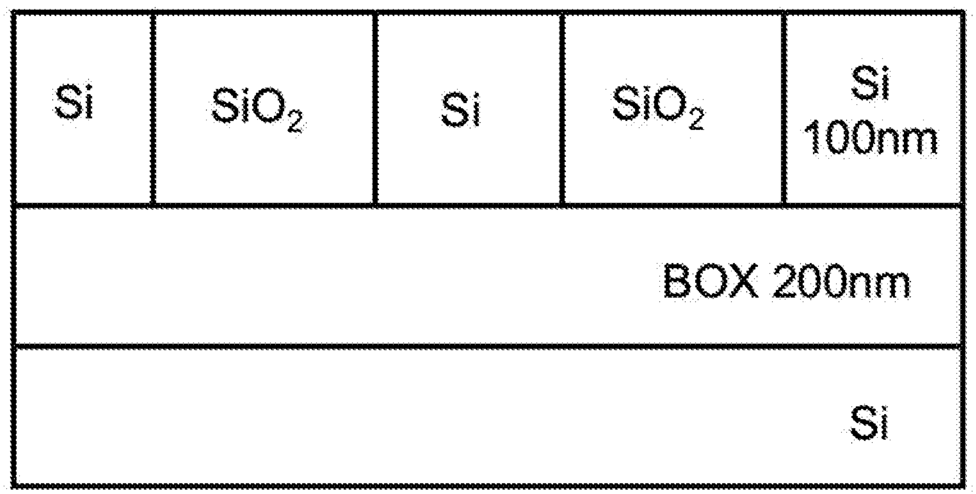
Figure 84B:
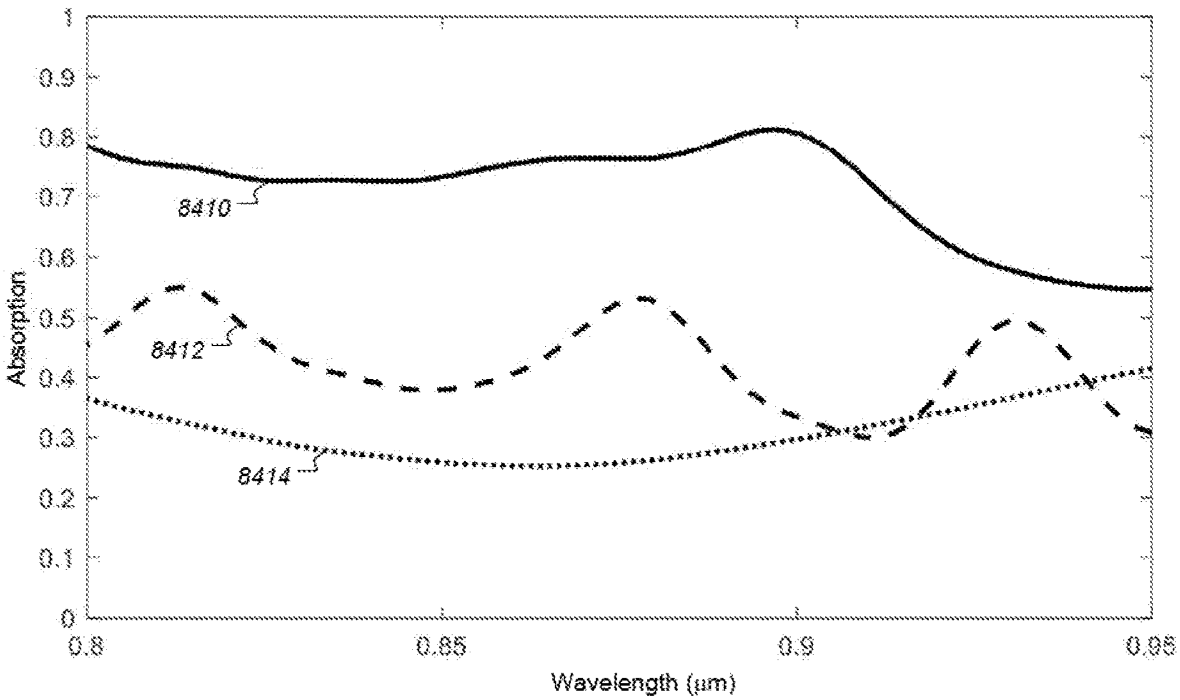
Figure 84C:
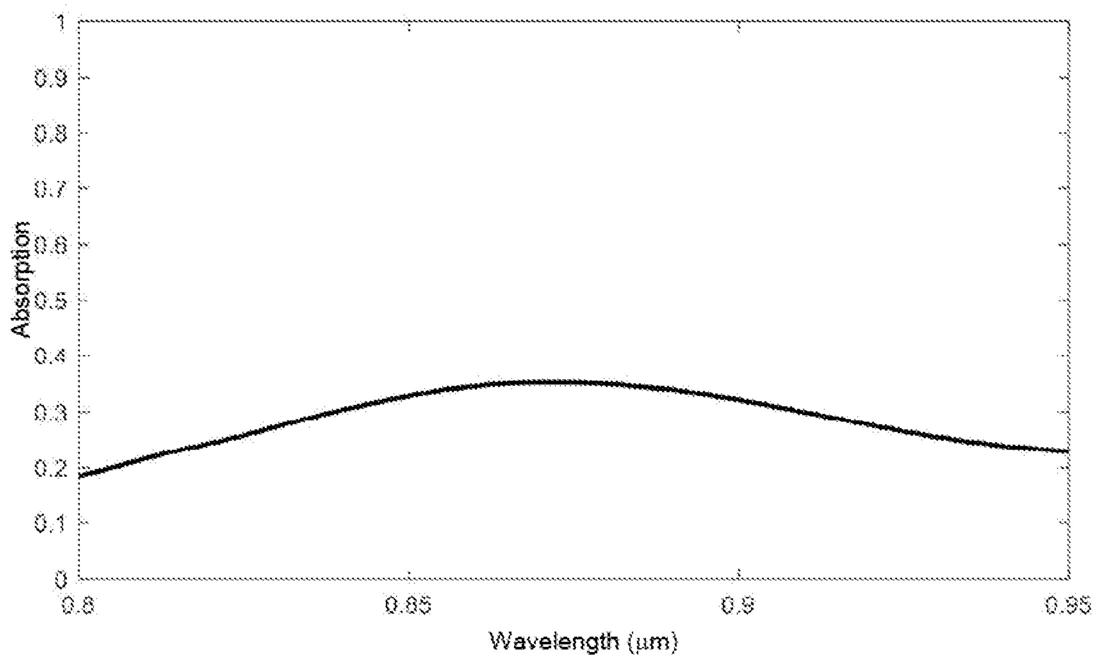

FIGS. 84A-C are similar to FIGS. 83A-C with the exception that the microstructure holes are filled with $SiO_2$ as shown in FIG. 84A.

FIG. 84B shows the FDTD of the optical field absorption vs wavelength for a structure shown in figure shown in FIG. 84A. The microstructure holes are 600 nm in diameter, 800 nm period in a square lattice, and where the holes extend to the BOX layer. In addition the holes are filled with $SiO_2$. The incident optical field is normal to the surface and averaged by +/−10° of its normal incidence. FIG. 84B shows the absorption vs wavelength for various device layer thickness ranging form 120 nm to 400 nm. Curve 8410 is for 200 nm, curve 8412 is for 400 nm and curve 8414 is for 120 nm. FIG. 84C shows absorption vs wavelength for a device layer thickness of 70 nm.

In some cases, the microstructure holes in structures such as illustrated in FIGS. 83A and 84A can be aperiodic and/or random, and in some cases the microstructure holes can be any combination of periodic, aperiodic and/or random.

In some cases, the microstructure holes in structures such as illustrated in FIGS. 83A and 84A can be etched into the BOX layer, and in some cases through the BOX layer. In some cases, the dielectric filling the microstructure holes can have a different refractive index than the BOX layer.

The thickness of the device layer in structures such as illustrated in FIGS. 83A and 84A can range from 30 nm to 500 nm, and in some cases from 70 nm to 2000 nm. The BOX layer thickness can range from 50 nm to 2000 nm. The microstructure hole lateral dimension can range from 300 nm to 1000 nm, and in some cases from 400 nm to 1500 nm, and the spacing between adjacent holes can range from 100 nm to 1000 nm, and in some cases for conical shaped holes such as inverted pyramids, the spacing between adjacent holes can be toughing and/or overlapping. The microstructure holes can be circular, rectangular, polygonal, amoebic, and/or any combination of shapes.

In some cases, Ge and/or GeSi layer(s) with thickness ranging from 30-500 nm can be epitaxially grown on the thin Si layer to extend the wavelength range beyond 1000 nm in structures such as illustrated in FIGS. 83A and 84A.

Figure 85A:
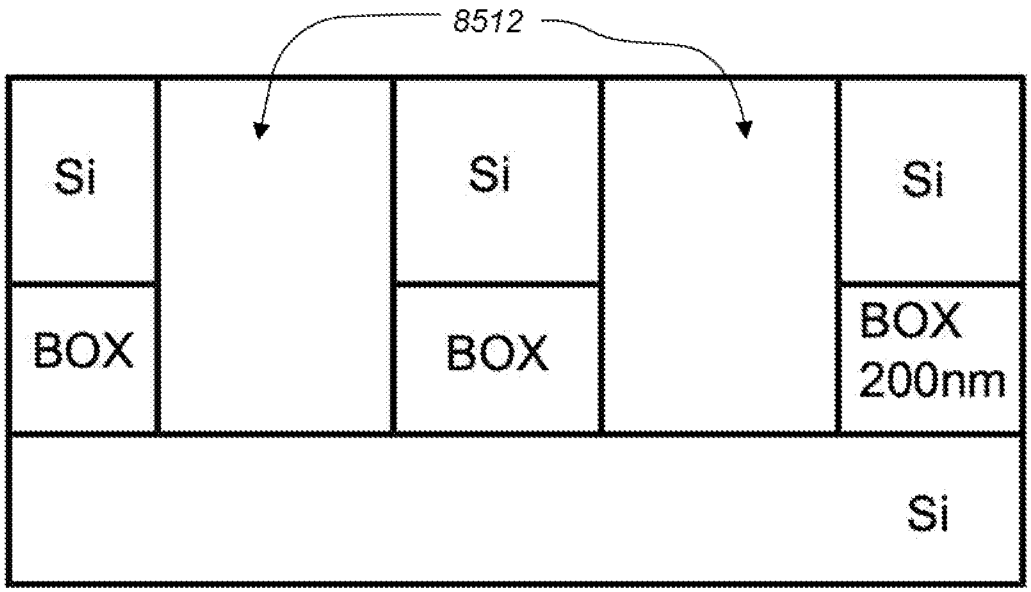
FIGS. 85A-B show partial simplified cross-sections of microstructure holes on a thin Si device layer, according to some embodiments.
Figure 85B:
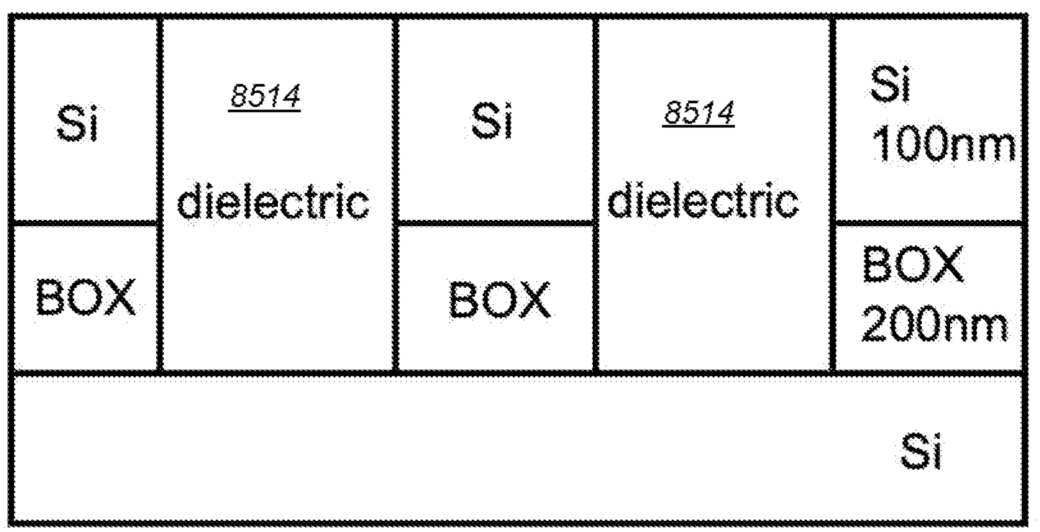

FIGS. 85A-B show partial simplified cross-sections of microstructure holes on a thin Si device layer. The device layer is on a SOI substrate where the microstructure holes can be etched into and/or through the BOX layer. FIG. 85A is similar to FIG. 83A with the exception that the holes 8412 are etched into and/or through the BOX layer. FIG. 85B is similar FIG. 84A with the exception that the microstructure holes 8514 are etched into or through the BOX layer, and in some cases into the Si layer, and the microstructure holes can be filled with a dielectric that have an index of a refraction different than the BOX layer, and in some cases can be filled with a dielectric with refractive index similar or identical to the BOX layer. The dielectric can partially or fully fill the microstructure holes, and in some cases multiple regions can have different dielectric index such as in the case of partially filled holes.

In structures such as illustrated in FIGS. 83A and 84A on SOI wafers, in some cases the Si device layer can be partially or fully depleted, and the device layer can be thin with thickness ranging from 5 nm to 200 nm and in some cases 10 nm to 35 nm, and the BOX layer can have a thickness ranging from 10 nm to 200 nm and in some cases from 20 nm to 100 nm, and in some cases greater than 200 nm, and the handle substrate can be intrinsic, and in some cases can be lightly doped with thickness ranging from 1 micron to 700 microns, and in some cases 1 micron to 3 microns, and in some cases 3 microns to 5 microns.

The lateral dimension of the microstructure hole can be divided by the optical refractive index of the material that fills the microstructure hole in some cases.

Figure 86A:
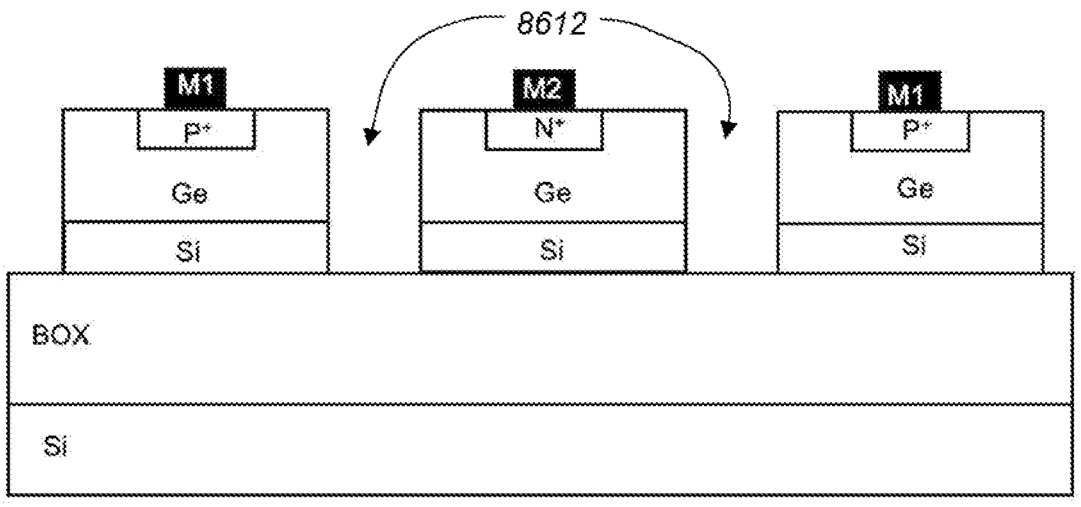
FIG. 86A shows a cross-section schematic of a microstructure hole photodetector, according to some embodiments.

FIG. 86A shows a cross-section schematic of a microstructure hole photodetector. The device layer is etched to the BOX layer to form the microstructure holes 8612, and the device layer can be removed in areas where Ge and/or GeSi growth are not desired, and in some areas, the Si device layer can be covered with a dielectric such as Si dioxide, or Si nitride for example where Ge and/or GeSi epitaxial growth are not desired. Using selective area epitaxial growth of Ge and/or GeSi on exposed Si surfaces can form Ge/GeSi on Si photodetector with microstructure holes. P and N doping can be formed interdigitally and interdigit M1 and M2 electrodes can make ohmic contact to the P and N wells. The thickness of the Ge and/or GeSi layer can range from 20 nm to 500 nm, and in some cases from 30 nm to 450 nm, and in some cases greater than 500 nm. The microstructure holes 8612 can be periodic, and/or aperiodic and/or random and/or any combination thereof arranged. The lateral dimension of the microstructure hole can range from 400 nm to 1500 nm, and in some cases from 300 nm to 1500 nm, and the spacing between adjacent holes can range from 100 nm to 600 nm, and in some cases from 50 nm to 300 nm, and in some cases from 300 nm to 1000 nm. In some cases, the spacing between the holes can range from ½ a wavelength to 1 wavelength, and in some cases material, such as Ge and/or GeSi. Light can impinge from the top surface, and in some cases, light can impinge from the bottom surface. In some cases, the selective area growth of the Ge on Si photodetector can be formed on the bottom surface or the handle wafer surface, and the CMOS and/or BiCMOS electronics can be formed on the device layer. Such a device allows easy formation of electrical contacts with the CMOS and/or BiCMOS electronics, especially in the case of high-density arrays of photodetectors, which can be photodiodes/APD/SPAD. The formation of ASICs electronics on the device layer and the photodetector arrays on opposing surfaces have been described above see for example FIG. 58 to FIG. 64. FIG. 86A shows a lateral PIN Ge/GeSi on Si microstructure hole photodetector where the Si device layer and the Ge/GeSi layer are I "intrinsic" or low dope P or N. A reverse bias is applied between the M1 anode, and the M2 cathode with reverse bias voltage ranging from 0.3 volts to 3.3 volts, and in some cases 3.3 volts to 35 volts, and some cases 35 to 50 volts. The incident wavelength can range from 850 nm to 1100 nm, and in some cases from 900 nm to 1350 nm, and in some cases from 1200 nm to 1650 nm, and in some cases from 1500 nm to 2200 nm.

Figure 86B:
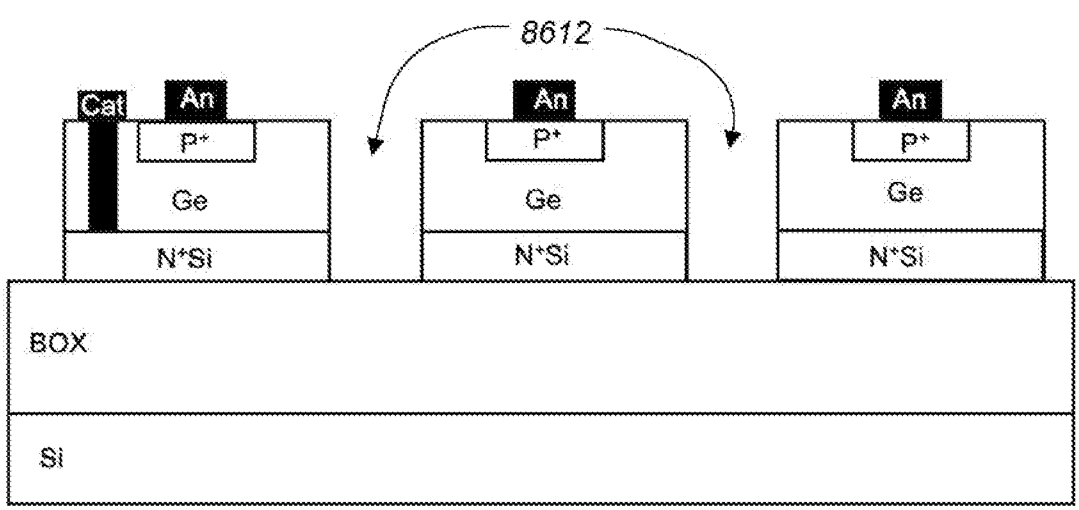
FIG. 86B shows a cross-section schematic of a Ge/GeSi on Si microstructure hole photodetector, according to some embodiments.

FIG. 86B shows a cross-section schematic of a Ge/GeSi on Si microstructure hole photodetector. The photo detector has a vertical PIN structure using selective area epitaxial growth similar to FIG. 86A. The Si device layer can be doped fully or partially with a $N^+$ well and a cathode electrode can be formed in contact with the $N^+$ well by etching through the Ge and in some cases by forming a contact to the $N^+$ well separate from the Ge/GeSi layer. The interdigits and in this case can be all anodes. The Ge/GeSi layer thickness and dimensions of the microstructure holes are similar to FIG. 86*a*. A reverse bias voltage is applied between the anode and cathode. The P and N can be interchanged. In some cases, portions of the Ge/GeSi layer can be N doped. In some cases, portions of the device layer can be P doped to form an avalanche diode in the Si, for example a PIPN structure, and in some cases a PN structure.

Figure 86C:
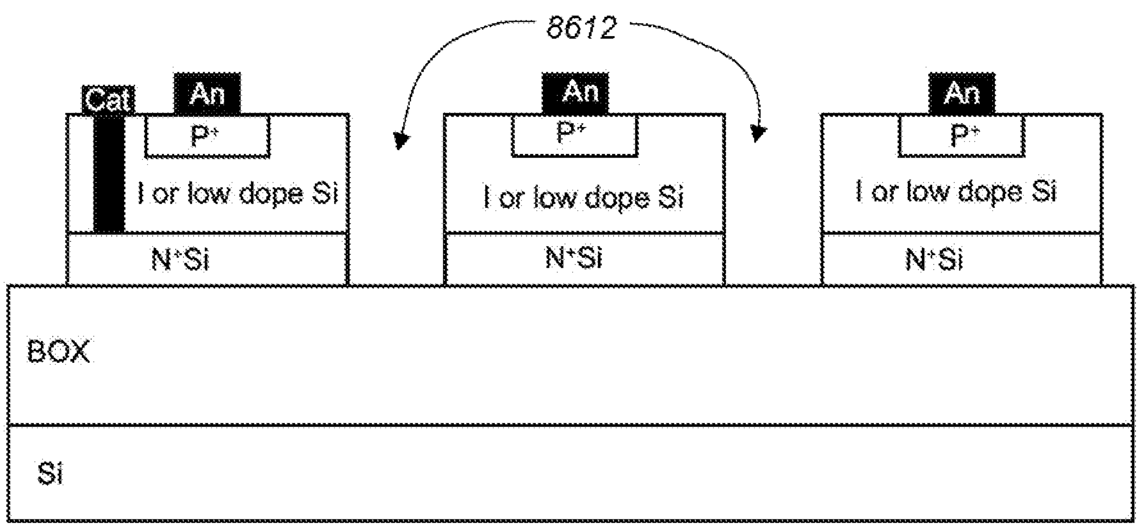
FIG. 86C shows a Si microstructure hole vertical PIN where the interdigits are anodes and the cathode electrode can be formed on the $N^+$ Si, according to some embodiments.

FIG. 86C shows a Si microstructure hole vertical PIN where the interdigits are anodes and the cathode electrode can be formed on the $N^+$ Si. The microstructure holes 8612 can be periodic, and/or aperiodic, and/or random, and any combination thereof arranged. The microstructure holes can have a lateral dimension ranging from 300 nm-1200 nm, and in some cases 400 nm-1000 nm, and the spacing between adjacent holes can range from 100 nm-600 nm, and in some cases from 100 nm-1000 nm. In some cases, the adjacent holes can intersect for example in the case of inverted pyramids. The thickness of the I or low dope Si can range from 35 nm-1000 nm, and in some cases from 35 nm-400 nm. The $N^+$ well thickness can range from 10 nm-100 nm. A reverse bias is applied between the anode and cathode with voltage ranging from 0.3 volts-35 volts. The wavelength of the incident optical signal can range from 800 nm-1000 nm.

Data rates for data center interconnect applications in structures such as illustrated in FIGS. 86A-C can range from 10 Gb/s-50 Gb/s, and in some cases to 100 Gb/s. Multiple photodetectors can be monolithically integrated with CMOS and/or BiCMOS ASICs and can be either on the front or back surfaces of the SOI wafer such that CMOS and BiCMOS ASICs and photodetector arrays are on opposing surfaces. For LiDAR or flash LiDAR applications the rise time of the microstructure hole photodetector in the 10-90% or 20-80% rise time of the detected optical pulse can have a time response of picoseconds for example 1-20 picoseconds, and in some cases 1-40 picoseconds, and in some cases 5-15 picoseconds, and in some cases 10 picoseconds or less. This gives a depth resolution of millimeters as compared to commercial Si photodetectors with equivalent quantum efficiency of nanoseconds, or 10s of nanoseconds. For sensors such as CMOS image sensors with high density pixels, with pixel size of 1-25 microns in lateral dimension the microstructure hole photodetectors can have a higher IR sensitivity at certain wavelength than a comparable CMOS image sensor without microstructure holes. The microstructure hole array can be formed on the same surface as the CMOS ASICs, and in some cases the CMOS image sensor can be formed on the handle substrate or on the opposing surface of the CMOS ASICs and where microstructure holes can be formed.

Figure 88B:
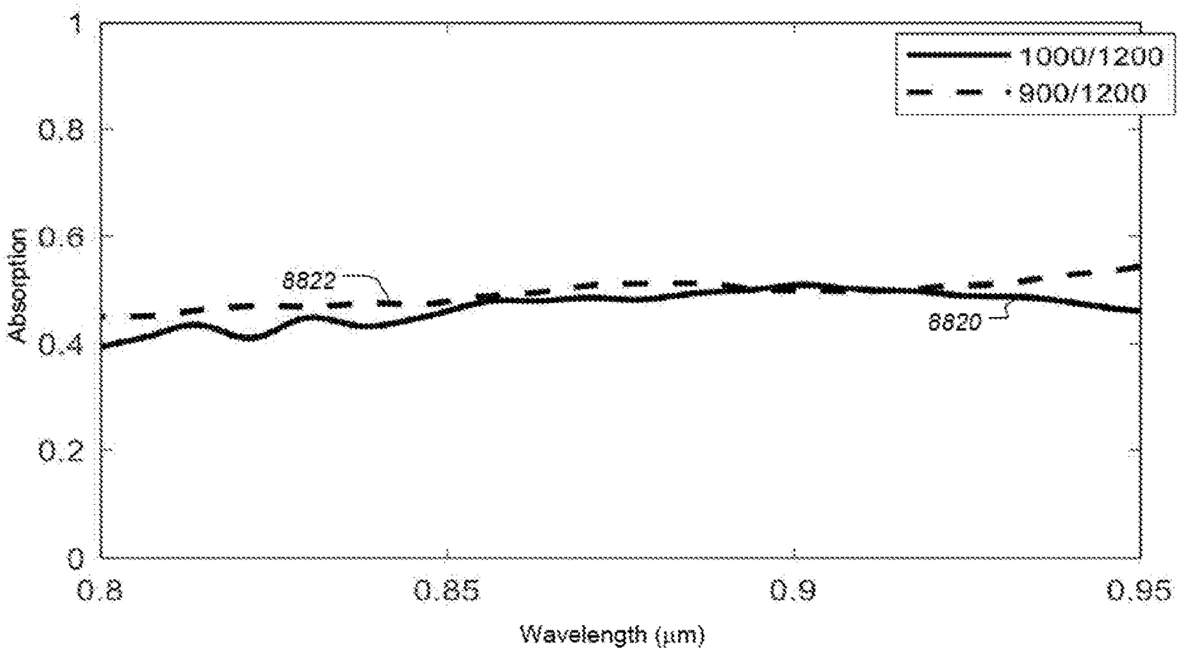
Figure 88C:
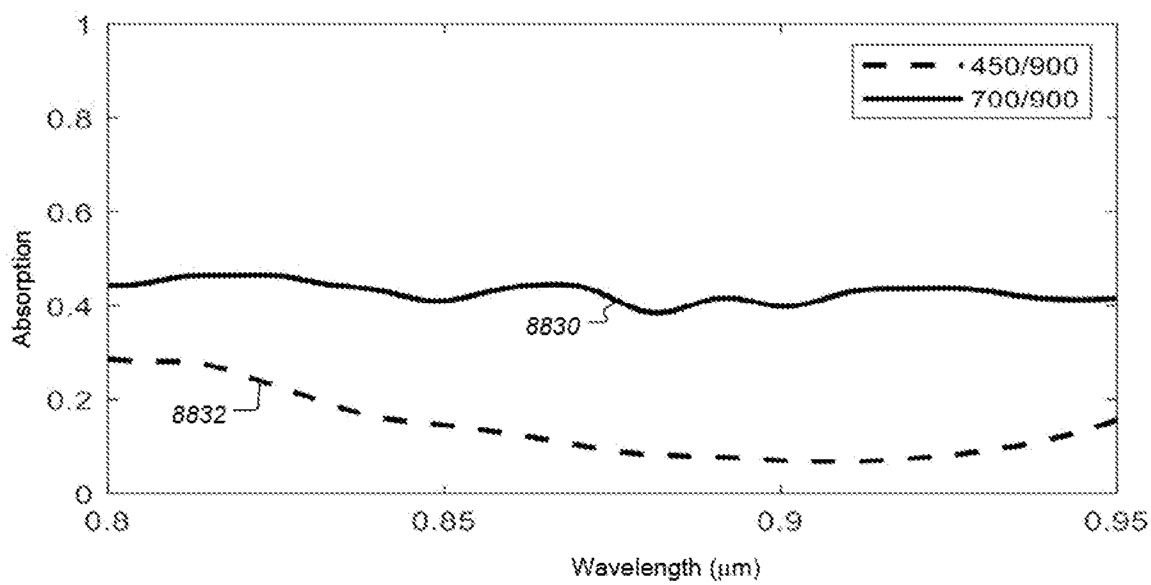

In some cases, in structures such as illustrated in FIGS. 88A-C the I or low dope Si can be N type and in some cases it can be low dope P type, and in some cases the anode electrode can be a Schottky contact. A reverse bias is applied between the Schottky metal contact and the buried N—Si layer.

Figure 87:
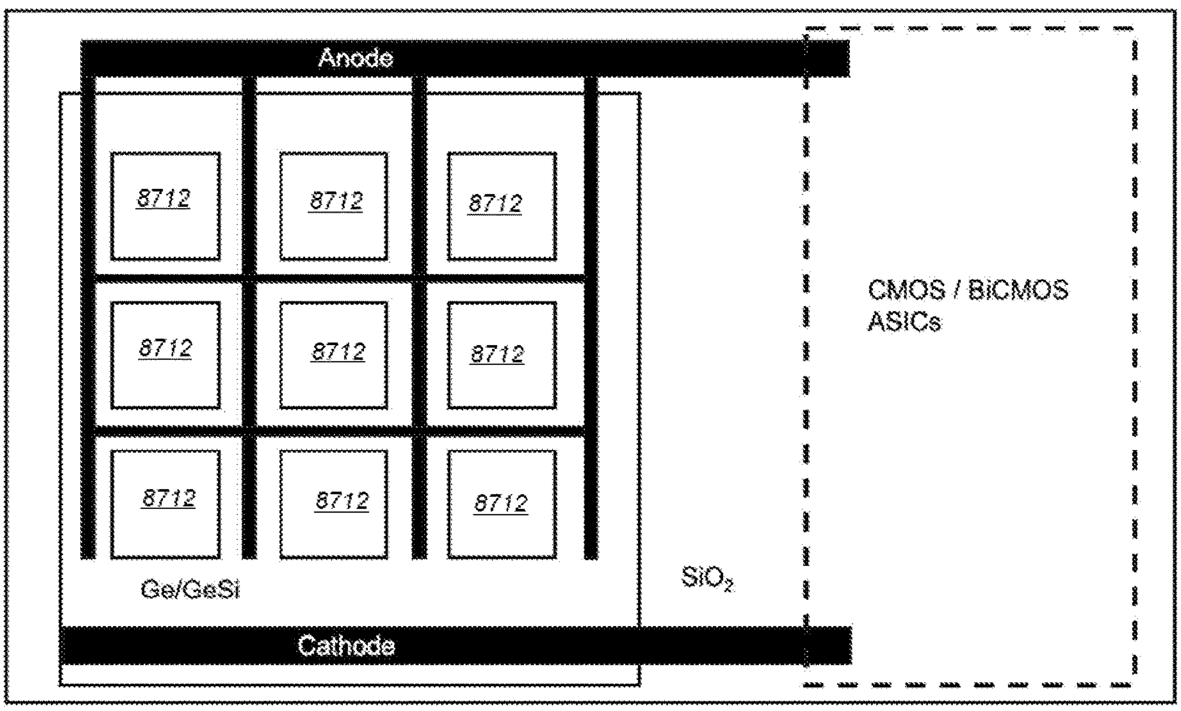
FIG. 87 is a schematic top view of a vertical PIN photodetector, according to some embodiments.

FIG. 87 is a schematic top view of a vertical PIN photodetector. The photodetector can be Si as in FIG. 86C or Ge/GeSi on Si as in FIG. 86B, and where the photodetector(s) can be formed on the same surface as the CMOS and/or BiCMOS ASICs. The Ge/GeSi layer can be selective area grown and the anode can be a grid around the microstructure holes to reduce series resistance, and the cathode can be formed on the $N^+$ Si layer by etching a via through the Ge/GeSi layer, and the transmission lines connected to the CMOS/BiCMOS ASICs. Other electrode configurations can be used to optimized the performance of the photodetector.

FIGS. 88A-C show an FDTD simulation of the optical field impinging on the top device layer surface. The "device layer surface" is of a 70 nm thick Si device layer on a 200 nm thick BOX layer structure as shown in FIG. 88A. The microstructure holes 8812 are circular and etched to the BOX layer, and arranged in a periodic square lattice, with diameter ranging from 450 nm-1000 nm. The optical signal impinges normal to the surface.

FIG. 88B shows the absorption vs wavelength where absorption is directly proportional to external quantum efficiency for two different microstructure hole diameters. The solid curve 8820 shows the case with a hole diameter of 1000 nm and a period of 1200 nm, the dashed curve 8822 shows the case with a hole diameter of 900 nm and a period of 1200 nm. The absorption is 40% or more over a wavelength range of 800-950 nm.

FIG. 88C shows absorption vs wavelength for the case of hole diameter of 700 nm and period of 900 nm as solid curve 8830, and for hole diameter of 450 nm and period of 900 nm for the dashed curve 9932. Photodetectors with microstructure holes can have a higher external quantum efficiency than a comparable photodetector without microstructure holes at certain wavelengths.

Figure 89B:
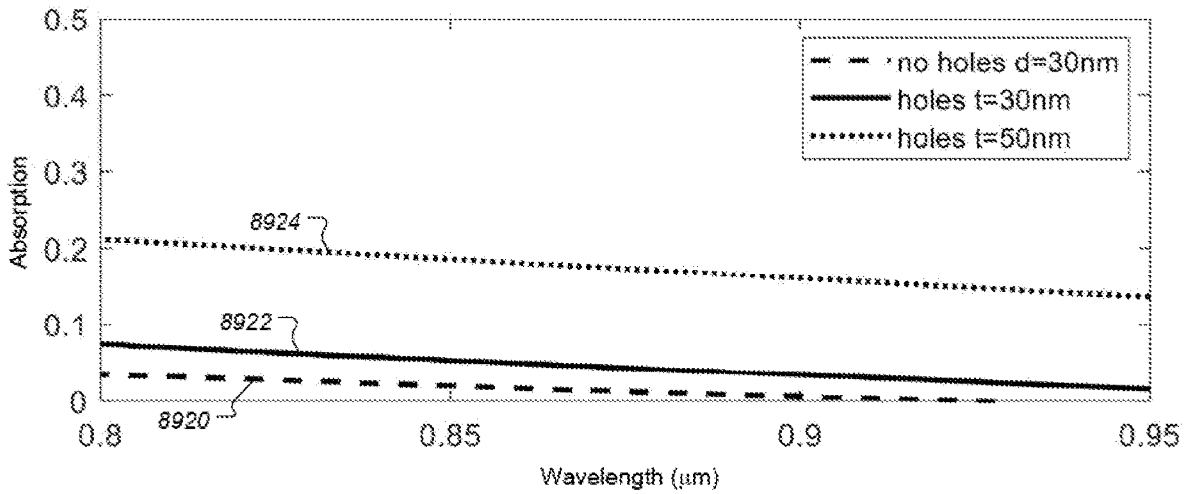

FIGS. 89A-B show an FDTD simulation of a microstructure hole structure. FIG. 89A shows the configuration with microstructure holes 8912 formed in a 30 nm and 50 nm device layer thickness on a BOX layer of 200 nm. FIG. 89B shows the absorption vs wavelength for microstructure hole dimensions of 900 nm diameter and 1200 nm period etched to the BOX layer. The dotted curve 8924 shows absorption vs wavelength for microstructure holes with device layer thickness of 50 nm, and the solid curve 8922 for a device layer of 30 nm. The dashed curve 8920 shows the absorption vs wavelength for 30 nm device layer thickness without microstructure holes.

Figure 90B:
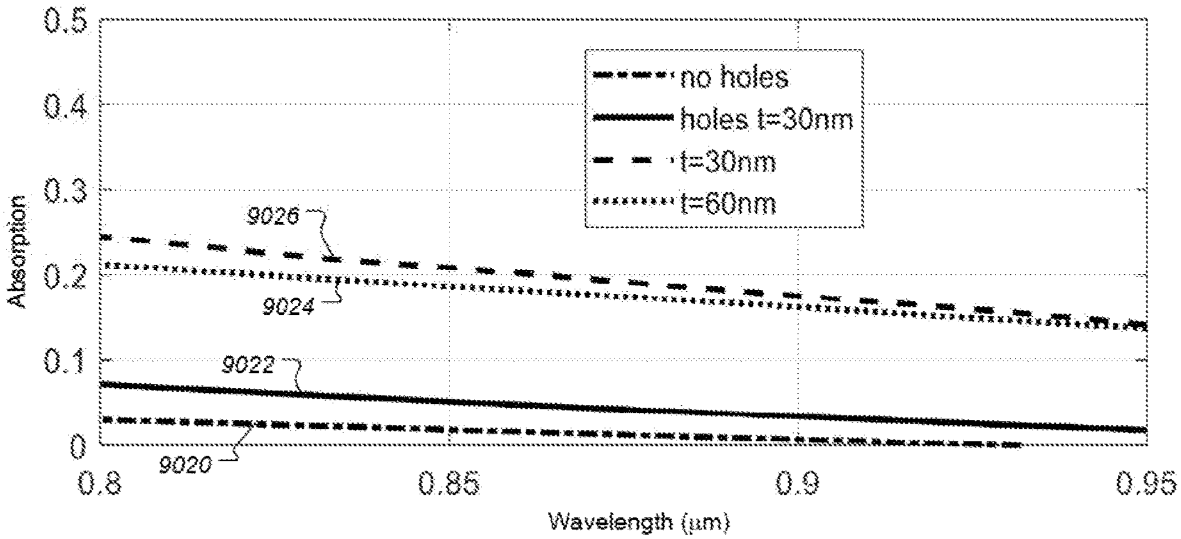

FIGS. 90A-B show an FDTD simulation of the optical field of a microstructure hole structure. FIG. 90A shows the configuration with microstructure holes 9012 formed in a device layer thickness of 30 nm and 60 nm and a dielectric such as Si dioxide of 70 nm and a BOX layer of 200 nm. The microstructure holes 9012 as in FIG. 89A have 900 nm diameter, and 1200 nm period, and are etched to the BOX layer. In FIG. 90B the solid curve 9022 is for microstructure holes with a dielectric layer, and a device layer thickness of 30 nm. The dotted curve 9024 is for microstructure holes with dialectic and a device layer thickness of 60 nm. The dashed curve 9026 is for microstructure holes with dialectic and a device layer thickness of 30 nm. The dash-dot-dash curve 9020 shows the absorption vs wavelength of a structure without microstructure holes and a device layer of 30 nm.

The dielectric on top of the Si device layer in FIG. 90A can have a refractive index similar to that of Si refractive index at a given wavelength.

Figure 91B:
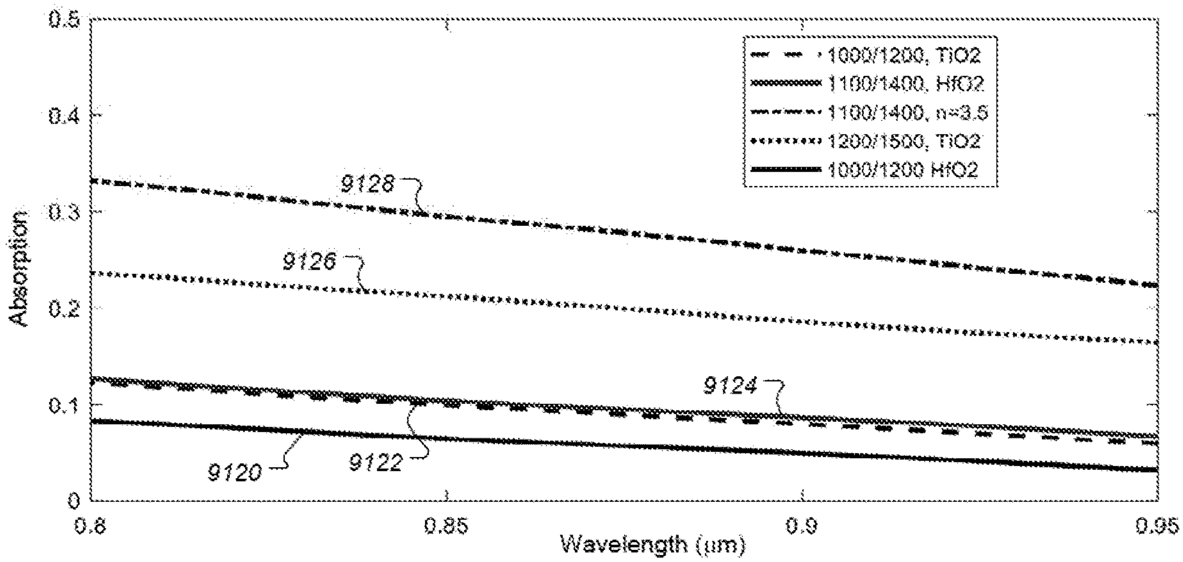

FIGS. 91A-B show an FDTD simulation of the optical field of a microstructure configuration. The structure, shown in FIG. 91A, is similar to the one in FIG. 90A except that the dielectric on top of the Si device layer can be Ti oxide or Hf oxide. The Si device layer is 30 nm thick, and the Hf oxide or Ti oxide is 100 nm thick, and the BOX layer is 200 nm on top of Si. In FIG. 91B the plots show absorption vs wavelength where absorption can be directly proportional to external quantum efficiency, and for wavelength ranging from 800-950 nm. The dotted curve 9126 shows absorption vs wavelength for microstructure holes of 1200 nm in diameter, and 1500 nm period in a square lattice with Ti oxide dielectric on top of the device layer. Curve 9120 is for 1000 nm diameter, 1200 nm period with Hf oxide, curve 9122 is for 1200 nm diameter, 1500 period with Ti oxide, curve 9124 is for 1100 nm diameter, 1400 nm period with Hf oxide, and curve 9128 is for 1000 nm diameter holes, 1200 nm period with Ti oxide. The absorption in this configuration is greater than 15% over the wavelength range of 800-950 nm. A comparable structure without microstructure holes has absorption of less than 1% over the same wavelength range.

Figure 92:
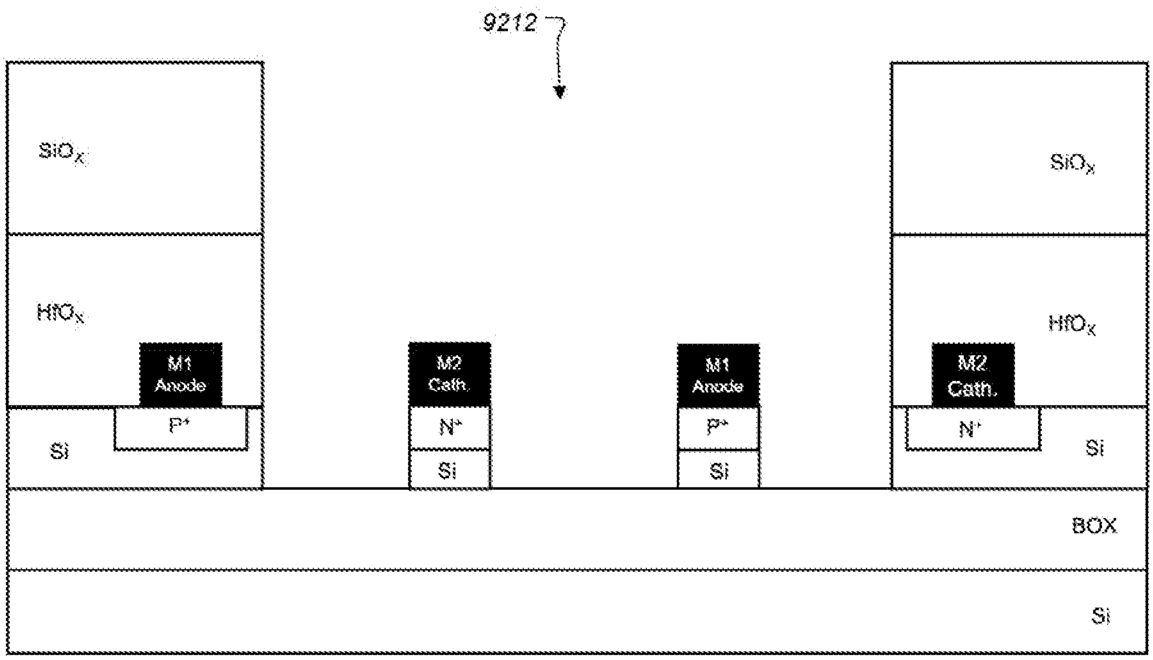
FIGS. 92-94 show partial cross-section schematics of lateral PIN interdigitated photodiodes, according to some embodiments.

FIG. 92 shows a partial cross-section schematic of a lateral PIN interdigitated photodiode. The photodiode is fabricated on a SOI wafer where the Si device layer can be I or low dope P or N, and can be partially or fully depleted, and can have thickness range of 8 nm-200 nm, and in some cases 10-30 nm. CMOS ASICs are formed on the Si device layer and can be monolithically integrated with the lateral PIN photodiode which can have multiple photodetectors, and in some cases a 2D array of photodetectors for optical data communication, LiDAR, or 3D imaging. The lateral PIN can be covered with a high index dielectric such as Hf oxide, and can be further covered with Si dioxide. Microstructure holes 9212 are formed in the dielectric and can be etched to the BOX layer as shown in FIG. 92. Light can impinge on the top surface. The interdigitated electrodes can have spacing ranging from 100 to 1000 nm, and the width of the interdigits can range from 10 nm to 160 nm. The thickness of the dielectric which can have single or multiple layers of different refractive index can have thickness ranging from 50 nm to 600 nm. The diameter of the microstructure holes can range from 400 nm-1200 nm. The microstructure holes can be periodic and/or aperiodic, and/or random, and can be circular, rectangular, polygonal in shape and can have spacing ranging from 200 nm to 1000 nm. Wavelength range for the microstructure hole photodetector can range from 800 nm to 1100 nm, and in some cases from 800 nm to 1000 nm. The external quantum efficiency of a microstructure hole photodetector can be greater than the external quantum efficiency of a comparable photodetector without microstructure holes at certain wavelengths.

Figure 93:
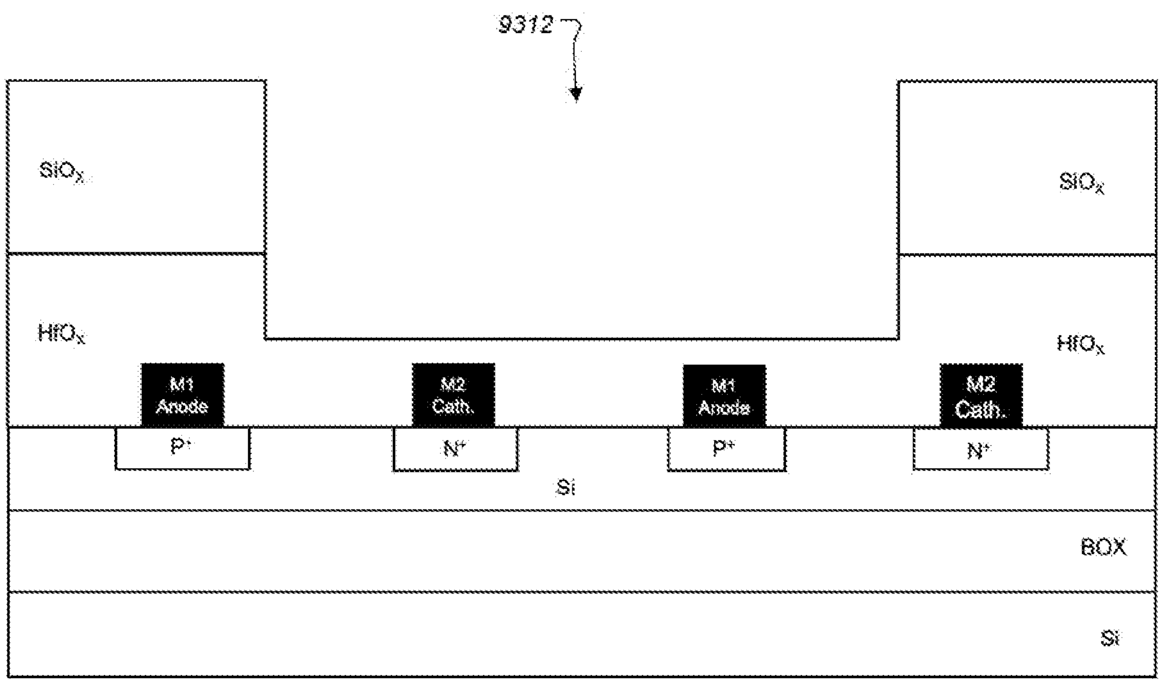

FIG. 93 shows a partial cross-section schematic of a lateral PIN interdigitated photodiode similar to FIG. 92. In the case of FIG. 93 the microstructure holes 9312 are etched partially into one or more dielectrics, and not into the Si device layer. The external quantum efficiency of microstructure hole photodetector can be higher than the external quantum efficiency of a comparable photodetector without microstructure holes at certain wavelengths.

Figure 94:
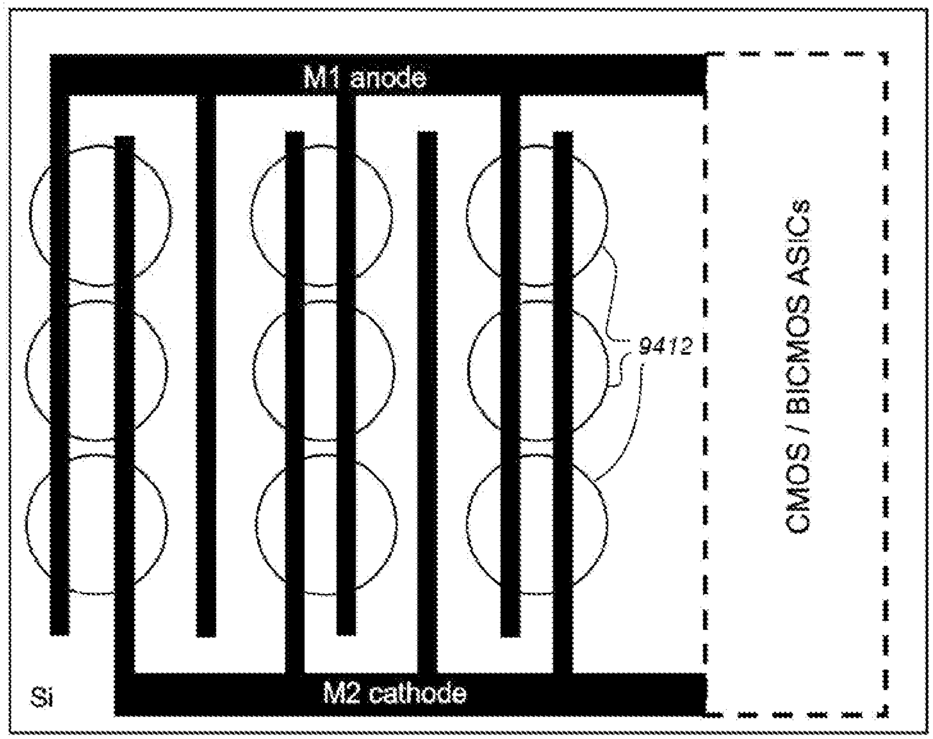

FIG. 94 is a schematic of a top view of microstructure lateral PIN as shown in FIGS. 92 and 93. Only a single photodetector is shown for simplicity. Multiple photodetectors in 1D or 2D arrays can be fabricated on a single chip and monolithically integrated with CMOS ASICs. In this structure the interdigits are first formed followed by the etching of microstructure holes 9412 in the dielectric that can be partially etched into the dielectrics, or through the dielectrics to the Si device layer, or to the BOX layer. The microstructure holes 9412 can have a larger lateral dimension than the spacing of the interdigit electrodes. Transmission lines connecting the M1 and M2 interdigits are connected to a CMOS ASICs.

A reverse bias voltage is applied to the M1 anode, and M2 cathode in FIG. 94 with voltage ranging from 0.1 volt to 4 volts, and in some cases greater than 4 volt, where multiplication gain is desired.

Figure 95:
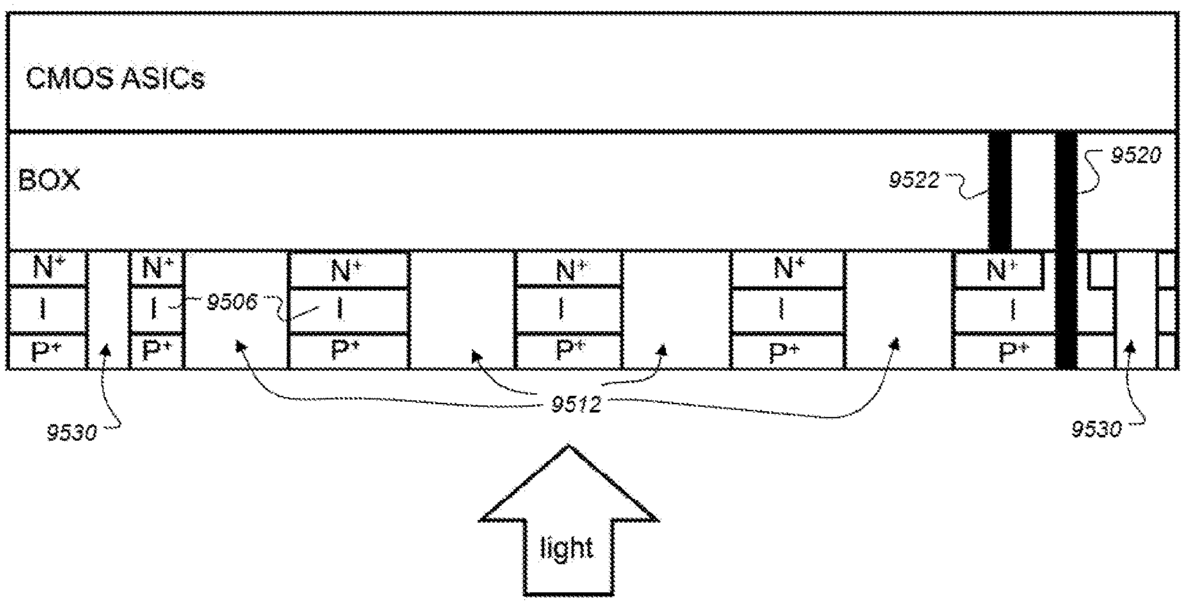
FIG. 95 shows a simplified partial cross-section schematic of a bottom illuminated CMOS image sensor or a bottom illuminated CMOS high speed vertical PIN photodiode, according to some embodiments.

FIG. 95 shows a simplified partial cross-section schematic of a bottom illuminated CMOS image sensor or a bottom illuminated CMOS high speed vertical PIN photodiode for optical data center interconnect applications or for LiDAR or Time-of-Flight, or for Time-of-Flight 3D imaging. The CMOS ASICs are formed in the Si device layer of a SOI wafer that can be partially or fully depleted, and in some cases not partially or fully depleted, and the photodetector is formed on the opposite surface on the handle substrate where the handle substrate can be thinned to 5 micron thickness or less, and in some cases to 2 micron thickness or less. P and N junctions can be formed by ion implantation followed by rapid thermal anneal and microstructure holes can be etched to the BOX layer. The handle substrate 9506 can be I or low dope N or P, and the P and N can be interchanged. Electrodes are connected from the top CMOS ASICs to the P and N layer of the photodetector by means of a via. The lateral dimension of the photodetector or pixel can range from 1 micron to 25 microns, and in some cases 25 microns-50 microns, and in some cases more than 50 microns. Microstructure holes 9512 lateral dimensions can range from 300 nm to 1200 nm, and in some cases 600 nm-1000 nm, and in some cases greater than 1200 nm. The spacing between adjacent holes can range from 100 nm to 600 nm, and in some cases the holes can touch or intersect if the holes are inverted pyramids for example. Isolation trenches 9530 can be included to separate the photodetector or pixel. For data communication, the data rate can range from 10-50 Gb/s, and in some cases 50-100 Gb/s, and in some cases greater than 100 Gb/s. The rise time for Time-of-Flight applications can range from 1 picosecond to 30 picoseconds, and in some cases from 10 picosecond to 40 picoseconds, and in some cases less than 100 picoseconds. The external quantum efficiency of a microstructure hole photodetector can be greater than the external quantum efficiency of a comparable photodetector without microstructure holes at certain wavelengths, the microstructure holes 9512 can be periodic, and/or aperiodic, and/or random. Optical signal and/or time of flight signal and/or images impinge on the bottom surface. A reverse bias is applied between the anode 9520 and cathode 9522 with voltage ranging from 0.1 to 4 volts, and in some cases greater than 4 volts where multiplication gain is desired. Wavelength range from 800-1100 nm.

Figure 96:
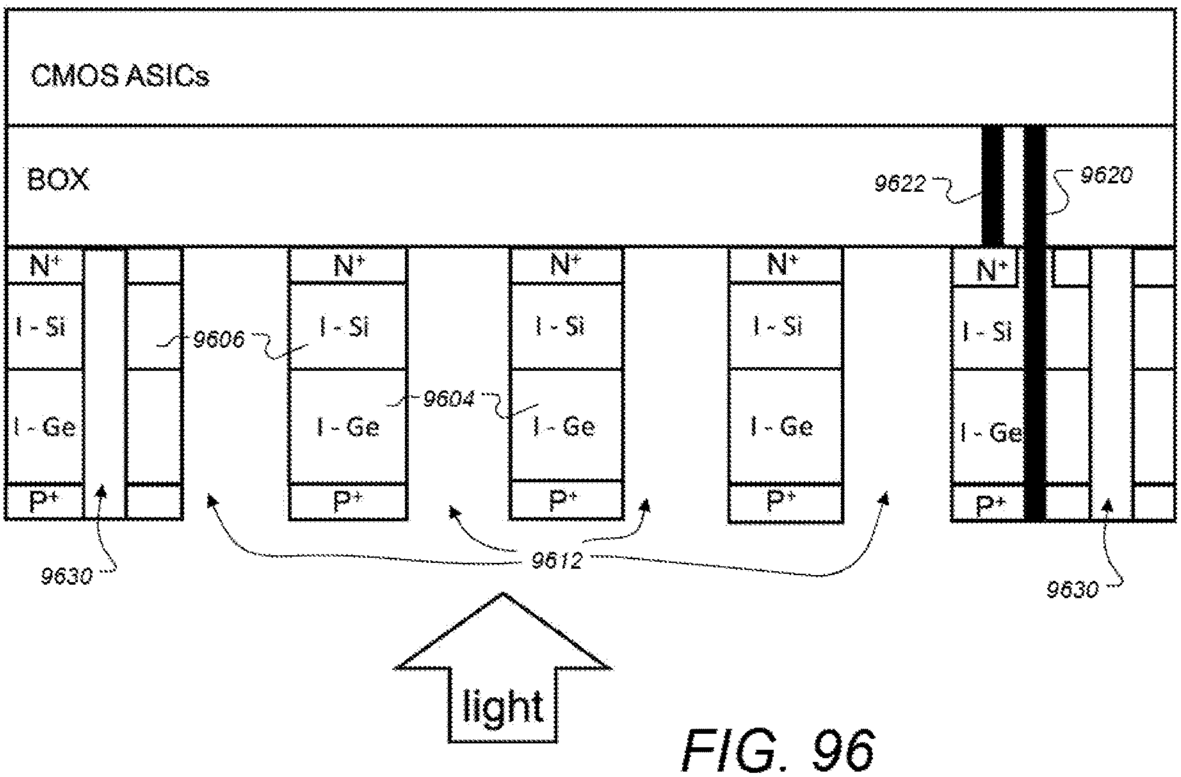
FIG. 96 shows a simplified partial cross-section schematic of a bottom illuminated CMOS image sensor or a bottom illuminated CMOS high speed vertical PIN photodiode, according to some embodiments.

FIG. 96 shows a simplified partial cross-section schematic of a bottom illuminated CMOS image sensor or a bottom illuminated CMOS high speed vertical PIN photodiode. FIG. 96 is similar to FIG. 95 with the addition of selective area growth of Ge 9604 on Si 9606. The P layer is formed on Ge 9604 and the N layer is formed on Si 9606. The Ge and/or GeSi layer can have a thickness ranging from 30 nm to 500 nm, and in some cases 50 nm 400 nm. The Ge or GeSi can I or low dope P or N. The microstructure holes 9612 can be periodic, aperiodic, and/or random, and/or any combination thereof. The microstructure holes can be partially etched into the Ge layer and in some cases etched to the Si layer and in some cases etched to the BOX layer. The lateral dimension of the microstructure hole can range from 300 to 1500 nm, and in some cases from 600 to 1500 nm, and in some cases more than 1500 nm. The spacing between adjacent holes can range from 100 nm to 600 nm, and in some cases greater than 600 nm. The lateral dimension of the photodetector can range from 2 microns to 30 microns, and in some cases from 30 microns to 100 microns, and in some cases greater than 100 microns. Electrodes are formed connecting the anode and cathode to the CMOS ASICs, and a reverse bias can be applied between the anode and cathode with voltage ranging from 0.1 to 4 volts, and greater than 4 volts where multiplication gain is desired. Wavelength range for the photodetector can be from 800 to 1650 nm, and in some cases from 800 to 1100 nm, and in some cases 800-1350 nm. Data rate can range from 10 to 50 Gb/s, and in some cases 50-100 Gb/s, and in some cases greater than 100 Gb/s for optical interconnect application. Rise time can range from 1 to 20 pico seconds, and in some cases from 10-40 pico seconds, and in some cases less than 100 pico seconds for time-of-flight applications such as LiDAR and 3D imaging. Microstructure holes photodetector can have external quantum efficiency greater than the external quantum efficiency of am comparable photodetector without microstructure holes at certain wavelengths. Optical signal and/or time-of-flight signal and/or 3D images impinge on the bottom surface. Multiple photodetectors/pixels can be formed in 1D or 2D arrays that are monolithically integrated with CMOS ASICs.

Figure 97A:
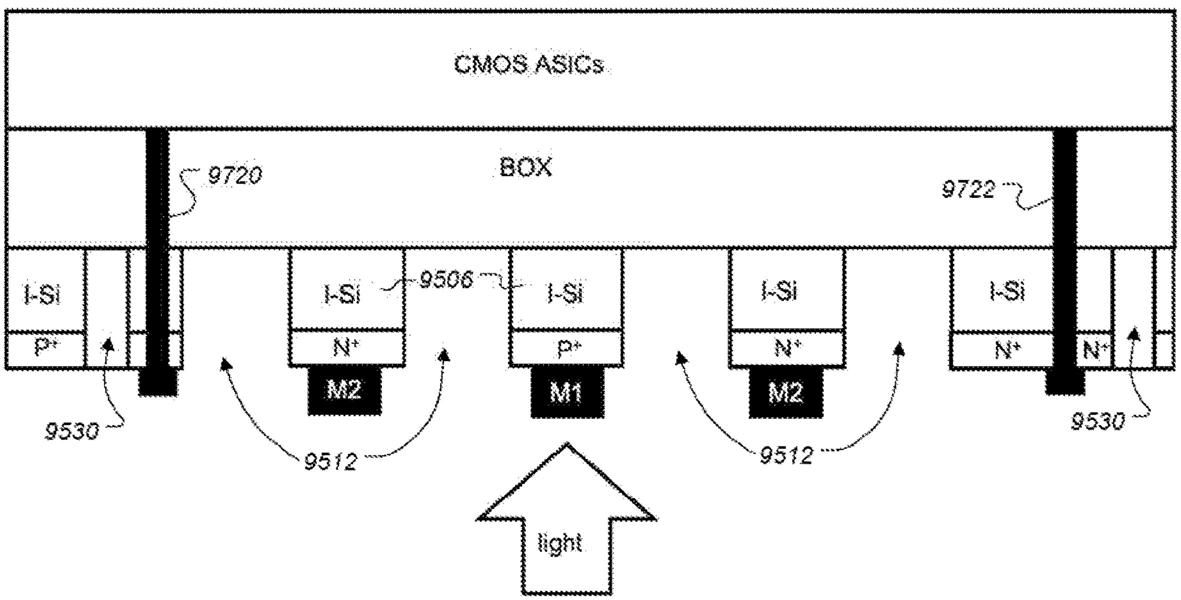
FIGS. 97A-B and 98A-B are partial schematic cross-sections similar to FIGS. 95 and 96.
Figure 97B:
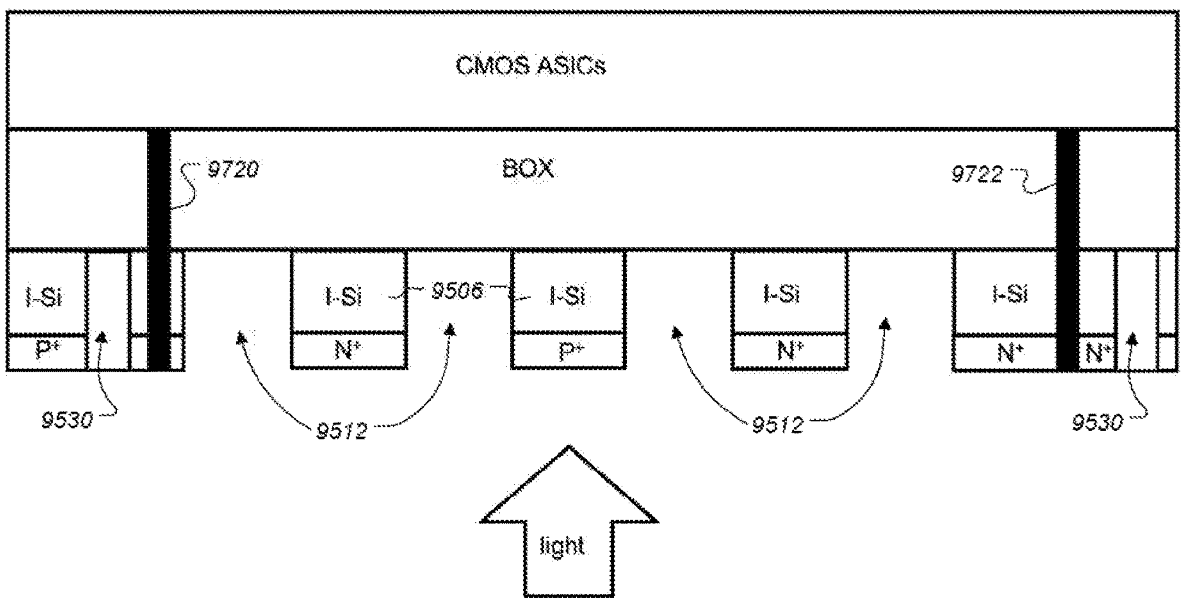

FIGS. 97A-B are partial schematic cross-sections similar to FIG. 95. In the case of FIG. 97A, a lateral PIN configuration interdigitated electrodes M1 and M2 form alternating PN junctions. The width of the M1 and M2 electrodes can range from 10 nm to 300 nm. The M1 and M2 electrodes form ohmic contacts to the P and N doped wells which can be formed by dopant diffusion and/or ion implantation. The lateral photodiode can be connected to the CMOS or BiC- MOS ASICs by electrodes 9720 and 9722 connecting the P and N regions respectively to appropriate contacts in the ASICs electronics by means of a via. The lateral dimension of the photodetector can range from a few microns to 10s of microns, and in some cases to 100s of microns. Applications can include optical interconnect for data centers, LiDAR for autonomous vehicles, robots, and drones and 3D imaging with or without time-of-flight. Multiple photodetectors and/or high density arrays can be fabricated and monolithically integrated with CMOS/BiCMOS ASICs. A reverse bias is applied between the anode and cathode with voltage ranging from 0.1 to 4 volts, and in some cases 4-50 volts where multiplication gain in desired.

FIG. 97B is similar to FIG. 97A without the M1 or M2 interdigitated electrodes, where the N and P doping are sufficiently high such that electrodes may not be necessary. A reverse bias is applied between the anode and cathode with voltage ranging from 0.1 to 4 volts, and in some cases 4-50 volts where multiplication gain in desired.

Figure 98A:
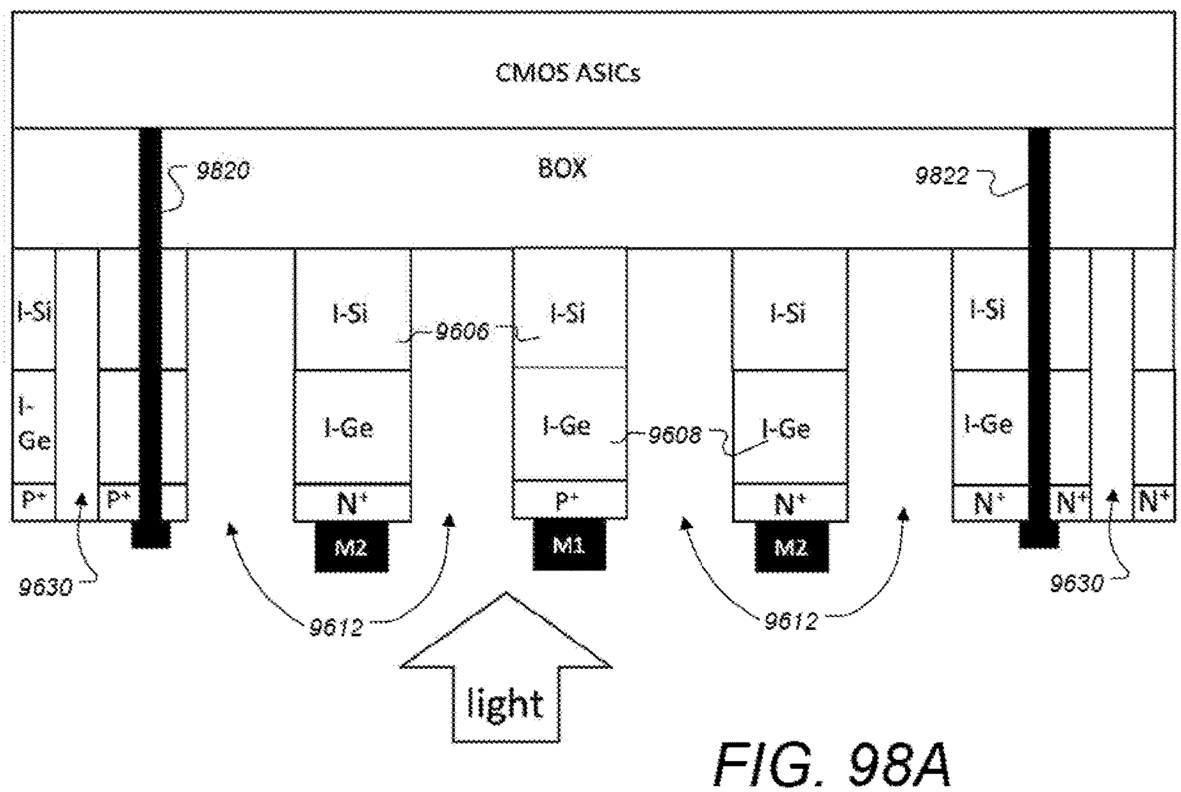
Figure 98B:
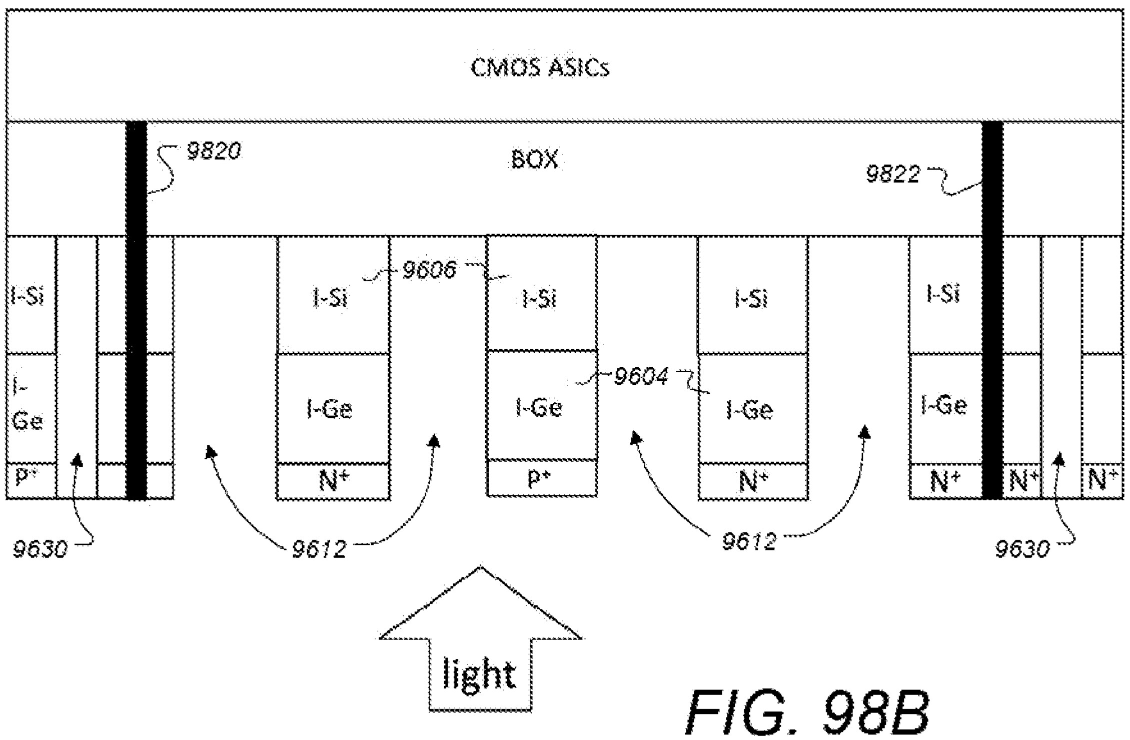

FIGS. 98A-B are partial schematic cross-sections similar to FIG. 96. In the case of FIG. 98A, a lateral PIN structure has interdigitated M1 and M2 electrodes on alternating P and N junctions. Connections of the photodetector anode and cathode to the CMOS electronics are made with electrodes 9820 and 9822 passing through a via in the BOX layer and layers in the photodetector to connect to the P and N ohmic contacts. A reverse bias is applied between the anode and cathode with voltage ranging from 0.1 to 4 volts, and in some cases 4-50 volts where multiplication gain in desired. The detector can detect light or optical signal with wavelength ranging from 800 to 1650 nm, and in some cases to 2200 nm, and in some cases 850 nm-1100 nm, and in some cases 1200 nm-1350 nm, and in some cases 850 nm-1550 nm. Applications include optical interconnect for data centers, LiDAR for autonomous vehicles, robots, and drones, 3D imaging with or without time-of-flight.

FIG. 98B is similar to FIG. 98A without the metal M1 and M2 interdigitated electrodes. In some cases, silicide such as Pt, Ti or Al silicide can be used in place of the metal electrodes, and in some cases the highly doped P and N region have sufficiently low series resistance for certain applications such that interdigtated metal electrodes may not be necessary.

All or almost all of the photodetector structures discussed in this patent specification, and/or the commonly assigned incorporated applications can be fabricated on the back side of a SOI wafer and the CMOS and/or BiCMOS electronics can be fabricated on the front side (device layer side).

In all cases for embodiments according to this patent specification the microstructure holes can be passivated with thermal native oxide and/or other dielectrics such as Al oxide, Si nitride, Hf oxide, to name a few by methods such as atomic layer deposition, and/or in some cases the microstructure holes can be partially or entirely filled with Si dioxide and/or other dielectrics. In addition, the Si dioxide, and/or other dielectrics can fill the microstructure holes and extend beyond the holes onto the surface. In some cases, the passivation layer for the microstructure holes can be amorphous semiconductor such as amorphous Si, and/or amorphous Ge to name a few.

Avalanche photodiode and/or single photon avalanche photodiode can also be fabricated in the back illuminated photodetector array in structures according to embodiments described in this patent specification with appropriate P N junction doping profiles and in some cases PIPN, and in some cases PIPIN, and where in some cases the P and N can be interchanged for both Si and Ge on Si structures.

Figure 99A:
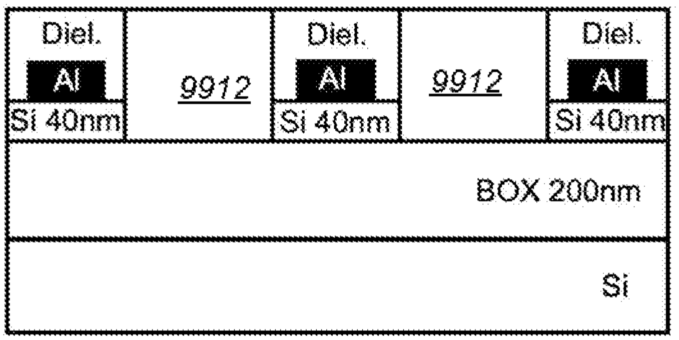
FIG. 99A shows a cross-section schematic of a thin Si layer on top of a BOX layer in a SOI structure.
Figure 99B:
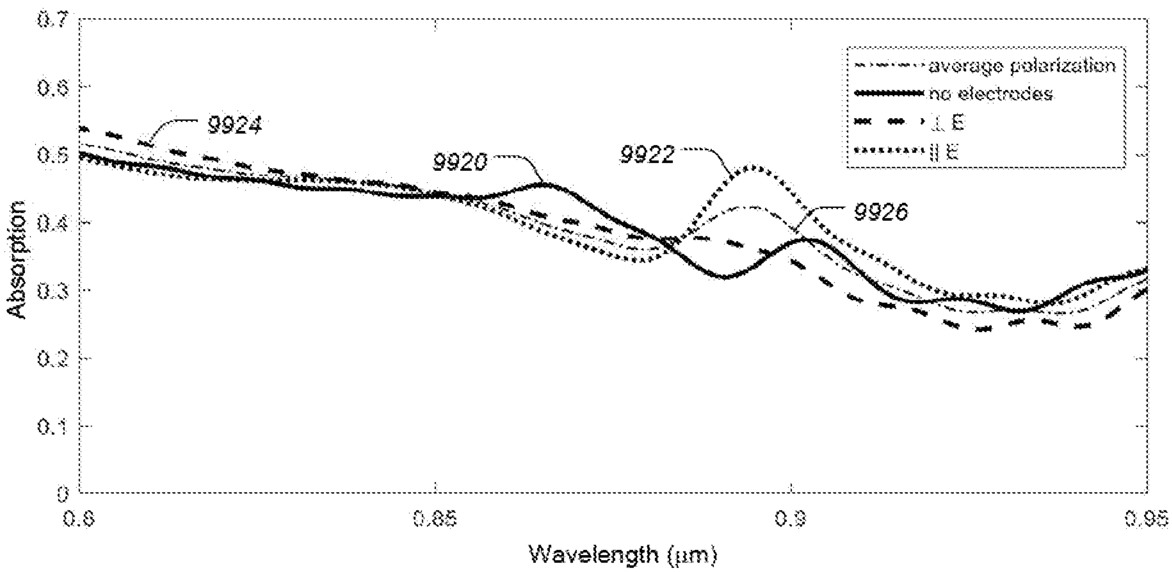
FIG. 99B shows an FDTD simulation of optical fields that are absorbed in the thin Si layer on top of the BOX layer in the SOI structure.

FIGS. 99A-B show an FDTD simulation of optical fields that are absorbed in a thin Si layer on top of a BOX layer in a SOI structure. A cross-section schematic is shown in FIG. 99A. Al electrodes are placed on the thin Si layer of 40 nm thickness, the Al has a width of 200 nm and a thickness of 20 nm. The structure is covered with $HfO_2$ to a thickness of 1000 nm. Holes 9912 are arranged in a square lattice are etched through the $HfO_2$ to the BOX layer with diameter of 800 nm and a period of 1000 nm. The FDTD simulation was made for both the optical electric field parallel and perpendicular to the interdigit Al electrodes. FIG. 99B plots absorption which is directly proportional to external quantum efficiency for wavelength ranging form 800-950 nm. The solid curve 9920 is for the case without electrodes, and the dashed curve 9924 is for the case with electrodes, and where the optical electric field is perpendicular to the interdigitated electrodes. The dotted curve 9922 is for the case with electrodes, and where the optical electric field is parallel to the interdigitated electrodes, and the dash-dot-dash curve 9926 is for the case with electrodes with both optical electric field parallel and perpendicular to the electrodes. As can be seen the absorption or quantum efficiency can range as high as 50% at 800 nm wavelength to over 20% quantum efficiency at 950 nm.

Photodetectors with microstructure holes can have a higher external quantum efficiency than a comparable photodetector without microstructure holes at certain wavelengths.

Figure 100A:
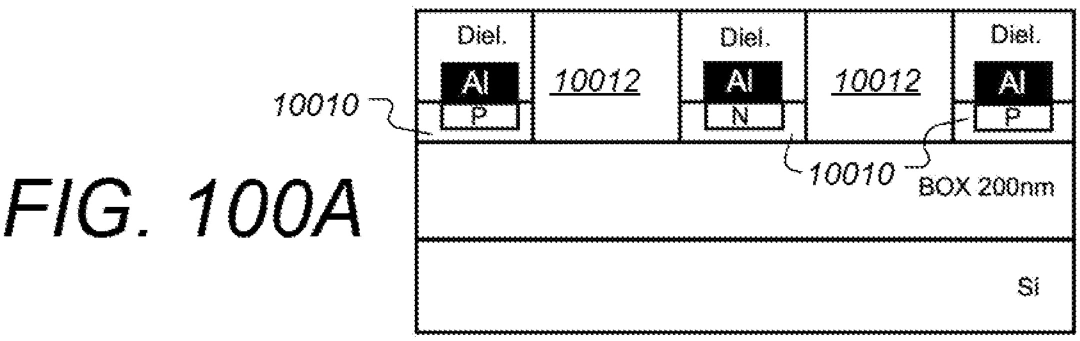
FIGS. 100A-B are partial schematic cross-sections of structure similar to that shown in FIG. 99A.
Figure 100B:
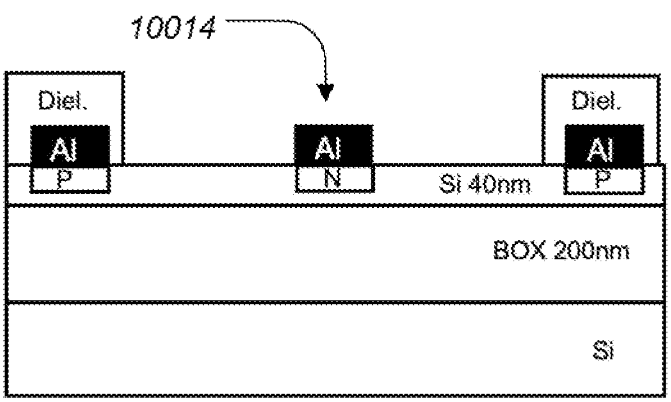

FIGS. 100A-B are partial schematic cross-sections of structure similar to that shown in FIG. 99A. In the case of FIG. 100A, P and N wells are added within the 40 nm thick Si layer 10010. The microstructure holes 10012 are etched through the dielectric ($Hf0_2$) to the BOX layer. And in some cases, the holes can be partially etched into the dielectric, and in some cases the holes can be etched to the Si device layer.

FIG. 100B is similar to FIG. 100A but with the lateral dimension of the microstructure hole 10014 wider than the spacing of the electrodes, as shown in this case the microstructure hole 10014 etched through the dielectric to the device layer, and in some cases etched partially in the dielectric layer, and in some cases etched into the device layer, and in some cases etched to the BOX layer, and in some cases etched into or through the BOX layer.

The width of the Al electrodes in structures such as illustrated in FIGS. 100A-B can range from 40 nm to 300 nm, the spacing between the Al electrodes can range from 100 nm to 1000 nm, and in some cases more than 1000 nm. The thickness of the Al electrodes can range from 10 nm to 100 nm, and in some cases more than 100 nm, and the length of the Al electrodes can range from 1 micron to 1000 microns or more. The electrode can be other metals such as Cu, Mo, Ta, Pt, to name a few, and in some cases the electrodes can be metal silicide, and in some cases the electrode can be heavily doped P or N semiconductor regions. The dielectric holes lateral dimension can range from 300 nm to 1600 nm, the dielectric thickness can range from 100 nm to 2000 nm or more, and the dielectric can be Ti oxide, Hf oxide, Si nitride, Si dioxide, to name a few. As in previously discussed structures with appropriate P and N doping profile and with PN, PIN, PIPN, PIPIN avalanche photodiodes, single photon avalanche photodiodes can be fabricated. Reference, Piemonte el. al, Overview on the main parameters and technology of modern Silicon Photomultipliers, Nuclear Inst. and Methods in Physics Research, A 926 (2019) 2-15

As shown in FIG. 99B with and without the interdigit electrodes under the dielectric absorption over a wavelength range of 800-950 nm is approximately the same. It can be seen that the geometric blocking of the optical signal by the electrode is minimal since the electrodes are subwavelength in the width dimension. This structure is different from prior art which doesn't include the electrode under the dielectrics.

The thickness of the dielectric in structures such as illustrated in FIGS. 100A-B can range from 100 nm to 1000 nm and in some cases greater than 1000 nm. The microholes in the dialectic can be filled partially or fully or buried by another dielectric with a different refractive index, and the dielectric on which the microholes are formed. The electrodes and/or P and N wells in some cases can be aligned with the microholes as shown in FIG. 100, and in some cases the electrode and/or P and N wells need not be aligned with the microholes. For example, the electrode and/or P and N wells can be intersecting with the microholes.

Figure 101A:
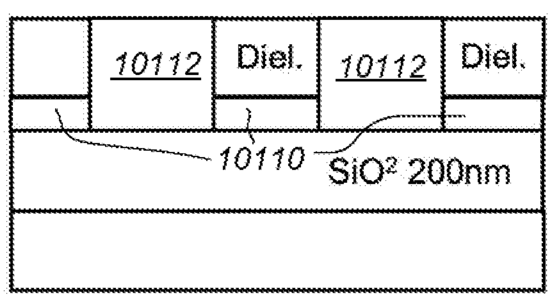
FIGS. 101A-B show an FDTD simulation of surface illuminated optical field of a structure, according to some embodiments.
Figure 101B:
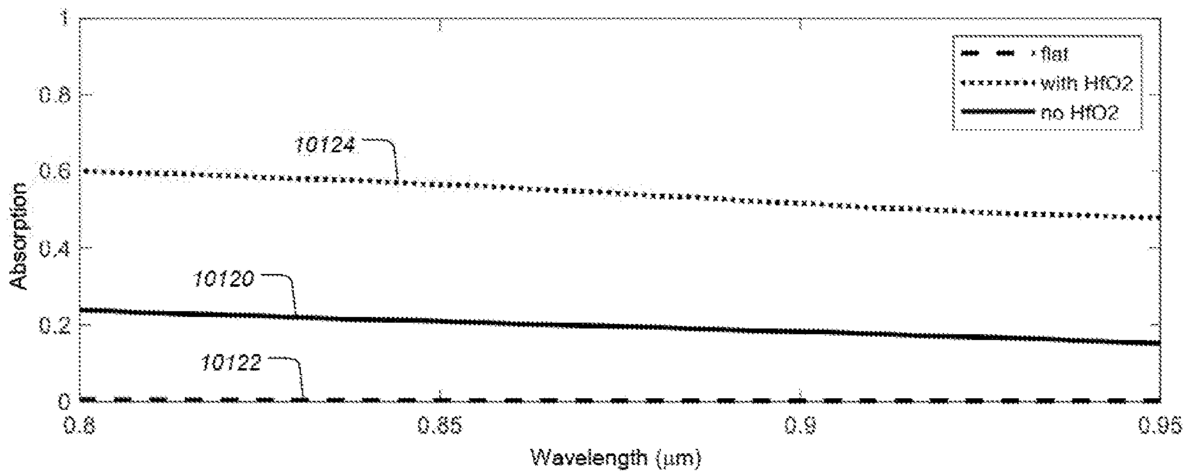

FIGS. 101A-B show an FDTD simulation of surface illuminated optical field of a structure. FIG. 101A shows the simulated configuration. An SOI wafer with 200 nm BOX layer and 30 nm Si device layer 10110 and with dielectric such as Hf oxide of 110 nm thick deposited on the Si device layer 10110. Metal interdigitated electrodes can be buried under the Hf oxide as shown in FIGS. 100A-B. The interdigits electrodes can be metal, silicide, heavily doped regions, transparent metal oxides to name a few. The microstructure holes 10112 are circular with a diameter of 800 nm and a period of 1000 nm in a square lattice. The holes can be periodic, aperiodic, and/or random and/or any combination thereof. Light impinges on the top surface or the dielectric surface. In FIG. 101B, curve 10122 is for a configuration without microstructure holes and the absorption is less than 1% for wavelength range of 800-950 nm. With Hf oxide shown by the dotted curve 10124 the structure can have an absorption which is directly proportional to quantum efficiency and is between 40-60% over the wavelength range. Without the dielectric (curve 10120), the absorption is roughly 20% in the wavelength range. Microstructure hole photodetector can have a higher external quantum efficiency than a comparable photodetector without microstructure holes at certain wavelengths.

Figure 102A:
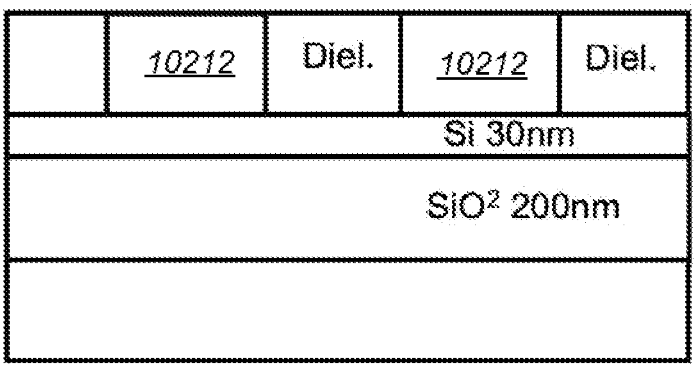
FIGS. 102A-B and 103A-C show FDTD simulations of surface illuminated optical field of a structures.
Figure 102B:
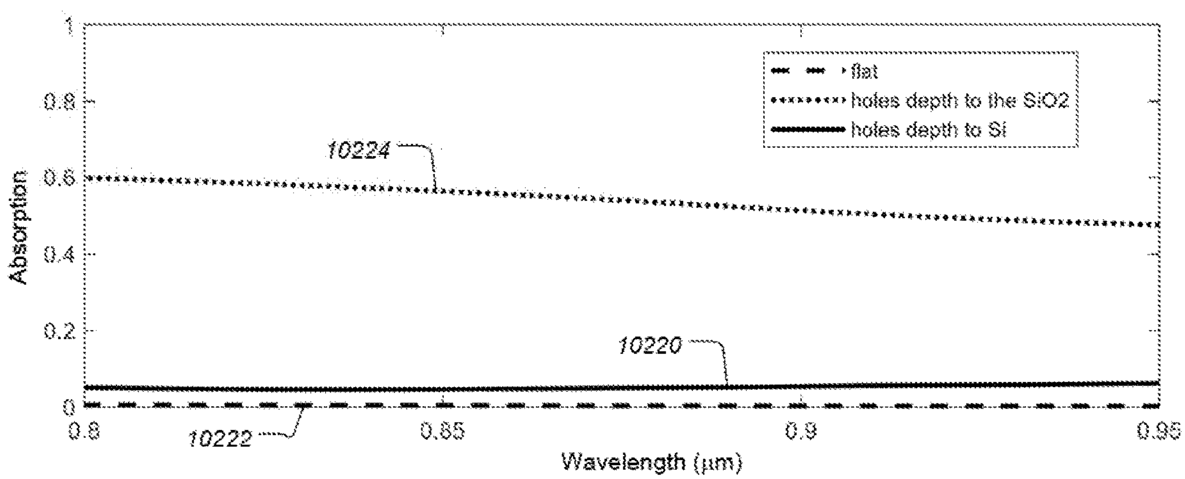

FIGS. 102A-B shows an FDTD simulation of surface illuminated optical field of a structure. The structure shown in FIG. 102A is similar to the structure shown in FIG. 101A except that the holes 10212 are etched to the Si device layer. Electrodes can be buried underneath the dielectric as in FIG. 100A-B and as in FIG. 99A the electrodes will have minimal effect on the absorption. FIG. 102B shows the plotted FDTD simulation. The absorption efficiency can range from 50-60% over the wavelength range of 800-950 nm. Curve 10220 is for holes etched to the SiO2 layer while curve 10224 is for holes etched to the Si layer. Curve 1022 is for a structure without holes.

Figure 103A:
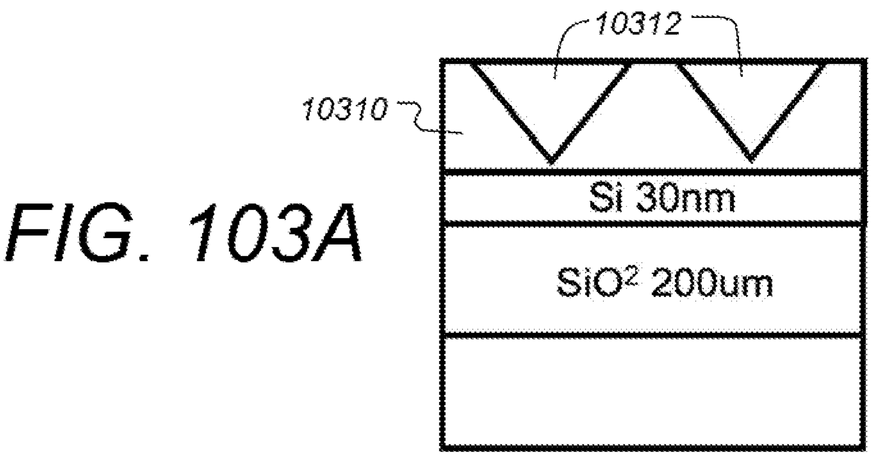
Figure 103B:
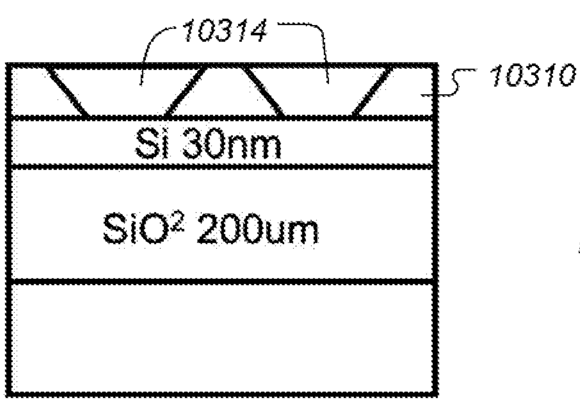
Figure 103C:
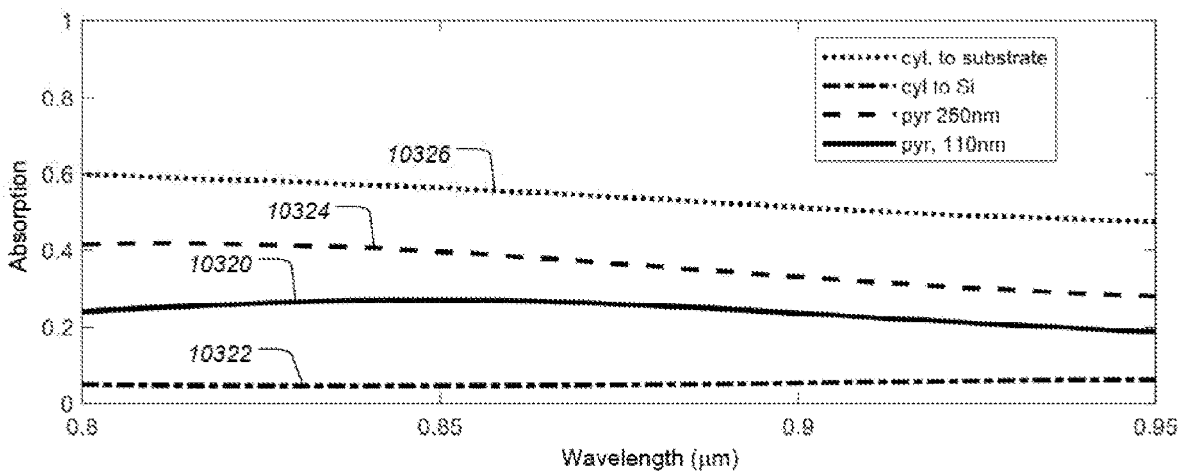

FIGS. 103A-C shows an FDTD simulation of surface illuminated optical field of a structure. The structures, shown in FIGS. 103A and 103B are similar to that shown in FIG. 102A. The holes are etched to the device layer and are rectangular with a lateral dimension of 800 nm and period of 1000 nm with a conical shape in the case of holes 10312 formed in a 250 nm Hf oxide layer 10310, as shown in FIG. 103A. FIG. 103B shows rectangular holes 10314 that are trapezoidal in Hf oxide layer 10310 that is 110 nm thick. In FIG. 103C, the solid curve 10320 gives the trapezoidal holes with 110 nm of dielectric has absorption of approximately 20% over the wavelength range of 800-950 nm. The conical or inverted pyramid holes on 250 nm (curve 10324) has approximately 30-40% absorption over the wavelength range of 800-950 nm. Absorption is directly proportional to external quantum efficiency and if all the photogenerated carriers are collected the absorption can be equal to external quantum efficiency. Curve 10326 is for a cylindrical holes, 800 nm diameter, 1000 nm period, square lattice, etched to the Si substrate through 250 nm HfO2, 30 nm Si, 200 nm BOX. Curve 10322 is for just cylindrical holes 800 nm diameter, 1000 nm period in 30 nm Si.

Very thin Si device layer of 10-30 nm and in some cases 10-100 nm are often used in current state of the art CMOS technology where NMOS and PMOS are formed on these thin Si device layer. In some cases, the thin Si device layer can be partially or fully depleted, and often is a low dope P layer, and in some cases it can be a low dope N layer.

Photodiodes, avalanche photodiodes, and/or single photon avalanche photodiodes 1D or 2D arrays according to the embodiments described in this patent specification can be formed on the thin Si layer with appropriate P and N doping in a lateral PIN, PIPN, PIPIN structure. In some cases the holes can be fully or partially filled with a dielectric of a lower index than the dielectric where the holes are formed. In some cases, the holes can be partially or fully filled with a dielectric with a higher index than the dielectric on which the holes are formed. In some cases, the holes can be fully buried with a dielectric with a refractive index that is different than the refractive index of the dielectric in which the holes are formed. Optical fields impinge on the top surface or the dielectric surface, and in some cases can impinge from the bottom surface through a via in the Si handle layer.

FIGS. 104A-H are a simplified partial schematic of a top views of photodetector arrays configured as dense 2D arrays for imaging applications. In FIG. 104A, each pixel can have lateral dimensions ranging from 1000 nm to 2000 nm. In the case for pixels of 1000-2000 nm lateral dimension the number of microholes can range from 1 to 10 or more, and in some cases only 1 microhole may be formed in each pixel. The dimension of the microhole is approximately a wavelength, for example 600-1000 nm, and in some cases 700-900 nm.

In FIG. 104B, a single microhole is shown in a pixel where the distance between the edge of the microhole to the edge of the pixel can be approximately 1 wavelength in the material (free space wavelength/refractive index of material), for example can have dimensions ranging from 200 to 500 nm. Each pixel can be isolated from the adjacent pixel with an isolation trench that can extend partially into the Si and in some cases can extend to the BOX layer.

FIG. 104C shows a single microstructure hole in a pixel where the microstructure hole is an inverted pyramid that can be formed with wet etching.

FIGS. 104D-E show multiple microholes in a pixel with larger lateral dimension.

FIGS. 104F-G show microholes of different lateral dimensions within a single pixel. FIG. 104H shows a single microhole in a pixel where the microhole is random, free-form or "amoeba" shaped.

Not shown in FIGS. 104A-H are the connecting metal layers or electrodes or metal silicide connecting the pixels to CMOS electronics. In some cases the pixels can have a common connection on the surface and individual connection to each pixel by means of an electrode passing through the BOX layer and connecting to the CMOS electronics on the opposing surface.

The photosensor arrays in FIGS. 104A-H can be 1000×1000 pixels, and in some cases can be 10,000×10,000 pixels or more, and in some cases can be less than 1000×1000 pixel array. The photosensor can be a photodiode and/or avalanche photodiode and/or single photon avalanche photodiode, and can have wavelength range from 700 to 1000 nm, and with an addition of Ge or GeSi alloy the wavelength range can be extended to 1650 nm. In the case of large pixels microhole arrays can range from 10×10 to 1,000×1,000 or more microholes. The microholes can be periodic and/or aperiodic and/or randomly arranged. The photosensor with microholes and have a higher external quantum efficiency than a comparable photosensor without microholes at certain wavelength in the range of 700-1650 nm. In time-of-flight applications the microhole photosensors can have rise time in the 10s of pico seconds.

Figure 105A:
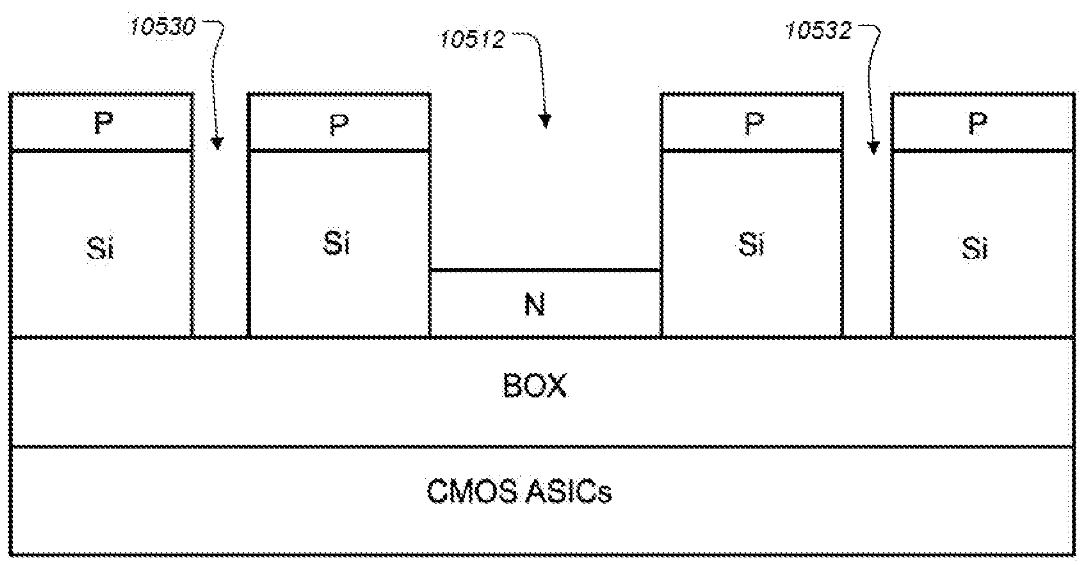
FIGS. 105A-C shows simplified partial cross-sections of a single microstructure hole in a pixel, according to some embodiments.
Figure 105B:
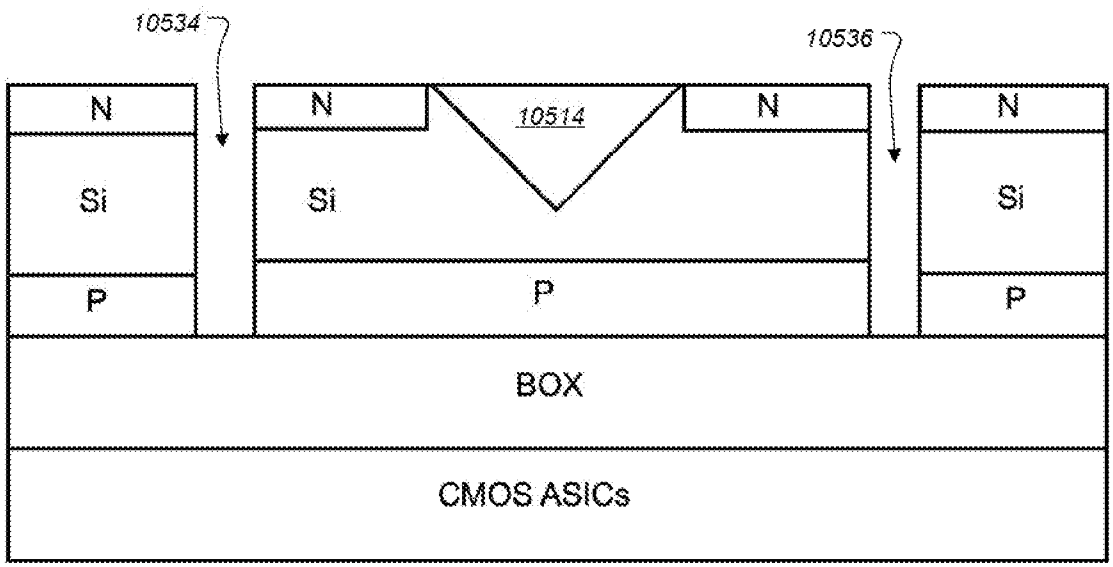
Figure 105C:
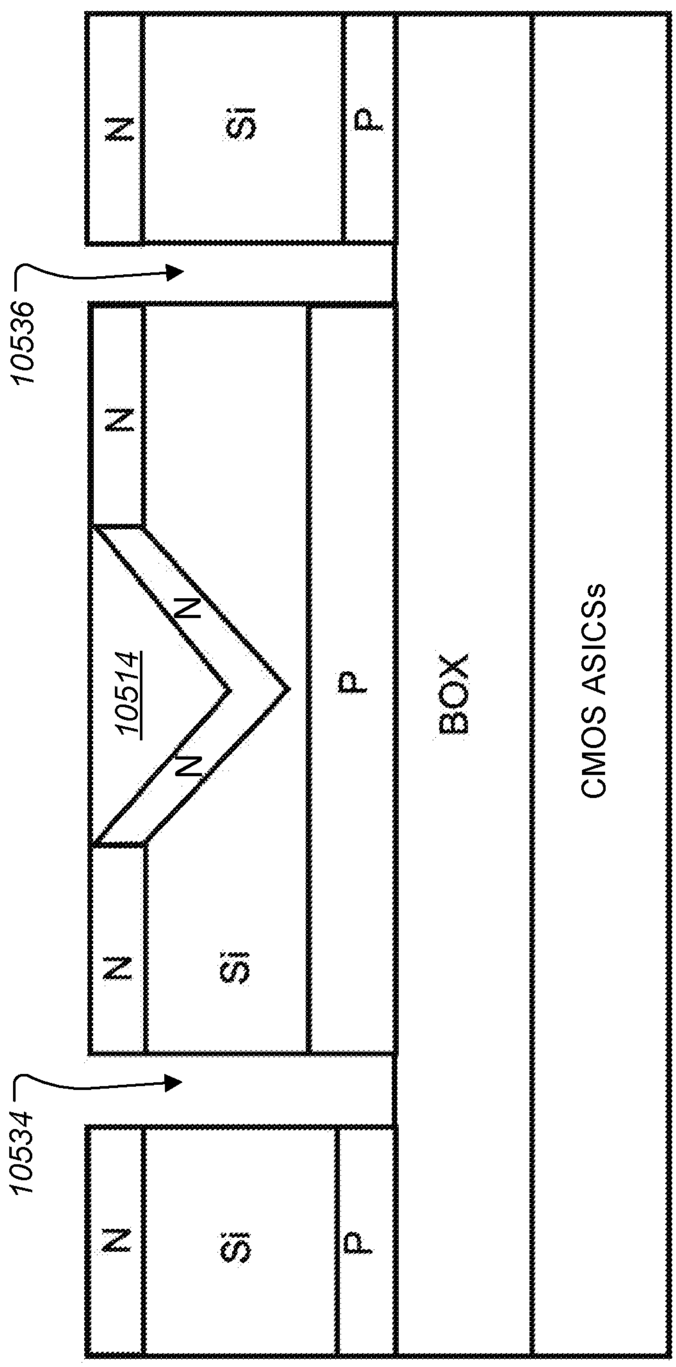

FIGS. 105A-C shows simplified partial cross-sections of a single microstructure hole in a pixel. CMOS electronics are shown on the opposing surface, and not shown are the connecting electrodes passing through the BOX layer, connecting each pixel to the CMOS electronics. In FIG. 105A, the P layer can be formed followed by dry etching of the microholes 10512 partially into the Si layer, and followed by the formation of N layer at the bottom of the microhole 10512. The P and N layers can be formed by ion implantation. In this example the ion implantation energy can be low since the ion does not have to penetrate the entire depth of the Si. The P and N regions can be interchanged. Isolation trenches 10530 can be etched partially into the Si, and as shown can be etched to the BOX layer. The isolation trenches 10530 and microholes 10512 can be filled with a dielectric such as $SiO_2$, and the surface can be planarized using chemical mechanical polishing for example and a common electrode can be formed on the P surface for all the pixels. The thickness of the Si layer on which photosensors are formed can have a thickness ranging from 1000-5000 nm, and in some cases to 10,000 nm. In some cases, the thickness of the Si on which the photosensors are formed can have thickness ranging from 100 nm-5000 nm, and in some cases less than 100 nm.

FIG. 105B shows a simplified partial cross-section schematic of a pixel with a single microhole 10514 in this case an inverted pyramid. P and N regions can be formed by ion implantation and the inverted pyramid can wet etched. Isolation trench 10534 can be formed to isolate each pixel electrically and/or optically. As in FIG. 105A the trenches in the microholes can be buried with an oxide. The oxide can also serve as a passivation layer. Not shown are connecting electrodes of each pixel to the CMOS electronics by means of a via through the BOX layer. N region of the pixels can be a common electrode.

FIG. 105C is similar to FIG. 105B except that the inverted pyramid 10514 is formed first followed by an N dopant which can be diffused and/or ion implanted. As in FIGS. 105A-B the trenches and the microholes can be buried with an oxide. The lateral dimension of the inverted pyramid can be approximately a wavelength for example 700-1000 nm and the distance from the edge of the pyramid to the edge of the pixel can be 1 wavelength in the material for example 200-500 nm. Light or optical signal or optical image impinge on the surface with the microholes. The wavelength can range from 700-1100 nm for Si and with the addition of Ge or GeSi alloy the wavelength can range from 700-2100 nm. The photosensor can be a photodiode or avalanche photodiode, or single photon avalanche photodiode, and can have rise time in the 10s of pico seconds, and can have bandwidth ranging from 1 GHz to 100 GHz, and in some cases less than 1 GHz. Optical image or signal impinge on the surface with microholes and is surface illuminated. The devices shown in FIGS. 105A-C are sometimes known as back illuminated CMOS image sensors.

With appropriate doping profiles of P and N junctions, and in some cases PIN, and in some cases PIPN, and in some cases PIPIN (P and N can be interchanged in structures such as illustrated in FIGS. 105A-C. However for the lowest noise APD/SPAD ionization of electrons for avalanche gain is preferred). The pixels with microholes can be photodiode (PD) and/or avalanche photodiode (APD) and/or single photon avalanche photodiode (SPAD)

Figure 106:
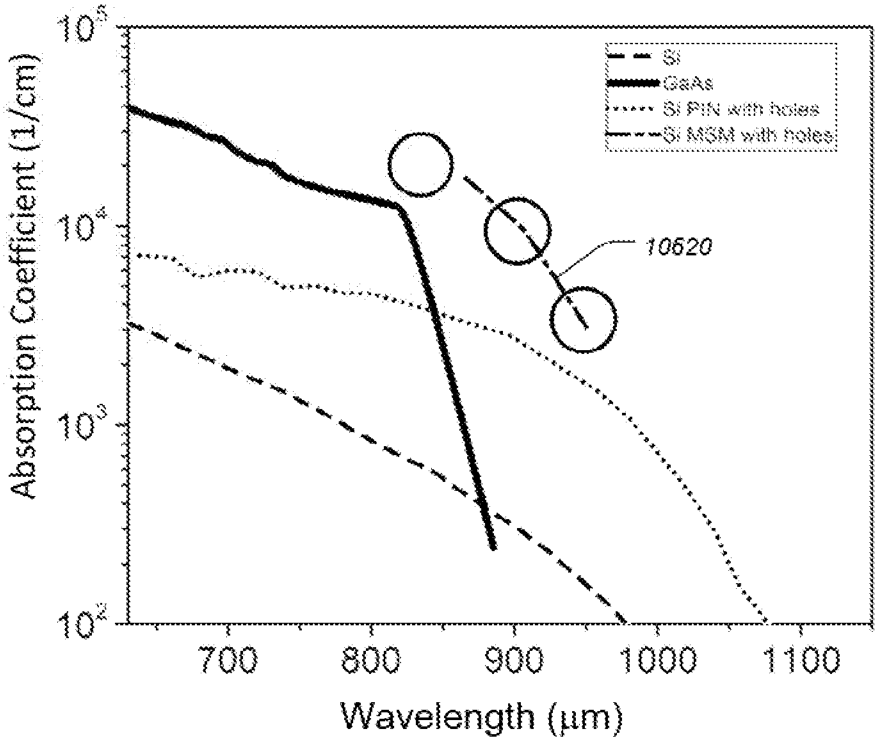
FIG. 106 shows experimental results of absorption enhancement with microstructure holes or microholes.

FIG. 106 shows experimental results of absorption enhancement with microstructure holes or microholes in structures such as illustrated in FIG. 47C and in other new lateral Schottky MSM structures described in this patent specification. Absorption coefficient vs wavelength is plotted for various material such as Si, and GaAs without microholes as compared with Si MSM photodiode with microholes and Si PIN vertical structure photodiode with microholes. The curve 10620 with large dots are experimental results of Si MSM interdigitated lateral photodiode with microstructure holes or microholes where the effective absorption coefficient at 850 nm wavelength is enhanced by 35 times to an effective absorption coefficient of 18,000 $cm^{-1}$ as compared to the absorption coefficient of Si without microstructure holes of 535 $cm^{-1}$. At 850 nm wavelength GaAs without microholes has an absorption coefficient of approximately 12,000 $cm^{-1}$. This is the first time that with photon trapping using microholes that absorption and/or quantum efficiency of Si is greater than that of GaAs at the wavelength range of 850 nm-980 nm.

The Si MSM lateral interdigitated photodiode with microholes fabricated on SOI Si wafer with device layer of 1 micron thickness and BOX layer of 2 micron thickness achieve 85% external quantum efficiency at 850 nm experimentally with a reverse bias (in MSM structures the current voltage is approximately symmetric and the device can operated in either reverse or forward bias, e.g., in structures such as illustrated in FIG. 47C and in other new lateral MSM structures where both M1 and M2 are Schottky contacts as described in this patent specification). Comparable photodetector without microstructure holes will have a lower EQE approximately 10% or less. The microholes are approximately 1 wavelength and the spacing between the microholes are approximately 1 wavelength in the material in a square lattice, and the interdigitated electrode width is approximately 300 nm with a spacing of approximately 1,000 nm.

Figure 107A:
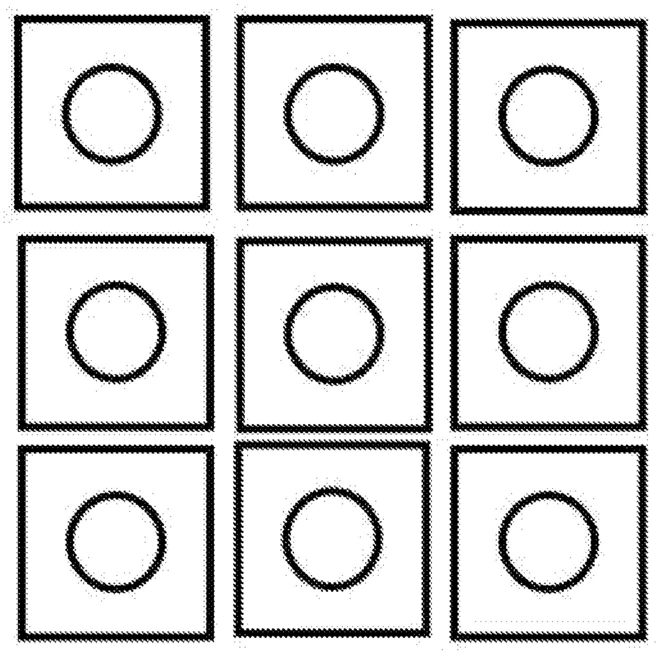
FIGS. 107A-C shows simplified partial schematic of a top views and a cross-section of a pixel with a single microstructure hole, according to some embodiments.
Figure 107B:
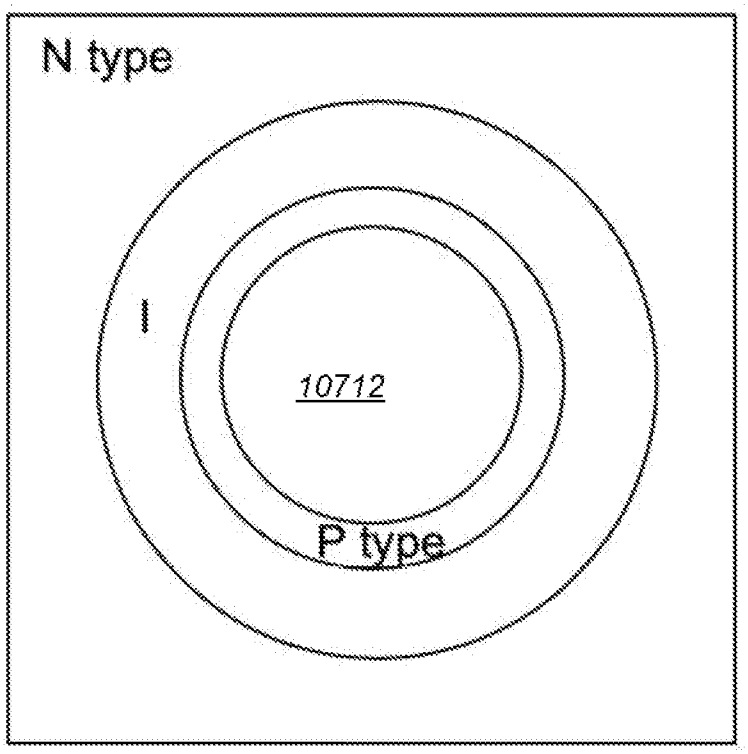
Figure 107C:
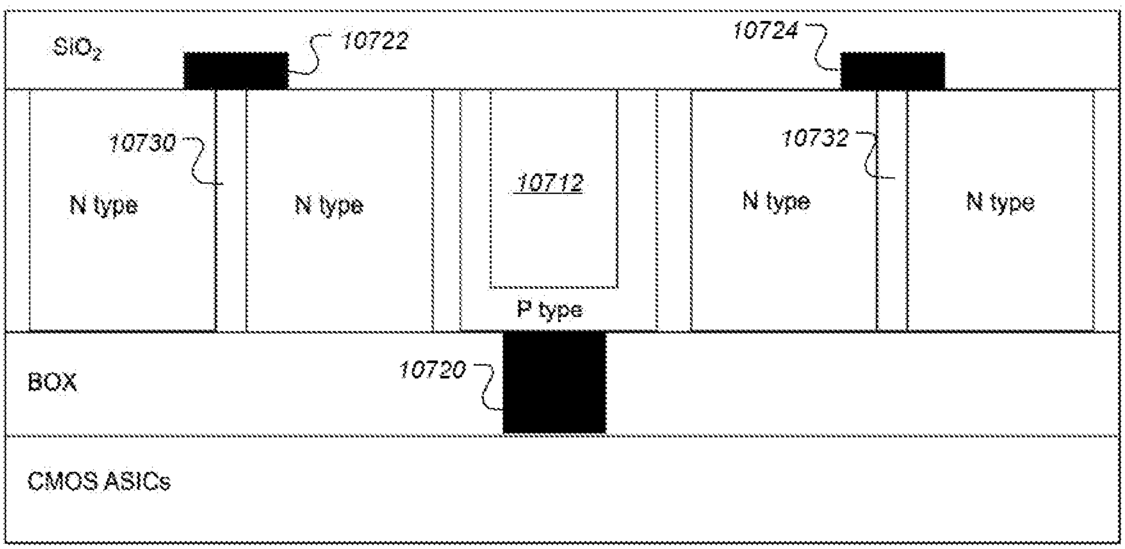

A Schottky interdigitated MSM photodiode on SOI wafer with 1 micron device layer with a resistivity ranging from 1-10 ohm-cm, and with cylindrical holes with diameter ranging from 700 nm-1000 nm and with a spacing between the holes of 300 nm in a square lattice have demonstrated experimentally an enhancement of the absorption coefficient by 35× at 850 nm wavelength and 37× at 905 nm wavelength as shown by the circle. Such enhancement pertains to structures such as illustrated in FIG. 47C and to other new lateral Schottky MSM structures described in this patent specification FIGS. 107A-C show simplified partial schematic of a top views and a cross-section of a pixel with a single microstructure hole. The pixel can be formed on the back side for example as in the case of back illuminated CMOS image sensor (BI-CIS) or it can be formed on the top surface for a front illuminated CMOS image sensor (FI-CIS). The lateral dimension of the pixel can range from 1 to 5 microns. With proper doping profiles such as PN, PIN, PIPN for example the pixel can operate in the photodiode or avalanche photodiode, or single photon avalanche photodiode mode with proper reverse bias. The reverse bias voltage can range from 0.3 V to 40 V, and in some cases 0.3 V-3.3 V, and in some cases from 3.3 V-15 V, and in some cases from 3.3 V-35 V.

FIG. 107A shows a top view of a pixel array where each pixel has a single microstructure hole and each pixel can be isolated electrically and optically with an isolation trench that can be etched partially or fully to the BOX layer (see trenches 10730 and 10732 in FIG. 107C). In addition, the trench and the microstructure hole can be filled with a dielectric such as Si dioxide. Not shown are connecting electrodes connecting the surface dopant region to adjacent pixels to form a common contact. In some cases, each pixel can have its own anode and cathode, and not have a common cathode for example. Light signal that can be modulated optical signal for data communication for optical signal from time-of-flight applications or optical images impinges on the surface where the holes are formed.

FIG. 107B shows a single pixel with examples of doping. A microstructure hole 10712 is formed within the pixel with a lateral dimension ranging from 600 nm-1300 nm, and in some cases 400 nm-1300 nm, and in some cases 700 nm-1000 nm. The microstructure hole can be formed using dry etching and can be circular, oval, rectangular, polygonal, amoebic to name a few. The microstructure hole can also be wet etched using TMAH to form inverted pyramids. The microstructure hole 10712 can be etched partially into the Si or entirely to the BOX layer. Doping can be diffused and/or ion implanted such that P dopant into the walls of the microstructure hole and an N dopant can be diffused or implanted surrounding the P dopant for example. The N and P can be interchanged by appropriate doping profiles of the P and N the device can operated in PD, APD, SPAD mode.

FIG. 107C shows a simplified partial schematic cross-section of a single microstructure hole within the pixel where the microstructure hole 10712 is shown as cylindrical and partially etched into the Si, and a P dopant is formed along the wall and the bottom of the hole, and an N dopant is formed adjacent to the P dopant. The thickness of the Si layer can range from 100 nm to 3000 nm, and in some cases can range from 300 nm to 3000 nm, and in some cases can range from 30 nm to 300 nm. The Si can be I or low dope N or P. In some cases, GeSi or Ge layers can be grown on the Si to form a Si/GeSi/Ge layer on which the single microstructure hole can be formed. Hole 10712 extends down into the P-type material, which in turn is surrounded by the I-region, so in effect the hole extends into the I-region as well. The depth of the hole can be grater than the depth of an inverted pyramid etched into a single-crystal semiconductor given the semiconductor's inherent crystal planes. Connecting electrode 10720 connects the P region (anode) to the CMOS electronics and common electrodes 10722 and 10724 connect adjacent electrodes; for example the cathode can be formed as shown and these electrodes can be connected to CMOS electronics which is not shown. In some cases, each pixel can have the anode and cathode connected directly to the CMOS electronics. The example shown in FIG. 107C is a BI-CIS where the CMOS electronics and the detector are on opposite sides of the BOX layer.

In some cases, the lateral dimension of the microstructure holes can be approximately the nominal wavelength in free space divided by the optical refractive index of the material that fills the microstructure holes.

Figure 108A:
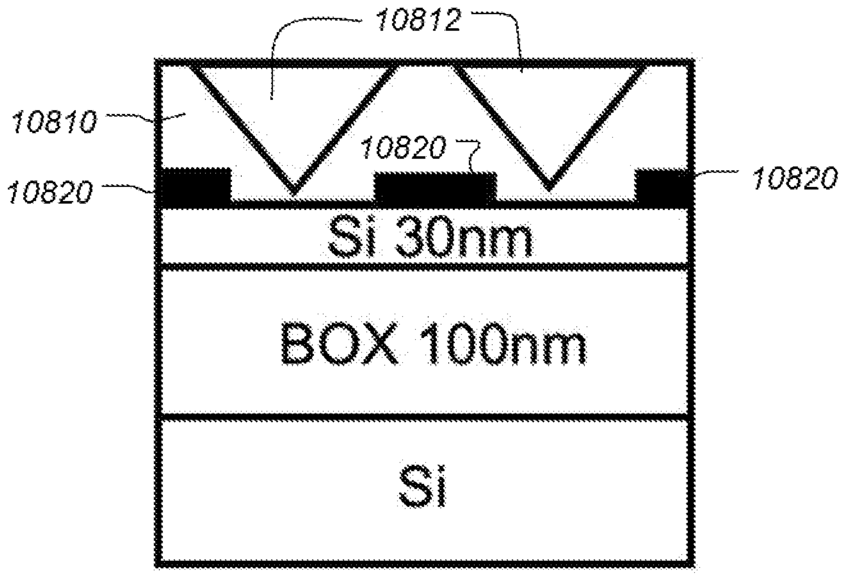
FIGS. 108A-C show an FDTD simulation of a thin Si device layer on SOI substrate where the Si is 30 nm thick, the BOX layer is 100 nm on Si substrate.
Figure 108B:
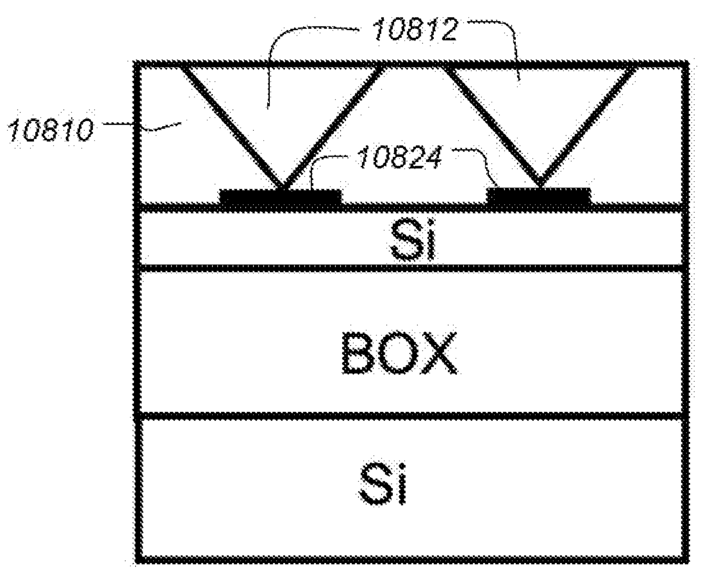
Figure 108C:
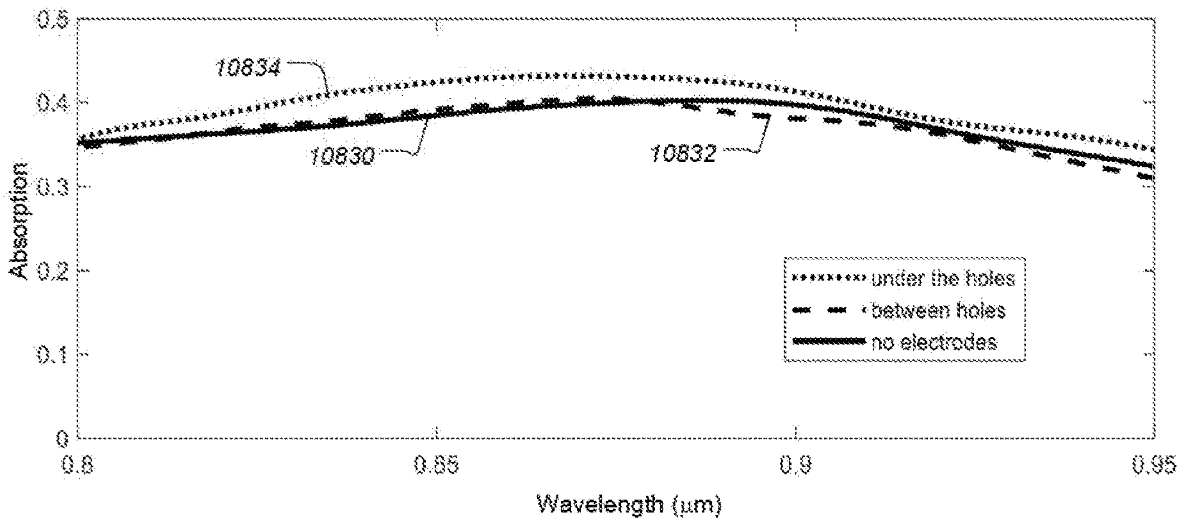

FIGS. 108A-C show an FDTD simulation of a thin Si device layer on SOI substrate (as in FIGS. 108A-B) where the Si is 30 nm thick, the BOX layer is 100 nm on Si substrate. The electrodes 10820 in FIG. 108A and 10824 in FIG. 108B are buried under the $HfO_2$ layer 10810. Conical holes 10812 are formed on the $HfO_2$ 10810 which has a thickness of 250 nm. The electrodes formed on the Si are 300 nm wide, 50 nm thick, and 100 microns long. The lateral dimension of the conical holes 10812 which is triangular shaped is 800 nm with a period of 1000 nm in a square lattice. The electrodes can be under the hole, or not under the hole. As shown in FIG. 108C with the dotted curve 10834 where the electrodes are under the hole, the dashed cure 10832 where the electrodes are between the holes, and the solid line 10830 is without any electrodes. As shown in the calculations for wavelength 800 nm-950 nm the difference between the 3 sets of curves is less than 5%, and has an absorption greater than or equal to 30% over the wavelength range. In some cases, the absorption can be greater or equal to 20% at certain wavelength range. A photodetector with microstructure hole or holes can have a higher external quantum efficiency than a comparable photodetector without microstructure hole/holes at certain wavelengths in the range of 800 nm-950 nm.

Figure 109:
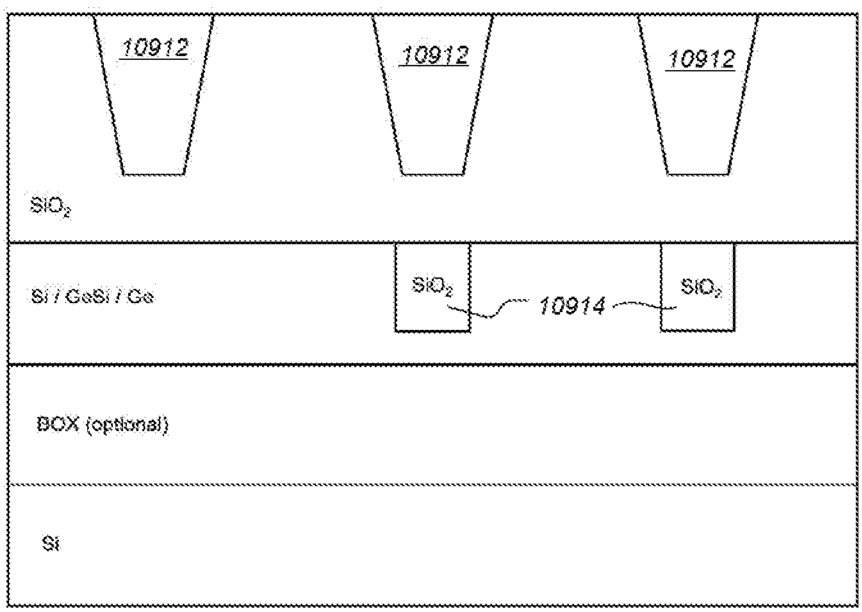
FIG. 109 shows a partial schematic cross-section of a light trapping structure, according to some embodiments.

FIG. 109 shows a partial schematic cross-section of a light trapping structure. Micro-holes 10914 are etched into the active layer that can be Si/GeSi/Ge and the microstructure holes can be filled with a dielectric such as $SiO_2$, and in addition the oxide can extend by 100 nm-3000 nm thick and on which additional microstructure holes 10912 can be formed. Not shown are electrodes for vertical PIN, PN, PIPN, PIPIN photodetector or electrodes for lateral PN, PIN, PIPN photodetector which can be PD or APD or SPAD. Optical signal impinges on the top surface with the microstructure holes 10912. The BOX layer can be optional and can have a thickness ranging from 20 nm to 2000 nm or more, the Si device layer can have a thickness ranging from 10 nm to 1000 nm and the GeSi/Ge layer can have a thickness ranging from 100 nm to 1000 nm that can be grown epitaxially on the Si device layer, and in some cases can be grown using selective area epitaxy growth. The microstructure holes 10914 formed in the Si/GeSi/Ge can have lateral dimension ranging from 300 nm to 1300 nm, and in some cases 500 nm-1000 nm, and the spacing between the microstructure holes 10914 can range from 100 nm to 500 nm, and in some cases more than 500 nm. The depth of the microstructure holes 10914 can be partially etched into the Si/GeSi/Ge or entirely to the BOX layer, in the case of no BOX layer to the Si substrate. The microstructure holes 10914 in the Si/GeSi/Ge can have a cylindrical cross-section, and in some cases a conical cross-section, and in some cases an inverted pyramid to name a few. The oxide can partially or entirely fill the microstructure holes 10914, and can extend to a thickness ranging from 100 nm to 5000 nm. In some cases a thin layer of amorphous Si can be formed on the side walls of the GeSi/Ge microstructure holes for passivation prior to depositing dielectric such as $SiO_2$. Microstructure holes 10912 can be formed on the $SiO_2$ or dielectric that can be coincidental with the microstructure holes 10914 in the Si/GeSi/Ge. And in some cases, the microstructure holes 10912 in the dielectric need not be coincidental.

The additional microstructure holes 10912 in the dialectic can have lateral dimension larger than the lateral dimension of microstructure holes in the Si/GeSi/Ge. The additional microstructure hole 10912 in the dielectric help reduce reflection from the surface and help funnel trapped photons to the microstructure holes in the semiconductor.

The lateral dimension of microstructure holes 10912 is approximately a wavelength, and the spacing between the microstructure holes is approximately a wavelength in the material. The wavelength can be the mean wavelength of the incident signal spectrum for example. In some cases, the lateral dimension can be less than a wavelength for example wavelength/2 and in some cases more than a wavelength were wavelength×integer.

The lateral dimension of microstructure holes in most cases mentioned in this patent specification are that for microstructure holes not filled with any dielectric, and filled only with air or vacuum where the optical refractive index is approximately 1. In the cases where the microstructure holes are filled fully or partially with the dielectric the lateral dimension of the microstructure hole can be reduced by the effective optical refractive index of the dielectric/voids in the microstructure holes. For example, a microstructure hole with lateral dimension of 800 nm not filled in air can have a lateral dimension of 533 nm if it was completely filled with $SiO_2$ which has an optical refractive index of approximately 1.5. Microstructure hole lateral dimension can in some cases be reduced when it is filled with dialectic, where the refractive index is greater than 1 for example (lateral dimension of microstructure hole in vacuum or air)/(optical refractive index), and in some cases where the microstructure hole is partially filled with dielectric and effective optical refractive index can be calculated by the ratio of the volume of 1 or more dielectrics in the microstructure hole.

Figure 110A:
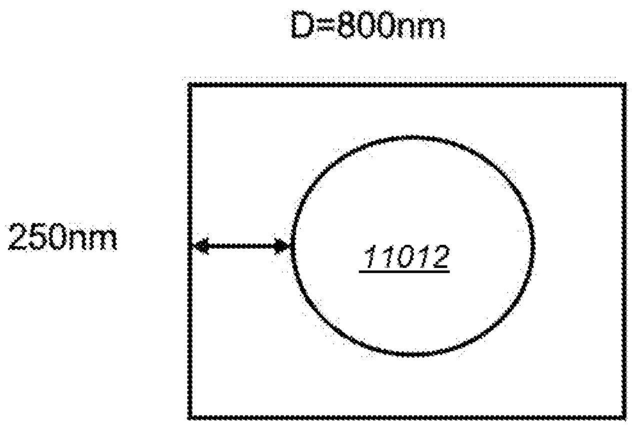
FIGS. 110A-C show FDTD simulated optical absorption, reflection and transmission of a single hole pixel in Si on a BOX layer, according to some embodiments.
Figure 110B:
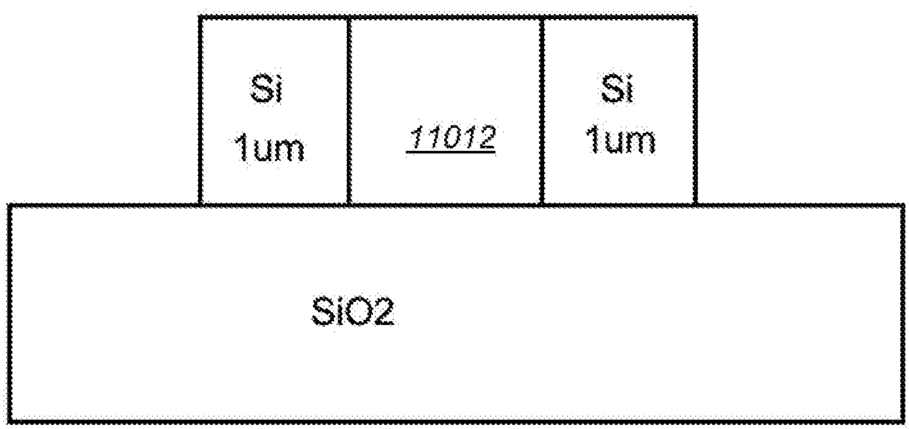
Figure 110C:
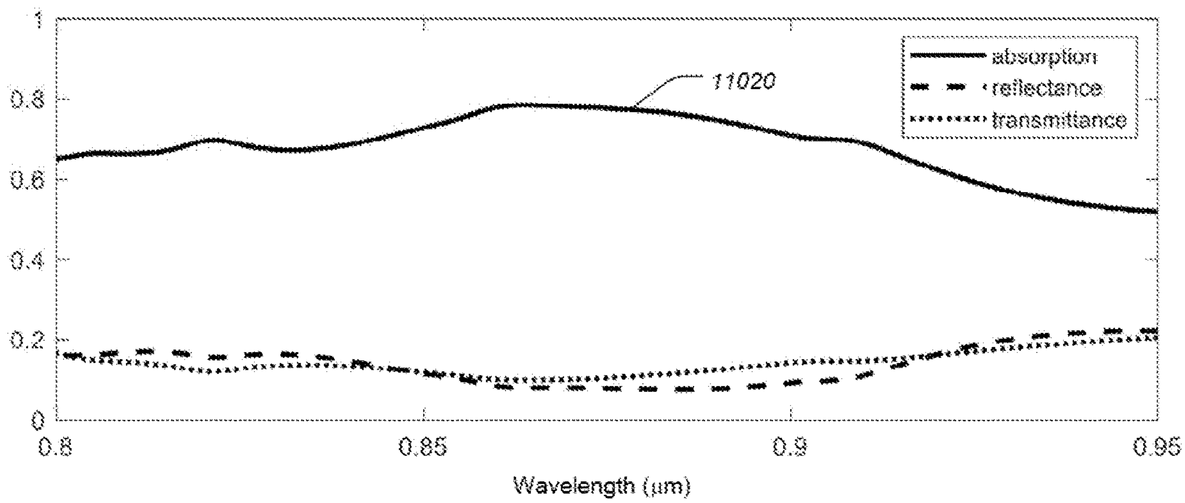

FIGS. 110A-C show FDTD simulated optical absorption, reflection and transmission of a single hole pixel in Si on a BOX layer, according to some embodiments. As shown in FIGS. 101A and 101B, the pixel size is 1300 nm square and the microstructure hole 11012 is 800 nm in diameter and is etched to the BOX layer. The thickness of the Si is 1 micron. In FIG. 101C, the simulation shows that the absorption which is proportional to the external quantum efficiency can be 50% or more in the wavelength range 800-950 nm. In some cases, the absorption can be as high as 80% at certain wavelengths. The solid curve 11020 is absorption, the dash curve is reflection and the dotted curve is transmission. These curves are related by the equation A+R+T=1 where A is absorption, R is reflection and T is transmission for this FDTD simulation of the optical fields incident at a normal and/or almost normal (+/−15 degrees) angle to the single microstructure hole pixel shown in FIG. 110A-B. External quantum efficiency, EQE, is proportional to absorption. If all the photo generated carriers are collected by the anode and cathode that are in turn connected to an external circuit that can include voltage bias, and signal processing ASICs convert the photo generated carriers into an electrical signal, the EQE can equal absorption and can be 50% or more at certain wavelengths in the range 800-950 nm and in some cases to 1000 nm. If any photogenerated carriers are lost to recombination for example the EQE will be less that absorption and in some cases 10-20% less and in some cases 20-50% less and in some cases 50-60% less at certain wavelengths in the wavelength range 800-950 nm and in some cases to 1100 nm. Pixels with microstructure hole(s) can have a higher EQE than pixel without microstructure hole(s) at certain wavelengths. The simulation is of single hole pixel where the hole is not filled with any dielectric except air. In some cases, the diameter of the microstructure hole can be reduced if the hole is filled or partially filled or buried by a dielectric. The diameter can then be given approximately by the diameter in free space divided by the optical refractive index of the dielectric material. In some cases, as in FIG. 109, additional microstructure holes can be formed in the dielectric to reduce reflection from the dielectric surface and improve light absorption in the microstructure holes Si. The pixel can be isolated from adjacent pixels by a trench that can be filled with a dielectric. The number of pixels can range from 100×100 to 1000×1000 to 5000×5000 or more.

Although the foregoing has been described in some detail for purposes of clarity, it will be apparent that certain changes and modifications may be made without departing from the principles thereof. It should be noted that there are many alternative ways of implementing both the processes and apparatuses described herein. Accordingly, the present embodiments are to be considered as illustrative and not restrictive, and the body of work described herein is not to be limited to the details given herein, which may be modified within the scope and equivalents of the appended claims.

The invention claimed is:

1. An integrated, single-chip structure comprising a photosensitive portion at one side of a substrate and an active CMOS or BICMOS electronic circuit at an opposite side of the substrate, wherein:

said photosensitive portion at one side of said substrate comprises at least one photodetector comprising a P-doped region, an N-doped region, and an I-region of low doped or undoped semiconductor material that is between the N-doped region and the P-doped region and has at least one hole deliberately formed to extend into said photosensitive portion;

wherein said I-region is essentially single-crystal semiconductor material having inherent crystal planes and said at least one hole extends into said photosensitive portion to a depth exceeding a depth of an inverted pyramid hole with sides along said crystal planes;

said active circuit at an opposite side of said substrate comprises plural active electronic elements;

connecting electrodes are configured to carry to said active electronic circuit electrical signals generated by said photosensitive portion in response to illumination, for processing by said active electronic circuit; and output electrodes are connected to said active electronic circuit and are configured to deliver electrical signals processed by the active electronic circuit.

2. The structure of claim 1, in which said P-doped region, N-doped region, and I-region are vertically arranged.

3. The structure of claim 2, in which said at least one hole extends through one and toward the other of said P-doped region and N-doped region.

4. The structure of claim 3, further including material of one of said P-doped region and N-doped region at sidewall portions of said at least one hole.

5. The structure of claim 2 in which said I-region is at a closed end of said at least one hole and along at least sidewall portions thereof.

6. The structure of claim 2, in which one of said P-doped region and N-doped region extends along at least sidewall portions of said at least one hole.

7. The structure of claim 2, in which said at least one hole extends through said P-doped region and N-doped region.

8. The structure of claim 2, in which said at least one hole comprises plural holes laterally spaced from each other and said photosensitive portion comprises plural photodetectors.

9. The structure of claim 2, further including at least one avalanche photodiode structure.

10. The structure of claim 2, further including at least one single photon avalanche photodiode (SPAD).

11. The structure of claim 1, in which said P-doped region, N-doped region, and I-region have at least portions that are vertically aligned.

12. The structure of claim 11, in which one of said P-doped region and N-doped region is at a closed end and at sidewall portions of said at least one hole.

13. The structure of claim 11, in which said at least one hole extends through at least one of said P-doped region and N-doped region.

14. The structure of claim 13, in which said at least one hole extends into both said P-doped region and N-doped region.

15. The structure of claim 11, in which said at least one hole penetrates through both said P-doped region and N-doped region.

16. The structure of claim 11, in which said at least one hole comprises plural holes laterally spaced from each other and said photosensitive portion comprises plural photodetectors laterally spaced from each other.

17. The structure of claim 11, in which said at least one hole has a closed end at one of said P-doped region and N-doped region.

18. The structure of claim 11, further including at least one avalanche photodiode structure.

19. The structure of claim 11, further including at least one single photon avalanche photodiode (SPAD).

20. The structure of claim 1, wherein the photosensitive portion comprises plural pixels and each pixel has only a single one of said holes.

21. The structure of claim 20, in which said pixels have round holes.

22. The structure of claim 20, in which said pixels have rectangular holes.

23. An integrated, single-chip structure comprising a photosensitive portion at one side of a substrate and an active CMOS or BICMOS electronic circuit at an opposite side of the substrate, wherein:

said photosensitive portion at one side of said substrate comprises at least one photodetector comprising a P-doped region, an N-doped region, and an I-region of low doped or undoped semiconductor material that is between the N-doped region and the P-doped region and has at least one hole deliberately formed to extend into said photosensitive portion;

wherein the P-doped region and the N-doped region overlap only partly;

wherein said I-region is essentially single-crystal semiconductor material having inherent crystal planes and said at least one hole extends into said photosensitive portion to a depth exceeding a depth of an inverted pyramid hole with sides along said crystal planes;

said active circuit at an opposite side of said substrate comprises plural active electronic elements;

connecting electrodes are configured to carry to said active electronic circuit electrical signals generated by said photosensitive portion in response to illumination, for processing by said active electronic circuit; and output electrodes are connected to said active electronic circuit and are configured to deliver electrical signals processed by the active electronic circuit.

24. The structure of claim 23, in which one of the P-doped and N-doped regions extends at least along an entire width of said at least one hole.

25. The structure of claim 23, in which one of the P-doped and N-doped regions extends at least along a part of a side wall of said at least one hole.

* * * * *